United States Patent
Goda et al.

(10) Patent No.: US 7,026,241 B2
(45) Date of Patent: Apr. 11, 2006

(54) SUPERCONDUCTOR DEVICE AND METHOD OF MANUFACTURING THE SAME

(75) Inventors: Akira Goda, Yokohama (JP); Mitsuhiro Noguchi, Yokohama (JP); Yuji Takeuchi, Yokohama (JP); Hiroaki Hazama, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 10/943,250

(22) Filed: Sep. 17, 2004

(65) Prior Publication Data

US 2005/0037612 A1   Feb. 17, 2005

Related U.S. Application Data

(62) Division of application No. 10/318,257, filed on Dec. 13, 2002, now Pat. No. 6,943,453.

(30) Foreign Application Priority Data

Dec. 13, 2001   (JP)   ............................. 2001-380656

(51) Int. Cl.
*H01L 21/4763* (2006.01)
(52) U.S. Cl. ........................ 438/637; 438/622; 438/618
(58) Field of Classification Search ...................... None
See application file for complete search history.

(56) References Cited

U.S. PATENT DOCUMENTS 5,734,607 A   3/1998   Sung et al.
6,160,297 A   12/2000  Shimizu et al.
6,411,548 B1   6/2002  Sakui et al.
6,440,843 B1 *  8/2002  Wada et al. ................. 438/635
6,444,570 B1 *  9/2002  Shibata ......................... 438/636

OTHER PUBLICATIONS

K. Ueno, et al. "A Quarter-Micron Planarized Interconnection Technology with Self-Aligned Plug," IEDM Tech. Dig., 1992, pp. 305-308.
K. Ueno, et al. "A Half-Micron Pitch Cu Interconnection Technology," VLSI Tech., Dig., 1995, pp. 27-28.
R.F. Schnabel, et al. "Slotted Vias for Dual Damascene Interconnects in 1Gb DRAMs," VLSI Tech. Dig., 1999, pp. 43-44.

* cited by examiner

*Primary Examiner*—Thao P. Le
(74) *Attorney, Agent, or Firm*—Oblon, Spivak, McClelland, Maier & Neustadt, P.C.

(57) ABSTRACT

A semiconductor device comprising element regions formed in a semiconductor substrate, conductor plugs embedded in an interlayer insulation film, and wiring layers connected to the plugs, wherein the plugs are arranged on a straight line orthogonal to a longitudinal direction of the wiring layer in the same pitch as the wiring layers such that the straight line and upper surfaces of the plugs are superposed each other, and when the plugs are viewed in a cross section parallel to a main surface of the substrate and a distance which is between those two edge points of each of the plugs where a split line which passes through a center of each of the plugs passes is defined as a contact diameter, the contact diameter has three or more maximum values and three or more minimum values while the split line is rotated in the cross section by 360 degrees.

6 Claims, 92 Drawing Sheets

Gate of peripheral transister

US 7,026,241 B2

SUPERCONDUCTOR DEVICE AND METHOD OF MANUFACTURING THE SAME

CROSS-REFERENCE TO RELATED APPLICATIONS

This application is a DIV of Ser. No. 10/318,257 file Dec. 13, 2002 now U.S. Pat. No. 6,943,453.

This application is also based upon and claims the benefit of priority from the prior Japanese Patent Application No. 2001-380656, filed Dec. 13, 2001, the entire contents of which are incorporated herein by reference.

BACKGROUND OF THE INVENTION

1. Field of the Invention

The present invention relates to a contact and a wiring layer of a semiconductor device, and more particularly, the invention relates to contacts arranged in the minimum process dimensions represented by data transfer line contacts of a NAND type EEPROM and a NOR type EEPROM.

2. Description of the Related Art

As a structural example of a conventional wiring contact in a semiconductor device, an example of the NAND type EEPROM is shown in FIGS. 68 to 71. FIG. 68 is a plan view of a cell array, and FIGS. 69, 70, and 71 are cross sectional views taken along the lines 69—69, 70—70, and 71—71 of FIG. 68, respectively. The cell array is formed in a P-type well of a silicon substrate 1. In element regions arranged in a stripe shape electrically separated by element separating insulation films 2, a NAND type cell unit is formed of a plurality of nonvolatile memory cells. The plurality of nonvolatile memory cells are connected in series in a form such that an n-type source/drain diffusion layer 3 is shared by the adjacent memory cells.

The memory cell has a structure in which a floating gate 4 and a control gate 5 are deposited each other. The control gate 5 is formed to be patterned as a word line WL that is a continuous layer in one direction as shown in FIG. 68. Selection transistors are formed at both ends of the NAND cell unit, and gate electrodes 6 thereof are formed to be continuous patterns used as control gate lines SSL and GSL parallel to the word line WL.

A drain side end of the NAND cell unit and the diffusion layer 3 of the source side end are connected to first wiring layers 12a and 12b via conductor plugs (contact plugs) 11a and 11b embedded in an interlayer insulation film 10a, respectively. A first wiring layer 12b at the source side is provided as a common source line SL running in parallel to the word line WL, as shown in FIG. 68. The first wiring layer 12a at the drain side is a lead-out wiring (a connecting wiring) to the bit line and is connected to a bit line (BL) 13 formed on an interlayer insulation film 10b formed thereon.

When attention is paid to the contact 11a at the bit line side, as shown in FIG. 68, the contact 11a are formed in a circular (or elliptical) shape, and are arranged in a direction (a direction along the line 70—70) orthogonal to the wiring layer 12a. The arrangement pitch of the contacts 11a in the direction along the line 70—70 depends on the widths of the element region and element separation region. For example, assuming that the minimum process dimension is F, when the element regions are formed with 2F pitch, the arrangement pitch of the contacts 11a is 2F as well. On the other hand, an interval between the contact 11a at the bit line side and the contact 11b at the common source line side, i.e., an interval in the bit line direction (a direction along the line 69—69) is 40F to 100F, for example.

The contacts 11a and 11b are embedded with polycrystalline silicon in which impurities such as phosphate is doped at a high concentration, and the first wiring layers 12a and 12b are embedded with a metal such as tungsten. The wiring layers 12a and 12b used here are provided as a connecting wiring to a bit line that is longer than 3F in the bit line direction. In the following discussion, a relationship between the wiring layer 12a and the contact 11a will be taken. More generally, a fine metal pattern in a long linear shape may be sufficient. The similar discussion applies to a relationship between the bit line and the contact when the contact 11b is directly connected to the bit line.

In order to ensure a lithography margin, in the case where the contact arrangement pitch is 2F, it is desirable that the diameter of the contact 11a in a circular shape is greater than F, and the wiring width is F. In this case, in a cross sectional view in a direction orthogonal to the wiring layer 12a, the wiring layer width is smaller than the diameter of the contact.

As miniaturization of an element advances, the following problems occur with the prior art of forming the above described contact in accordance with one-time lithography. When the contact is formed by optical lithography one time, of course, a circular or elliptical contact is formed because it is subject to restriction of a spatial frequency caused by a wavelength. A first problem is lowering of a contact lithography margin as shown in FIG. 72A. The circular or elliptical contact is easily short-circuited if a distance between adjacent contacts becomes smaller. Further, in the case of using optical lithography and a positive resist, optical exposure is partially carried out between the contacts. Thus, an exposure quantity increases at a portion at which an interval between the arranged contacts is small so that a pattern loss is likely to occur.

If the contact diameter is reduced in order to prevent this margin lowering, it becomes difficult to open a contact in accordance with lithography. This is because, in comparison with a line/space pattern, in a contact hole pattern, the exposure intensity is reduced so that the exposure sensitivity is lowered, thus making it difficult to open a fine contact while providing a sufficient focal depth and a sufficient exposure variation allowable width. In respect that the spatial frequency of the optical intensity in an arbitrary direction is equal to or smaller than a so called resolution limit, it is obvious that the minimum wiring width of the resolution limit cannot be obtained at the same time in two directions. Therefore, this. problem is caused by forming a contact in a circular or elliptical shape with two axis having the substantially the same diameter during lithography.

A second problem is lowering of an alignment margin between the contact 11a and the wiring layer 12a as shown in FIG. 72B. If an interval between the adjacent contacts becomes smaller, the wiring layer is easily short-circuited with the adjacent contact because of a misalignment relevant to the contact of the wiring layer. This problem is caused by separately forming the wiring layer and the contact during lithography.

In addition, conventionally, the contact is subjected to alignment to a ground layer of one layer configuration. For example, when the contacts 11a are aligned to the gate electrodes 5 and 6 (i.e., when direct alignment is carried out), the contacts 11a are indirectly aligned to element regions in a stripe shape orthogonal to the gate electrodes 5 and 6. Therefore, a misalignment between the contact and the element region increases by not less than √2-fold direct alignment, and a contact is formed in the element separation region because of a misalignment between the element region and the contact region. FIGS. 70 and 71 each show a scheme of such a misalignment. If the contacts 11a and 11b exceed an edge of the element separating insulation film 2 and reach a p-type well beneath the n-type diffusion layer 3, a breakdown voltage across the p-type well and the contact material is lowered.

On the other hand, in the case where the contact 11a is aligned to the element region, the gate electrodes 5 and 6 and the contact 11a are directly aligned with each other. Thus, it is required to ensure a great alignment margin in order to prevent a short-circuit between the contact 11a and the gate electrode 6 that is provided as the selection gate line SSL. This causes an increase in length of a memory cell array in the bit line direction and an increase in chip area.

As described above, there has been a problem that, in the conventional wiring contact of the semiconductor device, a lithography margin is reduced, and an alignment margin is reduced along with miniaturization of the contact.

BRIEF SUMMARY OF THE INVENTION

According to an aspect of the present invention, there is provided a semiconductor device comprising a semiconductor substrate; a plurality of element regions formed in the semiconductor substrate and defined by an element separation region; a plurality of conductor plugs which are embedded in an interlayer insulation film that covers the semiconductor substrate having the element regions formed therein, the plurality of conductor plugs being connected to the respective element regions or conductor layers connected to the respective element regions; and a plurality of wiring layers which are formed on the interlayer insulation film and connected to the respective conductor plugs, wherein the conductor plugs are arranged on a straight line orthogonal to a longitudinal direction of the wiring layer in the same pitch as the wiring layers in such a manner that the straight line and upper surfaces of the conductor plugs are superposed each other, and when the conductor plugs are viewed in a cross section parallel to a main surface of the semiconductor substrate and a distance which is between those two edge points of each of the conductor plugs where a split line which passes through a center of each of the conductor plugs passes is defined as a contact diameter, the contact diameter has three or more maximum values and three or more minimum values while the split line is rotated in the cross section by 360 degrees.

BRIEF DESCRIPTION OF THE SEVERAL VIEWS OF THE DRAWING

in FIG. 41 and corresponds to the cross sectional view of FIG. 42A;

FIG. 48B is a cross sectional view of the semiconductor device shown in FIG. 48A, which is taken along the line 48B—48B of FIG. 48A;

FIG. 48C is a cross sectional view of the semiconductor device shown in FIG. 48A, which is taken along the line 48C—48C of FIG. 48A;

FIG. 49 is a plan view showing a cell array according to a further embodiment of the present invention;

FIG. 50A is a cross sectional view of the cell array shown in FIG. 49, which is taken along the line 50—50 of FIG. 49;

FIG. 50B is a cross sectional view of a modification of the cell array shown in FIG. 49 and corresponds to the cross sectional view of FIG. 50A;

FIG. 51A is a cross sectional view of the cell array shown in FIG. 49, which is taken along the line 51—51 of FIG. 49;

FIG. 51B is a cross sectional view of a modification of the cell array shown in FIG. 49 and corresponds to the cross sectional view of FIG. 51A;

FIG. 52A is a cross sectional view of the cell array shown in FIG. 49, which is taken along the line 52—52 of FIG. 49;

FIG. 52B is a cross sectional view of a modification of the cell array shown in FIG. 49 and corresponds to the cross sectional view of FIG. 52A;

FIG. 53 is a cross sectional view of the semiconductor device array in a step of the manufacturing method, of forming a barrier insulation film according to the embodiment of the present invention;

FIG. 54 is a cross sectional view of the semiconductor device array in a step of the manufacturing method, of depositing an interlayer insulation film according to the embodiment of the present invention;

FIG. 55 is a cross sectional view of the semiconductor device array in a step of the manufacturing method, of flattening the interlayer insulation film according to the embodiment of the present invention;

Figure 1A:
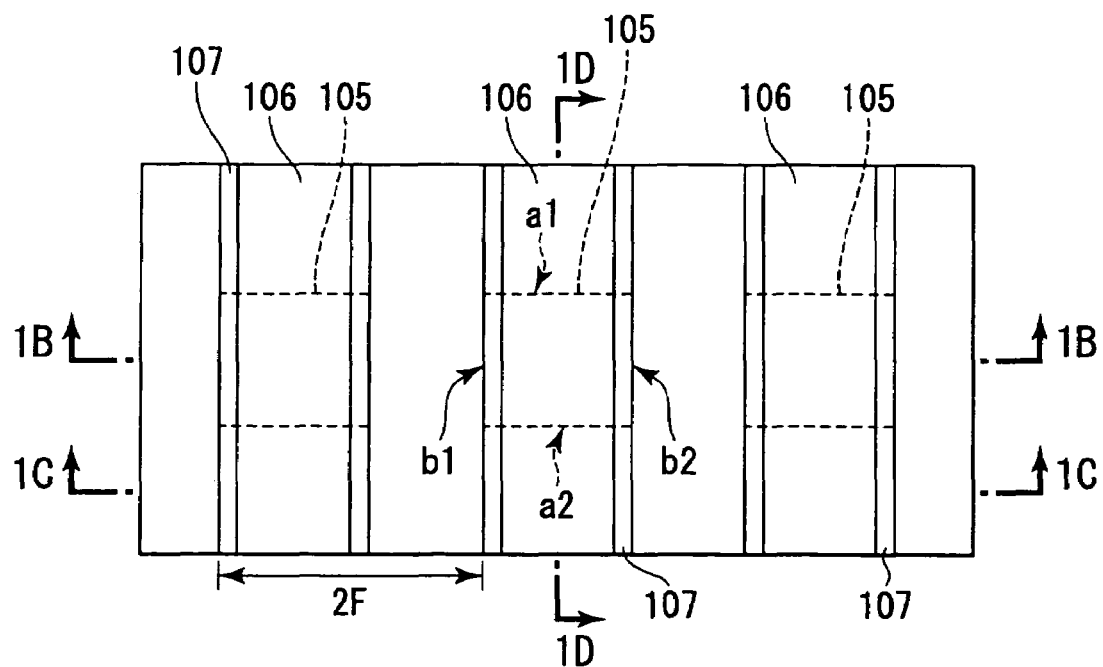
FIG. 1A is a plan view showing a wiring layer and a contact thereof of a semiconductor device according to an embodiment of the present invention.
Figure 4A:
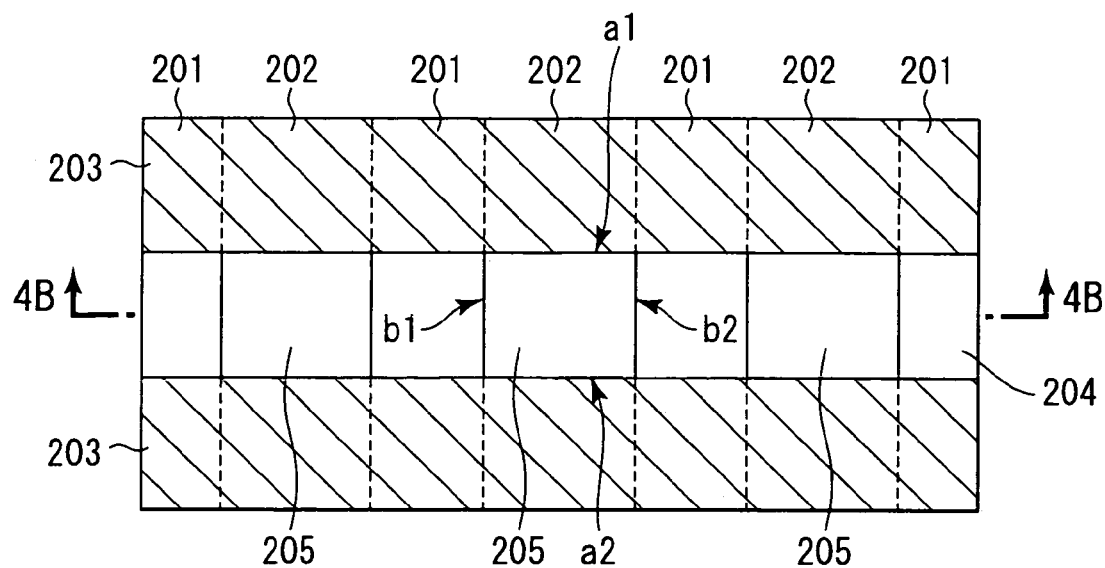
FIG. 4A is a plan view of the semiconductor device in a contact hole forming step of the manufacturing method of the present invention.
Figure 56:
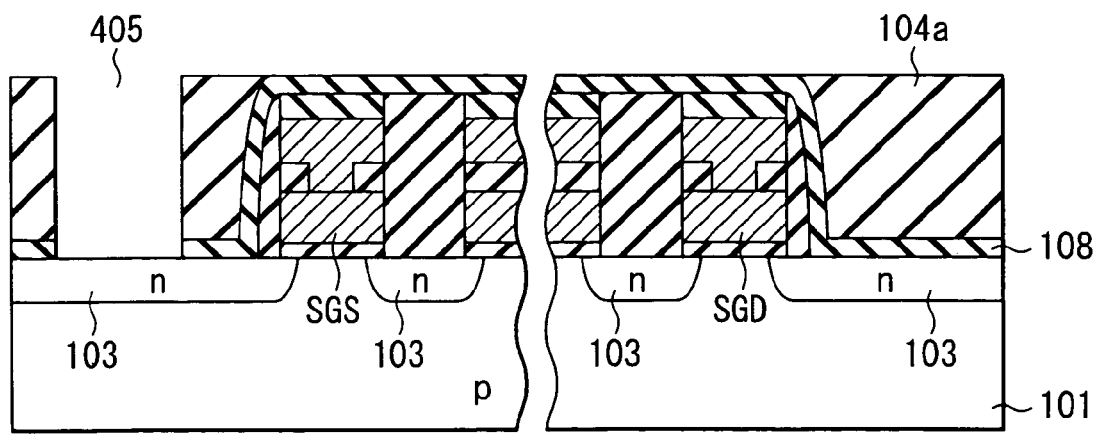
Figure 57:
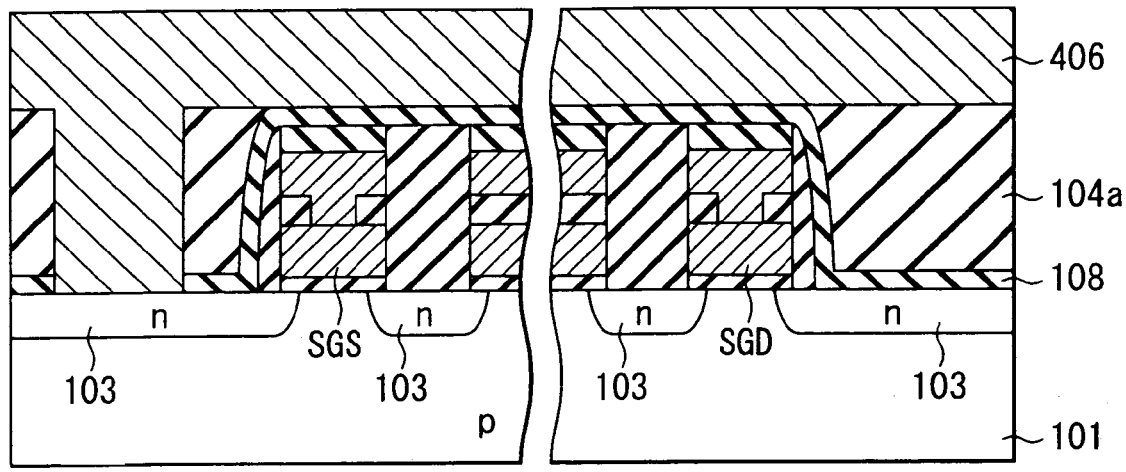
Figure 58:
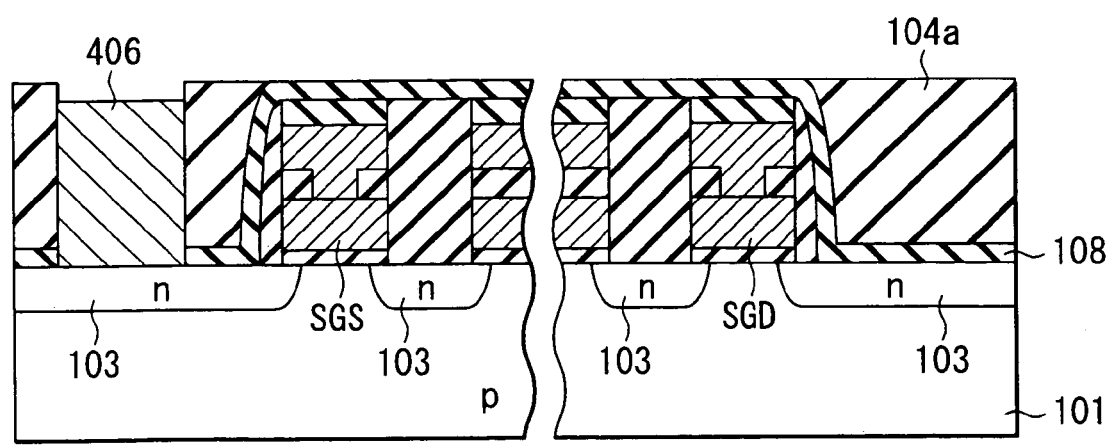
Figure 59:
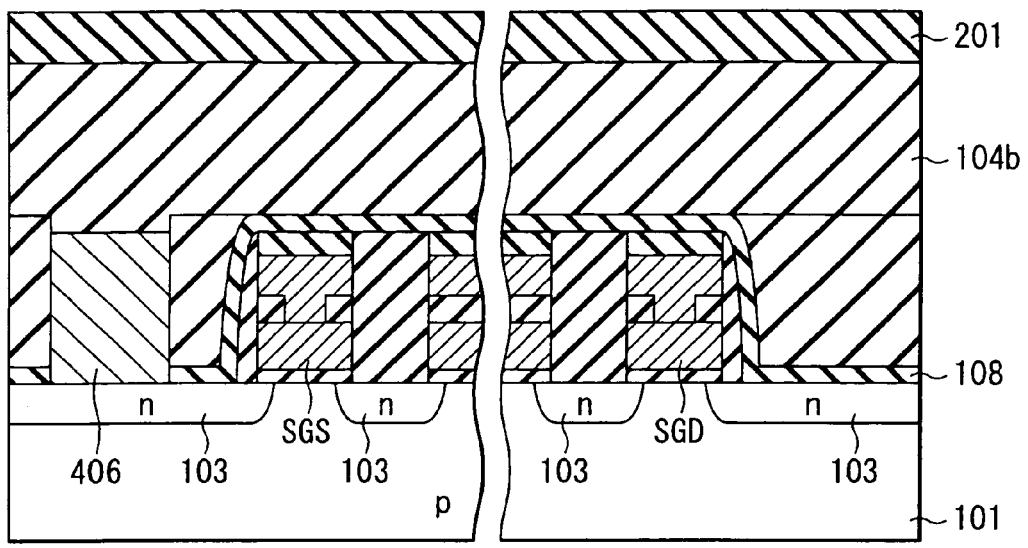
Figure 60A:
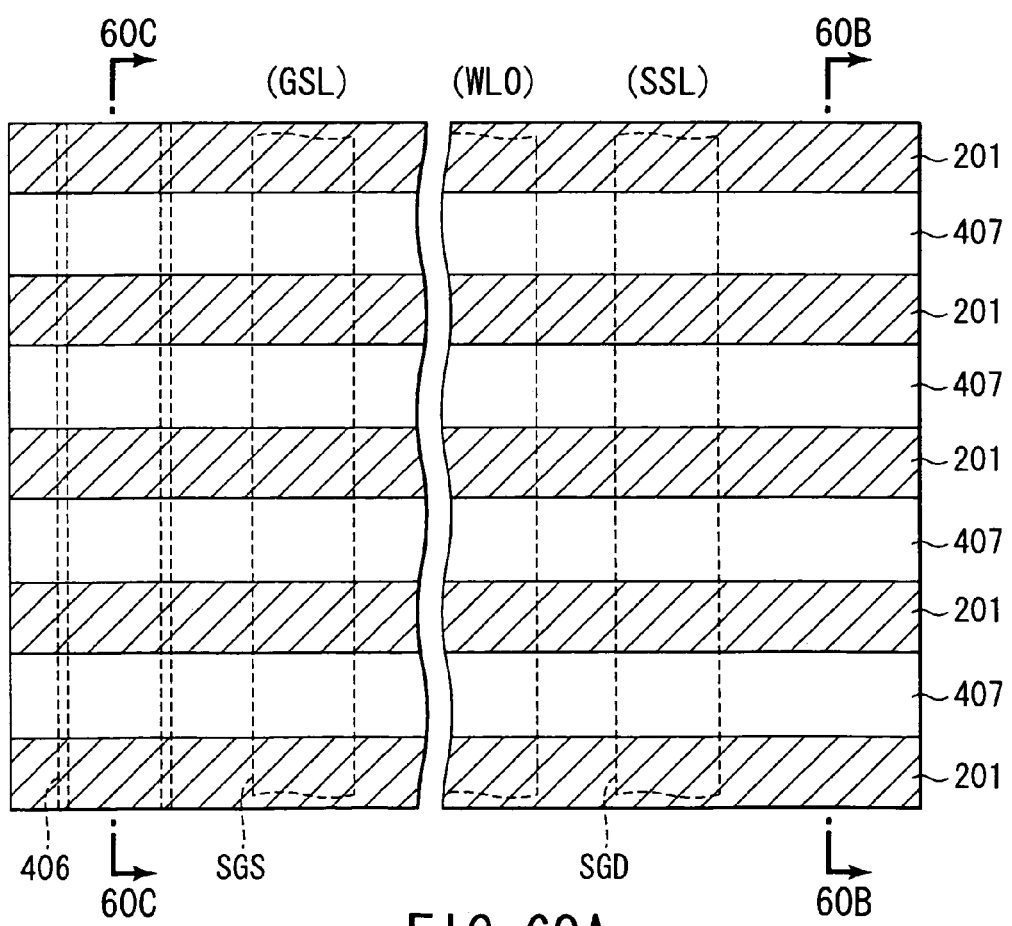
Figure 60B:
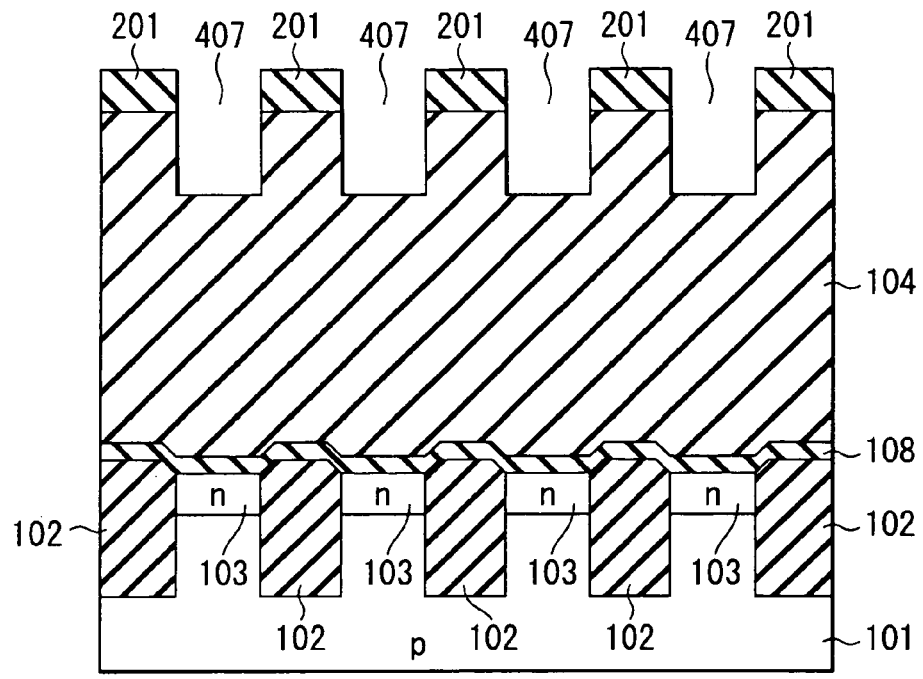
Figure 60C:
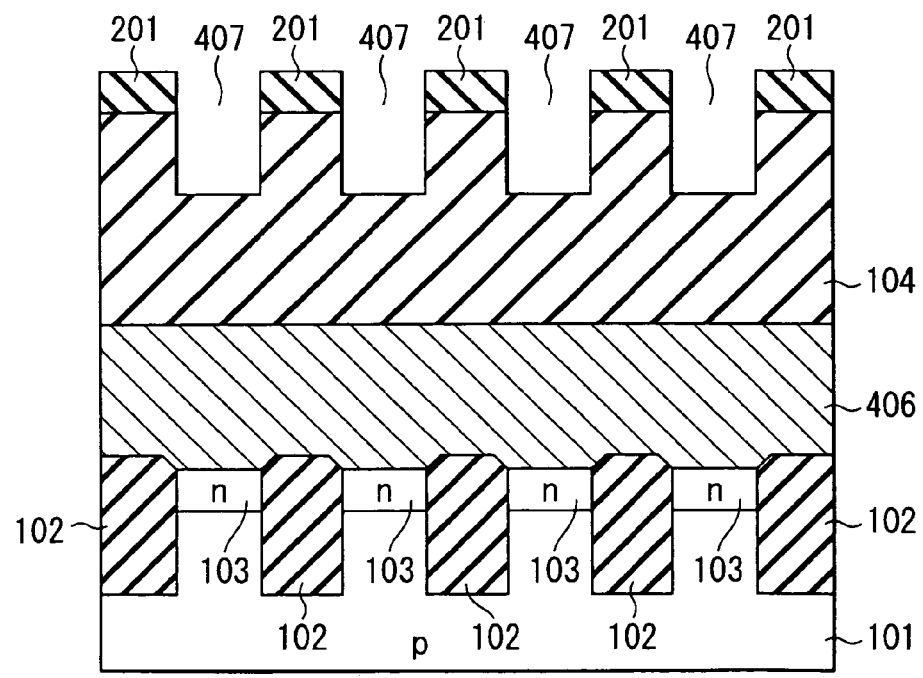
Figure 61A:
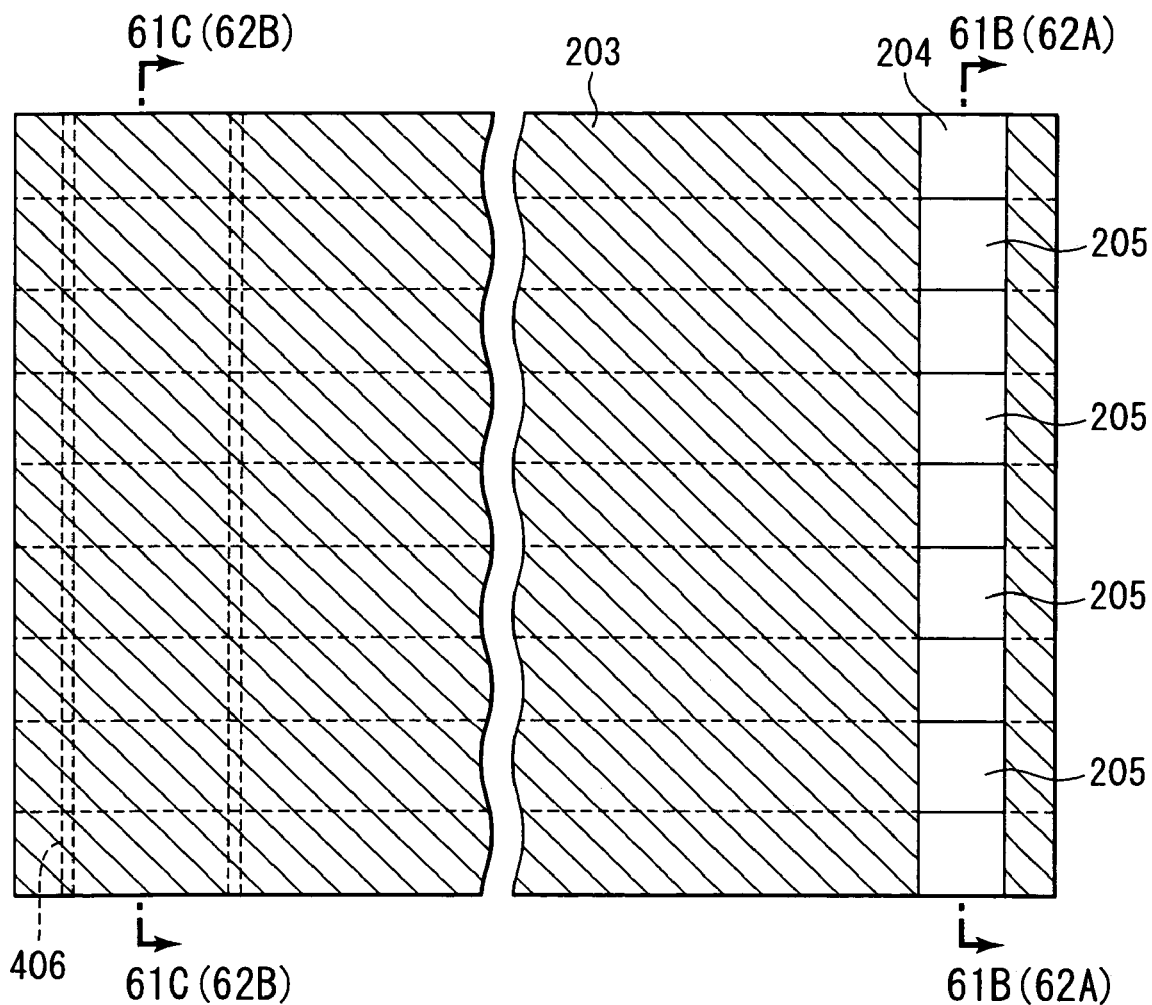
Figure 61B:
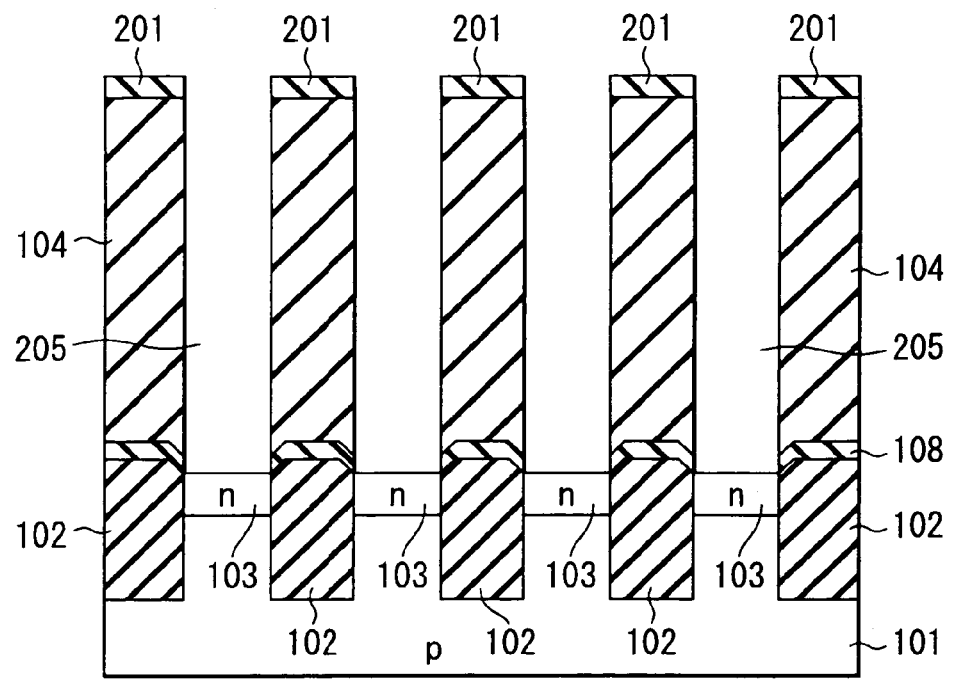
Figure 61C:
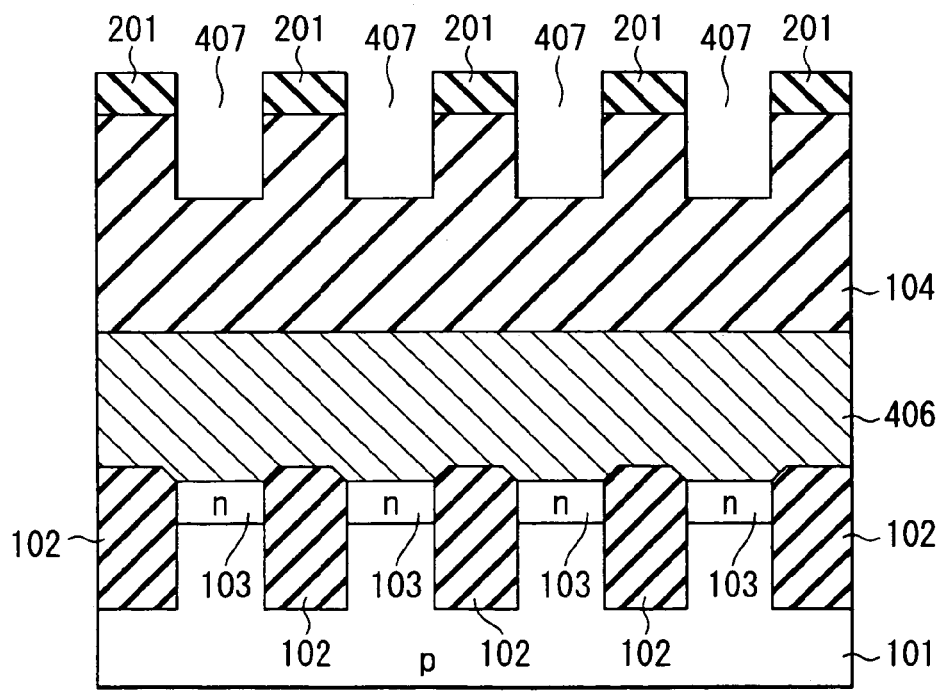
Figure 62A:
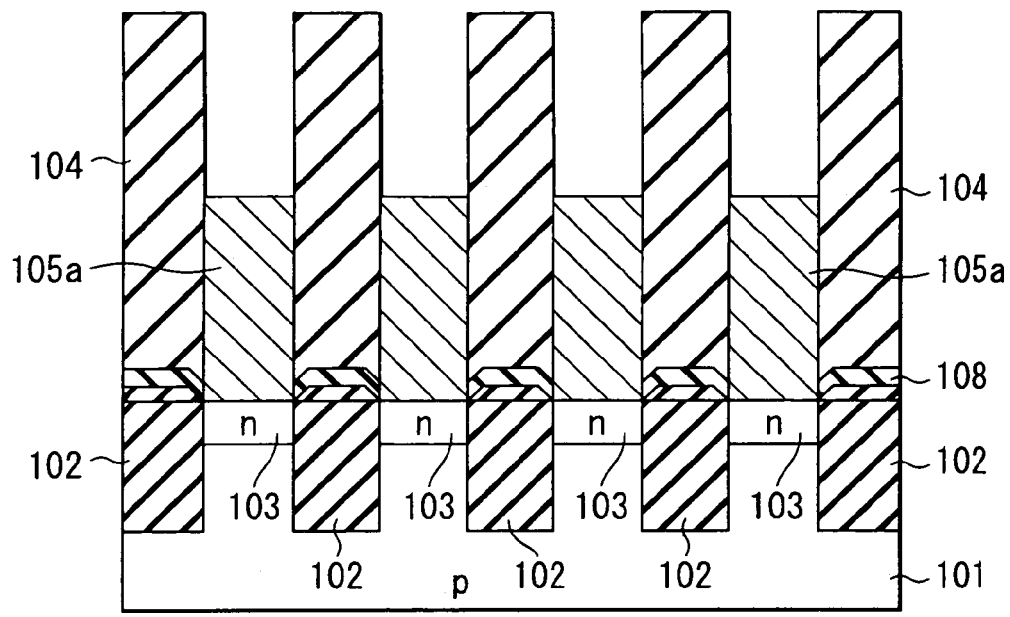
Figure 62B:
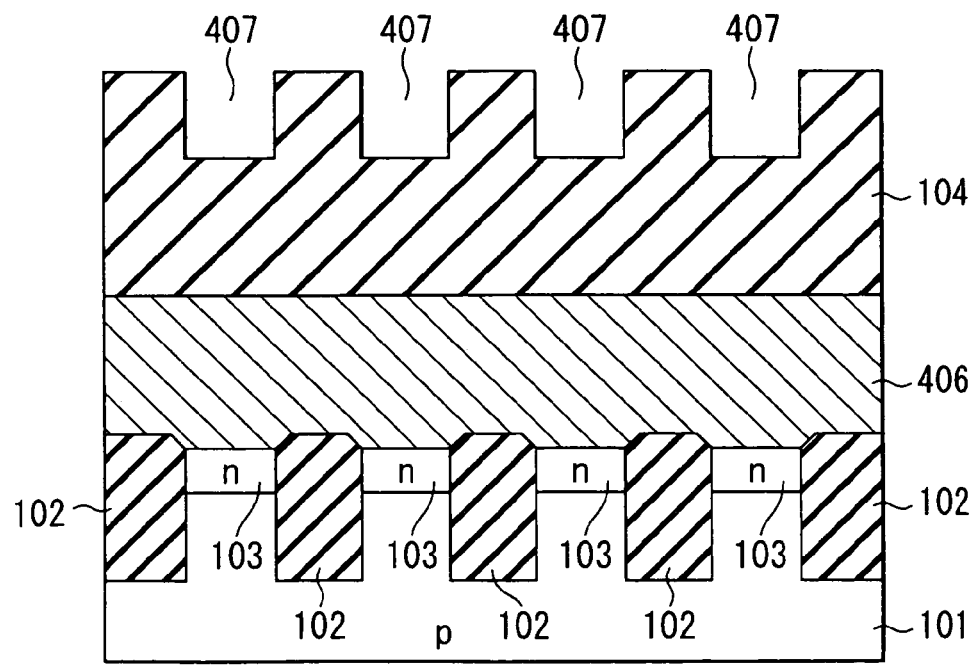
Figure 63:
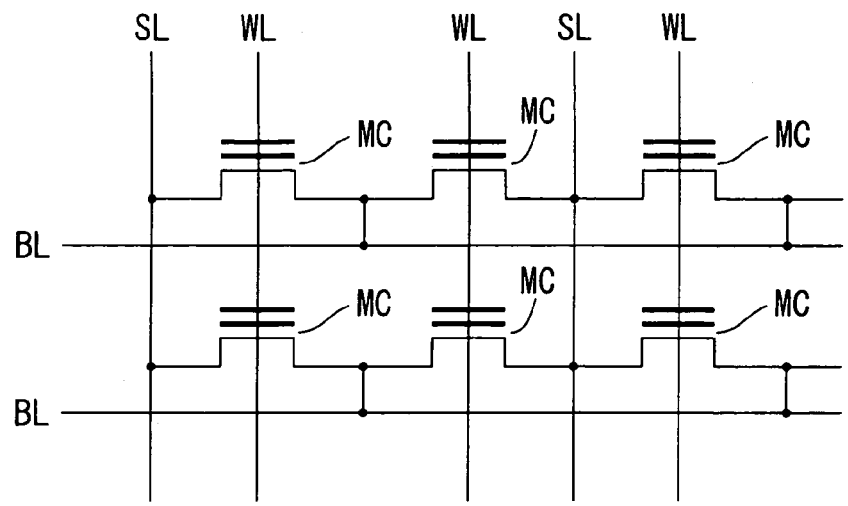
Figure 64:
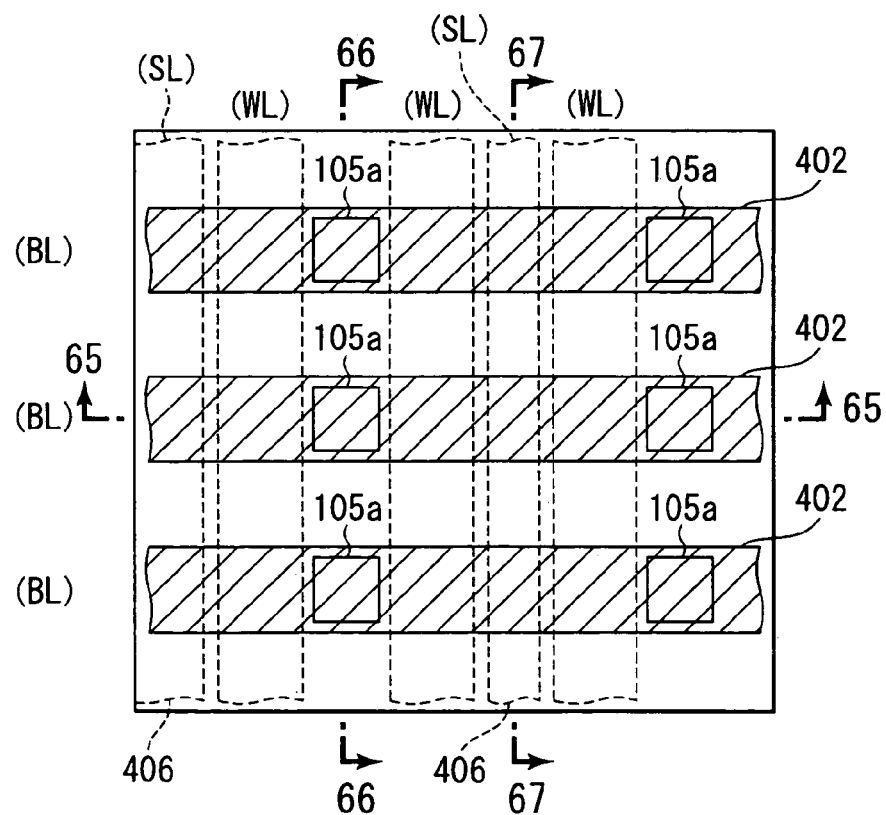
Figure 65A:
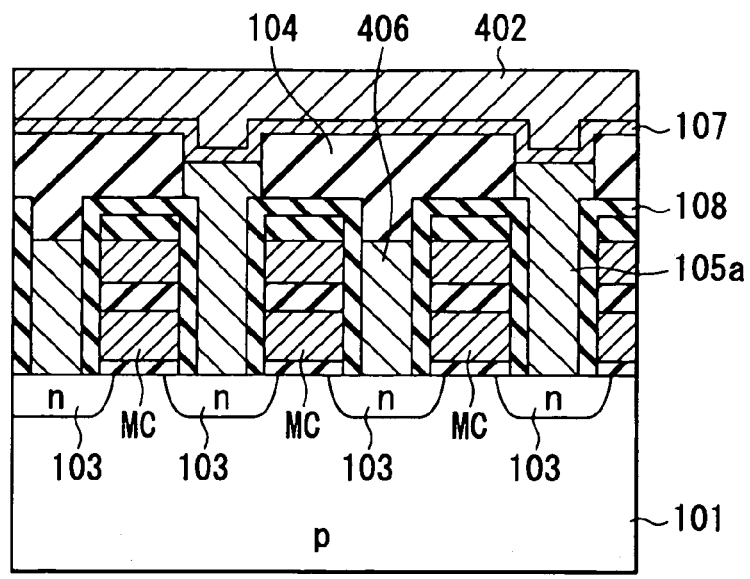
Figure 65B:
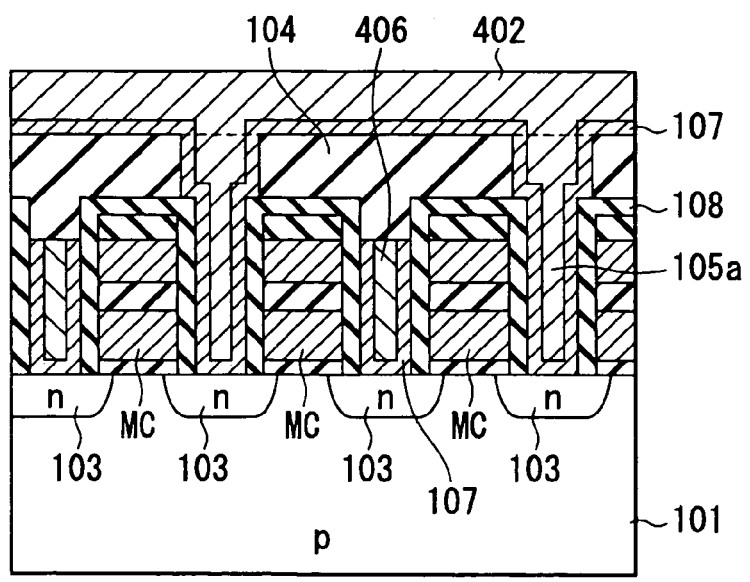
Figure 66A:
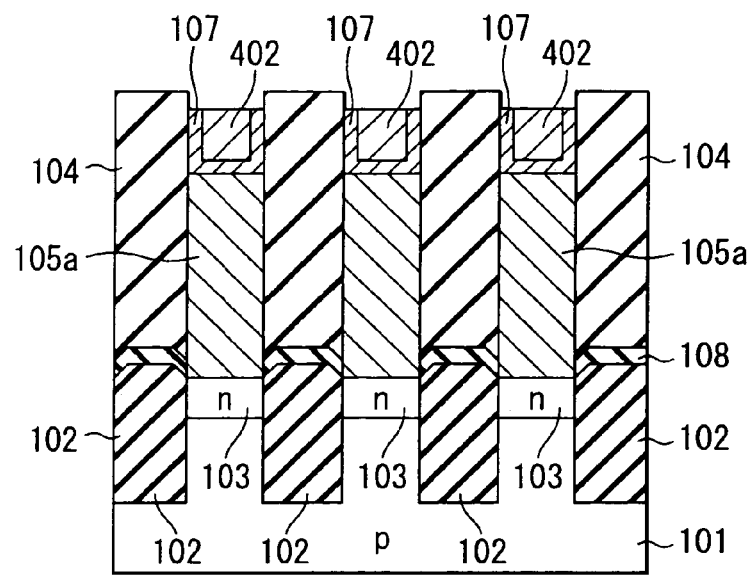
Figure 66B:
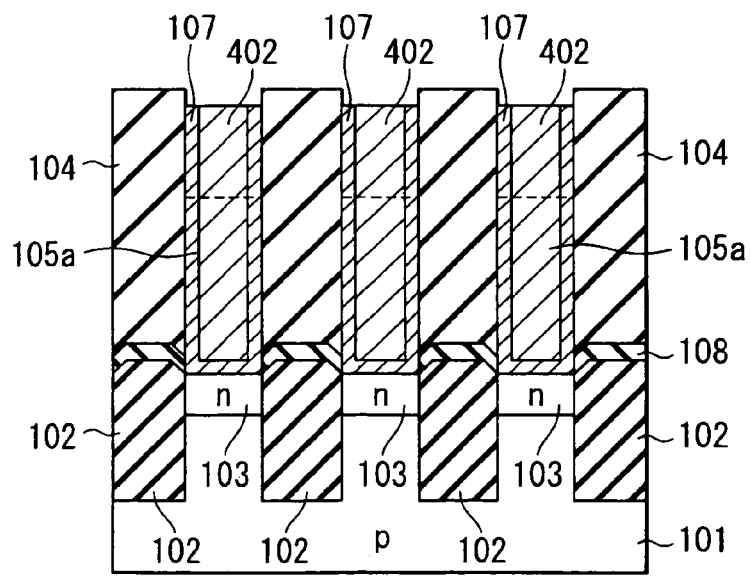
Figure 67A:
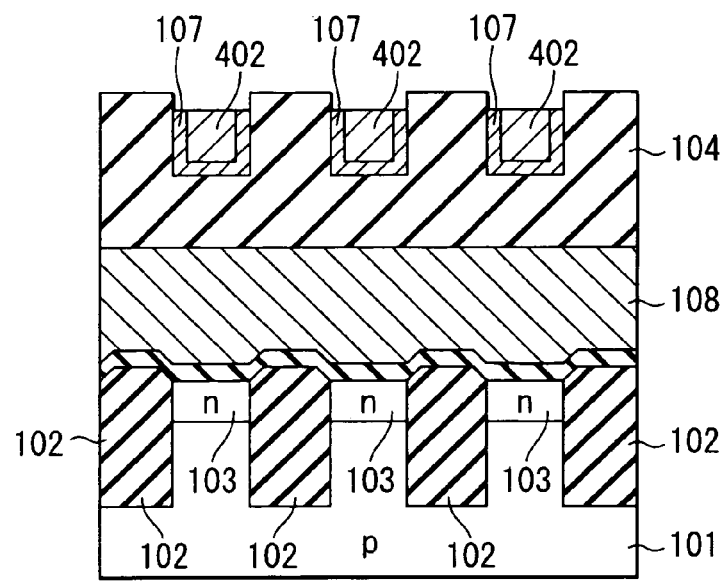
Figure 67B:
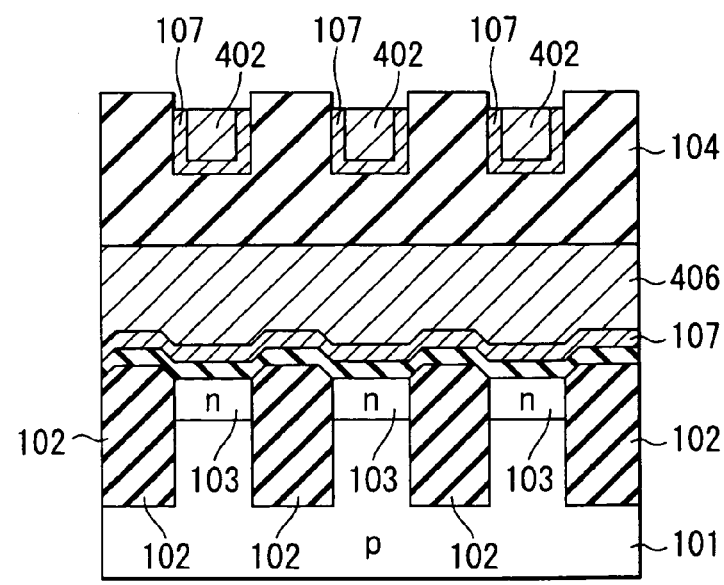
Figure 68:
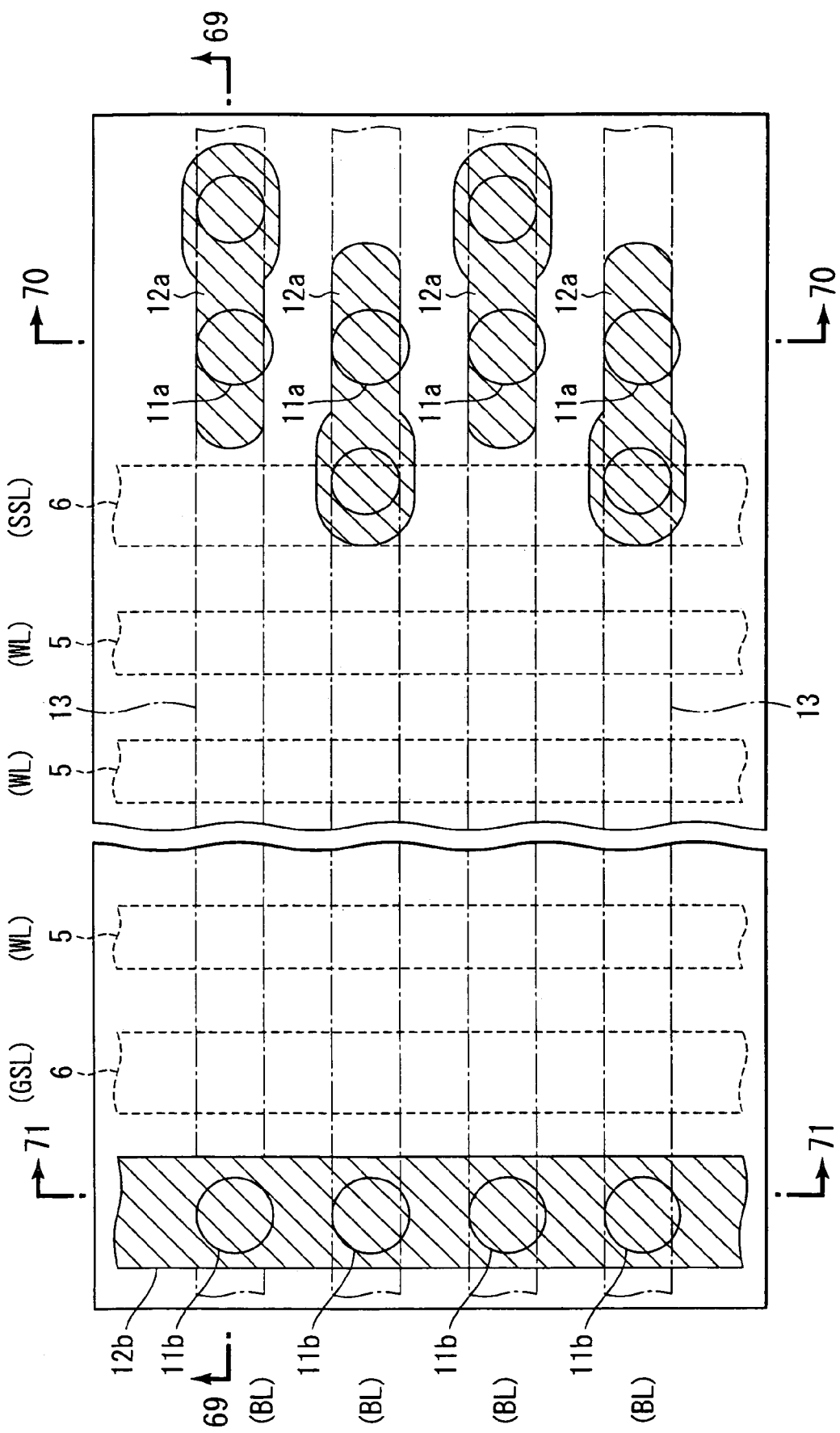
Figure 69:
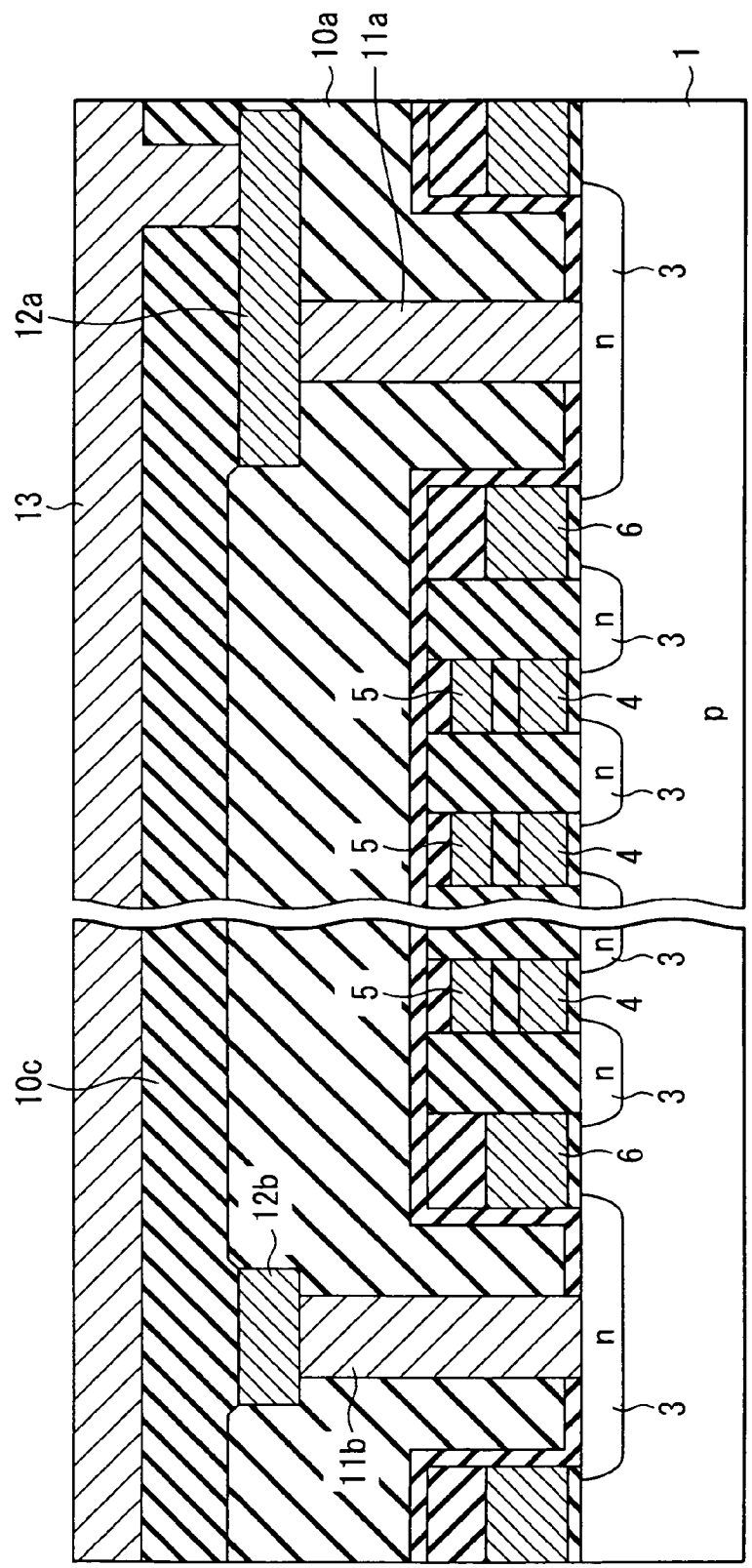
Figure 70:
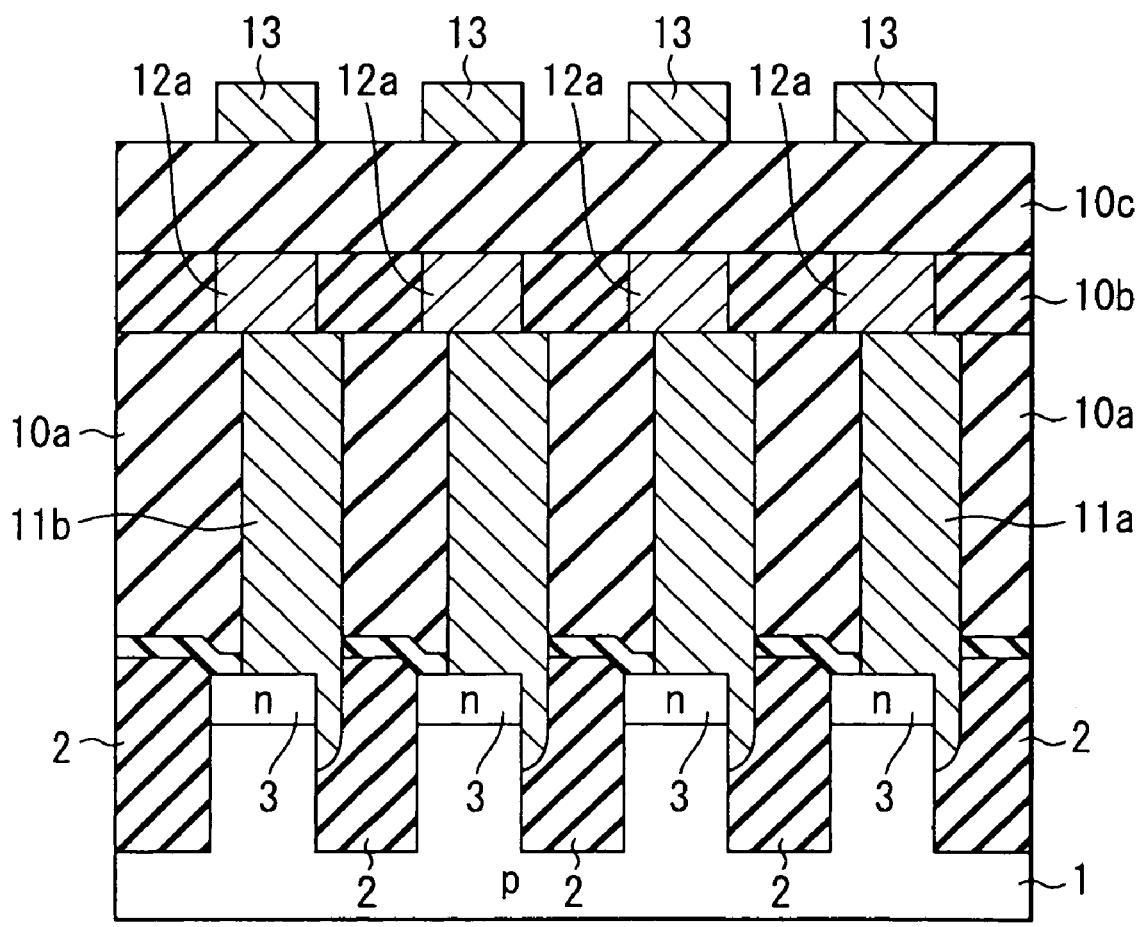
Figure 71:
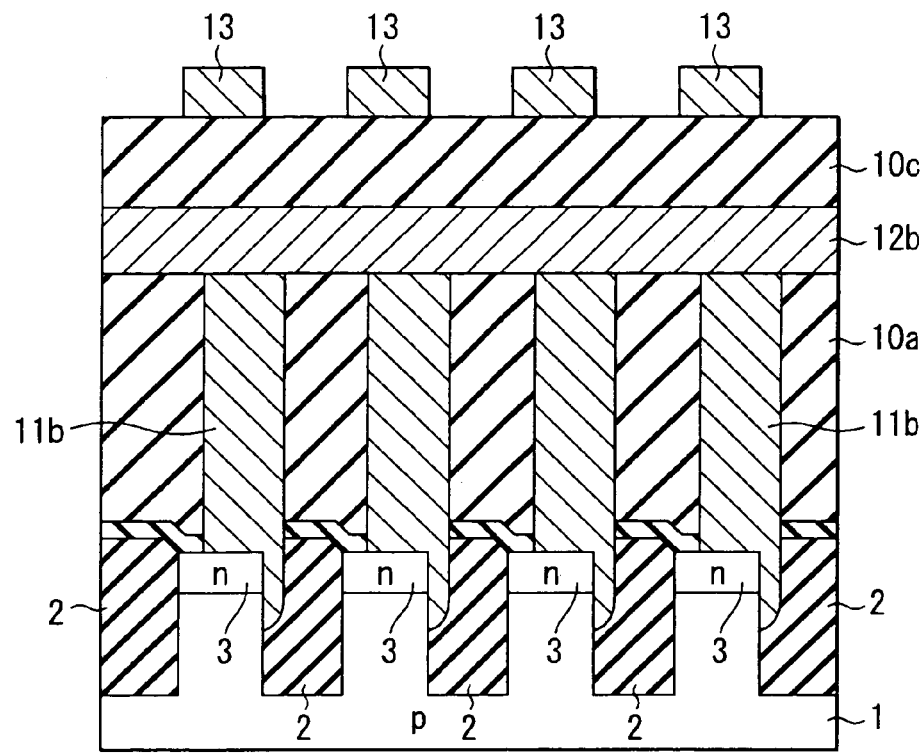
Figure 72A:
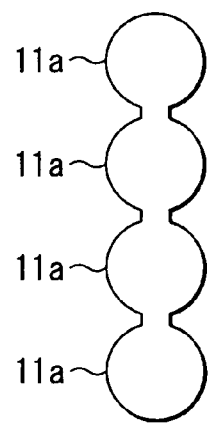
Figure 72B:
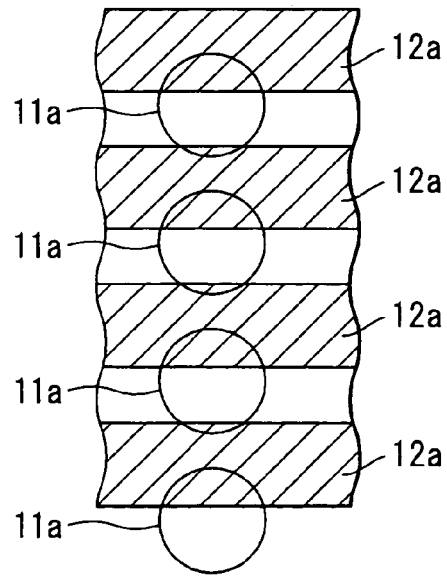
Figure 73A:
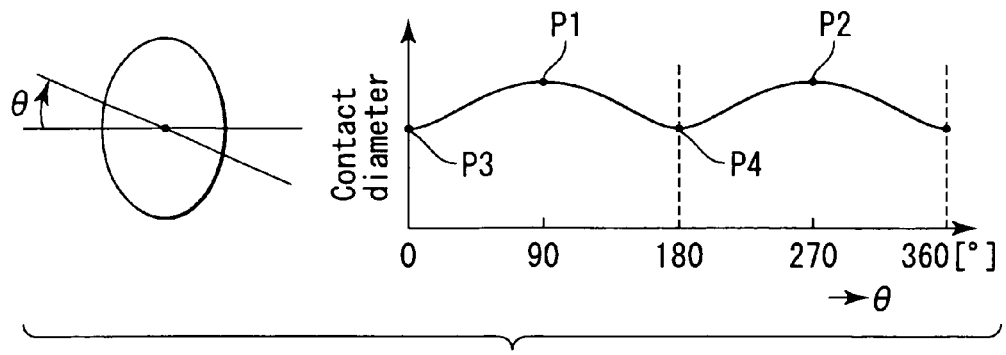
Figure 73B:
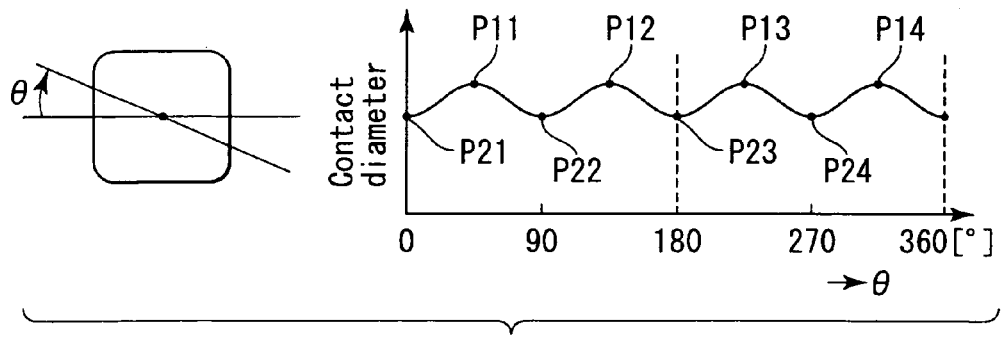
Figure 74A:
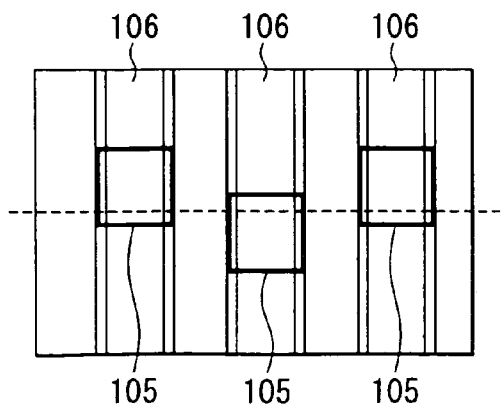
Figure 74B:
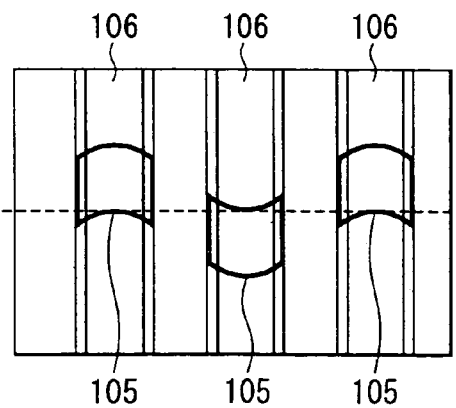
Figure 75A:
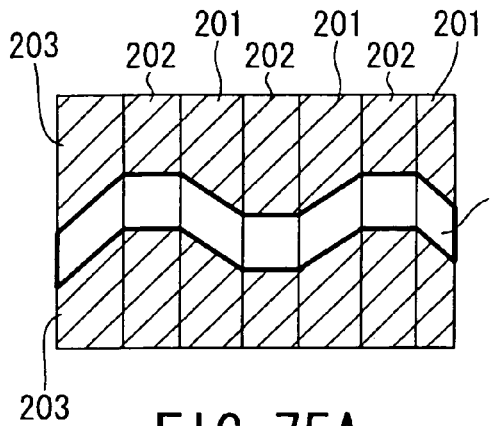
Figure 75B:
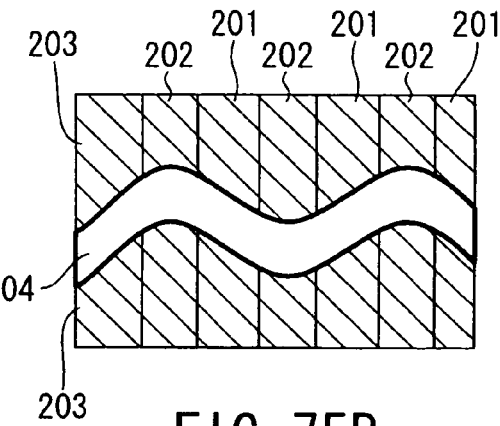
Figure 76:
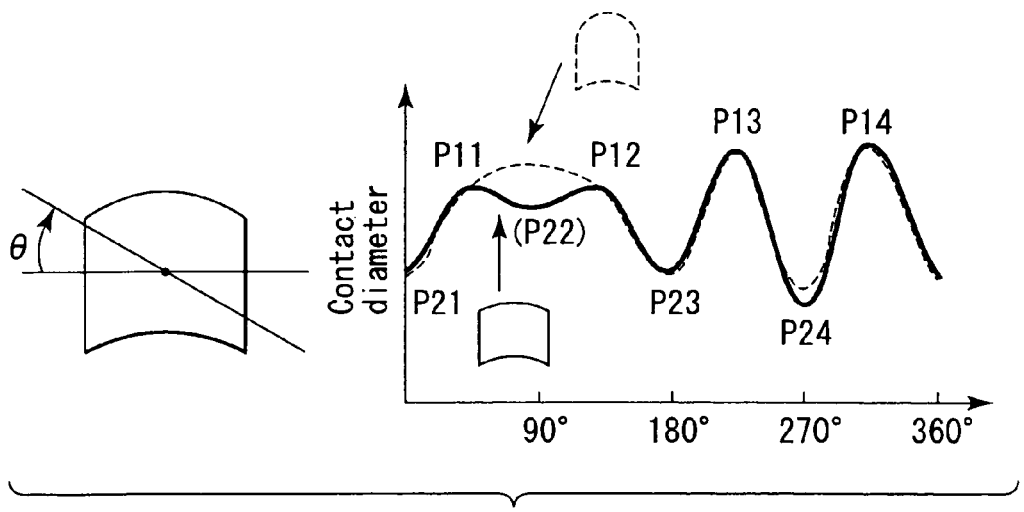
Figure 77:
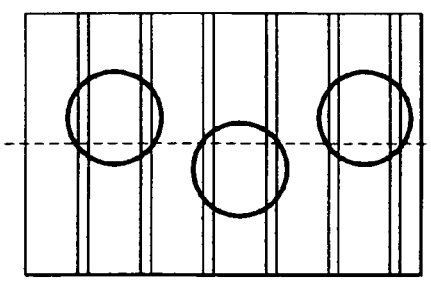

FIG. 56 is a cross sectional view of the semiconductor device array in a step of the manufacturing method, of forming a contact hole at a common source line side according to the embodiment of the present invention;

FIG. 57 is a cross sectional view of the semiconductor device array in a step of the manufacturing method, of depositing a common source line material film according to the embodiment of the present invention;

FIG. 58 is a cross sectional view of the semiconductor device array in a step of the manufacturing method, of embedding a common source line (local interconnect) according to the embodiment of the present invention;

FIG. 59 is a cross sectional view of the semiconductor device array in a step of the manufacturing method, of depositing a second interlayer insulation film according to the embodiment of the present invention;

FIG. 60A is a plan view of the semiconductor device array in a step of the manufacturing method, of forming a bit line wiring groove according to the embodiment of the present invention;

FIG. 60B is a cross sectional view of the semiconductor device, which is taken along the line 60B—60B of FIG. 60A;

FIG. 60C is a cross sectional view of the semiconductor device, which is taken along the line 60C—60C of FIG. 60A;

FIG. 61A is a plan view of the semiconductor device array in a step of the manufacturing method, of forming a bit line contact hole according to the embodiment of the present invention;

FIG. 61B is a cross sectional view of the semiconductor device, which is taken along the line 61B—61B of FIG. 61A;

FIG. 61C is a cross sectional view of the semiconductor device, which is taken along the line 61C—61C of FIG. 61A;

FIG. 62A is a cross sectional view of the semiconductor device array, which is taken along the line 62A—62A of FIG. 61A, in a step of the manufacturing method, of embedding a bit line contact according to the embodiment of the present invention;

FIG. 62B is a cross sectional view of the semiconductor device array, which is taken along the line 62B—62B of FIG. 61A, in the step of the manufacturing method, of embedding the bit line contact according to the embodiment of the present invention;

FIG. 63 is a diagram showing an equivalent circuit of a cell array according to a further embodiment of the present invention;

FIG. 64 is a plan view showing a cell array according to the embodiment of the present invention;

FIG. 65A is a cross sectional view of the cell array shown in FIG. 64, which is taken along the line 65—65 of FIG. 64;

FIG. 65B is a cross sectional view of a modification of the cell array shown in FIG. 64 and corresponds to the cross sectional view of FIG. 65A;

FIG. 66A is a cross sectional view of the cell array shown in FIG. 64, which is taken along the line 66—66 of FIG. 64;

FIG. 66B is a cross sectional view of a modification of the cell array shown in FIG. 64 and corresponds to the cross sectional view of FIG. 66A;

FIG. 67A is a cross sectional view of the cell array shown in FIG. 64, which is taken along the line 67—67 of FIG. 64;

FIG. 67B is a cross sectional view of a modification of the cell array shown in FIG. 64 and corresponds to the cross sectional view of FIG. 67A;

FIG. 68 is a plan view showing a conventional NAND type cell array;

FIG. 69 is a cross sectional view of the NAND type cell array shown in FIG. 68, which is taken along the line 69—69 of FIG. 68;

FIG. 70 is a cross sectional view of the NAND type cell array shown in FIG. 68, which is taken along the line 70—70 of FIG. 68;

FIG. 71 is a cross sectional view of the NAND type cell array shown in FIG. 68, which is taken along the line 71—71 of FIG. 68;

FIG. 72A is a plan view showing a contact for explaining a problem with a prior art;

FIG. 72B is a plan view showing a contact and a wiring layer for explaining a problem with a prior art;

FIG. 73A is a diagram for explaining the change of a contact diameter of an elliptical contact;

FIG. 73B is a diagram for explaining the change of a contact diameter of a rectangular contact;

FIG. 74A is a plan view showing a wiring layer and a contact of a semiconductor device according to a further embodiment of the present invention and corresponds to FIG. 1A;

FIG. 74B is a plan view showing a wiring layer and a contact of a semiconductor device according to a yet further embodiment of the present invention and corresponds to FIG. 1A;

FIG. 75A is a plan view showing a resist process of opening a contact hole of FIG. 74A and corresponds to FIG. 4A;

FIG. 75B is a plan view showing a resist process of opening a contact hole of FIG. 74B and corresponds to FIG. 4A;

FIG. 76 is a diagram for explaining the change of a contact diameter of the contacts shown in FIGS. 74B and 75B; and FIG. 77 is a plan view showing a circular contact according to a further embodiment of the present invention and corresponds to FIGS. 74A and 74B.

Figure 78A:
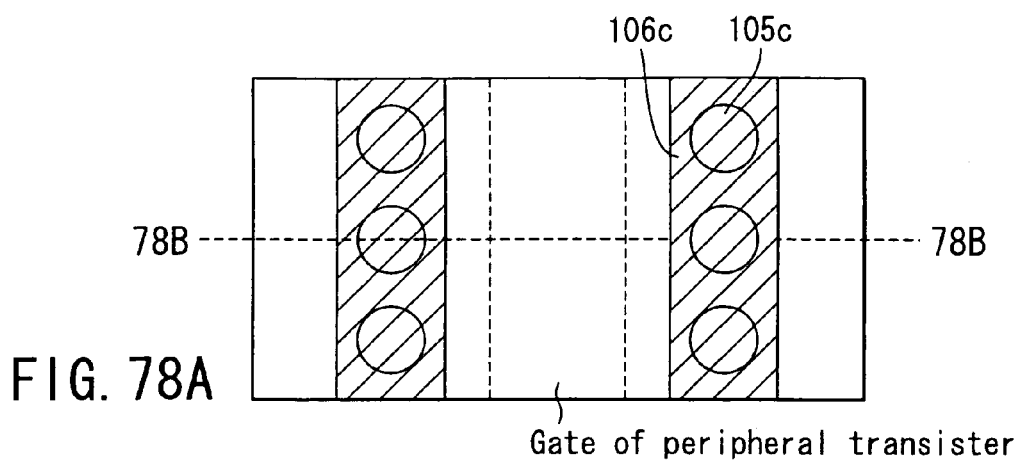

FIG. 78A is a plan view of an example of a peripheral circuit transistor.

Figure 78B:
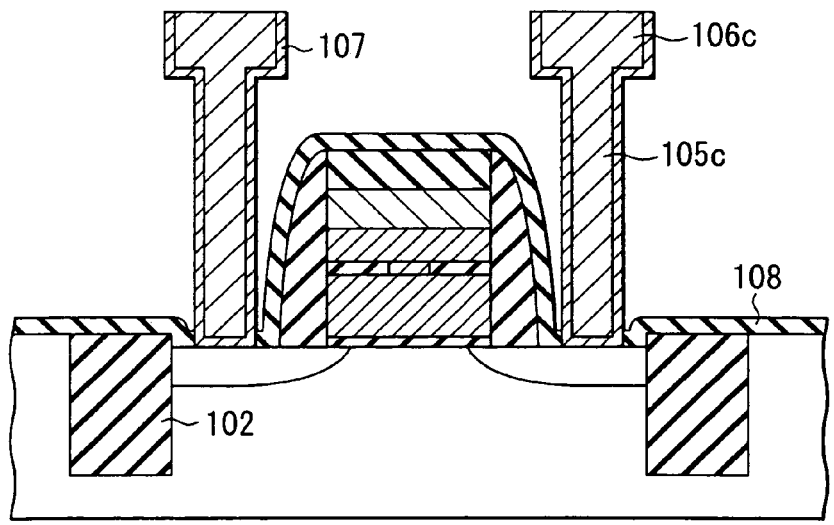

FIG. 78B is a cross sectional view of the peripheral circuit transistor shown in FIG. 78A.

Figure 78C:
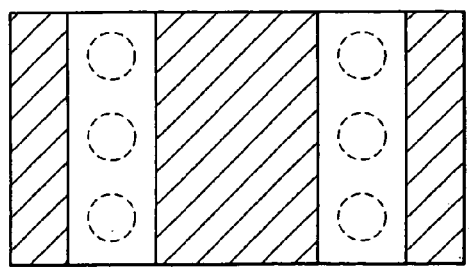

FIG. 78C shows a pattern of a wiring layer of the peripheral circuit transistor shown in FIG. 78A.

Figure 78D:
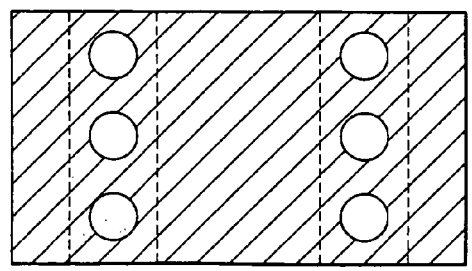

FIG. 78D shows a pattern of a contact of the peripheral circuit transistor shown in FIG. 78A.

Figure 79A:
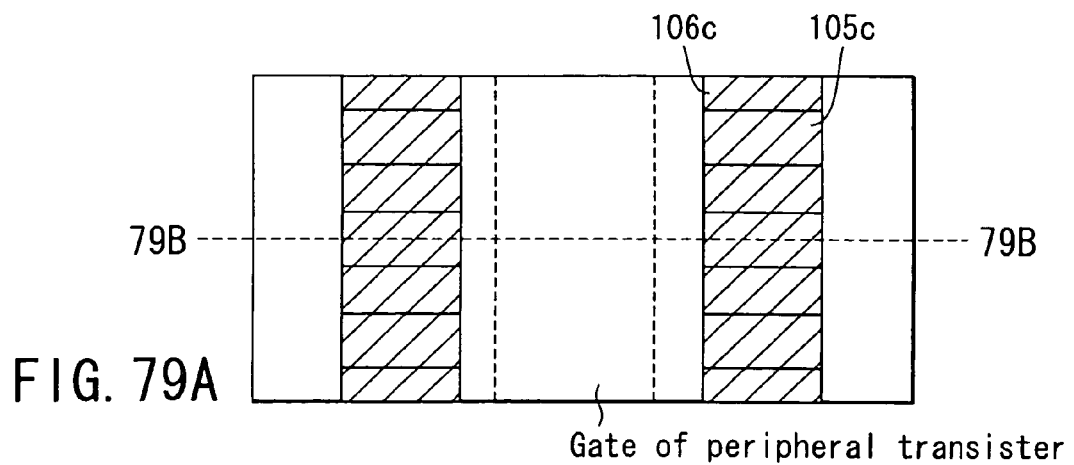

FIG. 79A is a plan view of another example of a peripheral circuit transistor.

Figure 79B:
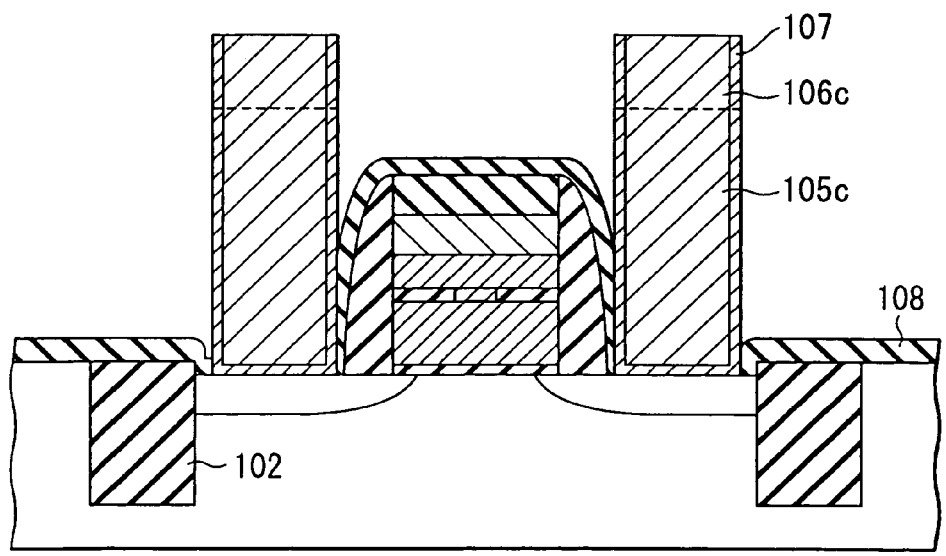

FIG. 79B is a cross sectional view of the peripheral circuit transistor shown in FIG. 79A.

Figure 79C:
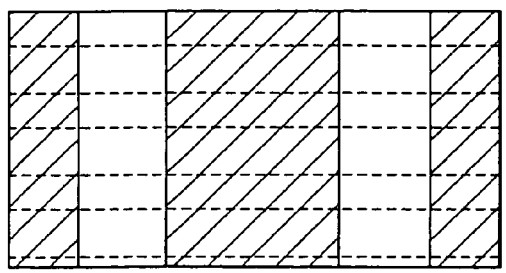

FIG. 79C shows a pattern of a wiring layer of the peripheral circuit transistor shown in FIG. 79A.

Figure 79D:
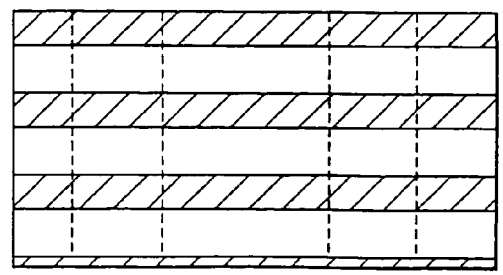

FIG. 79D shows a pattern of a contact of the peripheral circuit transistor shown in FIG. 79A.

Figure 80A:
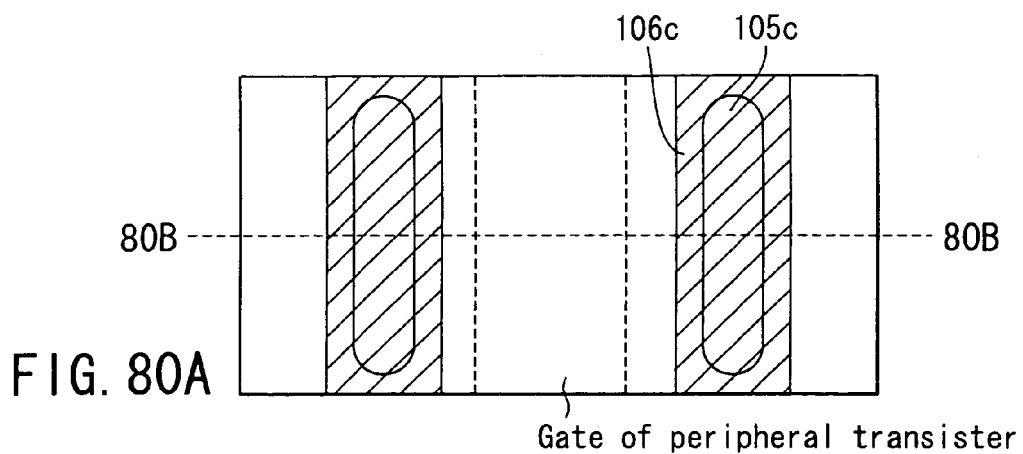

FIG. 80A is a plan view of a further example of a peripheral circuit transistor.

Figure 80B:
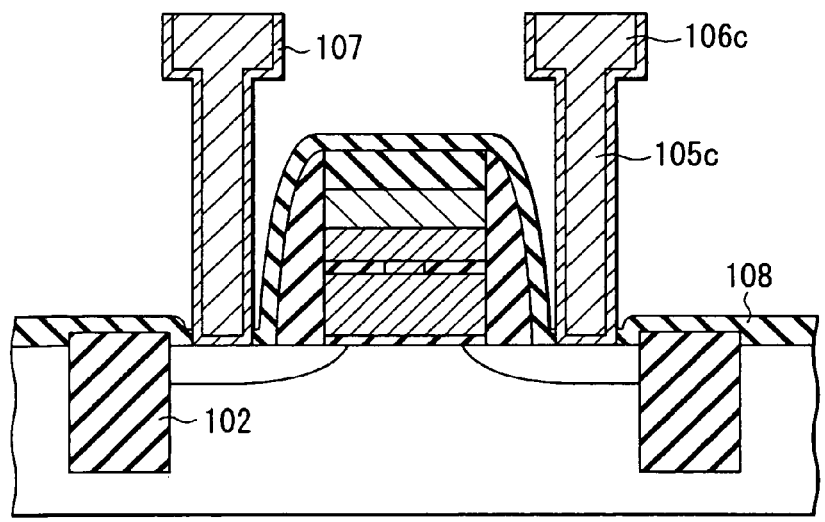

FIG. 80B is a cross sectional view of the peripheral circuit transistor shown in FIG. 80A.

Figure 80C:
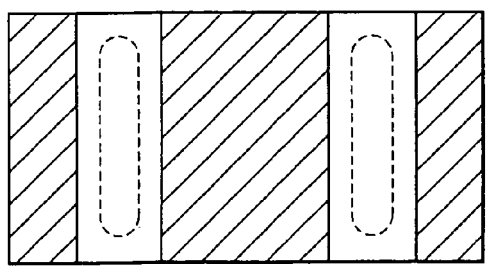

FIG. 80C shows a pattern of a wiring layer of the peripheral circuit transistor shown in FIG. 80A.

Figure 80D:
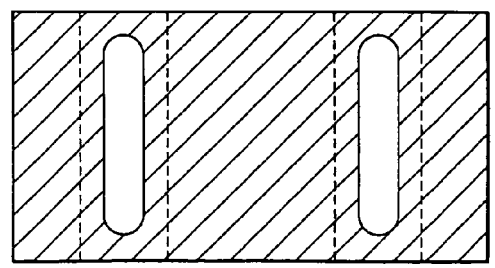

FIG. 80D shows a pattern of a contact of the peripheral circuit transistor shown in FIG. 80A.

Figure 81A:
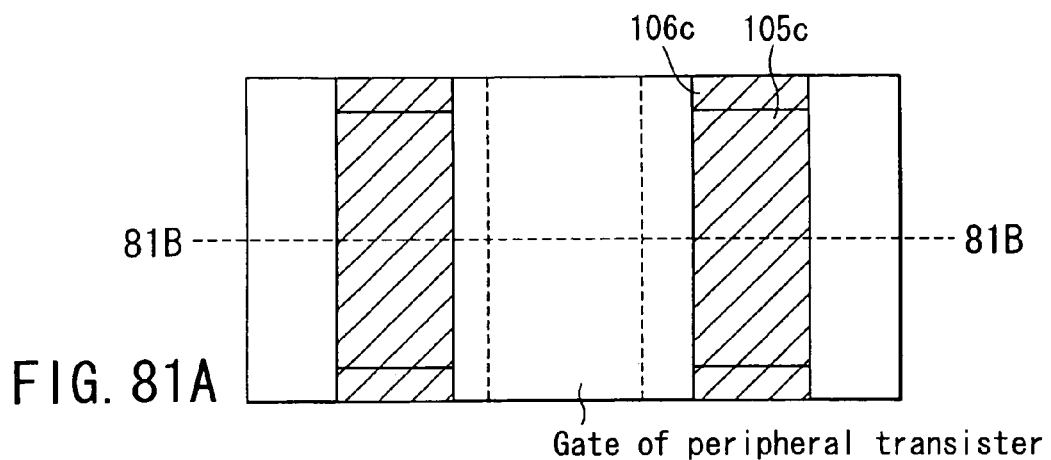

FIG. 81A is a plan view of a further example of a peripheral circuit transistor.

Figure 81B:
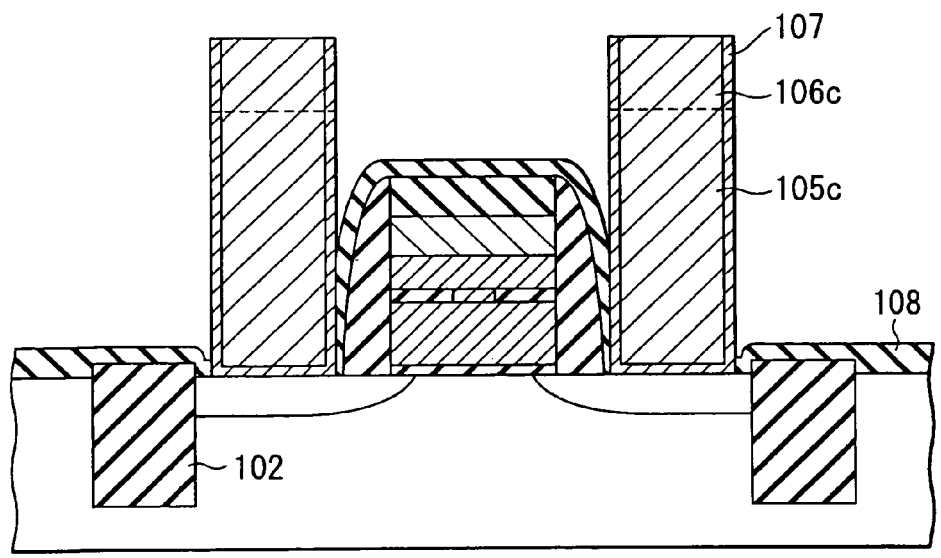

FIG. 81B is a cross sectional view of the peripheral circuit transistor shown in FIG. 80A.

Figure 81C:
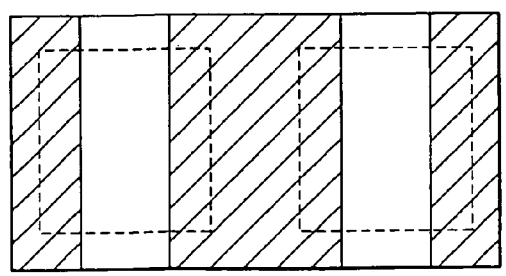

FIG. 81C shows a pattern of a wiring layer of the peripheral circuit transistor shown in FIG. 81A.

Figure 81D:
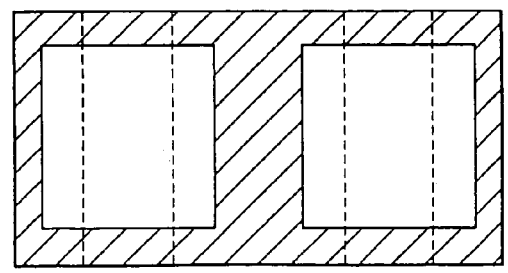

FIG. 81D shows a pattern of a contact of the peripheral circuit transistor shown in FIG. 81A.

DETAILED DESCRIPTION OF THE INVENTION

Hereinafter, preferred embodiments of the present invention will be described with reference to the accompanying drawings.

[First Embodiment]

Figure 1B:
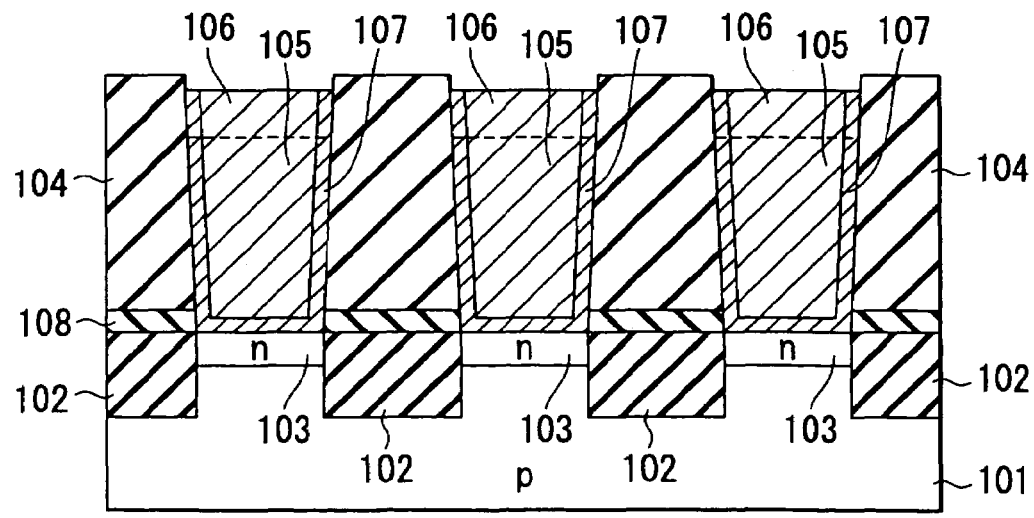
FIG. 1B is a cross sectional view of the semiconductor device shown in FIG. 1A, which is taken along the line 1B—1B of FIG. 1A.
Figure 1C:
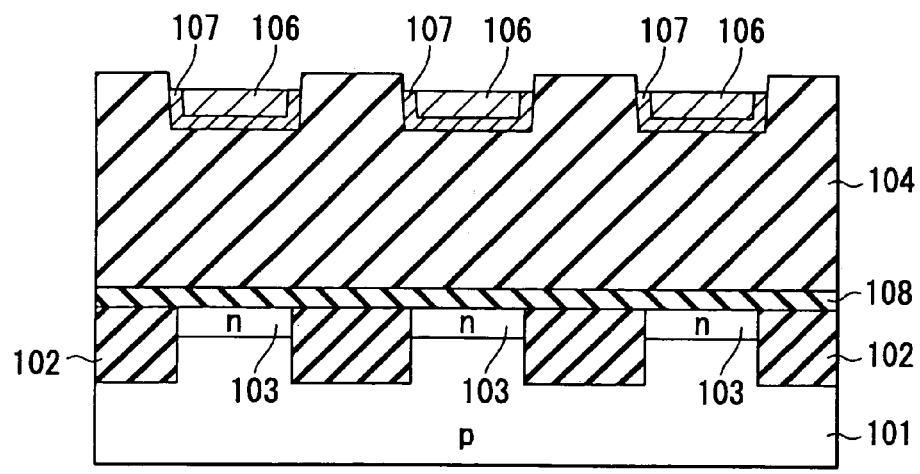
FIG. 1C is a cross sectional view of the semiconductor device shown in FIG. 1A, which is taken along the line 1C—1C of FIG. 1A.
Figure 1D:
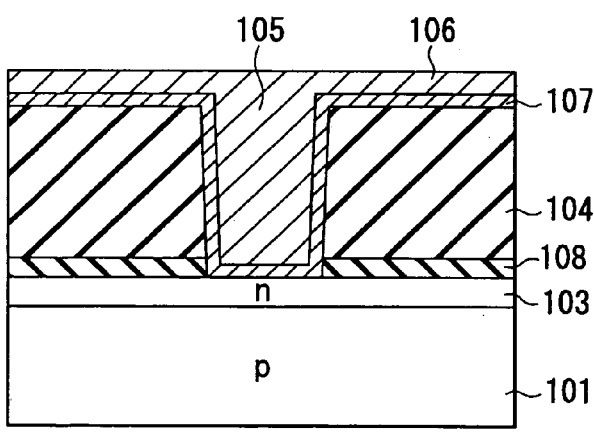
FIG. 1D is a cross sectional view of the semiconductor device shown in FIG. 1A, which is taken along the line 1D—1D of FIG. 1A.
Figure 1E:
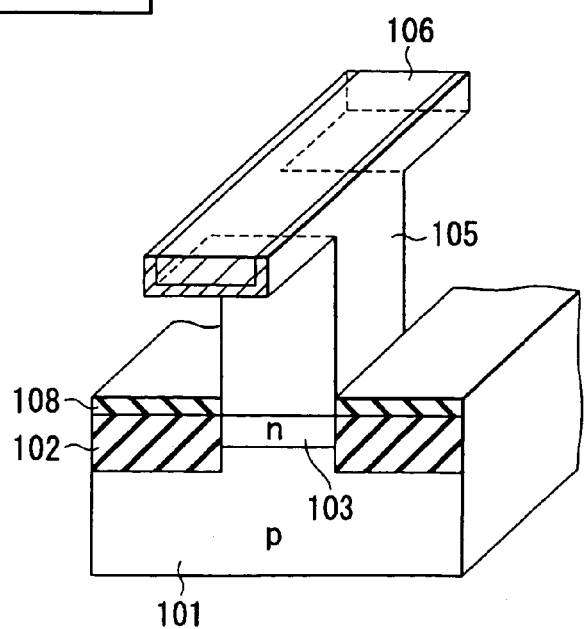
FIG. 1E is a perspective view showing the wiring layer and the contact thereof of the semiconductor device shown in FIG. 1A.

FIGS. 1A to 1D each show a structure of a wiring layer of a semiconductor device and a contact portion thereof according to one embodiment of the present invention. FIG. 1A is a plan view showing a region in which a plurality of wiring layers 106 parallel to each other are arranged. FIGS. 1B, 1C, and 1D are cross sectional views taken along the lines 1B—1B, 1C—1C, and 1D—1D, respectively. FIG. 1E is a perspective view showing one wiring layer 106 and a portion of a contact 105 (conductor plug) 105 integrated with the wiring layer 106 excluding a peripheral insulation film. In this embodiment, at least three wiring layers 106 are required. In the figures, a portion of the three wiring layers is shown.

A p-type well region of a silicon substrate 101 is defined in a predetermined pitch as a plurality of stripe shaped element regions by element separating insulation films 102. An n-type diffusion layer 103 that is a source, drain or the like is formed in each of the element regions. The wiring layer 106 connected to each n-type diffusion layer 103 and a contact plug (conductor plug) 105 integrated with the wiring layer 106 are formed to be embedded in an interlayer insulation film 104.

The stripe shaped element regions and element separation regions 102 are repeatedly arranged in a first direction in a predetermined pitch, and wiring layers 106 and contact plugs 105 are repeatedly arranged in the same direction as the first direction in the same pitch as the predetermined pitch. Further, a barrier insulation film 108 disposed on the element separation region is provided as an etching stopper when the contact plug 105 is formed. This makes it unnecessary to provide a mismatching margin of the contact plug and element separation region, and makes it possible to ensure high density of the element.

The contact plugs 105 each have a planar structure with a rectangular pattern having four sides a1, a2, b1, and b2 as shown in FIG. 1A, and are arranged in line in a direction orthogonal to the longitudinal direction of the wiring layer 106. With the minimum process dimension being F, assuming that the wiring layer 106 is formed as line/space=F/F on design, the contact plugs 105 are arranged in 2F pitch in a F×F rectangular pattern, for example. Of the four sides defining the contact plug 105, two sides b1 and b2 along the longitudinal direction of the wiring layer 106 are formed in a state in which no alignment shift with the width of the wiring width 106 exists. The other two sides a1 and a2 are formed on line among a plurality of contacts. Specifically, the contact plug 105 and wiring layer 106 are made of a metal material such as tungsten, aluminum, and copper, and are embedded in a contact hole and a wiring groove via a barrier metal 107 made of Ti, Ta, TaN, or TiN.

In this embodiment, a resist pattern according to lithography for processing a contact hole is formed as a linear (band shaped) opening that is at least three times longer than a contact width (F shown in an example of the figure) in a direction along the line 1B—1B of FIG. 1A, rather than a conventional circular or elliptical window, as specifically described later. The "three times" used here derives from contacts of at least three wiring layers as illustrated. In the case of more wirings and contacts thereof, a rectangular linear opening is provided in the arrangement direction of the wirings.

By using such a resist pattern, a problem that a lithography margin is reduced due to miniaturization in distance between the contacts is reduced. In the case of a conventional circular contact formed by a one-time lithography, it has been impossible to use a resist pattern having such a linear window because of a restriction on a short-circuit between adjacent contacts.

In the present embodiment, the contact plug 105 and wiring layer 106 are integrally formed so as to prevent a misalignment of two sides b1 and b2 facing each other between the adjacent contacts, of the four sides defining the contact 105 with the width of the wiring layer 106. In this way, the conventional problem with a misalignment between the contact plug and the wiring layer can be solved.

A manufacturing method for achieving a structure according to the present embodiment will be described with reference to FIGS. 2A and 2B through FIGS. 5A and 5B. FIGS. 2A, 3A, 4A and 5A are plan views corresponding to FIG. 1A, and FIGS. 2B, 3B, 4B and 5B are cross sectional views corresponding to FIG. 1B, which is taken along the line 1B—1B of FIG. 1A. Here, the wiring contact is shown as being connected to a diffusion wiring formed on a semiconductor substrate. However, more generally, a conductor region is used as the ground layer which the contact is connected to. In addition to the diffusion layer, a metal wiring layer is used as a ground layer to which the contact is connected.

Figure 2A:
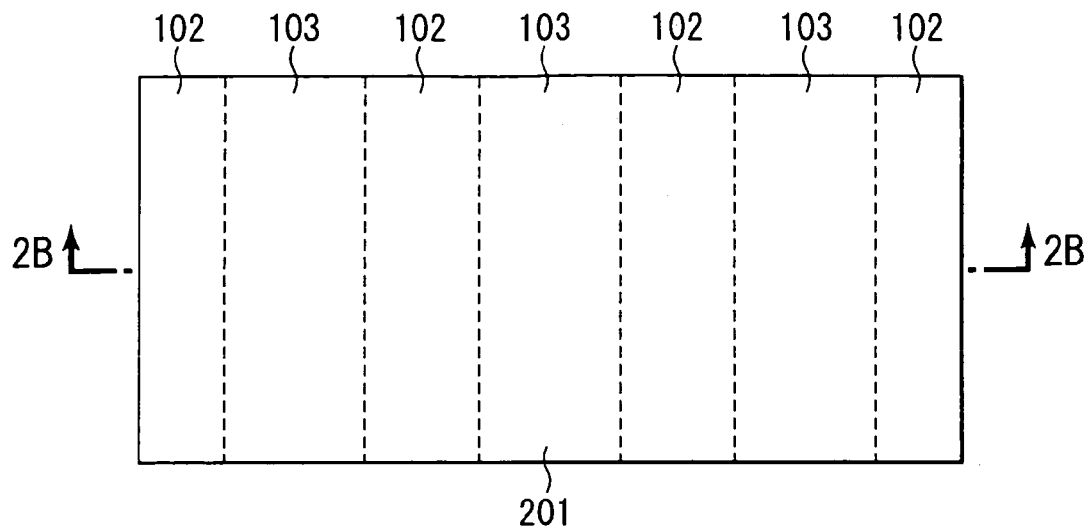
FIG. 2A is a plan view of a semiconductor device in an interlayer insulation film forming step of a manufacturing method for the semiconductor device, according to the embodiment shown in FIGS. 1A–1E.
Figure 2B:
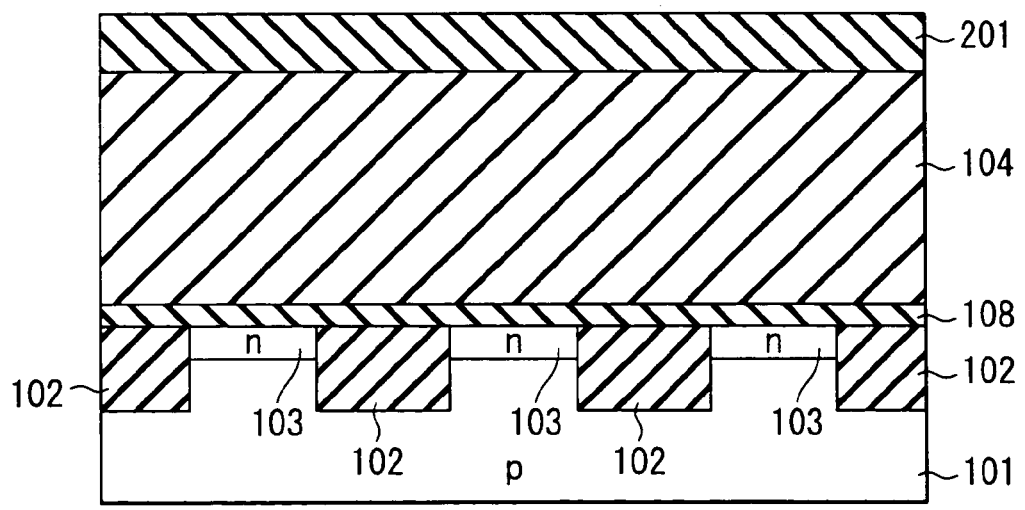
FIG. 2B is a cross sectional view of the semiconductor device shown in FIG. 2A, which is taken along the line 2B—2B of FIG. 2A.

As shown in FIGS. 2A and 2B, the p-type well region of a silicon substrate 101 is defined, with an STI technique, in stripe shaped element regions by the element separating insulation films 102 made of a silicon oxide film of 0.05 micron to 0.5 micron in depth, and an n-type diffusion layer 103 is formed in each of the element regions. The conductor type of each section is provided as a mere example. The element separation regions are formed in a direction along the line 2B—2B in the same pitch as the contact formed later (for example, 2F pitch), and the element region/element separation region is defined as F/F.

On a substrate having the diffusion layers 103 formed thereon, an interlayer insulation film 104 is formed via a barrier insulation film 108. The barrier insulation film 108 is an etching stopper layer for preventing a contact hole from being formed to extend into the element separation region because of an unsatisfactory etching controllability when the contact hole is formed and a breakdown voltage failure from occurring between the p-type well and the contact. This barrier insulation film is a silicon nitride film, a silicon acid nitride film, or an oxide aluminum film. Before depositing the barrier insulation film 108, a silicon oxide film may be prepared as a buffer insulation film in the range of 1 nm to 50 nm in accordance with a substrate oxidization or deposition method. The interlayer insulation film 104 is a silicon oxide film, a silicate glass such as BPSG or PSG, HSQ, SiLk or the like. The film thickness is about 10 nm to 1000 nm. A barrier insulation film 201 such as a silicon nitride film, a silicon acid nitride film, or an oxide aluminum film is further deposited on the interlayer insulation film 104.

The upper barrier insulation film 201 is used as a mask defining the two sides b1 and b2 of the contact 105 during contact hole etching. The upper and lower barrier insulation films 108 and 201 are required to have an etching selection ratio to the interlayer insulation film 104. It is desirable that these films are made of a common material. The thickness of the lower barrier insulation film 108 is about 10 nm to 1,000 nm, and the thickness of the upper barrier insulation film 201 is about 5 nm to 300 nm.

Figure 3A:
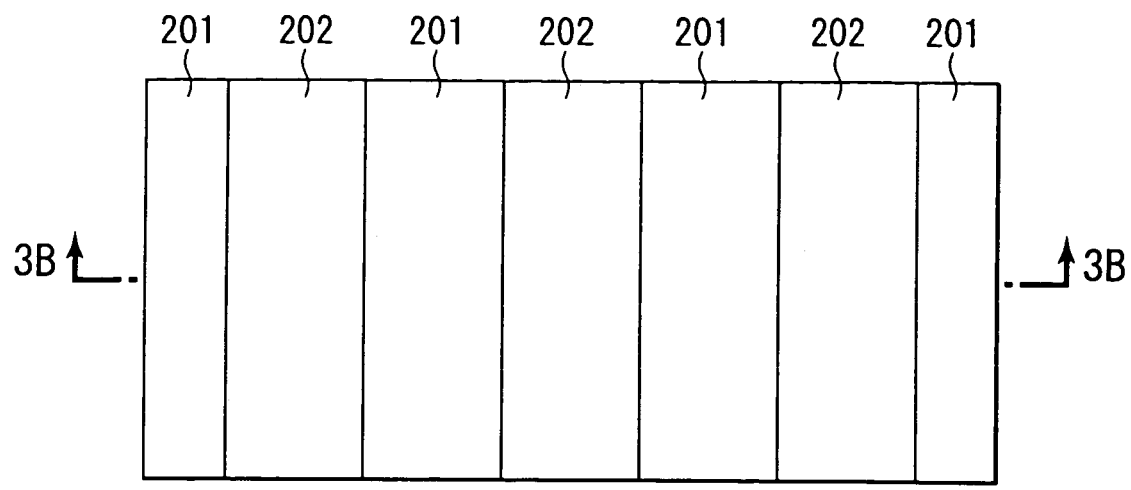
FIG. 3A is a plan view of the semiconductor device in a wiring groove forming step of the manufacturing method of the present invention.
Figure 3B:
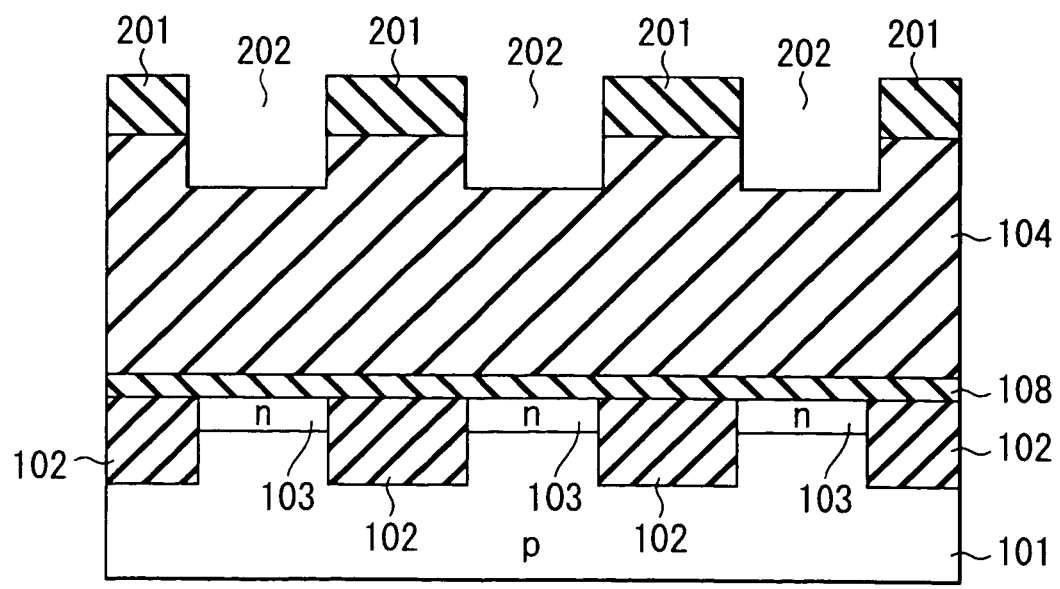
FIG. 3B is a cross sectional view of the semiconductor device shown in FIG. 3A, which is taken along the line 3B—3B of FIG. 3A.

Next, by anisotropic etching such as lithography and RIE, as shown in FIGS. 3A and 3B, the barrier insulation film 201 and part of the interlayer insulation film 104 are etched, thereby forming a plurality of wiring grooves 202 parallel to each other in the stripe shape. The wiring grooves 202 are formed in a state in which the grooves are aligned with the element regions in 2F pitch that is the same as that of the element regions. The etching depth of the interlayer insulation film 104 is defined as thickness of the wiring layer which is formed to be embedded later in accordance with the depth of the wiring groove 202. This depth is in the range of 5 nm to 500 nm.

Figure 4B:
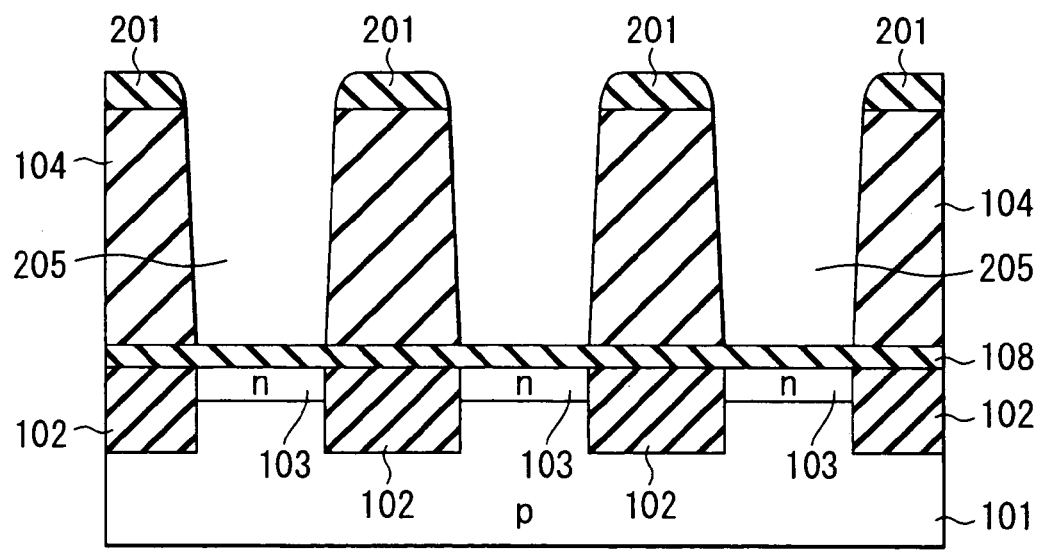
FIG. 4B is a cross sectional view of the semiconductor device shown in FIG. 4A, which is taken along the line 4B—4B of FIG. 4A.

Then, as shown in FIGS. 4A and 4B, a resist 203 having a linear opening 204 is patterned in accordance with lithography in a direction substantially orthogonal to the wiring groove 202. Contact regions are defined by the opening 204 of the resist pattern and the wiring groove 202. Then, using the resist 203 and barrier insulation film 201 as masks, the interlayer insulation film 104 is etched in accordance with anisotropic etching, thereby forming contact holes 205 arranged in line in a direction orthogonal to the wiring groove 202.

At this time, the etching condition having a selection ratio to the resist 203 and barrier insulation film 201 is required. It is desirable that a condition having a selection ratio also to the barrier insulation film 108 is set in order to prevent the removing of the substrate (or lower layer wiring) due to over-etching. When the removing of the substrate (or lower layer substrate) is not problematic or when etching having a sufficient selection ratio to the substrate (or lower layer substrate) is possible, the lower battier insulation film 108 is not required. Assuming that the width of the opening 204 of the resist pattern 203 is F, the contact hole 205 is defined in an F×F rectangular pattern. Two sides b1 and b2 thereof are aligned with edges of the wiring groove 202, and the other two sides a1 and a2 are arranged on line in accordance with the resist pattern 203.

Figure 5A:
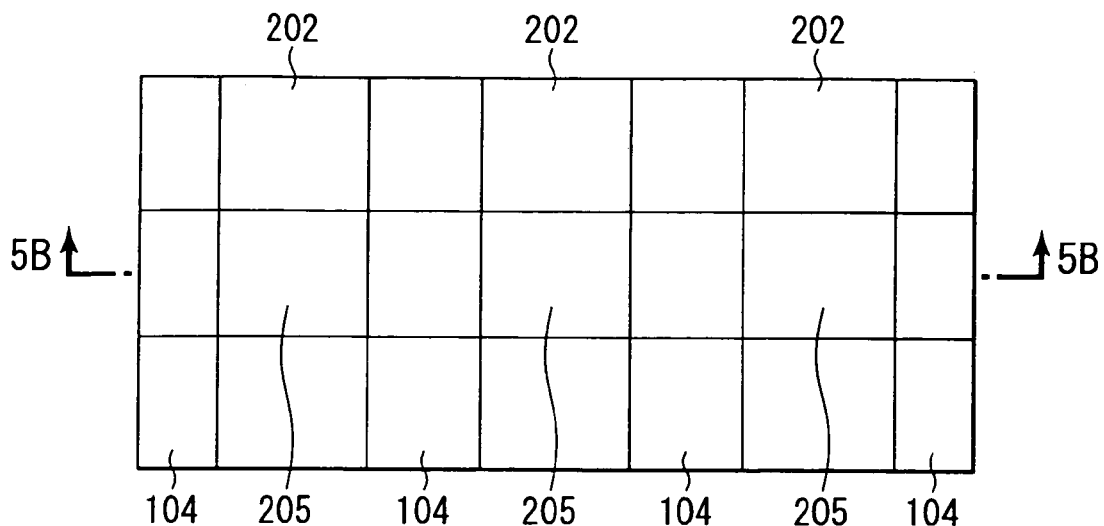
FIG. 5A is a plan view of the semiconductor device in a step of the manufacturing method, of removing a barrier insulation film at a bottom of the contact.
Figure 5B:
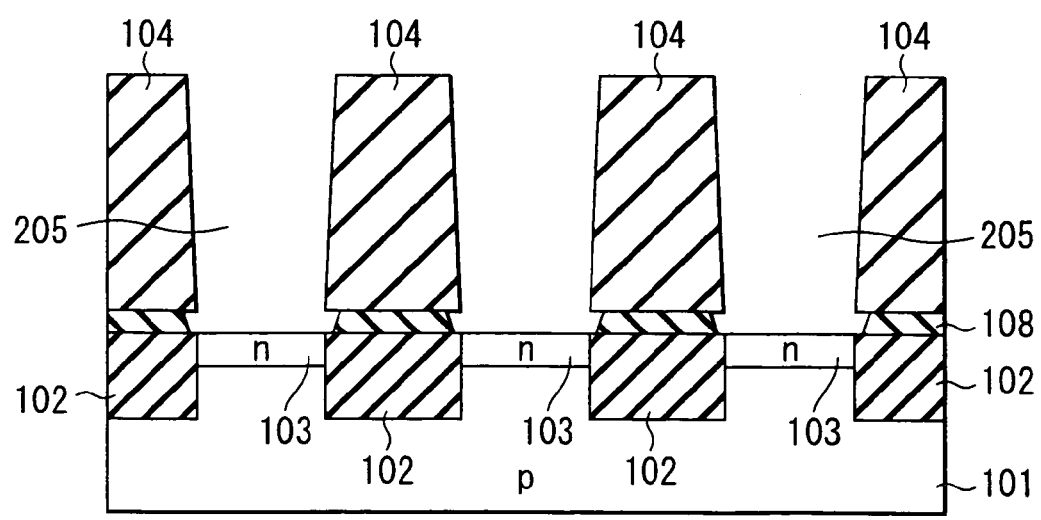
FIG. 5B is a cross sectional view of the semiconductor device shown in FIG. 5A, which is taken along the line 5B—5B of FIG. 5A.

Subsequently, as shown in FIGS. 5A and 5B, after removing the resist 203, the barrier insulation film 108 exposed to the bottom of the contact hole 205 is etched in an anisotropic manner to expose the diffusion layer 102. At this time, a condition having a selection ratio to the semiconductor substrate and the interlayer insulation film is set. This condition is desirable in that a set process of peeling off the barrier insulation film 108 is not required as post-process; retraction to the interlayer insulation film 102 of the barrier insulation film 108 shown in FIG. 5B is restricted; forward tapered shapes of the contact hole 205 are maintained; and the contact diameter 205 is maintained to be small. For example, in the case where the residual thickness of the lower barrier insulation film 108 in the process of FIGS. 4A and 4B is smaller than the maximum thickness of the upper barrier insulation film 201, the upper barrier insulation film 201 is peeled off, for example, by a high temperature wet-etching of phosphate or the like. FIG. 5B is a cross sectional view showing a case in which the above described wet etching is carried out, the cross sectional view showing a scheme when an end of the lower barrier insulation film 108 is retracted. A case where no wet etching is carried out, i.e., a case where the barrier insulation film 108 is retracted more significantly than the interlayer insulation film will be described later.

For example, impurities such as phosphor or arsenic are then ion-implanted with dosage between $1 \times 10^{13}$ cm$^{-2}$ and $1 \times 10^{18}$ cm$^{-2}$, whereby the resistance of the n-type diffusion layer regions of a contact portion may be lowered. After a barrier metal such as Ti, Ta, TaN, or TiN has been deposited in the range of 1 nm to 100 nm in accordance with, for example, a sputtering or CVD method, a metal material such as tungsten, aluminum, or copper is deposited in the range of 10 nm to 1000 nm in thickness, so that the contact hole 205 and wiring groove 202 are embedded. Then, etching-back is carried out in accordance with CMP (Chemical Mechanical Polishing) or the like. In this manner, wiring and a contact structure shown in FIGS. 1A to 1D can be obtained.

As a method for film-forming the barrier metal 107, it is desirable that the CVD method is used to deposit the film uniformly in the contact hole with a higher aspect ratio. In the present embodiment, a wiring layer metal is embedded in the contact hole, and thus, a resistive contact can be formed in either of the p-type semiconductor layer and n-type semiconductor layer. Further, the barrier insulation film 108 can be thinly formed, so that a stress or degradation to the element on the semiconductor substrate due to the barrier insulation film 108 can be reduced. In addition, even when a step occurs with the semiconductor substrate, a more uniform etching stopper film can be formed without the step being embedded in the barrier insulation film 108 because the barrier insulation film 108 is thin.

[Second Embodiment]

FIGS. 6A to 6E each show a structure of a wiring layer of a semiconductor device and a contact portion thereof according to a second embodiment which modifies the first embodiment in correspondence with FIGS. 1A to 1E. Like elements corresponding to those in the first embodiment are designated by like reference numerals. A difference from the first embodiment will be described below.

In the above first embodiment, the wiring layer 106 and contact plug 105 are formed of the same wiring layer material in a one-shot depositing process. In the second embodiment, the wiring layer 106 and contact plug 105 are formed of different materials. In other words, the contact plug 105 is embedded in the middle of the contact hole by a material different from that of the wiring layer 106 such as poly-crystalline silicon in which phosphor or arsenic is doped in $1 \times 10^{19}$ cm$^{-3}$ or more and $1 \times 10^{22}$ cm$^{-3}$ or less, monocrystalline silicon, amorphous silicon, a SiGe mixture crystal, or a SiGeC mixture crystal. The wiring layer 106 is embedded in the wiring groove and the upper part of the contact plug 105 of the contact hole. This embodiment is the same as the first embodiment in that a barrier metal 107 is provided at the ground layer of the wiring layer 106.

Figure 7A:
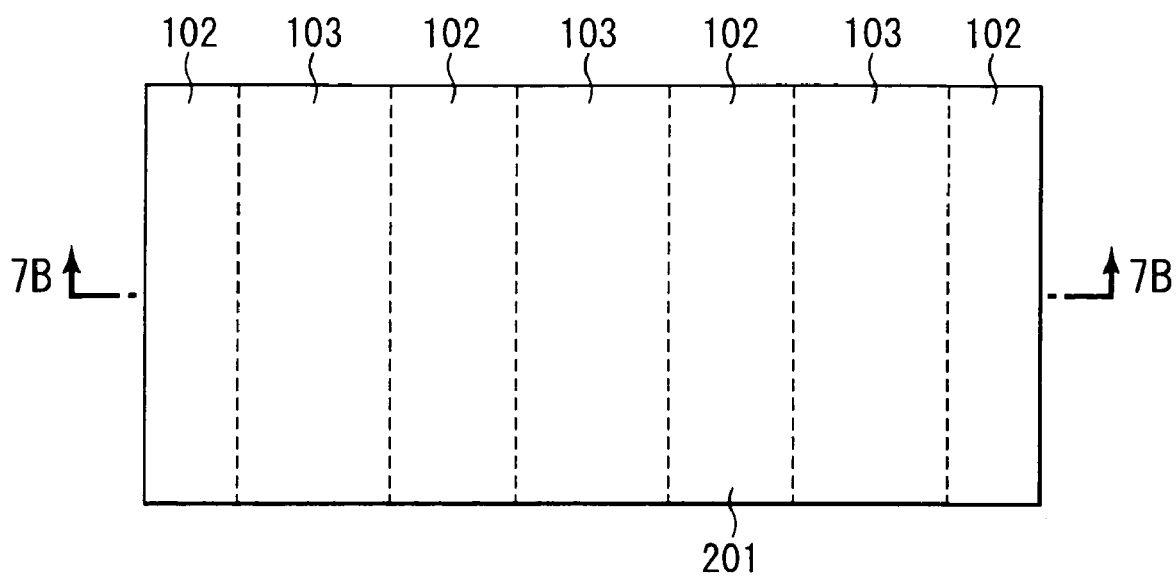
FIG. 7A is a plan view of a semiconductor device in an interlayer insulation film forming step of a manufacturing method for the semiconductor device according to the embodiment shown in FIGS. 6A–6E.
Figure 7B:
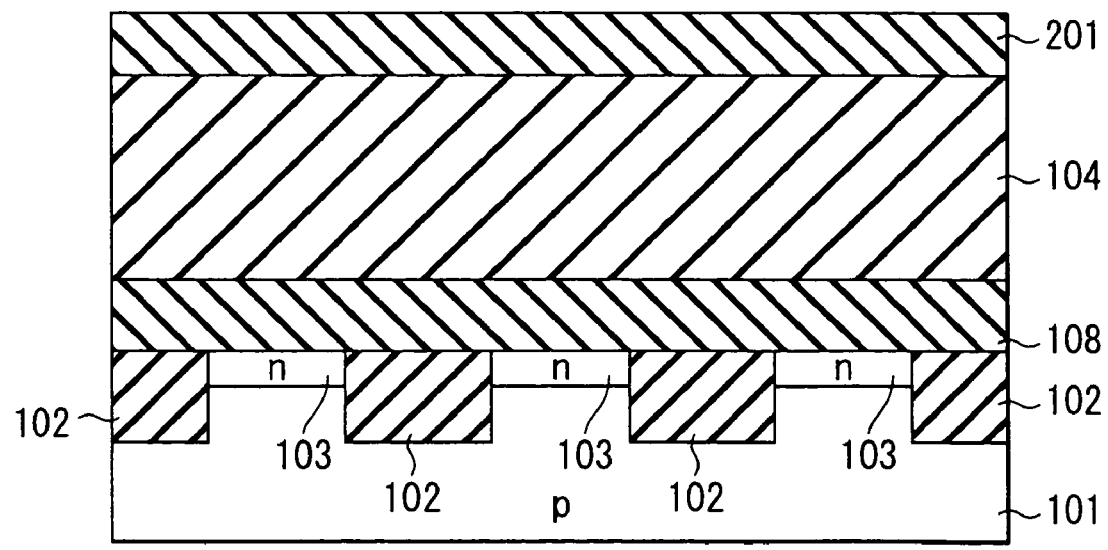
FIG. 7B is a cross sectional view of the semiconductor device shown in FIG. 7A, which is taken along the line 7B—7B of FIG. 7A.

The manufacturing process according to the second embodiment will be described with reference to FIGS. 7A and 7B to FIGS. 11A and 11B. FIGS. 7A and 7B correspond to FIGS. 2A and 2B according to the first embodiment. The barrier insulation film 108 forming a ground layer for the interlayer insulation film 104 is thicker than the barrier insulation film 201 on the interlayer insulation film 104. For example, the thickness of the barrier insulation film 201 is defined as about 3 nm to 100 nm, and the thickness of the barrier insulation film 108 is defined as about 5 nm to 200 nm. By setting such a relationship in film thickness, it is desirable that a process of peeling off the barrier insulation film 201 can be eliminated. More precisely, as shown in FIGS. 8A and 8B, in the wiring groove 202, the film thickness t2 of the barrier insulation film 108 is larger than the remaining film thickness t1 of the barrier insulation film 201 after processed.

Figure 8A:
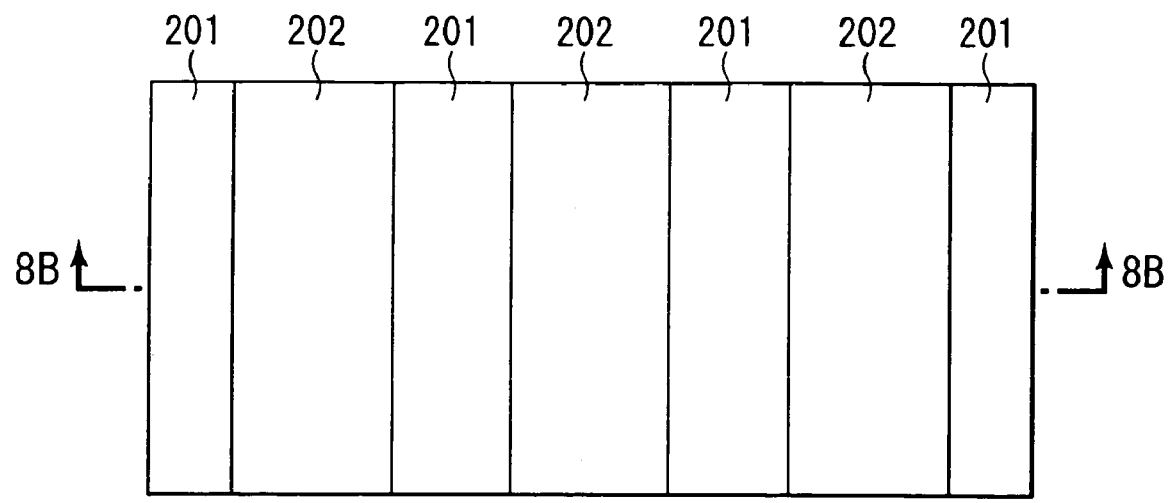
FIG. 8A is a plan view of the semiconductor device in a wiring groove forming step of the manufacturing method of the present invention.
Figure 8B:
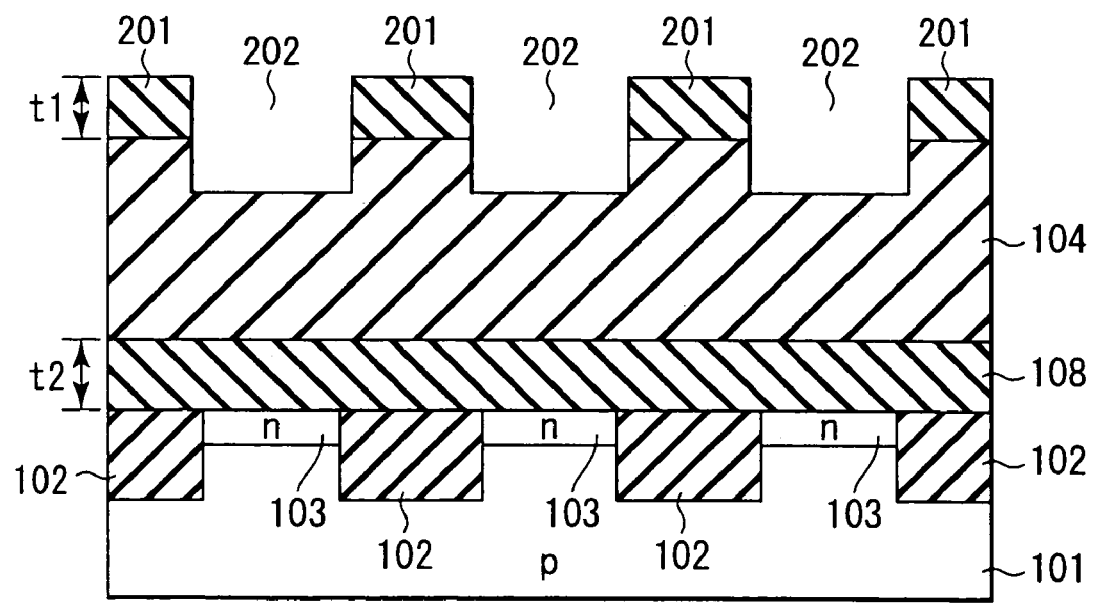
FIG. 8B is a cross sectional view of the semiconductor device shown in FIG. 8A, which is taken along the line 8B—8B of FIG. 8A.
Figure 9A:
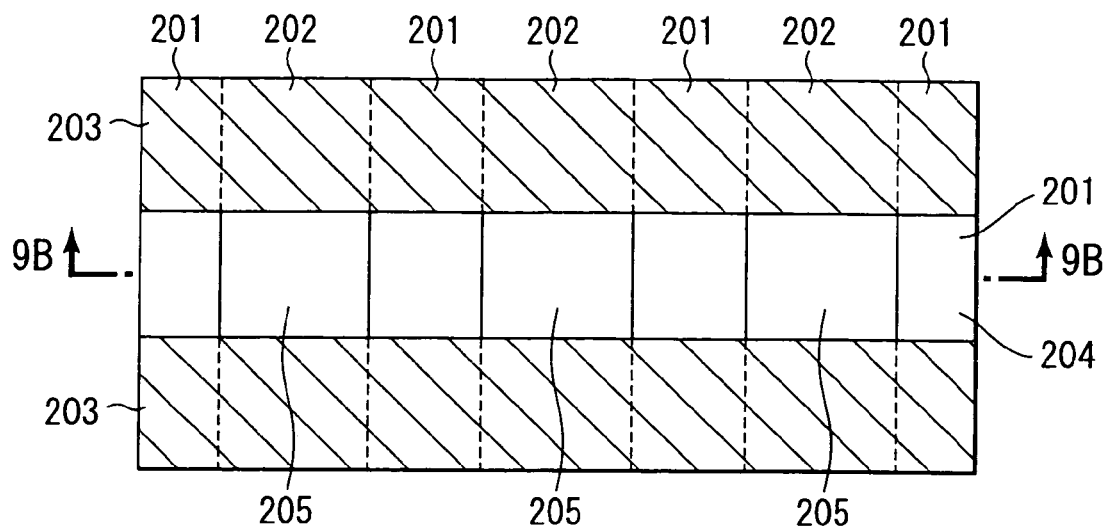
FIG. 9A is a plan view of the semiconductor device in a contact hole forming step of the manufacturing method of the present invention.
Figure 9B:
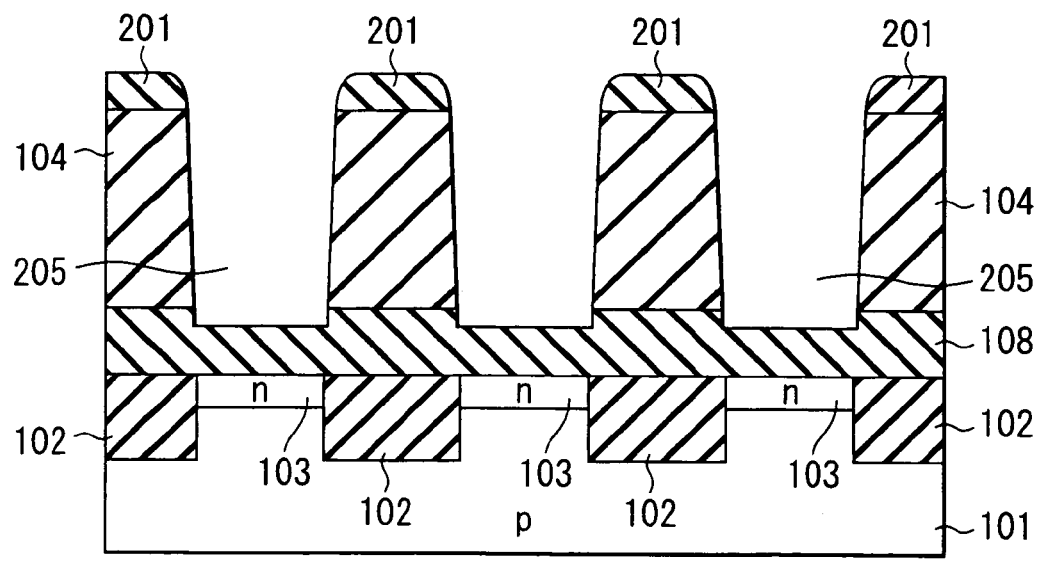
FIG. 9B is a cross sectional view of the semiconductor device shown in FIG. 9A, which is taken along the line 9B—9B of FIG. 9A.
Figure 10A:
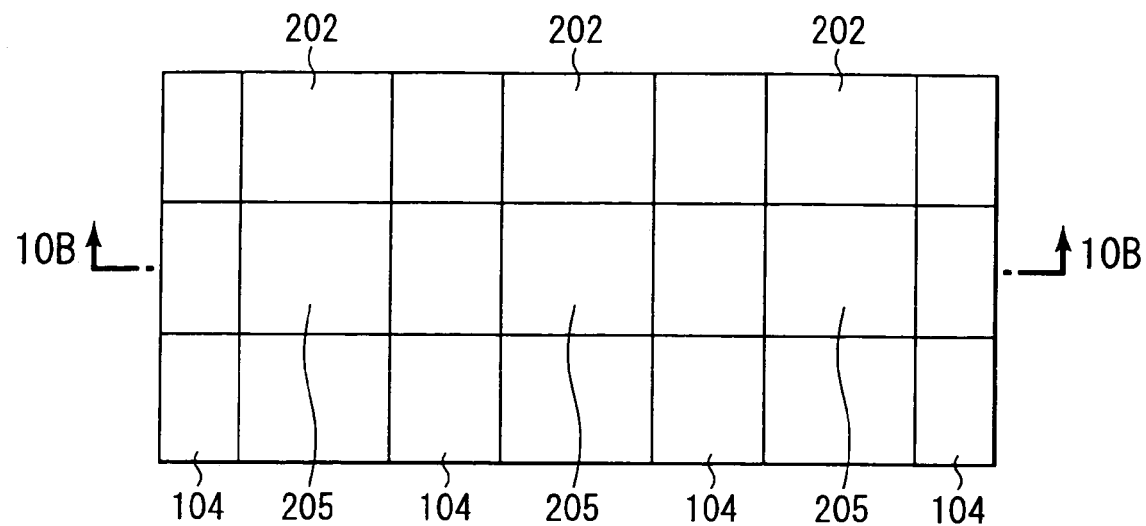
FIG. 10A is a plan view of the semiconductor device in a step of the manufacturing method, of removing a barrier insulation film at a bottom of the contact.
Figure 10B:
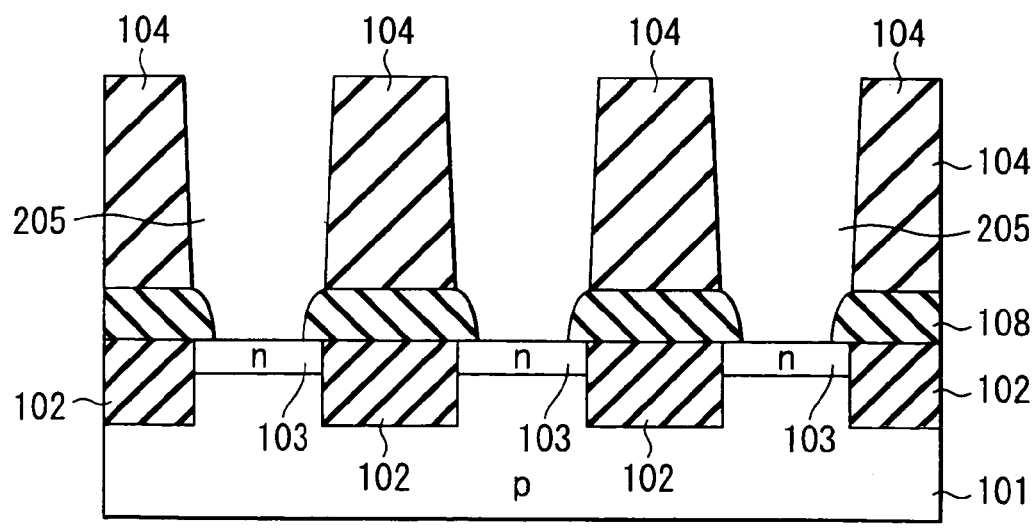
FIG. 10B is a cross sectional view of the semiconductor device shown in FIG. 10A, which is taken along the line 10B—10B of FIG. 10A.

The present embodiment is the same as the first embodiment in that the wiring groove 202 is processed to be etched as shown in FIGS. 8A and 8B, and then, the contact hole 205 is processed to be etched as shown in FIG. 9A and FIG. 9B. Then, after removing the resist 203, as shown in FIGS. 10A and 10B, the barrier insulation film 108 is etched in an anisotropic manner. At this time, a condition having a selection ratio to the semiconductor substrate and interlayer insulation film is desirable because a wet process of peeling off the barrier insulation film is not required as post-process; retraction to the interlayer insulation film of the barrier insulation film 108 is eliminated; and the forward tapered shapes and the contact diameter can be maintained to be small. In addition, the remaining film thickness of the barrier insulation film 108 in the process of FIGS. 9A and 9B, for example, is greater than the maximum thickness of the barrier insulation film 201, whereby the peeling of the barrier insulation film 201 can be carried out at the same time in a process of etching the barrier insulation film 108.

Figure 11A:
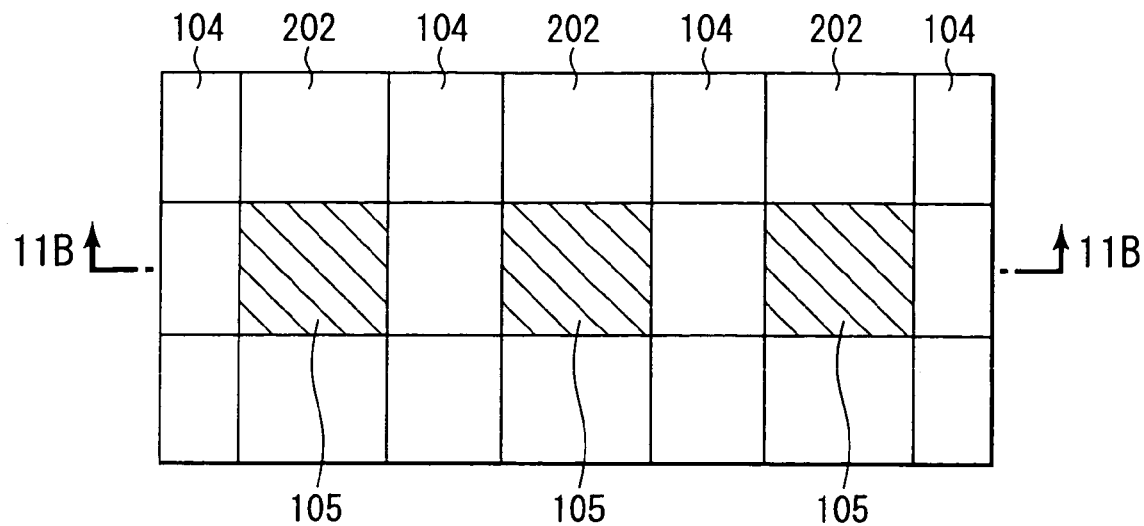
FIG. 11A is a plan view of the semiconductor device in a contact plug embedding step of the manufacturing method of the present invention.
Figure 11B:
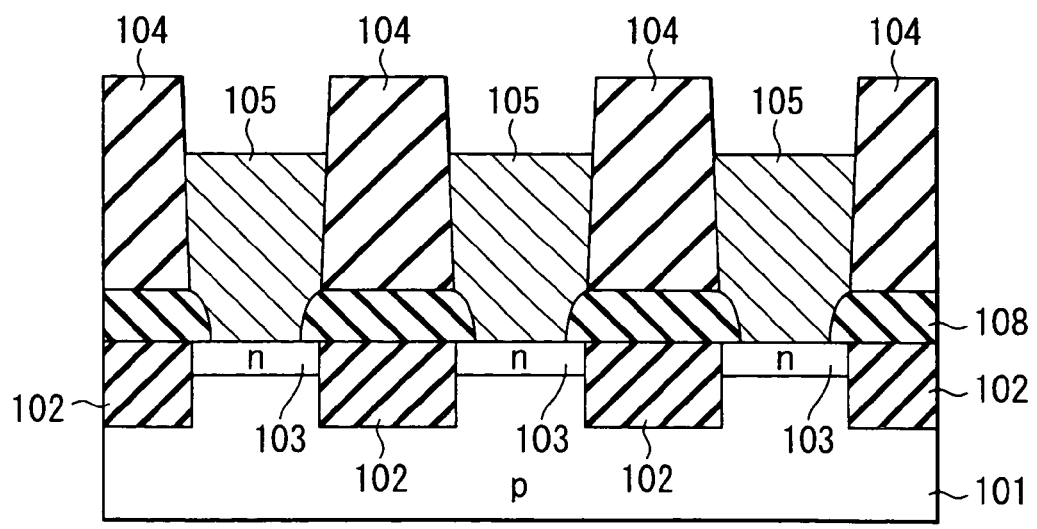
FIG. 11B is a cross sectional view of the semiconductor device shown in FIG. 11A, which is taken along the line 11B—11B of FIG. 11A.
Figure 12A:
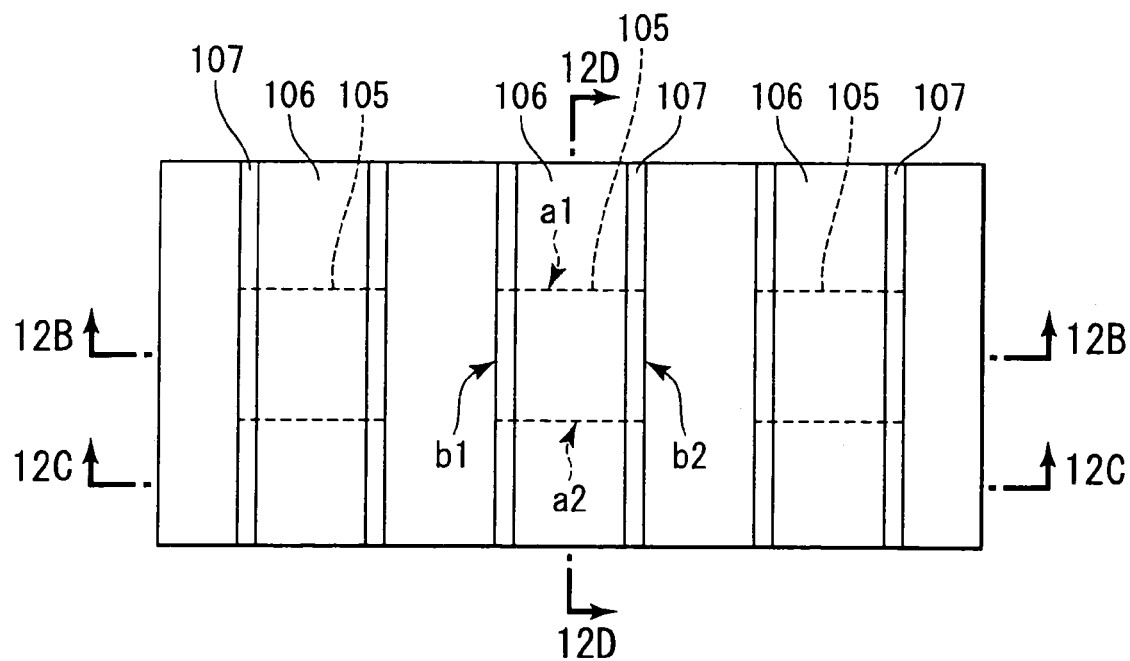
FIG. 12A is a plan view showing a wiring layer and a contact thereof of a semiconductor device according to a further embodiment of the present invention.
Figure 12B:
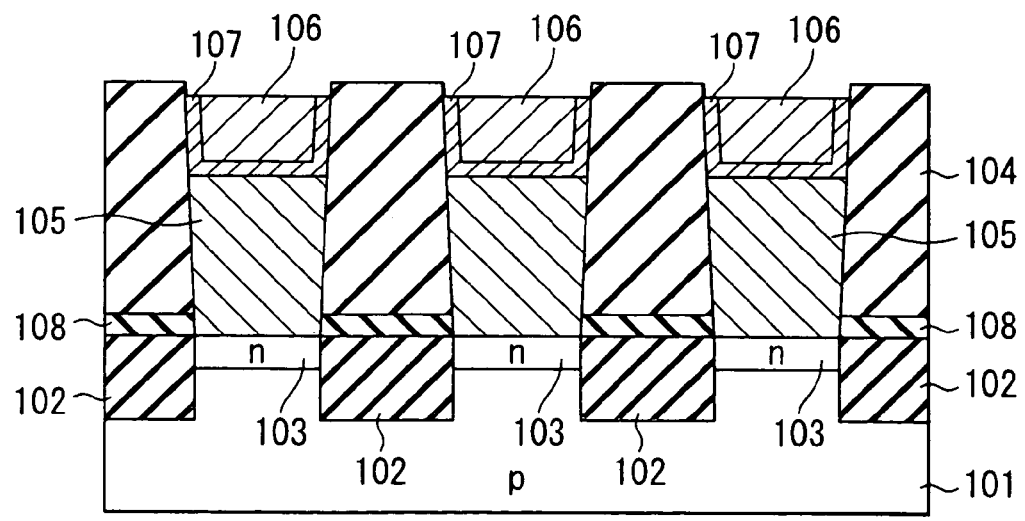
FIG. 12B is a cross sectional view of the semiconductor device shown in FIG. 12A, which is taken along the line 12B—12B of FIG. 12A.
Figure 12C:
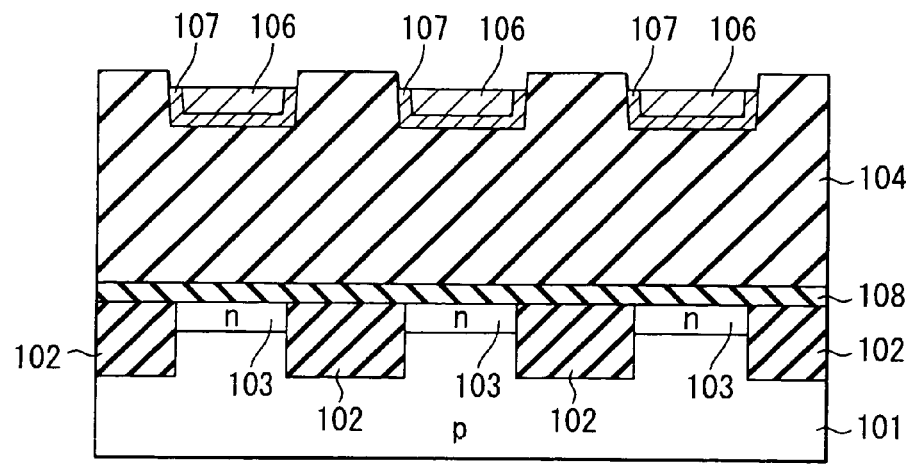
FIG. 12C is a cross sectional view of the semiconductor device shown in FIG. 12A, which is taken along the line 12C—12C of FIG. 12A.
Figure 12D:
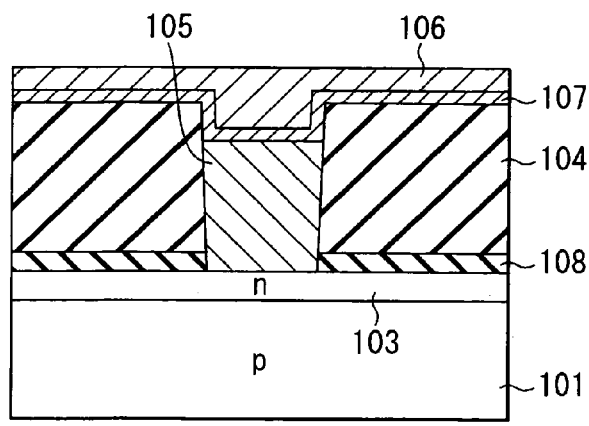
FIG. 12D is a cross sectional view of the semiconductor device shown in FIG. 12A, which is taken along the line 12D—12D of FIG. 12A.
Figure 12E:
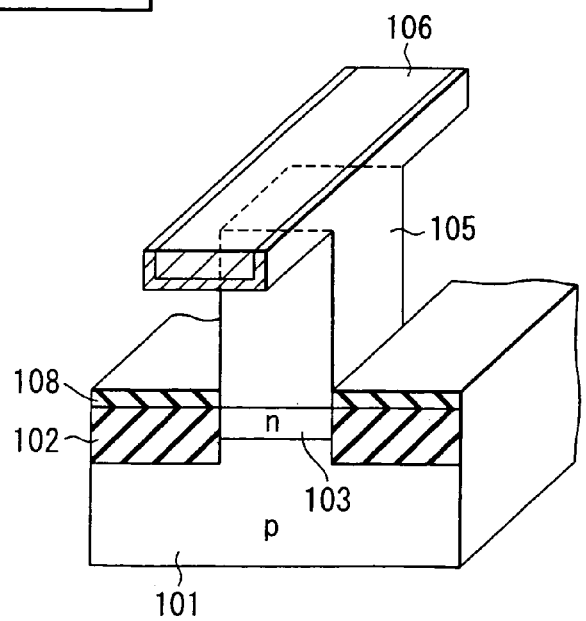
FIG. 12E is a perspective view showing the wiring layer and the contact thereof of the semiconductor device shown in FIG. 12A.
Figure 13A:
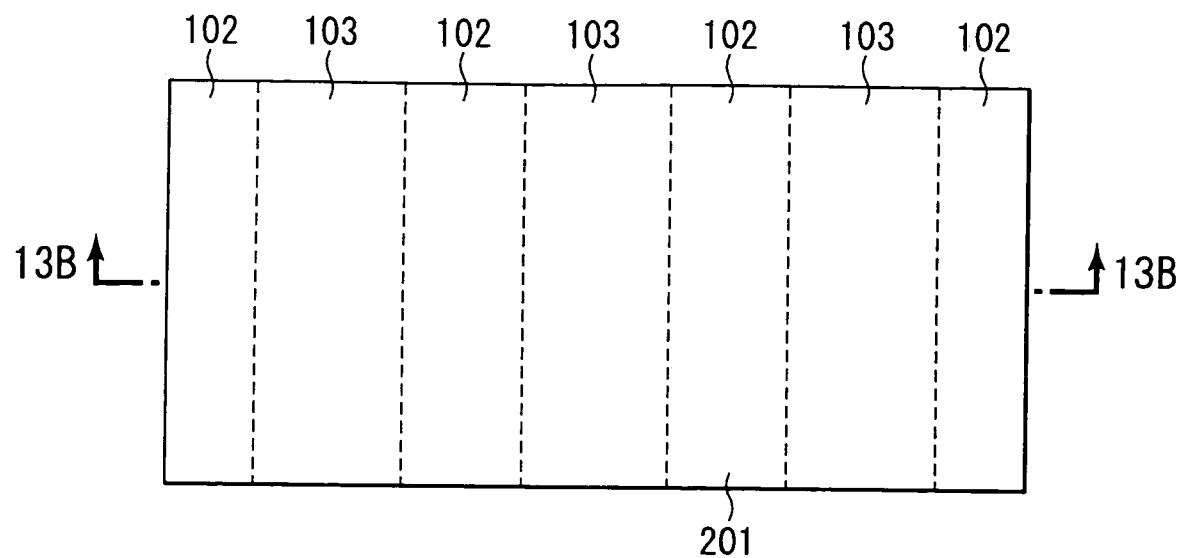
FIG. 13A is a plan view of a semiconductor device in an interlayer insulation film forming step of a manufacturing method for the semiconductor device according to the embodiment shown in FIGS. 12A–12E.
Figure 13B:
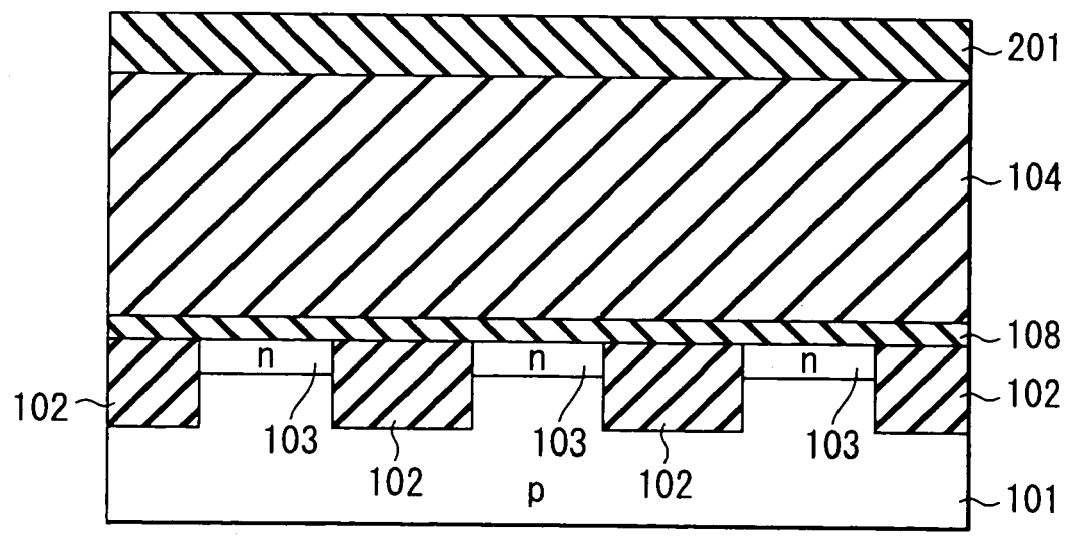
FIG. 13B is a cross sectional view of the semiconductor device shown in FIG. 13A, which is taken along the line 13B—13B of FIG. 13A.
Figure 14A:
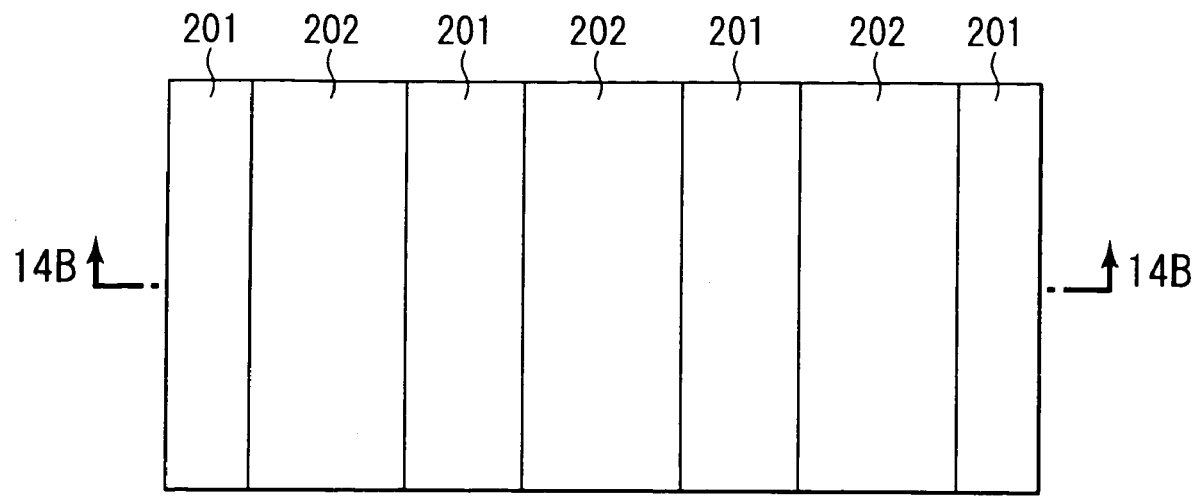
FIG. 14A is a plan view of the semiconductor device in a wiring groove forming step of the manufacturing method of the present invention.
Figure 14B:
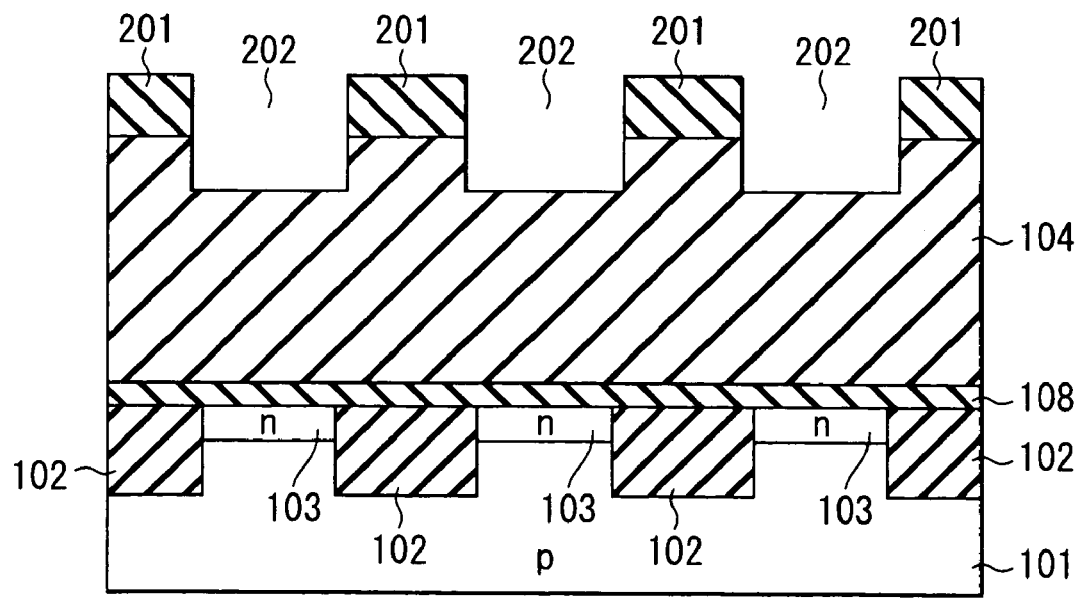
FIG. 14B is a cross sectional view of the semiconductor device shown in FIG. 14A, which is taken along the line 14B—14B of FIG. 14A.

As has been described above, after patterning the wiring groove 202 and contact hole 205, for example, the patterned contact hole is embedded in a poly-crystalline silicon in which impurities such as phosphor or arsenic are doped at a high concentration. Then, etching back is carried out in accordance with anisotropic etching or isotropic etching such as CDE (Chemical Dry Etching), so that, as shown in FIGS. 11A and 11B, the contact plug 105 is etched in the middle of the contact hole 205.

Figure 6A:
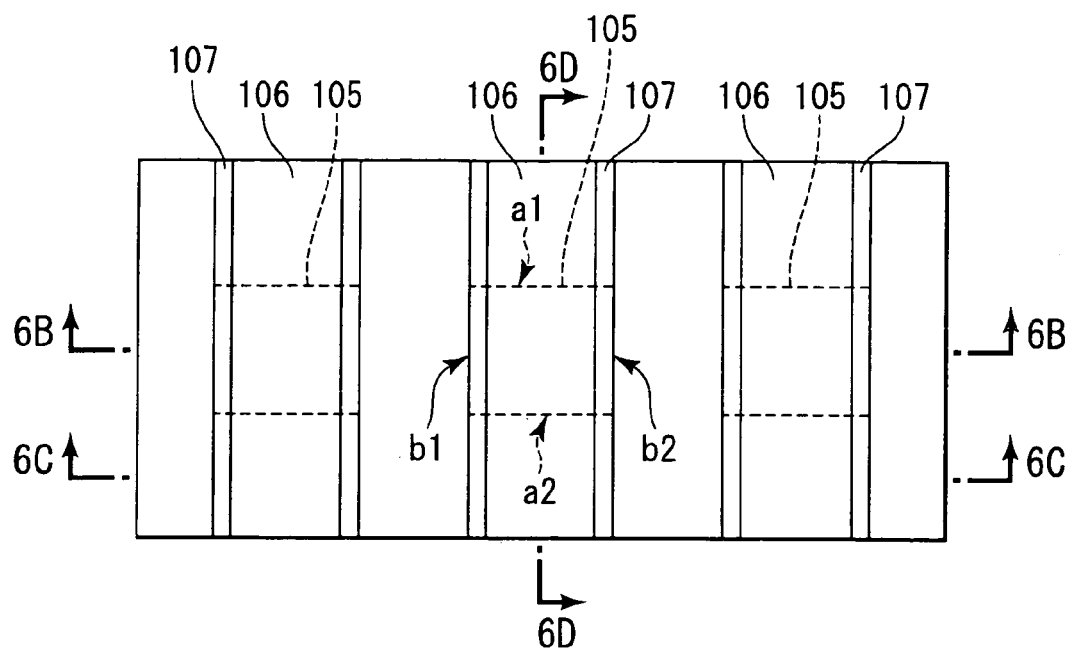
FIG. 6A is a plan view showing a wiring layer and a contact thereof of a semiconductor device according to another embodiment of the present invention.
Figure 6B:
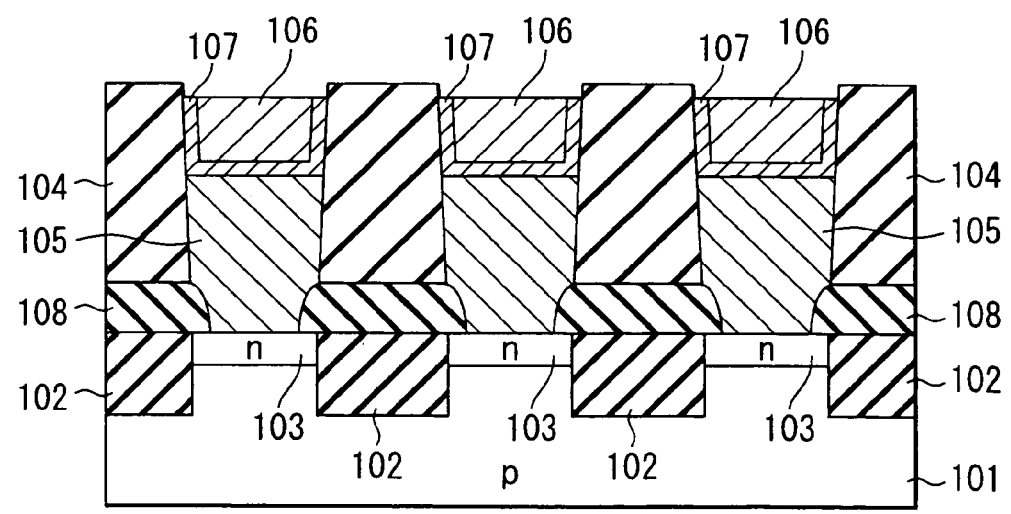
FIG. 6B is a cross sectional view of the semiconductor device shown in FIG. 6A, which is taken along the line 6B—6B of FIG. 6A.
Figure 6C:
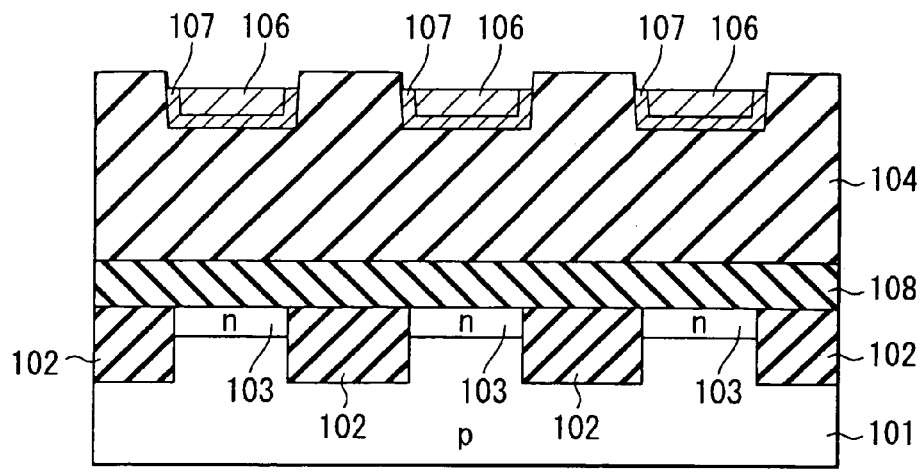
FIG. 6C is a cross sectional view of the semiconductor device shown in FIG. 6A, which is taken along the line 6C—6C of FIG. 6A.
Figure 6D:
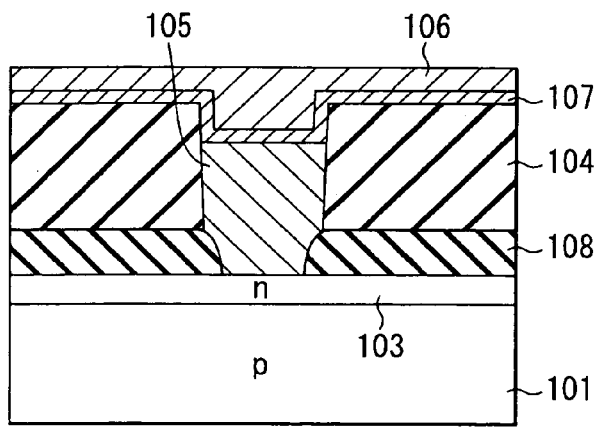
FIG. 6D is a cross sectional view of the semiconductor device shown in FIG. 6A, which is taken along the line 6D—6D of FIG. 6A.
Figure 6E:
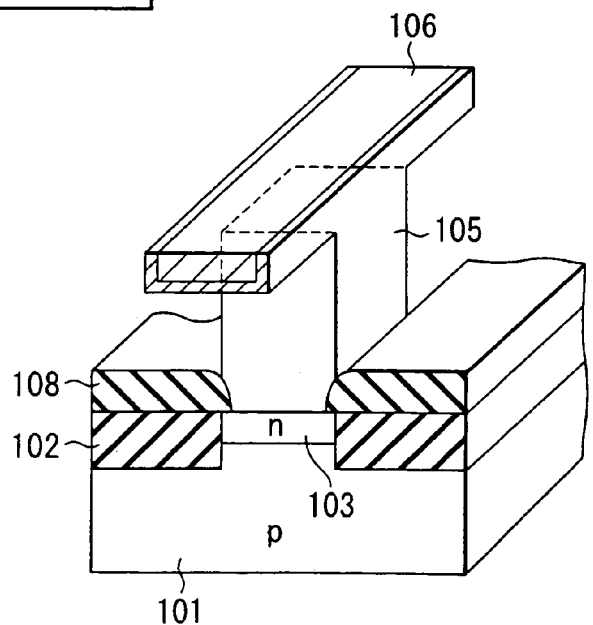
FIG. 6E is a perspective view showing the wiring layer and the contact thereof of the semiconductor device shown in FIG. 6A.

Then, after depositing a barrier metal 107 such as Ti, Ta, TaN, or TiN, a metal material such as tungsten, aluminum, or copper is deposited, and etching back is carried out in accordance with CMP or the like to embed the wiring layer 106 as shown in FIGS. 6A to 6C. The wiring layer 106 is embedded at the upper part of the contact hole 205 as well.

Advantageous effect of the second embodiment will be described below.

In general, when a contact aspect ratio becomes high, the coverage of the barrier metal is likely to be insufficient. As a result, a deposition failure with the embedded metal or a leak current between the contact and the substrate (or lower layer wiring) increases. In the second embodiment, since a contact is embedded with a poly-crystalline silicon, an increase in leak current caused by the unsatisfactory coverage of the barrier metal can be prevented. In addition, since the lower part of the contact is embedded in advance, an aspect ratio for embedding the wiring layer including the upper part of the contact is reduced, and thereby the characteristics of embedding the barrier metal and metal is improved.

Moreover, when a poly-crystal Si, SiGe, or amorphous Si or SiGe is used for a contact embedding material, Si or SiGe can be embedded in accordance with the CVD method with very high coverage, compared with a metal, and can be embedded constantly even with a high aspect ratio structure. Further, when a poly-crystal Si or SiGe is used for the impurity doped contact embedding material, the impurities can be diffused on a substrate, whereby, even if re-diffusion ion implantation is not carried out, a constant contact resistance can be obtained. In addition, a barrier metal is not required in embedding the lower part of the contact. Thus, even if the contact is miniaturized, a constant contact resistance with the n-type region can be achieved.

On the other hand, in the first and second embodiments, when isotropic etching is used when the upper barrier insulation film 201 is etched back, the lower barrier insulation film 108 as well is etched. Thus, there is a problem that a short-circuit margin between the contacts is likely to lower. A third embodiment which modifies this point will be described later.

[Third Embodiment]

FIGS. 12A to 12E each show a structure of a wiring layer of a semiconductor device and a contact portion thereof according to the third embodiment in correspondence with FIGS. 6A to 6E. In addition, FIGS. 13A and 13B to FIGS. 16 and 16B each show a manufacturing process therefor in correspondence with FIGS. 7A and 7B to FIGS. 11A and 11B. Like elements corresponding to those in the first and second embodiments are assigned by like reference numerals. The present embodiment is the same as the second embodiment in that the contact plug 105 and wiring layer 106 are formed to be embedded by different materials.

In the third embodiment, the thickness of the upper barrier insulation film 201 of the interlayer insulation film 104 is larger than that of the lower barrier insulation layer 108. Specifically, the thickness of the upper barrier insulation film 201 is defined as about 10 nm to 1000 nm, and the thickness of the lower barrier insulation film 108 is defined as about 5 nm to 100 nm. The process of patterning the wiring groove 202 and contact hole 205 in FIG. 13A to FIGS. 15A and 15B is the same as those in the first and second embodiments.

Figure 15A:
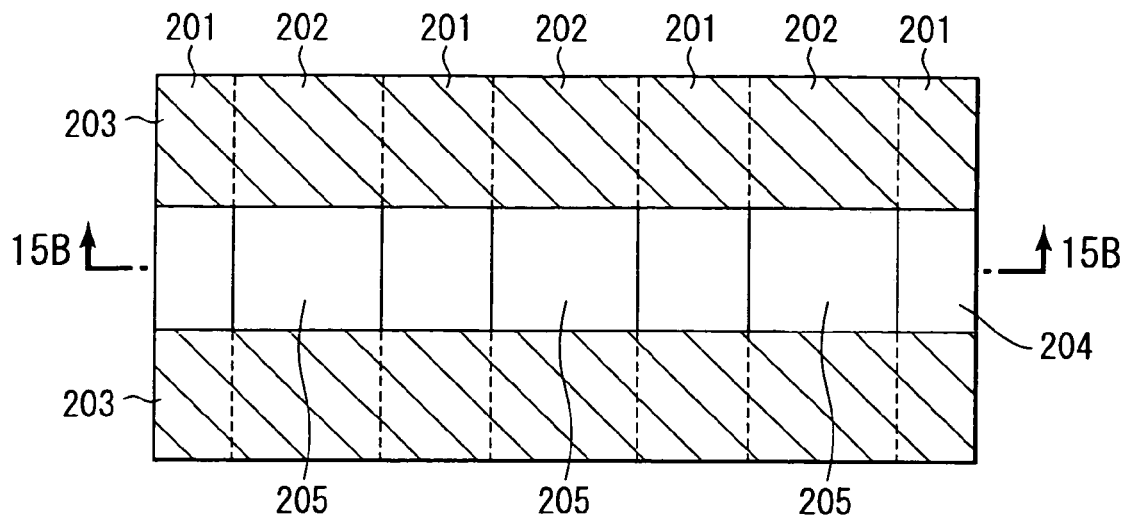
FIG. 15A is a plan view of the semiconductor device in a contact hole forming step of the manufacturing method of the present invention.
Figure 15B:
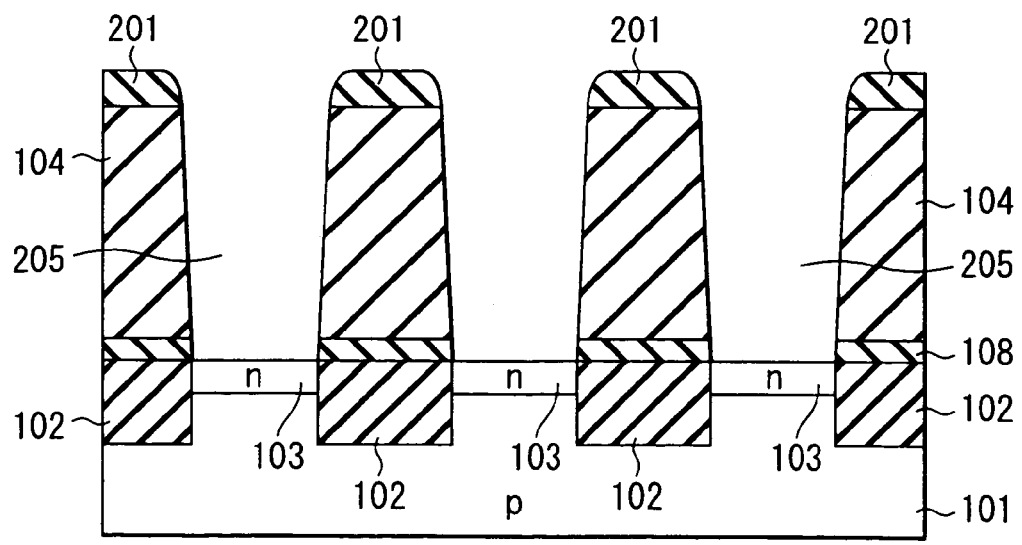
FIG. 15B is a cross sectional view of the semiconductor device shown in FIG. 15A, which is taken along the line 15B—15B of FIG. 15A.

After removing the resist 203 in FIGS. 15A and 15B, the barrier insulation film 108 is etched in an anisotropic manner. At this time, it is desirable to meet a condition having a selection ratio to the semiconductor substrate and interlayer insulation film because a wet process of peeling off the barrier insulation film is not required as post-process, retraction to the interlayer insulation film of the barrier insulation film 108 is eliminated; and the forward tapered shapes and contact diameter can be maintained to be small. In the present embodiment, as shown in FIGS. 16A and 16B, the contact plug is embedded before peeling off the upper barrier insulation film 201.

Figure 16A:
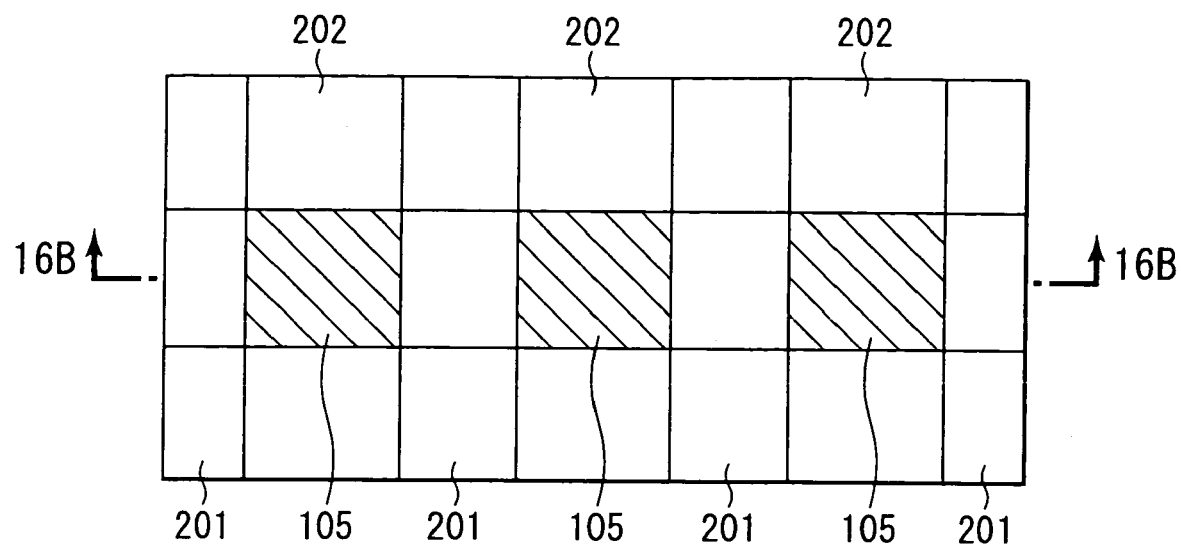
FIG. 16A is a plan view of the semiconductor device in a contact plug embedding step of the manufacturing method of the present invention.
Figure 16B:
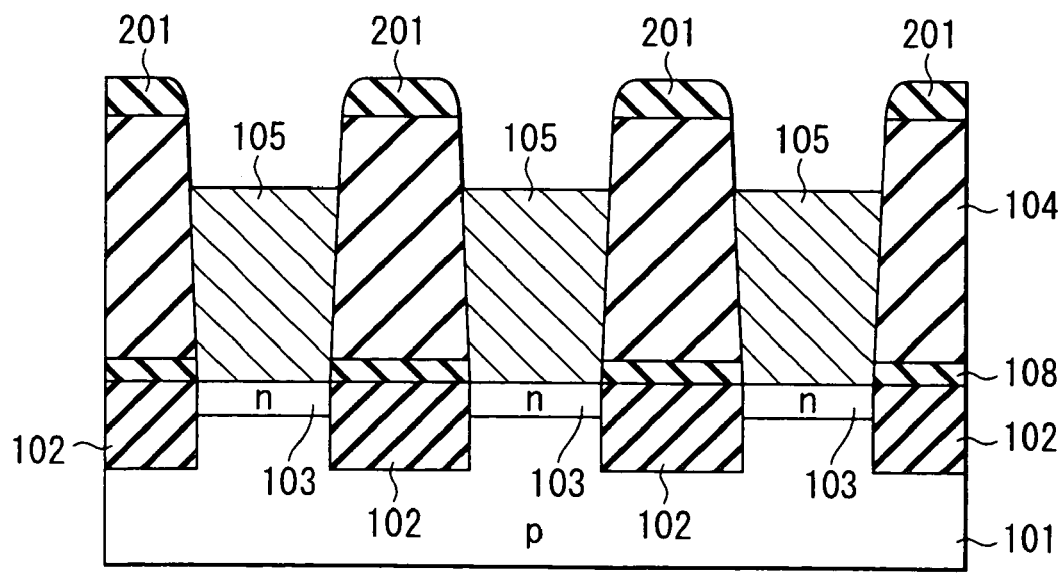
FIG. 16B is a cross sectional view of the semiconductor device shown in FIG. 16A, which is taken along the line 16B—16B of FIG. 16A.

For example, a contact embedding material made of poly-crystal silicon in which impurities such as phosphor or arsenic are doped in $1 \times 10^{19}$ cm$^{-3}$ or more and $1 \times 10^{21}$ cm$^{-3}$ or less, for example, or SiGe mixture crystal, is deposited and etched back to embed the contact plug 105 in the middle of the contact hole 205 as shown in FIGS. 16A and 16B. Thereafter, the barrier insulation film 201 remaining on the interlayer insulation film 104 is peeled off.

The upper surface position after etching back the contact plug 105 is deeper than the bottom of the wiring groove 202 and is higher than the upper surface position of the lower barrier insulation film 108. This positioning is desirable to lower the wiring resistance and prevent unintended retraction of the barrier insulation film 108. In addition, in etching the barrier insulation film 108, isotropic etching with less etching damage is used which uses etchant or gas having a selection ratio relevant to the interlayer insulation film 104 and contact plug 105, for example, phosphate heated at 80° C. to 130° C. At this time, the barrier insulation film 108 is covered with the contact plug 105, and its end face is not exposed. Thus, a well shaped contact can be formed by a more forward tapered shape without being etched unlike the first and second embodiments.

An isotropic etching condition with a very high selection ratio can be used for this process. Therefore, even if a step is formed at the barrier insulation film 201 when contact hole etching is carried out via a linear window that is long in the contact arrangement direction, a state in which no step is transferred to the interlayer insulation film 104 can be established. In this way, the height of the interlayer insulation film 104 between the adjacent contacts can be highly maintained in the same manner as in a portion at which no contact is formed, and the short-circuit between the adjacent contacts and between wirings can be prevented.

After embedding the contact plug, the barrier metal 107 such as Ti, Ta, TaN, or TiN is embedded, and the wiring layer 106 is embedded with a metal material such as tungsten, aluminum, or copper, and then, etching back is carried out in accordance with the CMP or the like, so that the structure shown in FIG. 12A to FIG. 12E is obtained.

As has been described above, in the present embodiment, since the contact plug 105 has already been embedded during peeling of the barrier insulation film 201, the lower barrier insulation film 108 is not exposed. Therefore, the barrier insulation film 108 is not etched at the same time when the upper barrier insulation film 201 is etched, and a short-circuit margin between the contacts is improved.

The above described first to third embodiments have the following advantageous effects in common.

<1> In these embodiments, the lengths in two directions of a rectangular (grid shaped) contact can be independently controlled with lithography in two directions, i.e., the longitudinal direction of the wiring layer and a direction orthogonal thereto. In particular, unlike lithography in a circular pattern in the case of the conventionally used circular contact, the lithography in two directions can use a linear pattern. In addition, the exposure intensity can be increased more than that of the circular pattern, the exposure sensitivity can be risen, and a contact hole can be opened while a sufficient focal depth and a sufficient exposure variation allowable depth are maintained.

Further, the minimum line width can be obtained in two directions, respectively. Thus, a finer contact than conventionally can be formed, and the contact diameter in the wiring widthwise direction and the wiring width can be substantially equal to each other. In the above described embodiments, after embedding the contact 105, prior to embedding the wiring metal, the interlayer insulation film 104 or barrier insulation film 201 may be slightly etched in order to improve coherence and reduce contamination. In this case, the wiring metal width is greater than the contact diameter in the wiring widthwise direction due to retraction of the end of the wiring groove 202.

In the prior art, when a device with the same resolution is used, as shown in FIG. 68, the minimum wiring width cannot be obtained in each of the two-axis directions. Thus, the contact pattern has been greater than the wiring width. In contrast, in the present embodiment, even when the wiring layer width is equal to or greater than the contact diameter, a distance between the contact of one wiring layer and the adjacent wiring layer can be established to be greater than that of the prior art. Therefore, the maximum diameter of the contact can be smaller than conventionally, and the shape of the contact can be formed to be more rectangular than conventionally. Because of this, a short-circuit between the contact and the adjacent wiring substantially parallel to one side thereof can occur more hardly than conventionally.

Furthermore, in the case where a ground layer for the contact is a linear pattern extending in a direction identical to the longitudinal direction of the wiring layer (or in a direction orthogonal thereto), even when a misalignment occurs, a contact area between the contact and the ground layer can be ensured to be greater than a case of the conventional circular contact. Thus, even if a misalignment with the ground layer occurs, a contact resistance can be reduced.

In addition, for example, as in a resist conversion difference, a dimensional error in the short side direction between the contact and the wiring is determined by one-time lithography. Unlike the prior art, two-shot lithography is not required for the contact and wiring, separately. Therefore, the dimensional error caused by lithography can be smaller than conventionally, and a contact with uniform dimensions can be formed.

<2> In comparison with a case in which a contact is formed in accordance with multiple exposure, and a wiring is formed in a process other than this exposure, two-step lithography will suffice to form the contact and wiring, and a problem with process reduction and alignment shift of a plurality of layers can be reduced. In addition, the wiring layer can be provided on a step-free flat surface prior to contact forming lithography. Thus, lithography with a low focal depth and high resolution can be used, and therefore, a wiring pitch can be reduced.

<3> In the case of using a ground conductor layer patterned in two directions, i.e., in the longitudinal direction of the wiring and a direction orthogonal thereto, lithography alignment is carried out along each of the two directions of the ground conductor layer, whereby a misalignment of the contact to the ground conductor layer can be reduced.

<4> An interlayer insulation film formed of a silicon oxide film, for example, can be formed between the adjacent wiring layers, and a barrier insulation film formed of a silicon nitride film with a high dielectric does not exist, so that a capacity between the wirings can be lowered. Further, since a barrier insulation film such as a silicon nitride film does not exist, an electron trap level between the wiring layers is decreased, and the breakdown voltage across the wirings can be improved.

In the first, second, and third embodiments and the subsequent embodiments as well, the upper surface shape of the contact is rectangular (angular) on the figures. However, even in a rectangular contact shape whose corner is slightly rounded, advantageous effect can be achieved due to a process resolution restriction. A difference in elliptical contact shape between the present invention and the prior art would be obvious, for example, by comparing one contact cut-face formed when the contact is cut on a flat face parallel to a main surface of the semiconductor substrate with another.

This obviousness will be described with reference to FIGS. 73A and 73B. As shown in FIGS. 73A and 73B, with respect to a case of an elliptical contact and a case of a rectangular contact, a distance in two intersecting points between a split line passing through the center of gravity of the above described contact cut-face and a contact cut-face end is defined as a contact diameter. When the contact diameter is measured after the split line passing through the center of gravity of the contact cut-face has been rotated from 0 degree to 360 degrees, two maximum points P1 and P2 (long diameters) and two minimum points P3 and P4 (short diameter) appear as shown in FIG. 73A in the conventional elliptical pattern contact. In contract, in the case of the rectangular contact, as shown in FIG. 73B, even if a corner is slightly rounded, four maximum points P11, P12, P13, and P14 corresponding to the diagonal line direction appear, and four minimum points P21, P22, P23, and P24 appear in the wiring widthwise direction and a direction orthogonal thereto.

Even in the case where the value of the contact diameter at the above described two minimum points is equal to that of the prior art, when the maximum value is obtained in the diagonal line direction as in the present embodiment, a contact area can be extended in the diagonal line direction more than the prior art while the maximum dimension in the wiring widthwise direction of the contact and a direction orthogonal thereto is equal to that of the prior art. Therefore, the contact resistance can be reduced.

In the above described rectangular contact shape according to the present embodiment, when an insulation film (an interlayer insulation film) having a contact formed therein is amorphous, a crystalline orientation does not exist in the insulation film. Thereby, a difference in etching velocity does not occur depending on a surface-extension direction, and such a difference does not occur due to the conventional one-time lithography. In addition, as a contact shape measurement reference point (in a thickness direction), a contact face between the contact upper part and the wiring bottom is desirable because such contact face reflects a pattern shape at the time of lithography more significantly.

In addition, according to the present invention, such a rectangular contact having two sides parallel to the wiring widthwise direction can be formed. Therefore, the maximum contact diameter in the wiring widthwise direction can be maintained to be more constant than that of the conventional elliptical contact, the contact area can be increased, and the contact resistance can be reduced.

[Fourth Embodiment]

Figure 17A:
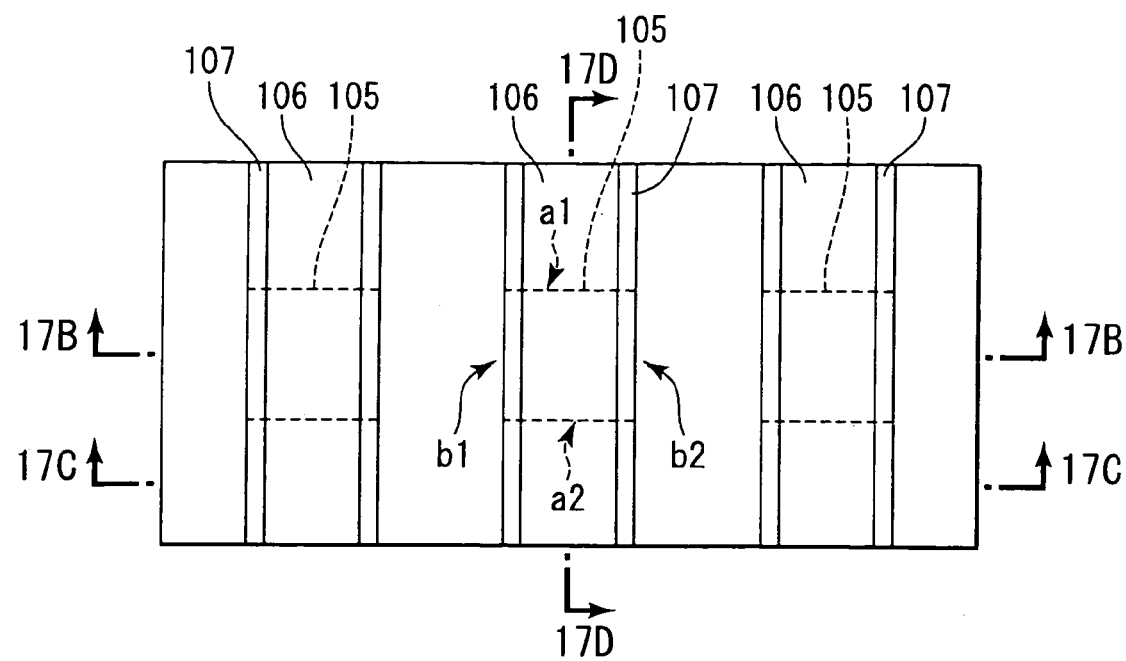
FIG. 17A is a plan view showing a wiring layer and a contact thereof of a semiconductor device according to a further embodiment of the present invention.
Figure 17B:
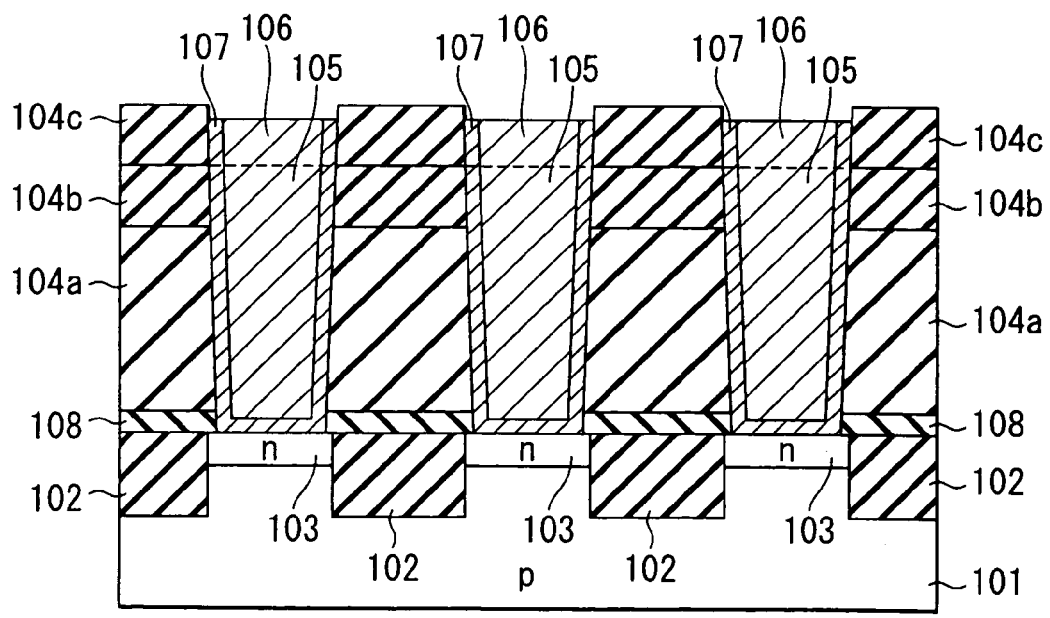
FIG. 17B is a cross sectional view of the semiconductor device shown in FIG. 17A, which is taken along the line 17B—17B of FIG. 17A.
Figure 17C:
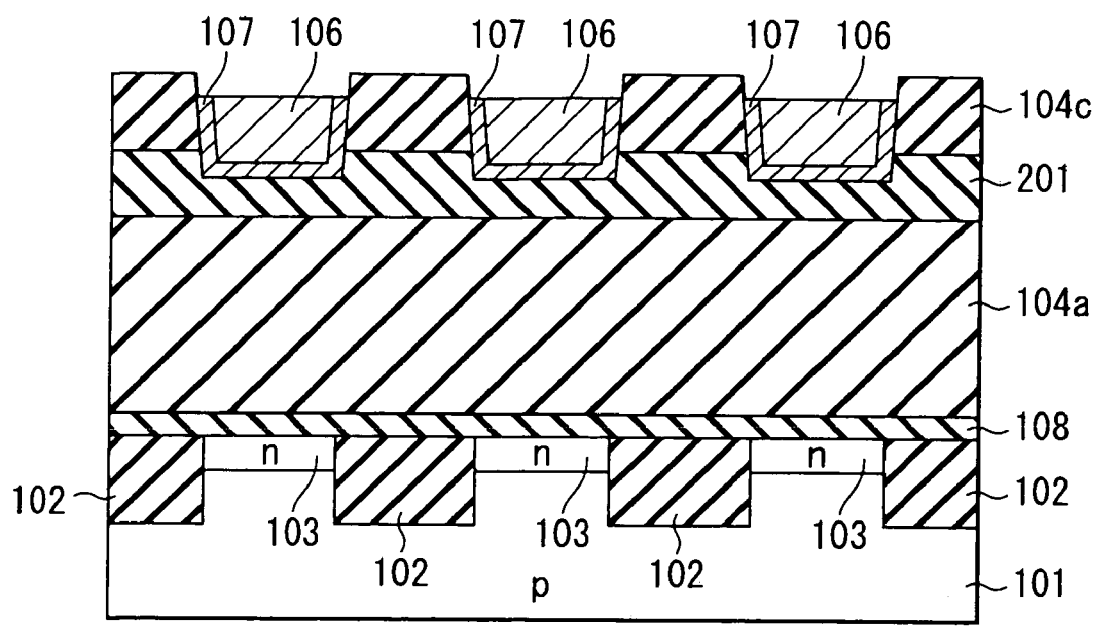
FIG. 17C is a cross sectional view of the semiconductor device shown in FIG. 17A, which is taken along the line 17C—17C of FIG. 17A.
Figure 17D:
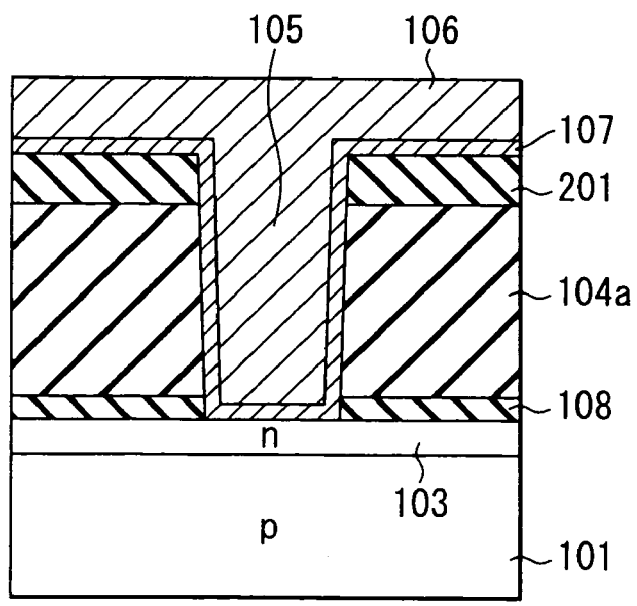
FIG. 17D is a cross sectional view of the semiconductor device shown in FIG. 17A, which is taken along the line 17D—17D of FIG. 17A.
Figure 18A:
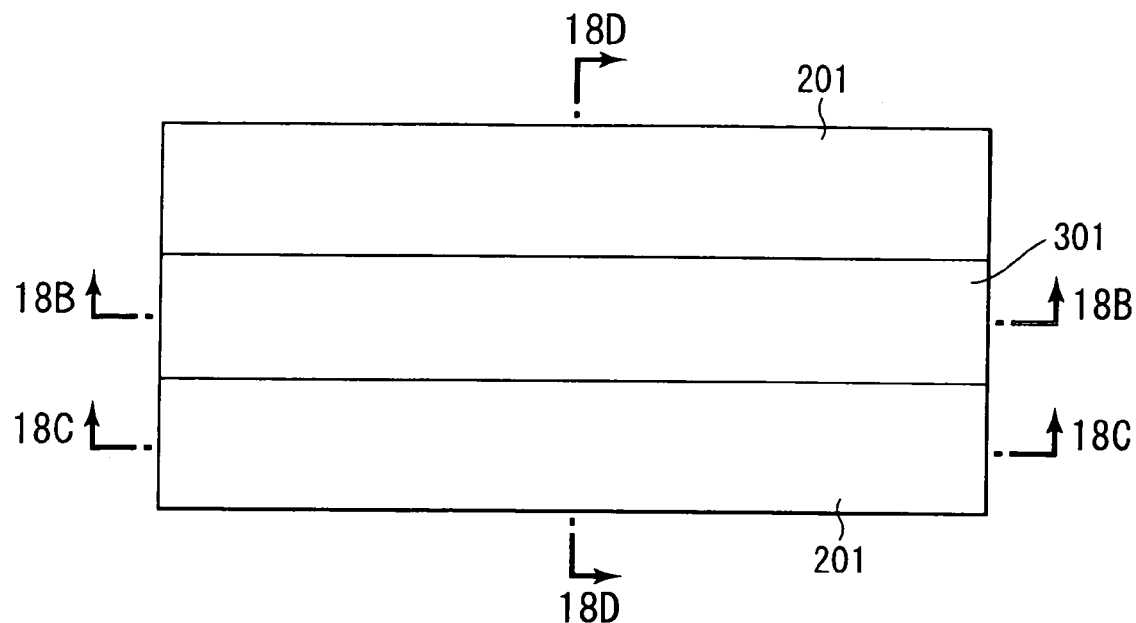
FIG. 18A is a plan view of the semiconductor device in a step of the manufacturing method, of patterning an upper barrier insulation film.
Figure 18B:
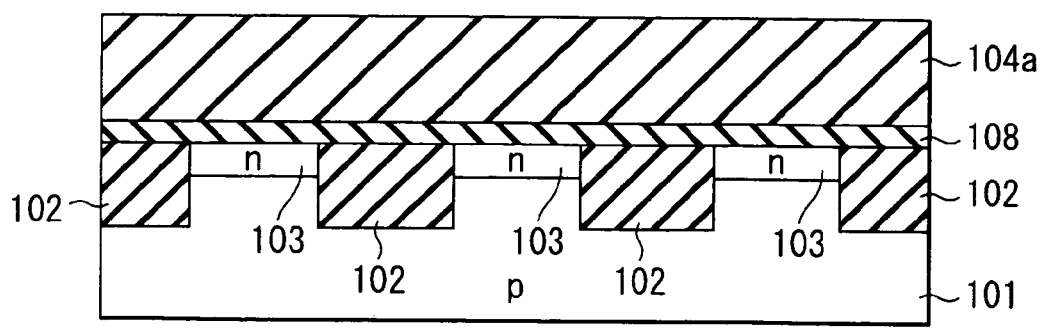
FIG. 18B is a cross sectional view of the semiconductor device shown in FIG. 18A, which is taken along the line 18B—18B of FIG. 18A.
Figure 18C:
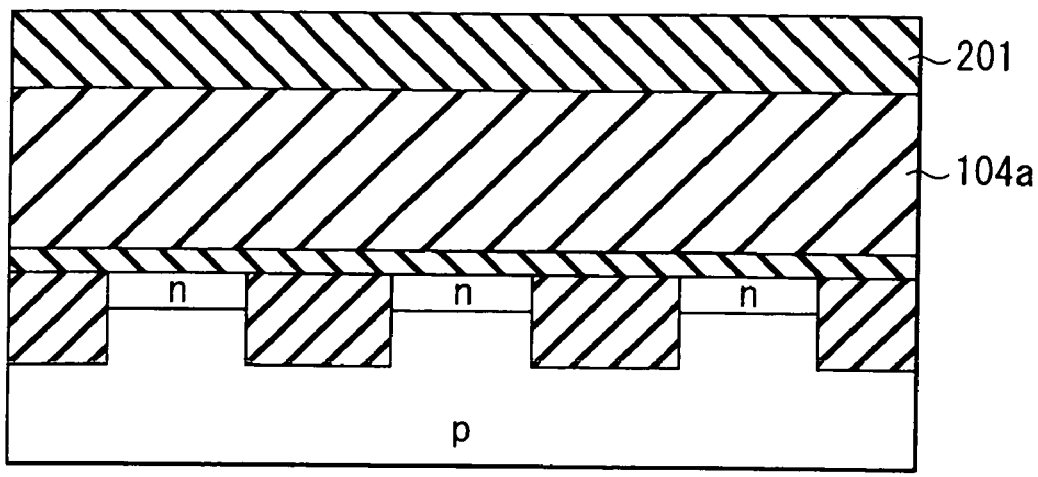
FIG. 18C is a cross sectional view of the semiconductor device shown in FIG. 18A, which is taken along the line 18C—18C of FIG. 18A.
Figure 18D:
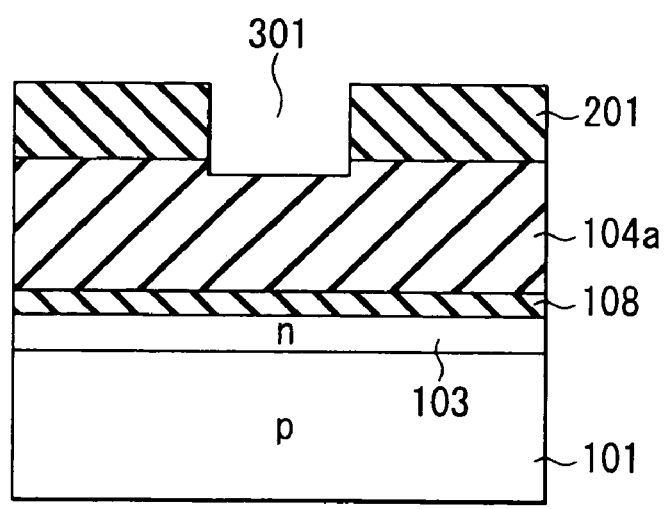
FIG. 18D is a cross sectional view of the semiconductor device shown in FIG. 18A, which is taken along the line 18D—18D of FIG. 18A.
Figure 19A:
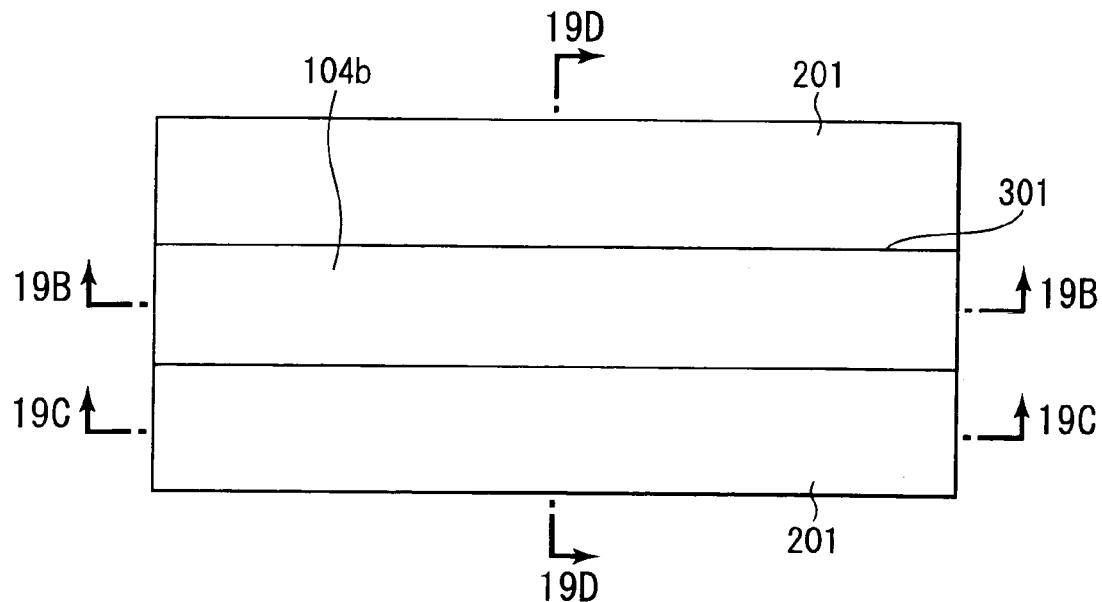
FIG. 19A is a plan view of the semiconductor device in a step of the manufacturing method, of embedding a second interlayer insulation film.
Figure 19B:
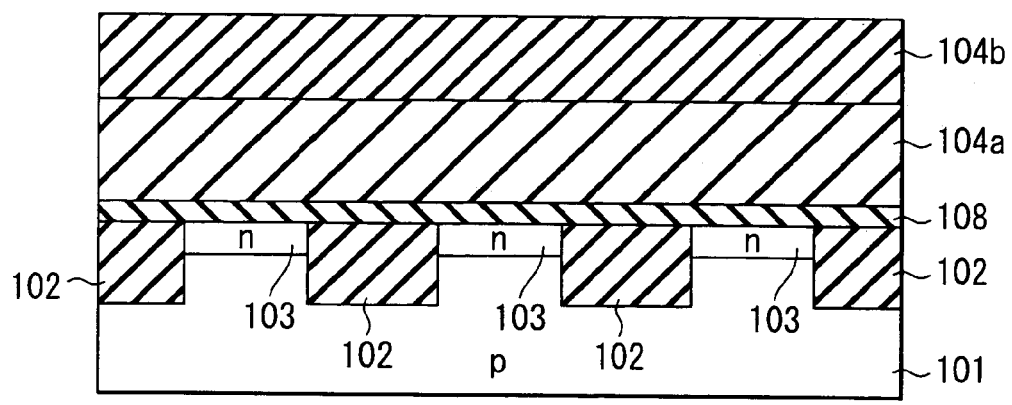
FIG. 19B is a cross sectional view of the semiconductor device shown in FIG. 19A, which is taken along the line 19B—19B of FIG. 19A.
Figure 19C:
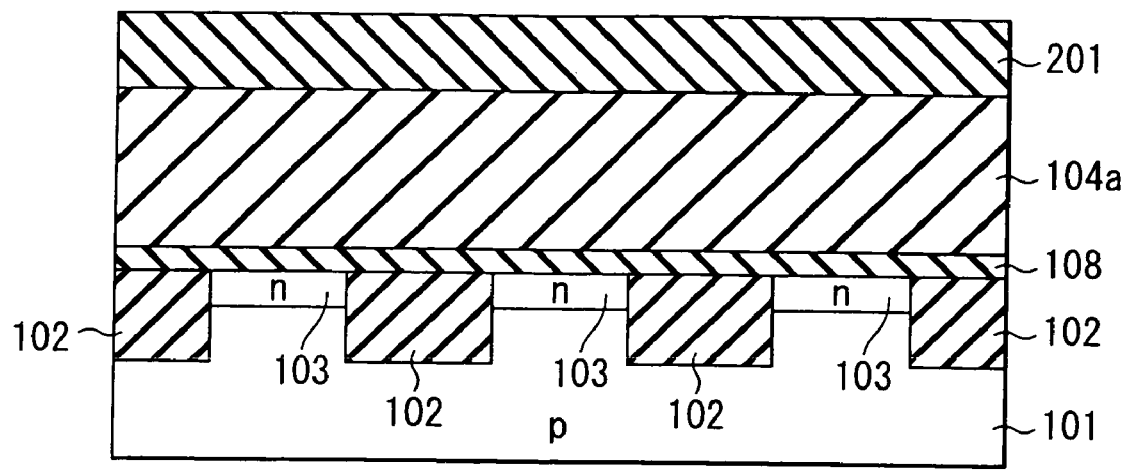
FIG. 19C is a cross sectional view of the semiconductor device shown in FIG. 19A, which is taken along the line 19C—19C of FIG. 19A.
Figure 19D:
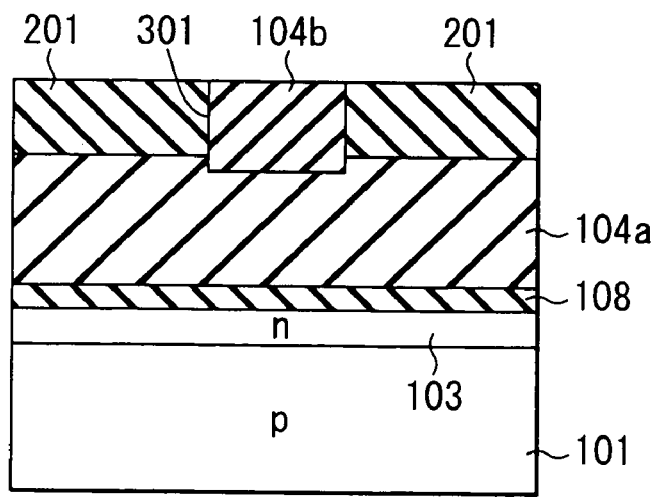
FIG. 19D is a cross sectional view of the semiconductor device shown in FIG. 19A, which is taken along the line 19D—19D of FIG. 19A.
Figure 20A:
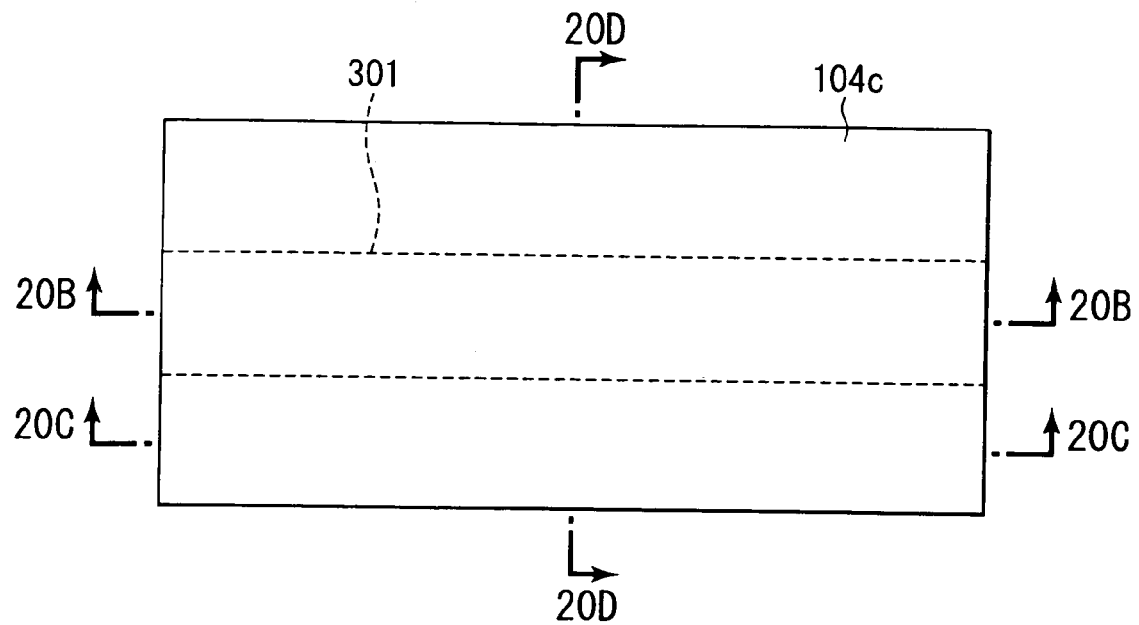
FIG. 20A is a plan view of the semiconductor device in a step of the manufacturing method, of depositing a third interlayer insulation film.
Figure 20B:
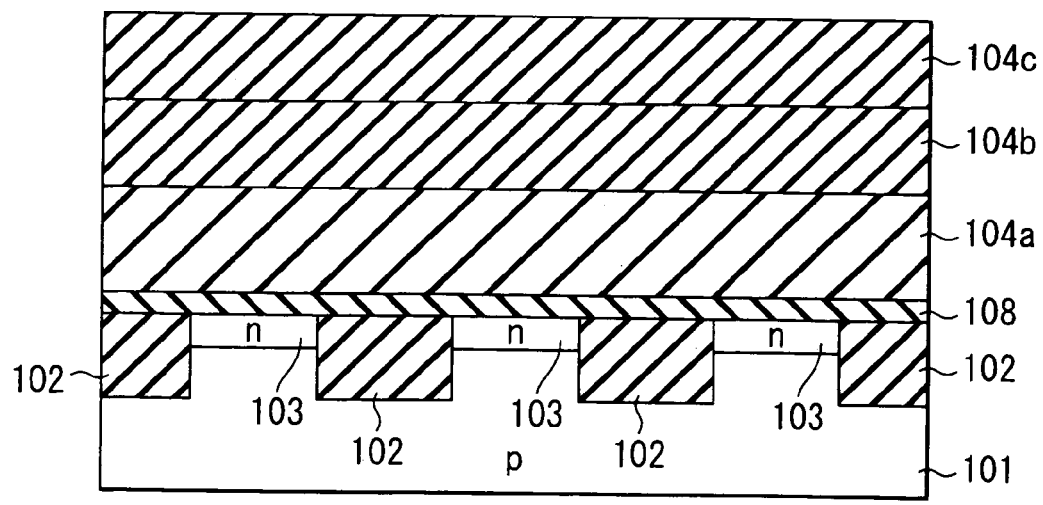
FIG. 20B is a cross sectional view of the semiconductor device shown in FIG. 20A, which is taken along the line 20B—20B of FIG. 20A.
Figure 20C:
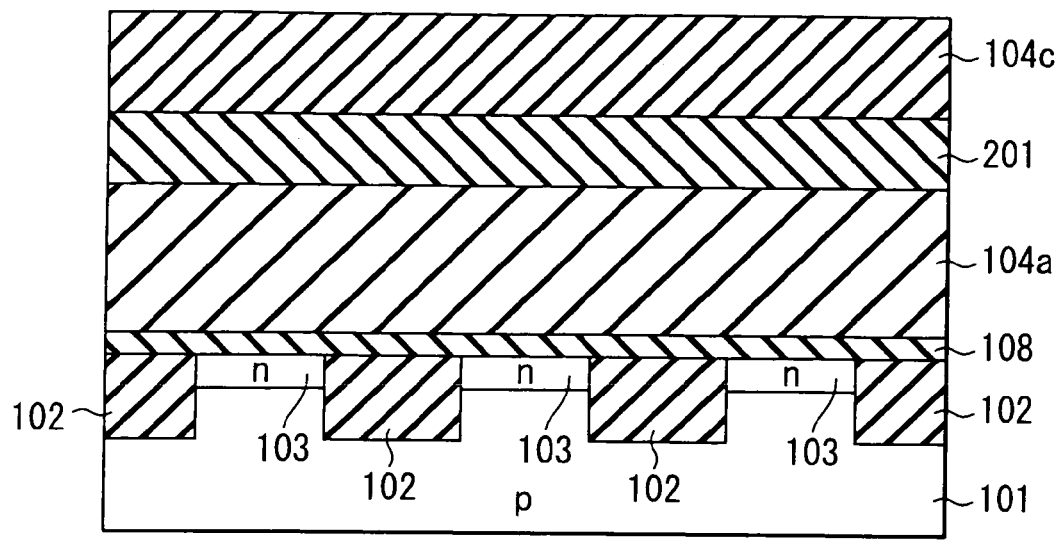
FIG. 20C is a cross sectional view of the semiconductor device shown in FIG. 20A, which is taken along the line 20C—20C of FIG. 20A.
Figure 20D:
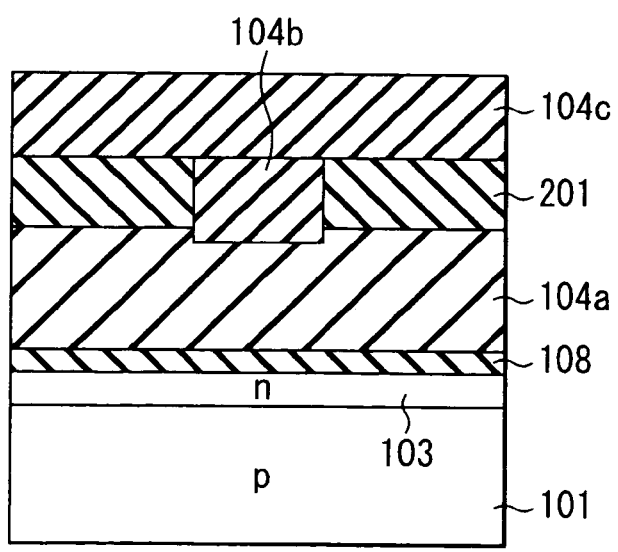
FIG. 20D is a cross sectional view of the semiconductor device shown in FIG. 20A, which is taken along the line 20D—20D of FIG. 20A.
Figure 21A:
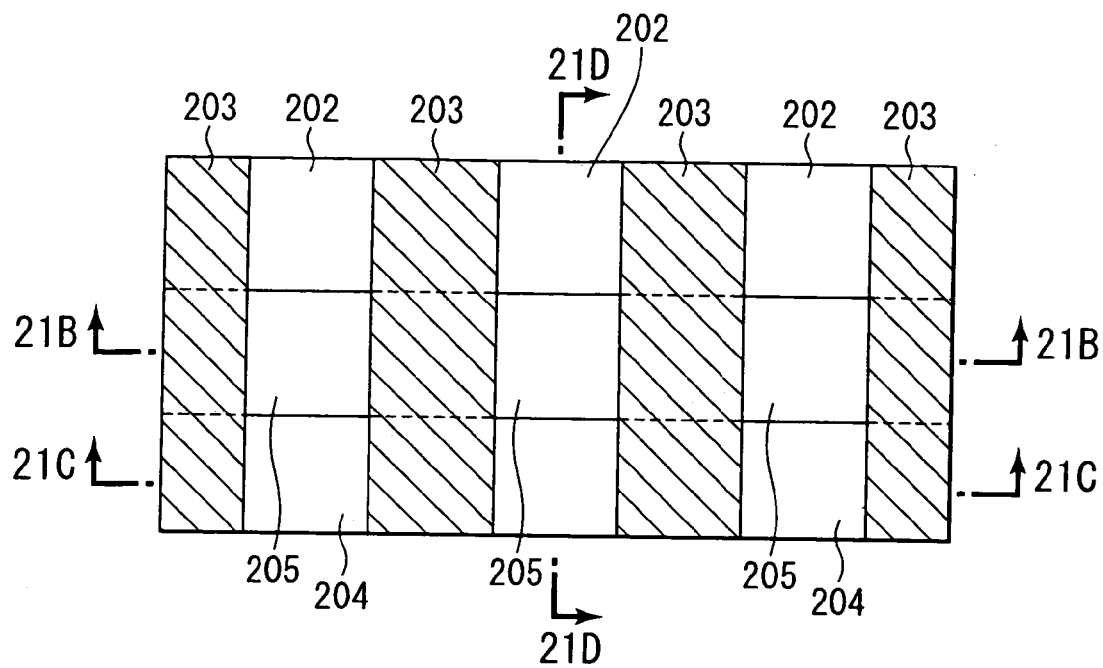
FIG. 21A is a plan view of the semiconductor device in a step of the manufacturing method, of forming a wiring groove and a contact hole.
Figure 21B:
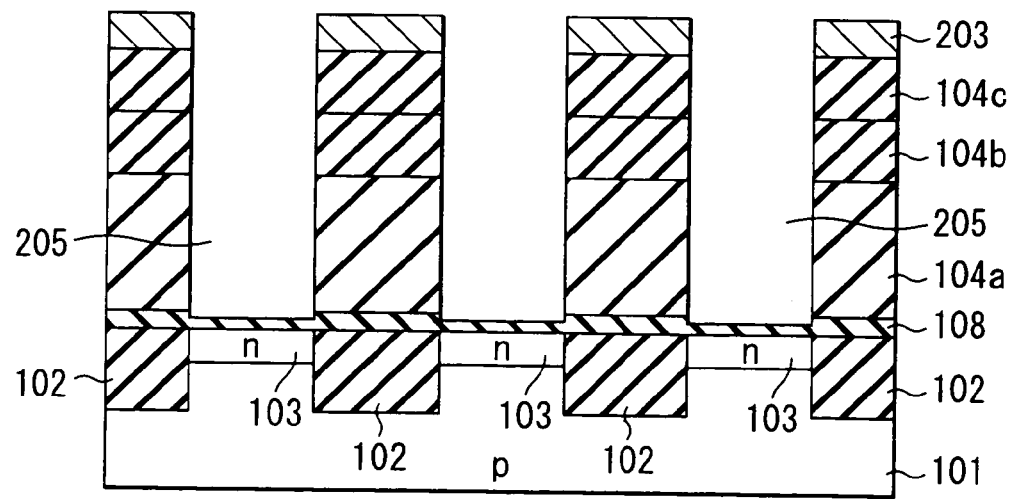
FIG. 21B is a cross sectional view of the semiconductor device shown in FIG. 21A, which is taken along the line 21B—21B of FIG. 21A.
Figure 21C:
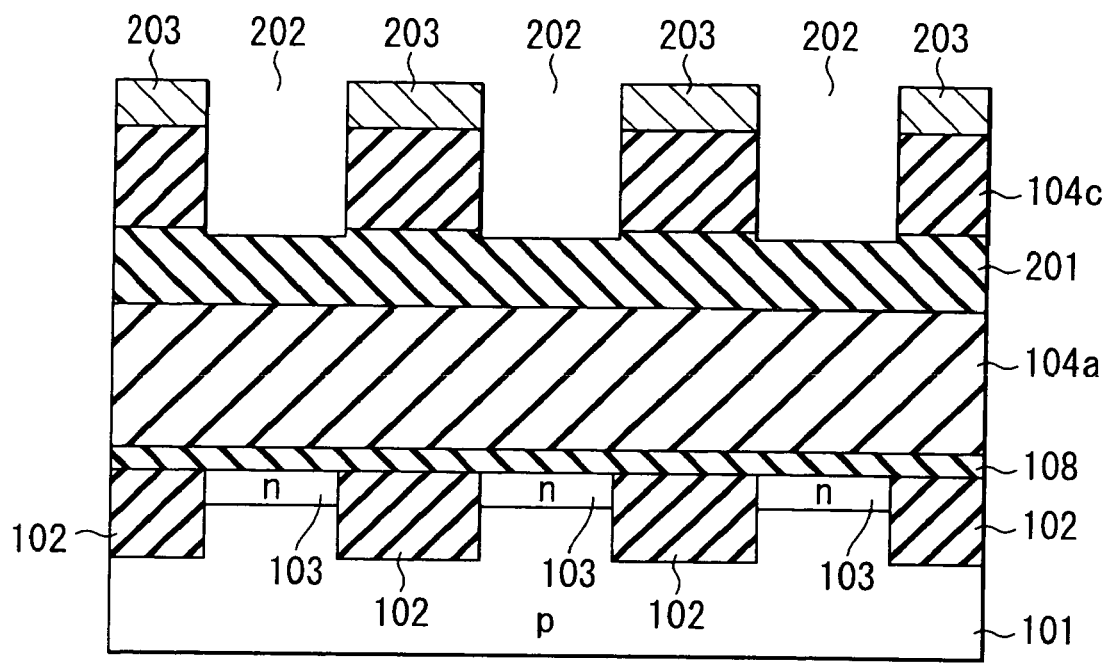
FIG. 21C is a cross sectional view of the semiconductor device shown in FIG. 21A, which is taken along the line 21C—21C of FIG. 21A.
Figure 21D:
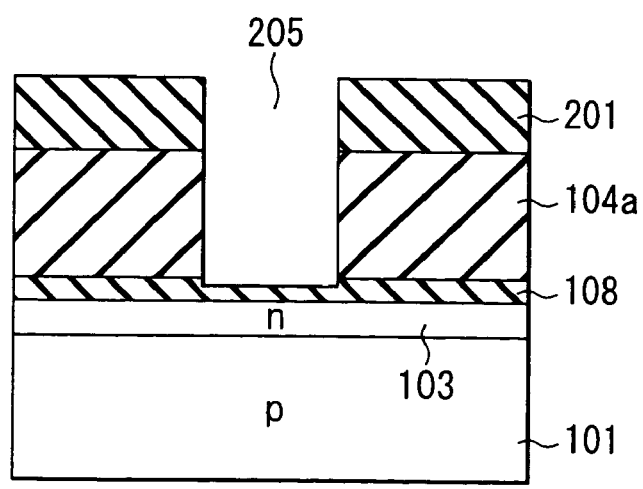
FIG. 21D is a cross sectional view of the semiconductor device shown in FIG. 21A, which is taken along the line 21D—21D of FIG. 21A.
Figure 22A:
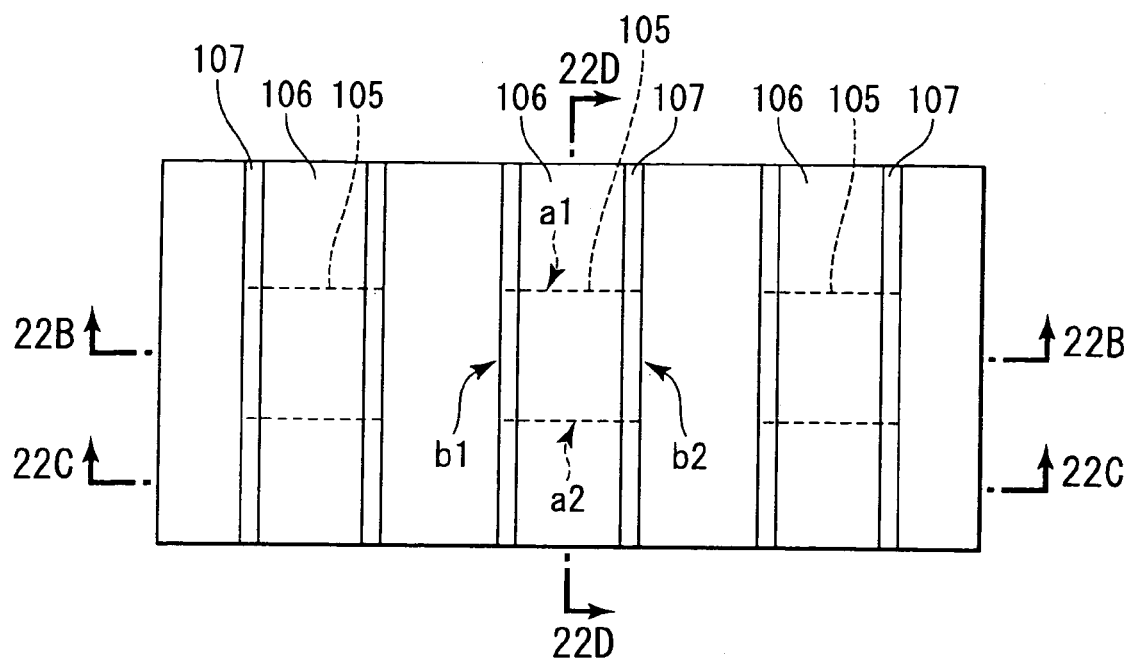
FIG. 22A is a plan view showing a wiring layer and a contact thereof of a semiconductor device according to a further embodiment of the present invention.
Figure 22B:
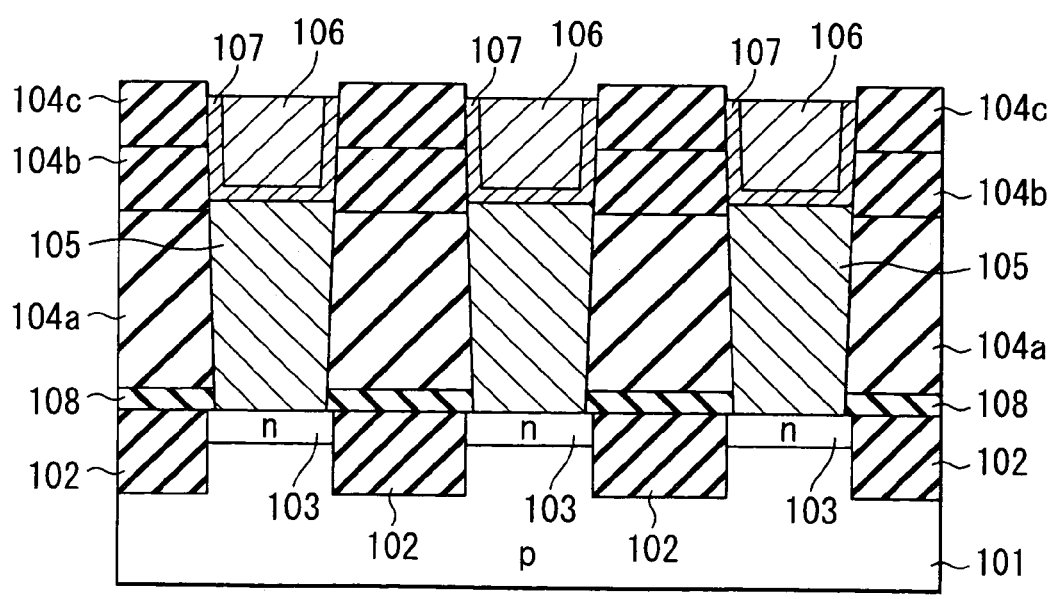
FIG. 22B is a cross sectional view of the semiconductor device shown in FIG. 22A, which is taken along the line 22B—22B of FIG. 22A.
Figure 22C:
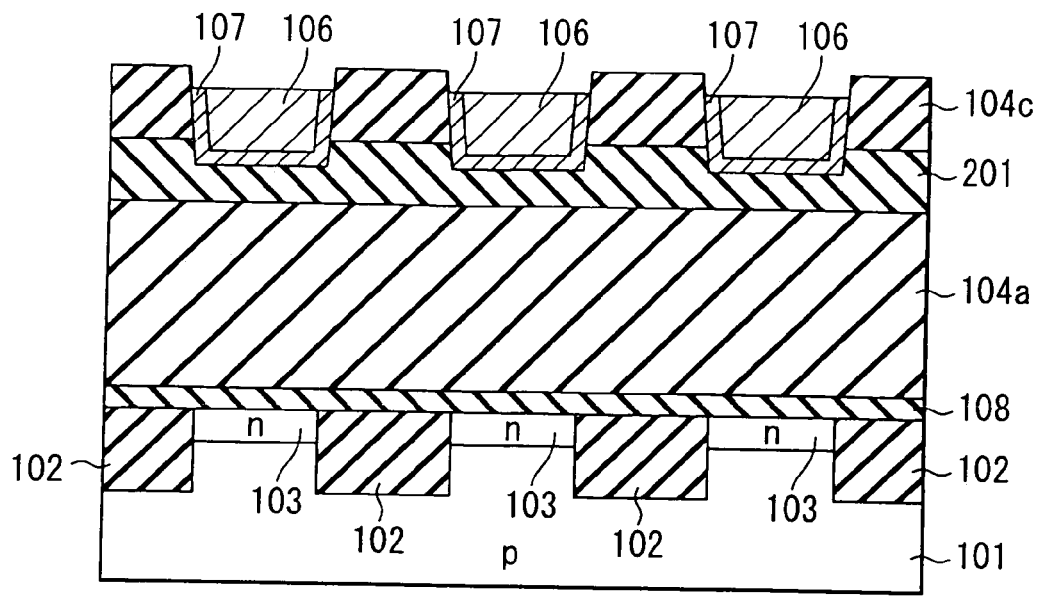
FIG. 22C is a cross sectional view of the semiconductor device shown in FIG. 22A, which is taken along the line 22C—22C of FIG. 22A.
Figure 22D:
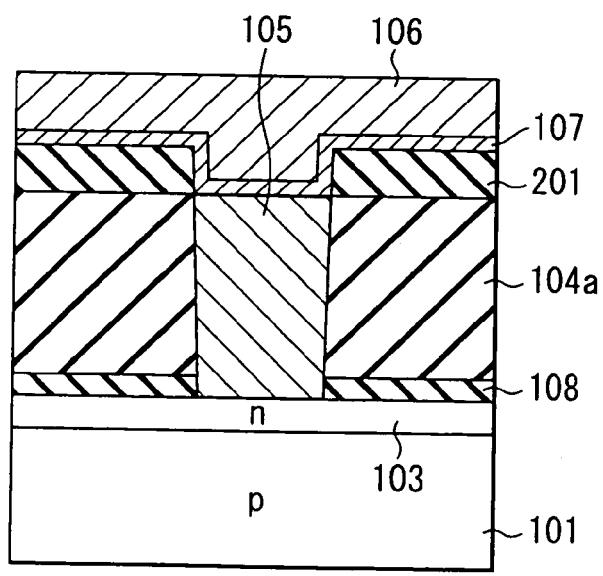
FIG. 22D is a cross sectional view of the semiconductor device shown in FIG. 22A, which is taken along the line 22D—22D of FIG. 22A.

Now, a fourth embodiment will be described in which an upper barrier insulation film used as a mask during contact hole etching uses a structure embedded in the middle of an interlayer insulation film. FIGS. 17A to 17D each show a wiring layer of a semiconductor device and a contact portion thereof according to the fourth embodiment. FIG. 17A is a plan view showing a region in which three wiring layers 106 are arranged. FIGS. 17B, 17C, and 17D are cross sectional views taken along the lines 17B—17B, 17C—17C, and 17D—17D of FIG. 17A, respectively.

Like elements corresponding to those of the embodiments described above are designated by like reference numerals. Two sides b1 and b2 of the four sides defining a contact are defined by a wiring width, and the other two sides a1 and a2 are arranged on one straight line between the contacts 105 arranged in line. The contact plug 105 and wiring layer 106 are embedded with the same wiring layer material. The material embedded is made of a metal material such as tungsten, aluminum, or copper, and is embedded via the barrier metal 107.

In the present embodiment as well, the flat shape of the contact plug 105 is patterned in a rectangular shape rather than in the conventional circular or elliptical shape. Thus, there is no problem that a lithography margin is lowered due to a shorter distance between the contacts. In addition, of the four sides defining the contact 105, since two sides b1 and b2 facing each other between the adjacent contacts are defined by the wiring width, there is no problem with a misalignment between the contact plug 105 and the wiring layer 106.

Unlike the foregoing embodiments, the barrier insulation film 201 serving as a mask when a contact hole is formed is formed to be patterned in advance in accordance with lithography and etching before forming a wiring groove, followed by lithography for forming the wiring groove. In addition, three interlayer insulation films 104a to 104c are used for that purpose.

A manufacturing process of the present embodiment will be described with reference to FIGS. 18A to 18D through FIGS. 21A to 21D. Although the present embodiment shows an example of contact formed on a semiconductor substrate, a via contact between the wiring layers can be embodied in the similar manner, and the similar advantageous effect can be expected.

On the silicon substrate 101, element regions defined by the element separating insulation films 102 are formed in the same manner as in the foregoing embodiments each, and the n-type diffusion layer 103 is formed in each of the element regions. As shown in FIGS. 18A to 18D, the barrier insulation film 108 such as a silicon nitride film, for example, is deposited on the substrate. Then, the interlayer insulation film 104a such as a silicon oxide film and the barrier insulation film 201 such as a silicon nitride film, for example are further deposited thereon. Before depositing the barrier insulation film 108, a silicon oxide film in the range of 1 nm to 50 nm in thickness may be formed as a buffer insulation film in accordance with substrate oxidization or deposition method.

A material for the barrier insulation films 108 and 201 is required to have an etching selection ratio to the interlayer insulation film 104a, and it is desirable that a common material is provided. The thickness of the barrier insulation film 108 is defined as about 10 nm to 300 nm, and the thickness of the barrier insulation film 201 is defined as about 10 nm to 500 nm. The thickness is required to have a sufficient processing margin depending on the thickness of the interlayer insulation film 104a and the etching selection ratio. The thickness of the wiring layer to be formed later is defined to be substantially about 50 nm to 500 nm, depending on the film thickness of the interlayer insulation film 104c.

On the barrier insulation film 201, a long linear groove 301 in the widthwise direction of a wiring layer to be formed later is formed to be etched so as to reach the interlayer insulation film 104a. In patterning this barrier insulation film 201, though not shown, a silicon oxide film is further deposited on the barrier insulation film 201, and the silicon oxide film is formed to be patterned by resist and can be used as a mask. The above description is shown in FIGS. 18A to 18D.

Next, the interlayer insulation film 104 made of a material with an etching selection ratios different from that of the barrier insulation film 201 formed from a silicon oxide film, a silicon nitride film such as silicade glass or the like is deposited. Then, a stripe shaped groove 301 is embedded, and is flattened in accordance with CMP or the like, thereby obtaining the structure of FIG. 19A to FIG. 19D. In addition, in order to recover a fine scratch caused by CMP, as shown in FIGS. 20A to 20D, it is preferable that a material identical to that for the interlayer insulation film 104b after flattened, or an interlayer insulation film 104c formed from a silicon oxide film or a silicon acid nitride film is deposited by about 5 nm to 300 nm.

Next, as shown in FIGS. 21A to 21D, the resist 203 is formed in a pattern having the stripe shaped opening 204 that corresponds to the wiring layer in accordance with lithography. Then, with this resist 203 being a mask, the interlayer insulation films 104c to 104a are etched, and the contact hole 205 is formed at the same time when the wiring groove 202 is formed. In the contact hole 205, the interlayer insulation film 104 is etched when the barrier insulation film 201 formed to be patterned in advance is defined as a mask. However, at a portion of the wiring groove 202 continuous to the contact hole 205, the barrier insulation film 201 serves as an etching stopper, and thereby the depth of the wiring groove 202 is determined.

At this time, the etching condition is required to have a selection ratio to the barrier insulation film 201. In order to prevent the removing of the substrate (or lower layer wiring) due to over-etching, it is desirable that the above etching condition have a selection ratio to the barrier insulation film 108 as well. In the present embodiment, when the removing of the substrate (or lower layer wiring) is not problematic or when etching having a sufficient selection ratio to the substrate (or lower layer wiring) is possible, the barrier insulation film 108 is not required.

Furthermore, the resist 203 is peeled off, and the barrier insulation film 108 is etched until reaching the n-type region. Then, impurities such as phosphor or arsenic are ion-implanted with a dosage of $1 \times 10^{13}$ cm$^{-3}$ to $1 \times 10^{16}$ cm$^{-2}$, for example, whereby the resistance of the n-type region at the contact portion may be lowered.

Subsequently, the barrier metal 107 such as Ti, Ta, TaN, or TiN is deposited in the range of 1 nm to 100 nm in accordance with a sputtering or CVD method, for example. Then, a metal material such as tungsten, aluminum, or copper is deposited in thickness of 10 nm to 1000 nm, and the contact plug 105 and wiring layer 106 are embedded. Thereafter, etching back is carried out in accordance with CMP (Chemical Mechanical Polishing). It is desirable in that the CVD method be used to deposit the film uniformly in a contact hole with a high aspect ratio. In this manner, the wiring structure shown in FIGS. 17A to 17D can be obtained.

In the present embodiment, since the same metal as the wiring layer 106 is embedded as the contact plug 105, a resistive contact can be formed in either of the p-type semiconductor substrate and n-type semiconductor substrate. Further, the barrier insulation film 108 can be thinly formed, and a stress or degradation to the elements on the semiconductor substrate due to the barrier insulation film 108 can be reduced. In addition, even in the case where a step occurs with the semiconductor substrate, a uniform etching stopper film can be formed without the step being embedded in the barrier insulation film 108 because of such thin barrier insulation film 108.

In the present embodiment, in addition to the advantageous effects of <1> to <3> in the foregoing embodiments, the following advantageous effects can be obtained.

<4> Since a process for peeling off the barrier insulation film 201 is not required, a short-circuit margin between contacts or wirings is not lowered by interlayer insulation film etching involving the peeling-off of the barrier insulation film 201. In addition, a short-circuit between the contacts does not occur when the barrier insulation film 108 is etched.

<5> Since a step of the ground layer does not exist during lithography for forming the wiring layer 106, finer wiring can be formed. In addition, since a process for peeling off the barrier insulation film 201 is eliminated, the aspect ratio for processing a contact can be reduced more remarkably than that of the foregoing embodiments each by the released barrier insulation film 201. Thereby, the etching shape or embedding shape of the contact hole can be improved more significantly.

[Fifth Embodiment]

FIGS. 22A to 22D each show a structure of a fifth embodiment which modifies the above described fourth embodiment in correspondence with FIGS. 17A to 17D of the fourth embodiment. The present embodiment is different from the fourth embodiment in that the contact plug 105 made of a material different from that of the wiring layer 106 is embedded. In other words, the contact plug 105 is embedded in the middle of the contact hole by a material different from that of the wiring layer 106 such as poly-crystal silicon in which phosphor or arsenic is doped in, for example, $1 \times 10^{19}$ cm$^{-3}$ or more and $1 \times 10^{22}$ cm$^{-3}$ or less, monocrystalline silicon, amorphous silicon, SiGe mixture crystal, or SiGe mixture crystal. The wiring layer 106 is embedded in the wiring groove and in the upper part of the contact plug 105 of the contact hole. The present embodiment is the same as the fourth embodiment in that the barrier metal 107 is provided as a ground layer for the wiring layer 106.

The basic manufacturing process according to the present embodiment is similar to that according to the fourth embodiment of the present invention. That is, the wiring groove 202 and the contact hole 205 are formed in a process similar to that of the present embodiment. Thereafter, the wiring groove and contact hole are embedded with poly-crystalline silicon in which impurities such as phosphor or arsenic, for example, are doped at a high concentration, etching back is carried out in accordance with anisotropic etching or isotropic etching such as CDE (Chemical Dry Etching), and thereby the contact plug 105 is embedded in the middle of the contact hole 205. Then, after depositing the barrier metal 107 such as Ti, Ta, TaN, or TiN, a metal material such as tungsten, aluminum, or copper is deposited, etching back is carried out in accordance with CMP or the like, and thereby as shown in FIGS. 22A to 22D, the wiring layer 106 is embedded. The wiring layer 106 is embedded in the upper part of the contact hole 105 as well.

According to the present embodiment, in addition to the advantageous effects of <1> to <5> of the foregoing embodiments, the following advantageous effect can be achieved.

<6> As the aspect ratio of the contact becomes high, the coverage of the barrier metal is likely to be insufficient. As a result, a leak current between the contact and the substrate (or lower layer wiring) increases. In the present embodiment, since the contact is embedded in poly-crystalline silicon, an increase in leak current caused by the unsatisfactory coverage of the barrier metal can be prevented. In addition, since the lower part of the contact is embedded in advance, the aspect ratio for embedding the wiring layer and the upper part of the contact is reduced, so that the characteristics for embedding the barrier metal and metal are improved.

[Sixth Embodiment]

A sixth embodiment for specifically applying the present invention to EEPROM will now be described here. Also in the following embodiment, like elements corresponding to those according to the foregoing embodiments each are designated by like reference numerals, and a detailed description is omitted here. The EEPROM is of NAND type, and the previously described second embodiment is applied to a data transfer line contact.

Figure 23:
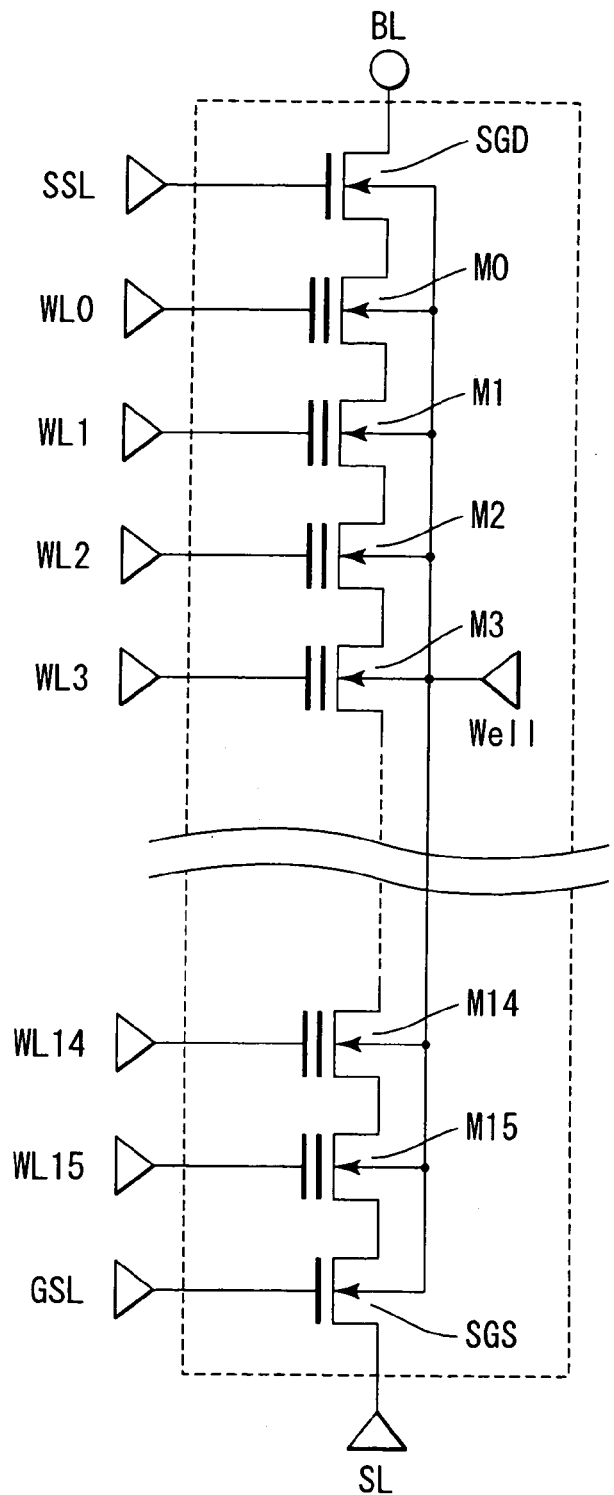
FIG. 23 is a diagram showing an equivalent circuit of a NAND cell unit according to a further embodiment of the present invention.

FIG. 23 shows an equivalent circuit of a memory cell unit (a NAND cell unit). A plurality of memory cells M (M0 to M15) (16 cells in the figure) and selection transistors SDG and SGS are connected in series in the form that the adjacent elements share a diffusion layer, and one NAND cell unit is formed. A control gate of each memory cell M is connected to word lines WL (WL0 to WL15). One end of the NAND cell is connected to a bit line BL, and the other end is connected to a common source line SL. Such NAND cell units are arranged in plurality to share the word lines in the word line direction, and a memory cell block is configured. In order to select one NAND cell unit in the memory cell block, the gates of the selection transistors SGD and SGS are arranged as selection gate lines SSL and GSL parallel to the word lines WL.

Figure 24:
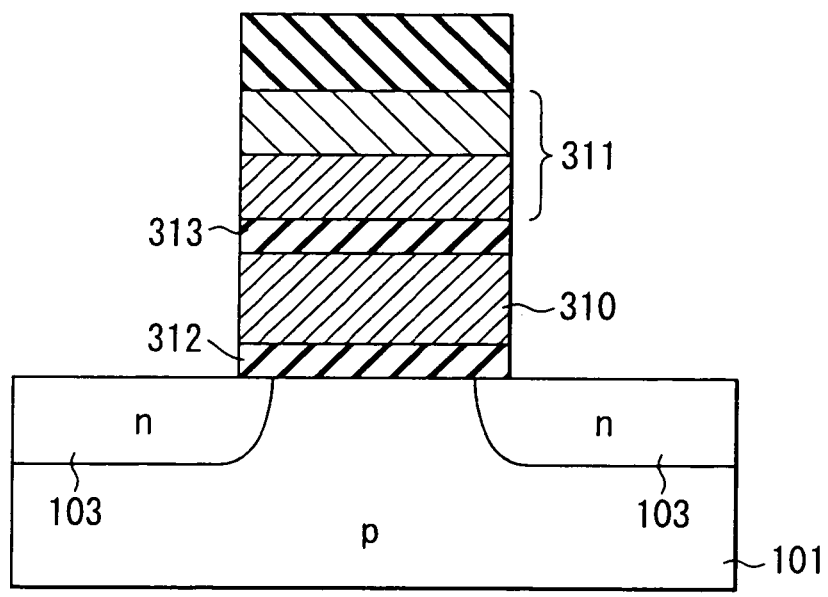
FIG. 24 is a cross sectional view showing a memory cell structure according to the embodiment of the present invention.
Figure 25:
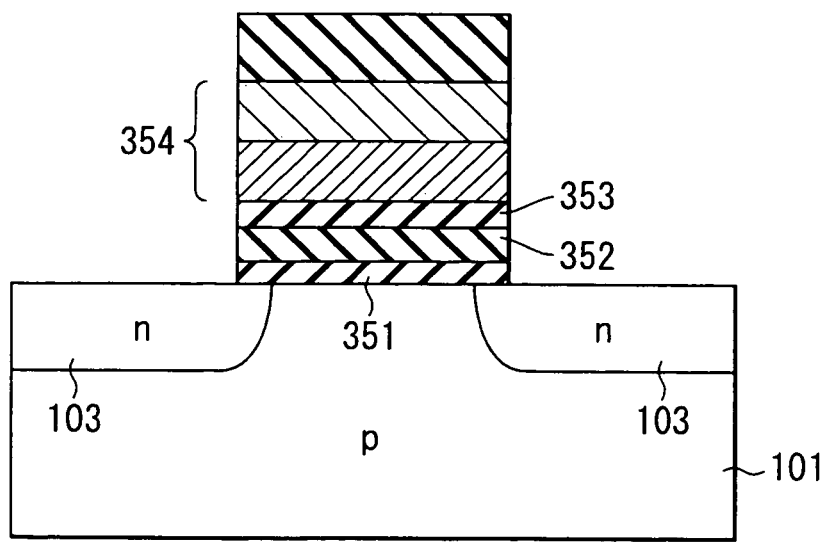
FIG. 25 is a cross sectional view showing another memory cell structure according to the embodiment of the present invention.

The memory cell M has a stacked gate structure in which, for example, as shown in FIG. 24, a floating gate 310 is formed on a tunnel insulation film 312 on which a control gate 311 is laminated via an inter-gate insulation film 313. Alternatively, as shown in FIG. 25, there is used a MONOS type memory cell as well having a laminated structure of a tunnel insulation film (silicon oxide film) 351, a silicon nitride film 352, and a silicon oxide film 353, the silicon nitride film 352 being used as a charge strage insulation film.

In the memory cell block, any one of the selection gate lines SSL and GSL may be provided. It is desirable that this line is formed in the same direction as in word lines (data selection lines) WL0 to WL15 in order to ensure high density. Although the number of memory cells of the NAND cell unit may be plural, it is desirable that the number of these memory cells is 2n (n is a positive integer) in order to decode an address.

The NAND cell units are arranged to share the bit lines BL in the direction of bit lines BL (data transfer lines) arranged to cross the word lines WL, and the NAND cell units are formed in a matrix shape. In such an array layout, it is required to store data independent of each memory cell. Therefore, wiring between the adjacent NAND cell units is required to be connected independently to an n-type drain diffusion layer of the selection transistor SGD of the respective NAND cell units as shown in the first embodiment of the present invention.

Figure 26:
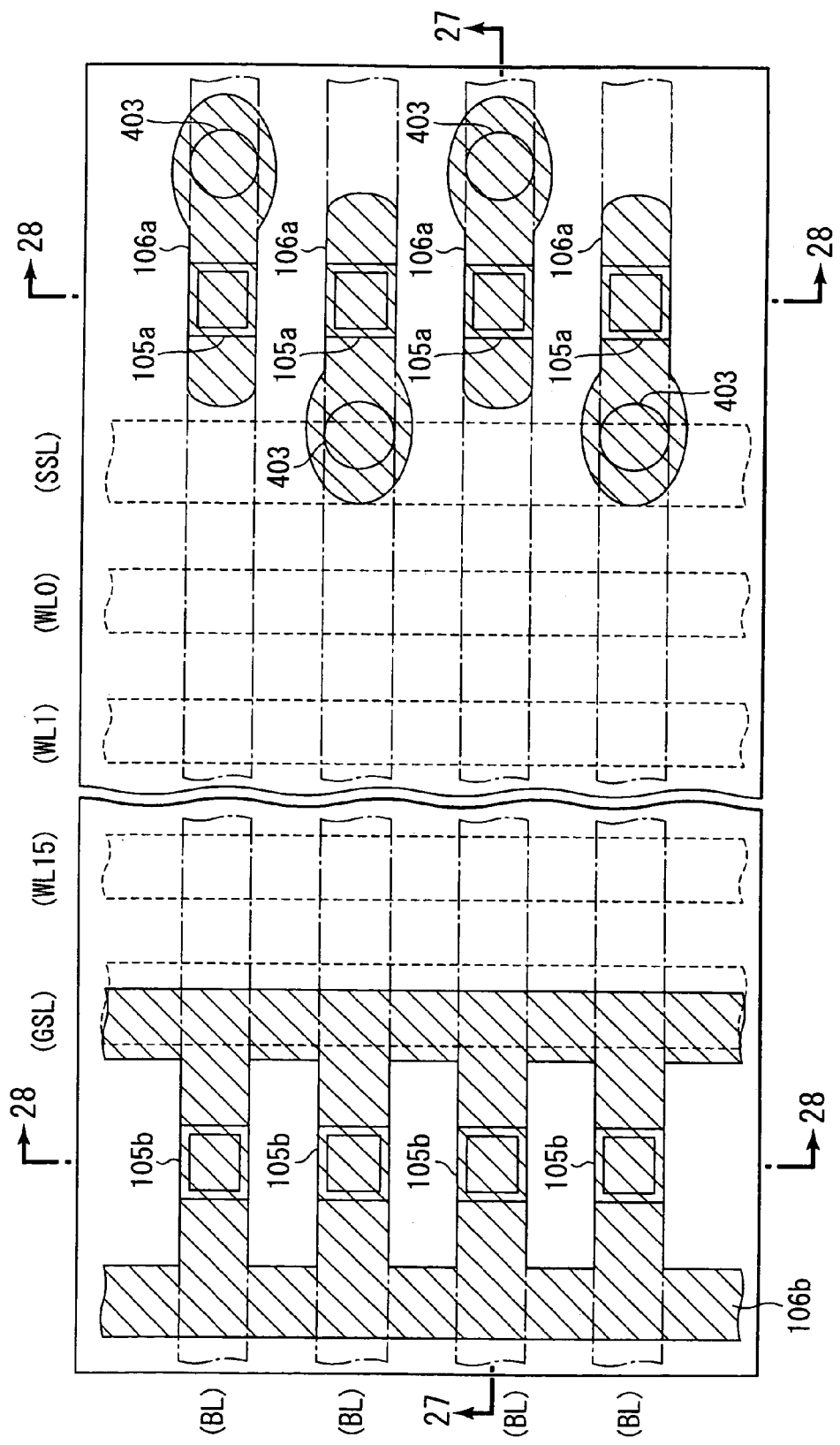
FIG. 26 is a plan view showing a cell array according to the embodiment of the present invention.
Figure 27A:
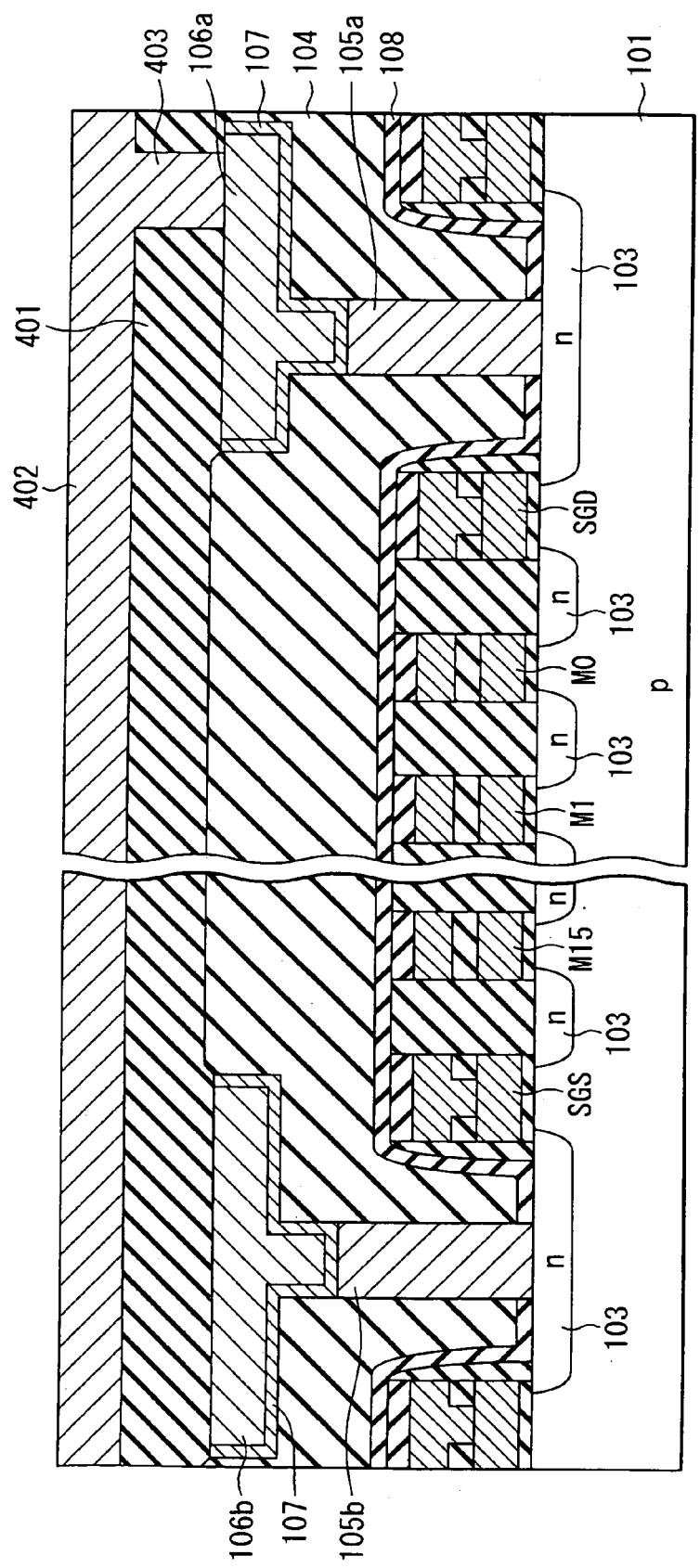
FIG. 27A is a cross sectional view of the cell array shown in FIG. 26, which is taken along the line 27—27 of FIG. 26.
Figure 28A:
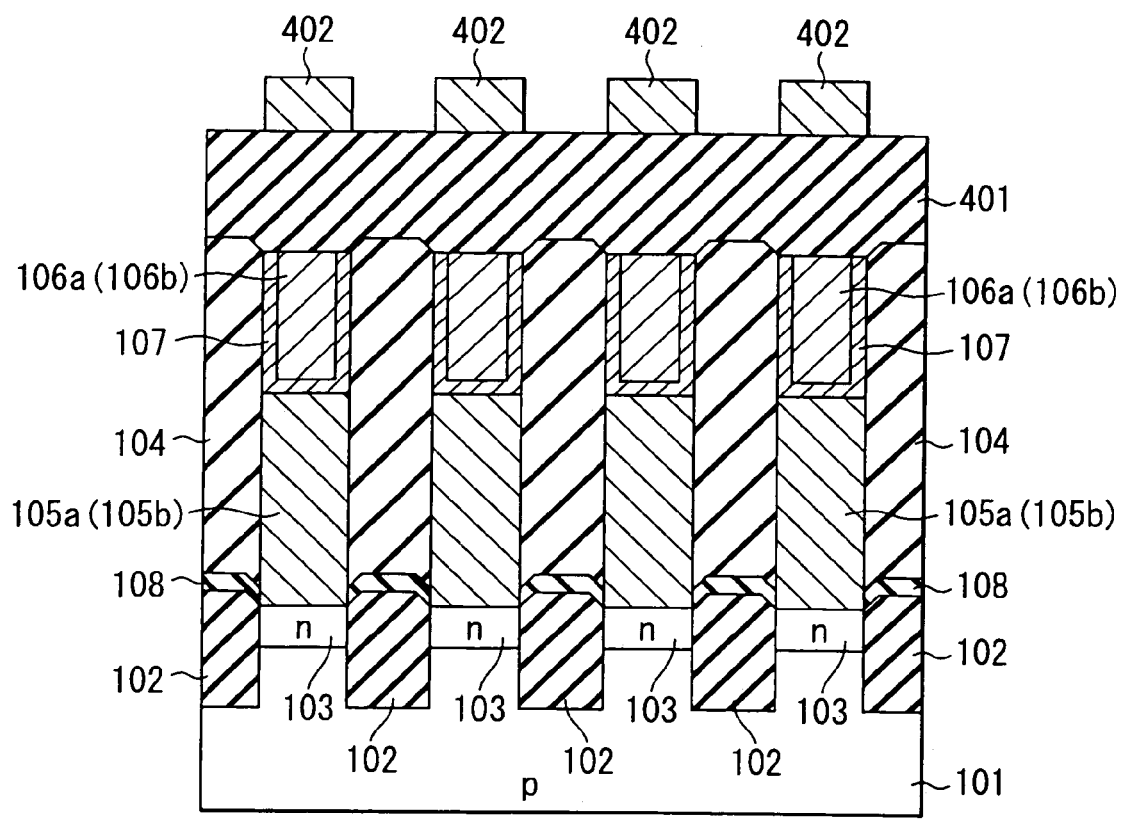
FIG. 28A is a cross sectional view of the cell array shown in FIG. 26, which is taken along the line 28—28 of FIG. 26.

FIG. 26 is a layout of a memory cell block. FIG. 27A is a cross sectional view taken along the line 27—27 of FIG. 26, and FIG. 28A is a cross sectional view common to the line 28—28. In the cell array region of the silicon substrate 101, element forming regions are defined in a stripe shape by the element separating insulation films 102. In the element forming regions, there are formed the n-type diffusion layer 103 that is a source or drain, the selection transistors SGD and SGS and the memory cells M0 to M15, each of which has a required gate structure. As shown in FIG. 26, the control gates of the memory cells are connected to form continuous layers used as the word lines WL0 to WL15. The gates of the selection transistors SGD and SGS as well are patterned to form continuous layers used as the selection gate lines SSL and GSL.

The thus formed memory cells each are covered with the insulation film 108 such as a silicon nitride film, a silicon acid nitride film, or an aluminum oxide film. The barrier insulation film 108 has a role of an etching stopper for preventing the bit line contact 105a and source line contact 105b from being formed to extend into the element separation region. At least two sides of the source line contact 105b are defined in a self-align manner depending on the width of a common source line 106b, and the other two sides are formed to be arranged on line among the contacts 105b arranged in line. Similarly, two sides of the bit line contact 105a are defined in a self-align manner depending on the width of the bit line lead-out wiring 105a, and the other two sides are formed so as to arranged on line among the contacts 105a arranged in line.

The bit line lead-out wiring 106a is formed of a conductor material in the same layer as in the common source line 106b. This wiring is connected via a via contact 403 to a bit line 402 formed on an interlayer insulation film 401 formed on these wirings 106a and 106b. The via contact 403 to the bit line lead-out wiring 106a is formed to be alternatively distributed on both sides of the arrangement of the bit line contacts 105a. The bit line lead-out wiring 106a and common source line 106b correspond to the wiring layer 106 described in the foregoing embodiments each, and these contacts 105a and 105b correspond to the contact 105 in the foregoing embodiments each.

The contact plugs 105a and 105b are formed by embedding poly-crystalline silicon doped at a high concentration in accordance with the second embodiment of the present invention. The wiring layers 106a and 106b connected at upper portions of the contact plugs are formed by embedding a metal material such as tungsten, aluminum, or copper via the barrier metal 107 such as Ti, Ta, TaN, or TiN.

Figure 27B:
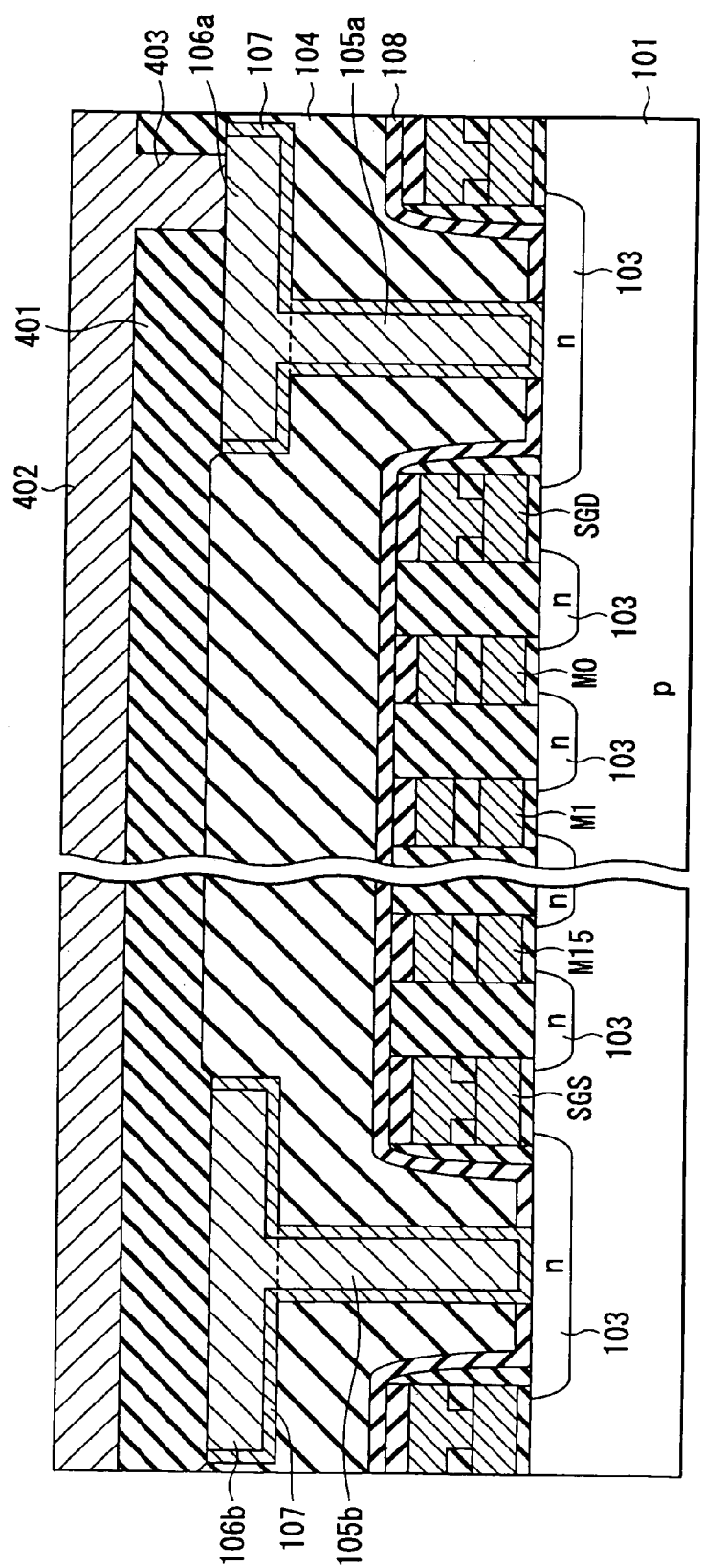
FIG. 27B is a cross sectional view of a modification of the cell array shown in FIG. 26 and corresponds to the cross sectional view of FIG. 27A.
Figure 28B:
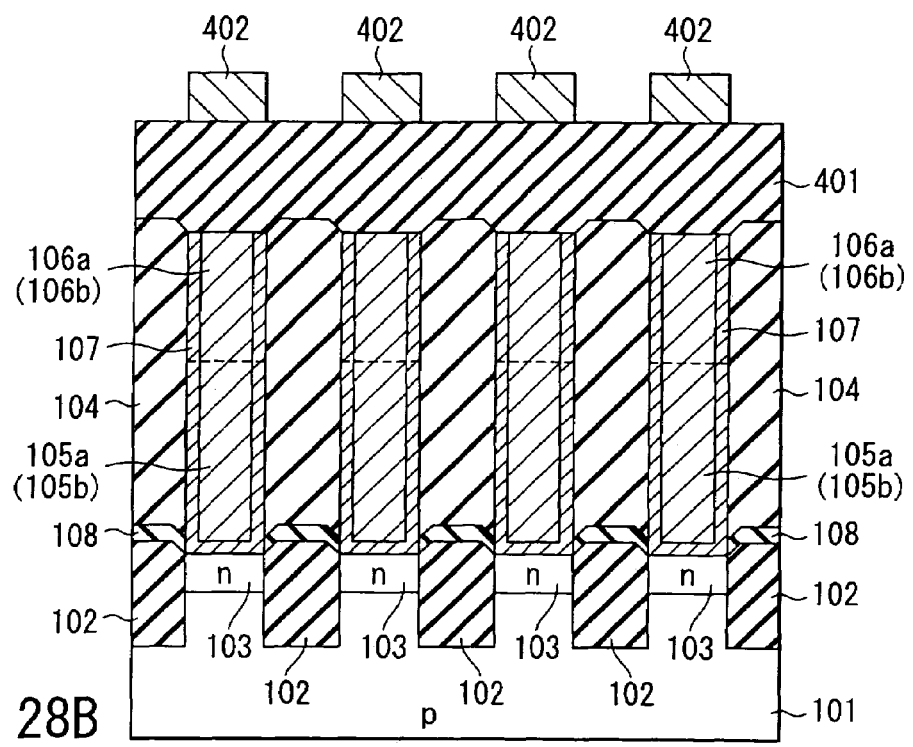
FIG. 28B is a cross sectional view of a modification of the cell array shown in FIG. 26 and corresponds to the cross sectional view of FIG. 28A.

Alternatively, as shown in FIGS. 27B and 28B, similarly to the first embodiment, the contact plugs 105a and 105b and wiring layers 106a and 105a both may be formed by embedding a metal material such as tungsten, aluminum, or copper via a barrier metal 107 such as Ti, Ta, TaN, or TiN. FIGS. 27B and 28B correspond to FIGS. 27A and 28A, respectively.

Figure 27C:
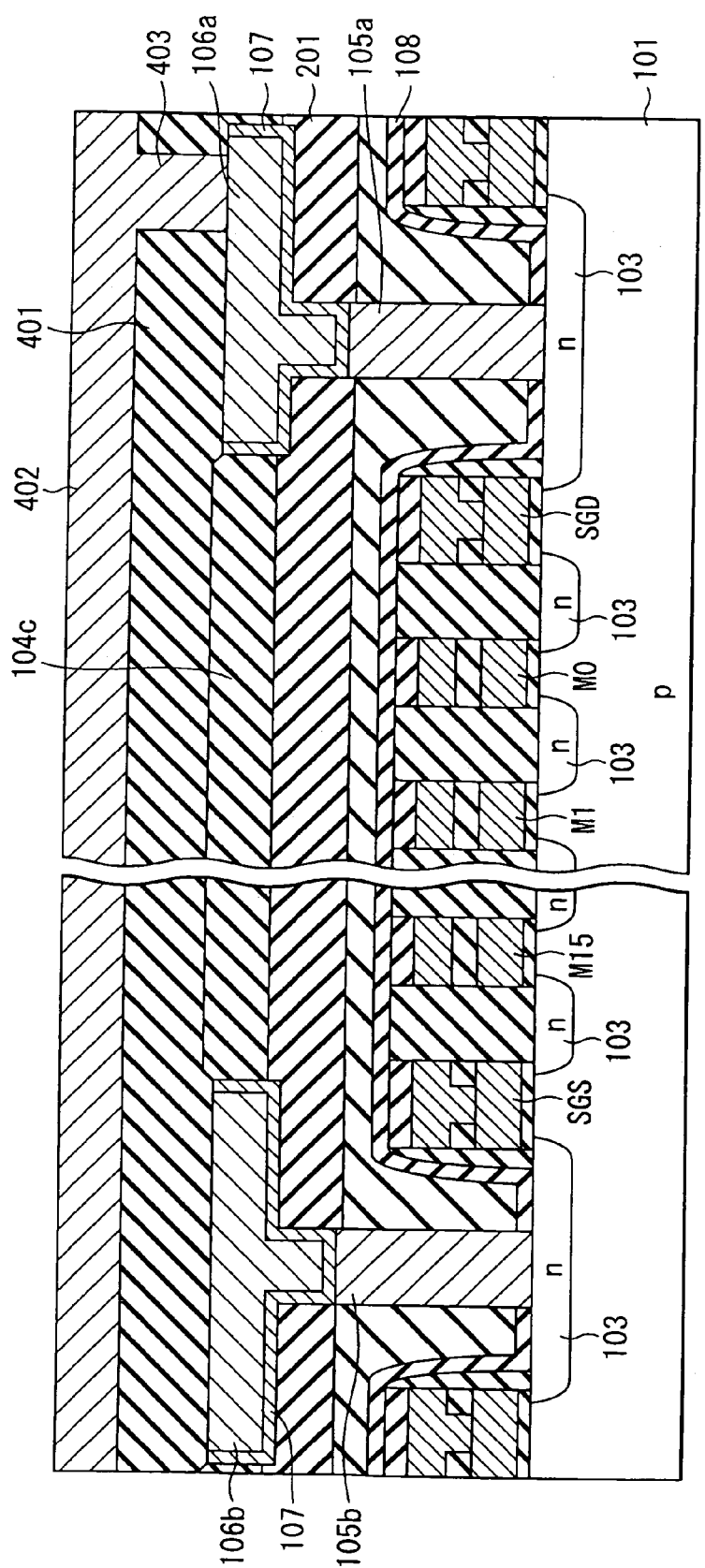
FIG. 27C is a cross sectional view of another modification of the cell array shown in FIG. 26 and corresponds to the cross sectional view of FIG. 27A.
Figure 28C:
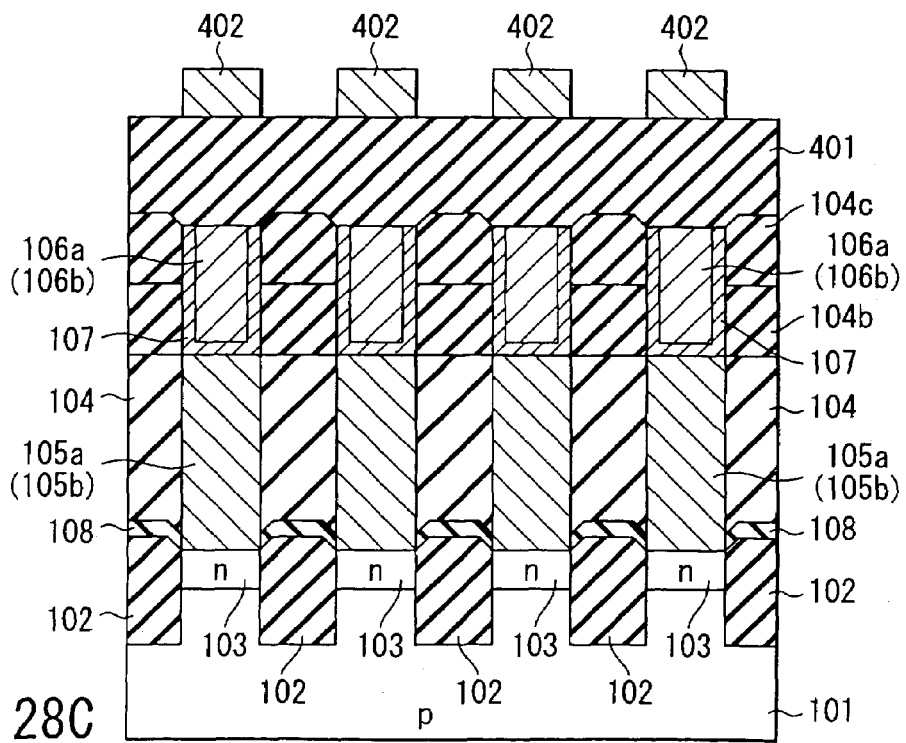
FIG. 28C is a cross sectional view of another modification of the cell array shown in FIG. 26 and corresponds to the cross sectional view of FIG. 28A.

Furthermore, when the methods shown in the fourth and fifth embodiments are taken, three interlayer insulation films 104a to 104c may be used as shown in FIGS. 27C and 28C.

FIGS. 29A and 29B to FIGS. 32A and 32B are views each showing a wiring forming process after forming an element. Each of FIGS. 29A to 32A shows a layout in which attention is paid to a bit line contact portion and a common source line contact portion. FIGS. 29B to 32B is a common cross sectional view taken along the lines 29B—29B to 32B—32B of FIGS. 29A to 32A, respectively.

Figure 29A:
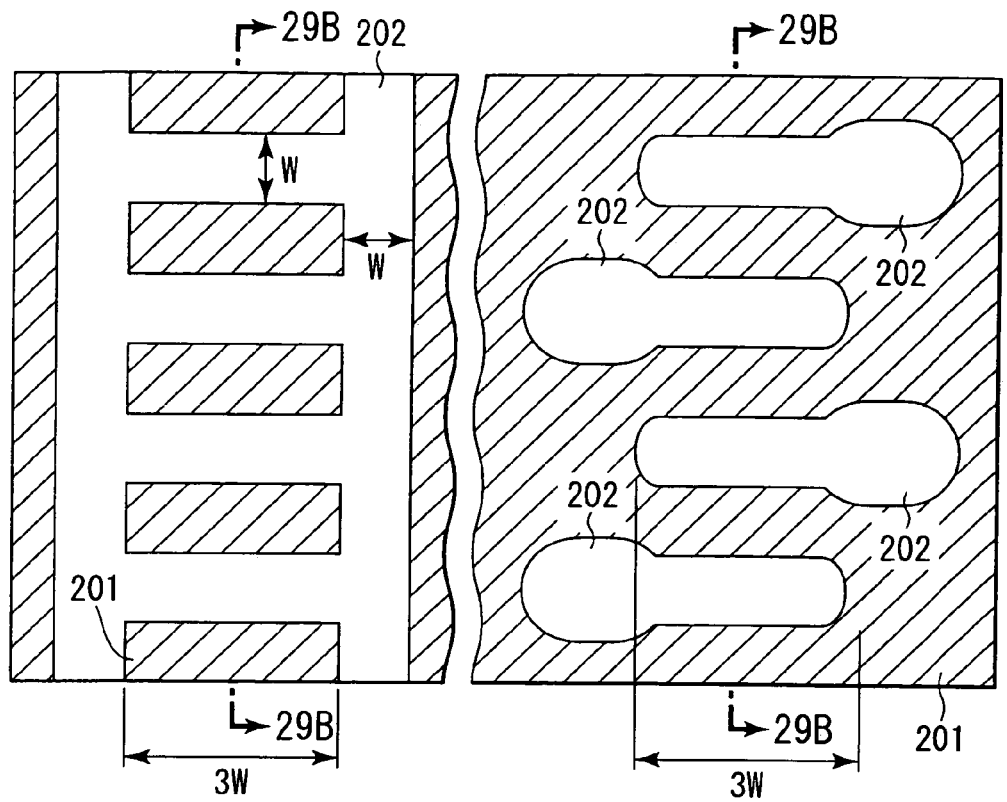
FIG. 29A is a plan view of the semiconductor device array in a step of the manufacturing method, of forming a wiring groove for a bit line lead-out wiring and a common source line according to the embodiment of the present invention.
Figure 29B:
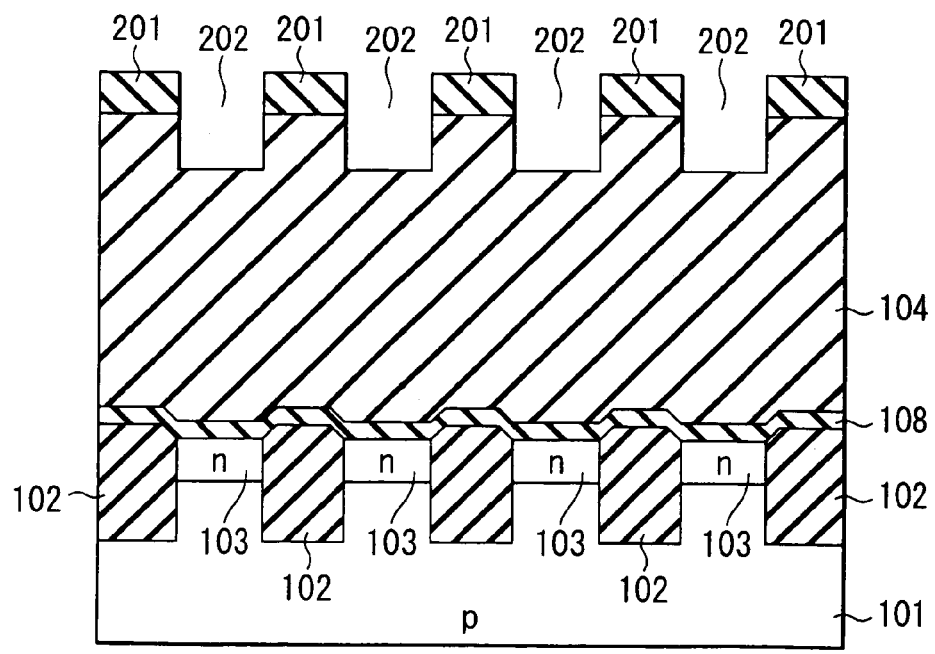
FIG. 29B is a cross sectional view of the semiconductor device shown in FIG. 29A, which is taken along the line 29B—29B of FIG. 29A.

As shown in FIGS. 29A and 29B, after forming the element, the barrier insulation film 108, interlayer insulation film 104, and barrier insulation film 201 are deposited. Then, the barrier insulation film 201 is selectively etched, and the wiring grooves 202 for bit line lead-out wirings and common source wirings are patterned. The wiring grooves 202 forming the common source lines and bit line lead-out wirings are formed in the same width W. This forming is desirable in order to meet the lithography and etching conditions for the common source line contact and bit line contact and produce uniform contacts. In addition, the lengths in the wiring longitudinal direction (bit line direction) of the wiring grooves 202 for the bit line lead-out wiring portion and common source line portion are defined as at least 3W or more. In this manner, the lowering of resolution due to an end effect is prevented, the short diameter of a more uniform wiring layer can be achieved, and a low resistance and an inter-wiring interval both can be maintained.

As an aligning ground layer in lithography for forming the wiring groove 202, it is desirable to provide an element forming region in a stripe shape in which a common source wiring and a bit line lead-out wiring are required to be aligned with each other in order to reduce a contact resistance. Further, in this manner, a contact is formed in the element separation region to prevent a misalignment between the element region and the contact region. A contact material reaches the p-type well beneath the contact, and thereby the frequency of failures in which the breakdown voltage across the p-type well and the contact material can be lowered.

Figure 30A:
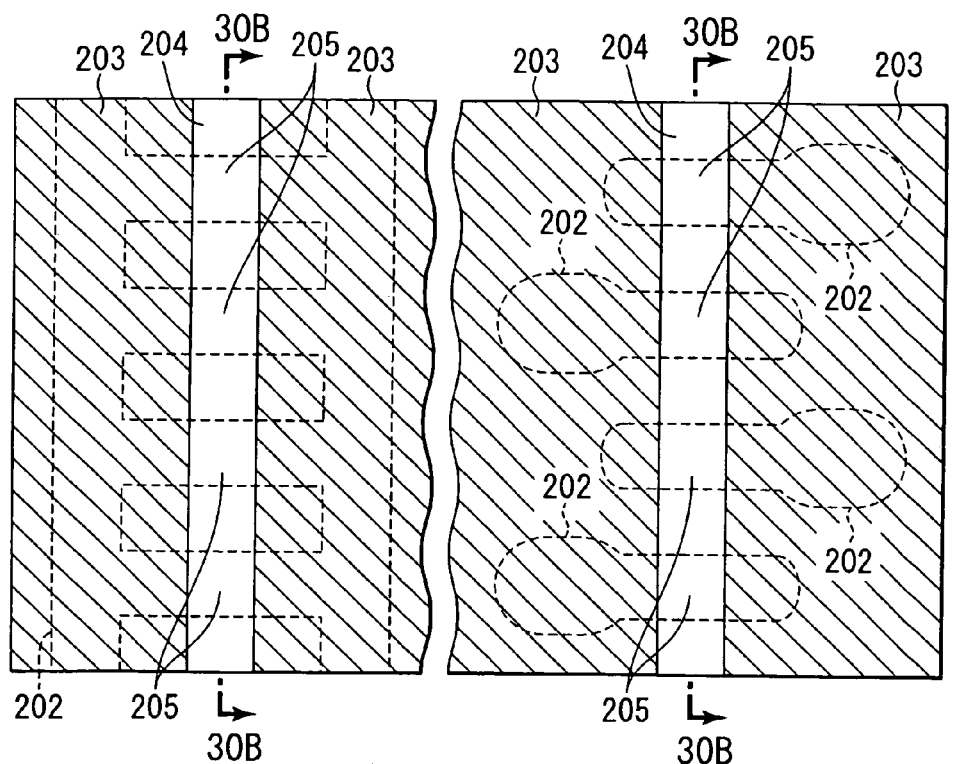
FIG. 30A is a plan view of the semiconductor device array in a step of the manufacturing method, of forming a contact hole for a bit line lead-out wiring and a common source line.
Figure 30B:
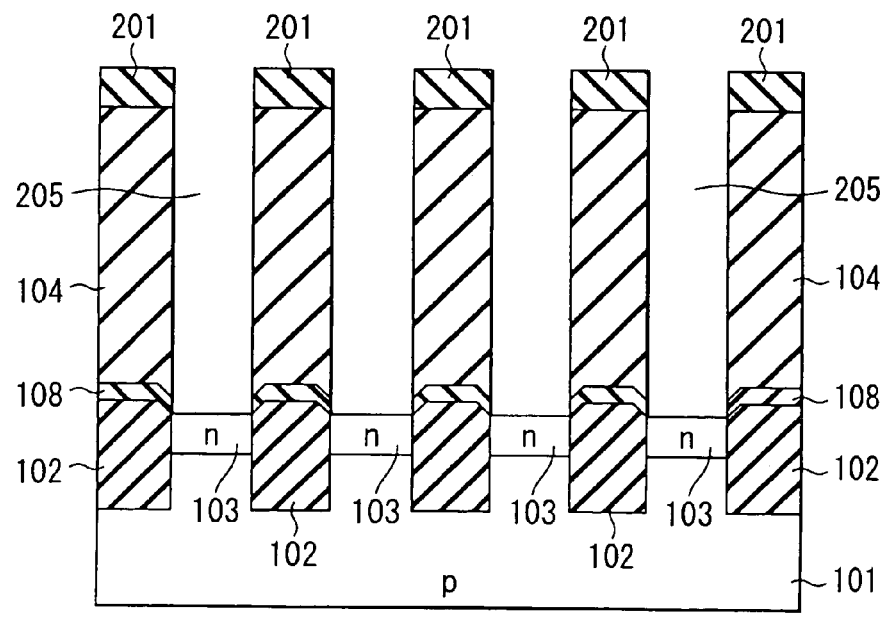
FIG. 30B is a cross sectional view of the semiconductor device shown in FIG. 30A, which is taken along the line 30B—30B of FIG. 30A.

In accordance with lithography, as shown in FIGS. 30A and 30B, there is formed a resist pattern 203 having a long linear opening 204 in the arrangement direction of the bit line contacts and common source line contacts and arranged in line, respectively. It is desirable that portions, at which contacts of the common source line and bit line lead-out line are formed, are formed in the same opening width in order to meet the lithography and etching conditions for the respective contacts and produce uniform contacts. Selection gate lines SSL and GSL patterned as continuous layers in a direction orthogonal to the bit lines are provided as an alignment ground layer for the lithography process. In this manner, the short-circuit between the selection gate line and the contact due to a misalignment can be prevented.

Subsequently, with the resist 203 being a mask, the interlayer insulation film 104 are etched in an anisotropic manner under a condition having a selection ratio relevant to the barrier insulation films 108 and 201. Then, the etching condition is changed, the barrier insulation film 108 is etched to form the contact hole 205 as shown in FIGS. 30A and 30B. At this time, two sides in the bit line direction of the contact hole 205 are defined by the barrier insulation film 201, and the other two sides in the word line direction is defined by the resist 203. In addition, when this contact hole is formed, since the barrier insulation film 108 works as an etching stopper, the element separation groove is never etched.

Figure 31A:
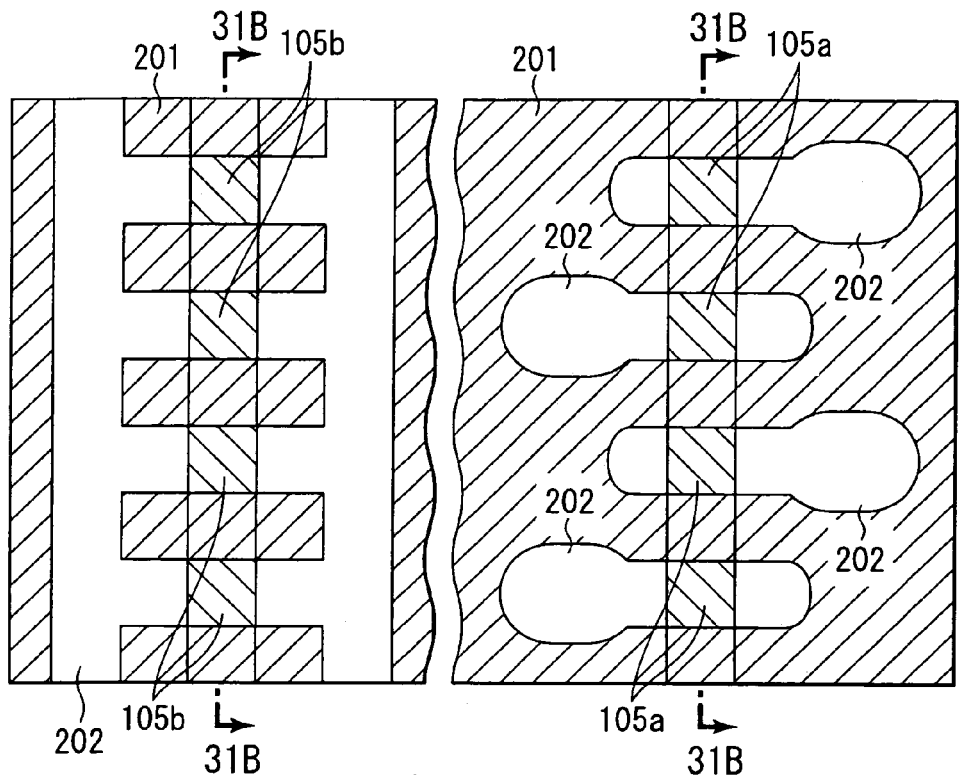
FIG. 31A is a plan view of the semiconductor device array in a contact plug embedding step of the manufacturing method of the present invention.
Figure 31B:
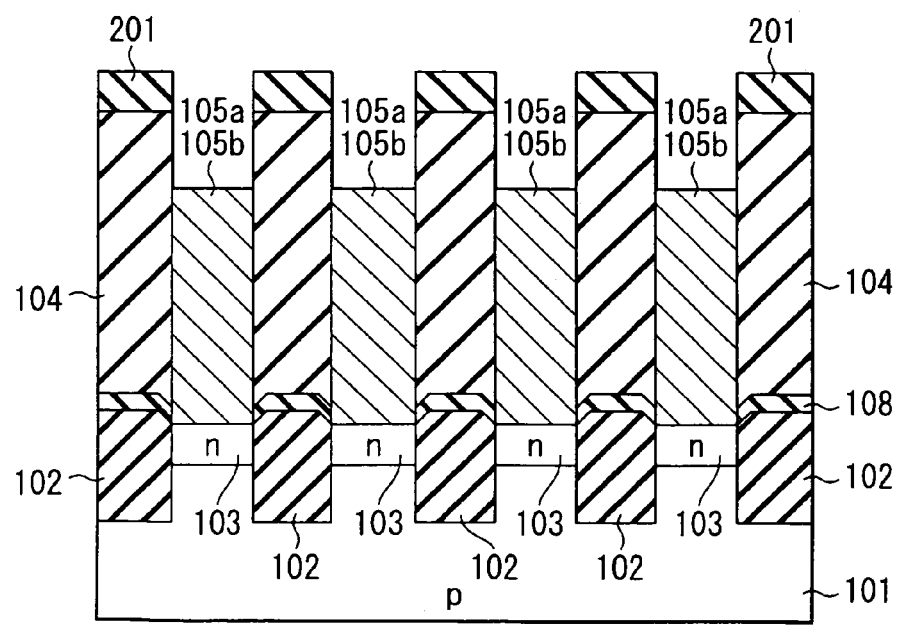
FIG. 31B is a cross sectional view of the semiconductor device shown in FIG. 31A, which is taken along the line 31B—31B of FIG. 31A.
Figure 32A:
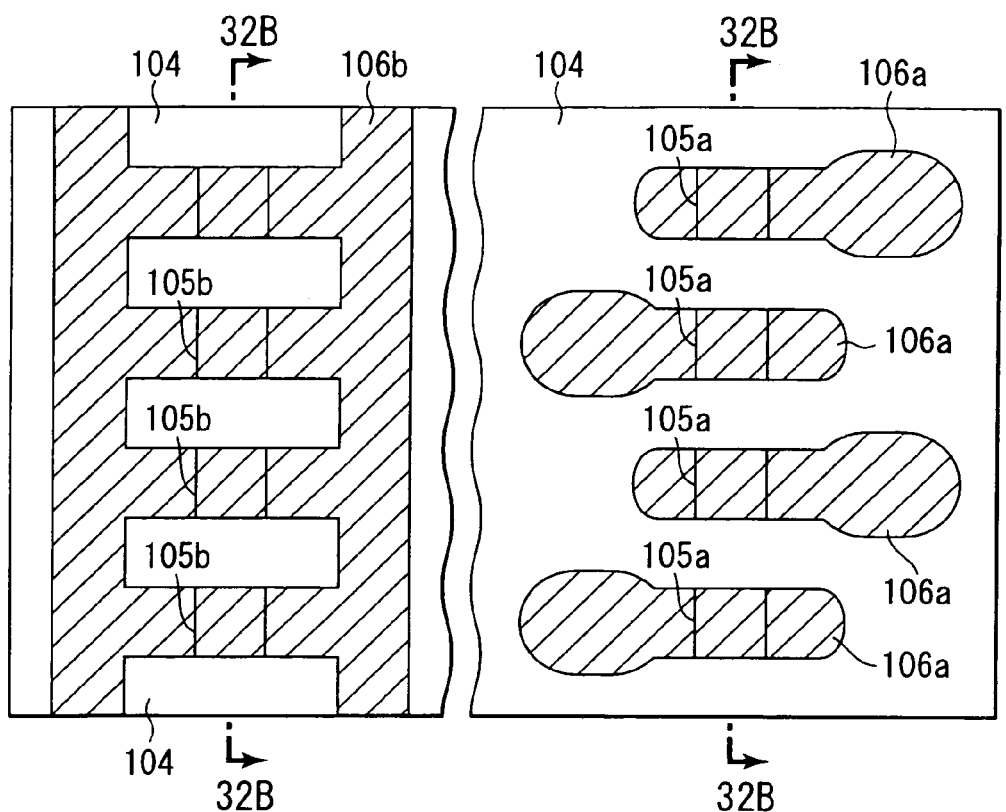
FIG. 32A is a plan view of the semiconductor device array in a step of the manufacturing method, of embedding a bit line lead-out wiring and a common source line.
Figure 32B:
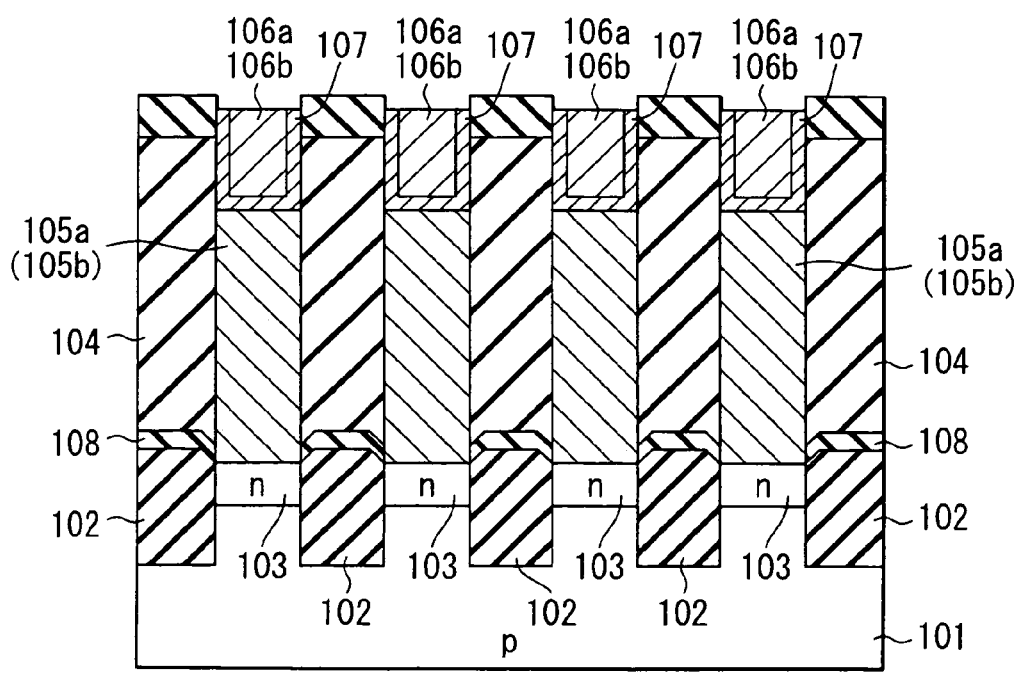
FIG. 32B is a cross sectional view of the semiconductor device shown in FIG. 32A, which is taken along the line 32B—32B of FIG. 32A.

Next, poly-crystalline silicon in which phosphor or arsenic is doped at a high concentration is deposited, and etching back is carried out in accordance with anisotropic etching or isotropic etching such as CDE (Chemical Dry Etching). Then, as shown in FIG. 31A and FIG. 31B, the contact plugs 105a and 105b are embedded in the middle of the contact hole 205. After embedding the contact plugs 105a and 105b, the barrier insulation film 201 is removed. Then, after depositing the barrier metal 107 such as TiN, a metal material such as tungsten, aluminum, or copper is deposited, and CMP processing is carried out. As shown in FIGS. 32A and 32B, the contact hole 205 and wiring groove 202 are embedded with the wiring layers 106a and 106b.

In the NAND type EEPROM, the bit line contact pitch is arranged to be equal to the pitch between the element forming region and the element separation region of the memory cell. In the NAND type EEPROM according to the present embodiment, even if the bit line contact pitch is reduced with miniaturization of the element, it is possible to ensure a short-circuit margin between the contacts and a misalignment margin between the adjacent contacts of the bit line lead-out wiring.

In the present embodiment, although a contact is embedded with poly-crystalline silicon in accordance with the foregoing second embodiment, and an upper part thereof and wiring layer are embedded with a barrier metal and metal, any of the methods according to the first to fifth embodiments may be used.

The present embodiment is featured by the wiring layers of the common source line 105a and bit line lead-out wiring 106a and the wiring and pattern of the contact. In particular, in the present embodiment, the short diameter of the contact 105b of the common source line 105a is equal to that of the bit line contact 105a in size, whereby the lithography and etching conditions for the common source line contact and bit line contact are met, and a uniform contact can be produced.

Further, the common source line and bit line lead-out wiring and the lithography alignment direction for forming their contacts can be coincided with each other. Thus, the common source line contact and bit line contact with less misalignment can be achieved for both of the selection gate lines SSL and GSL and the element region. Therefore, a memory cell array can be formed with a lesser alignment margin, and a memory cell area can be reduced. Furthermore, a pattern is formed so as to largely ensure the common source line width in the same wiring layer as that of the bit line lead-out portion, so that the common source line resistance can be lowered, and more stable setting of a threshold value can be provided. In addition, the common source line contact is formed on the element region as in the bit line contact. This makes it possible to prevent a failure that the contact material reaches the p-type well and the breakdown voltage across the p-type well and the contact material, which occurs in the case where the contact are superposed on the element separation region, is lowered.

In the present embodiment, although the technique according to the second embodiment is used, even if any of the contact forming methods according to the first to fifth embodiments is used, advantageous effect to a flat pattern is produced similarly. Further, the processing film thickness can be set in detail in the same manner as that described in the first to fifth embodiments each.

[Seventh Embodiment]

Figure 33:
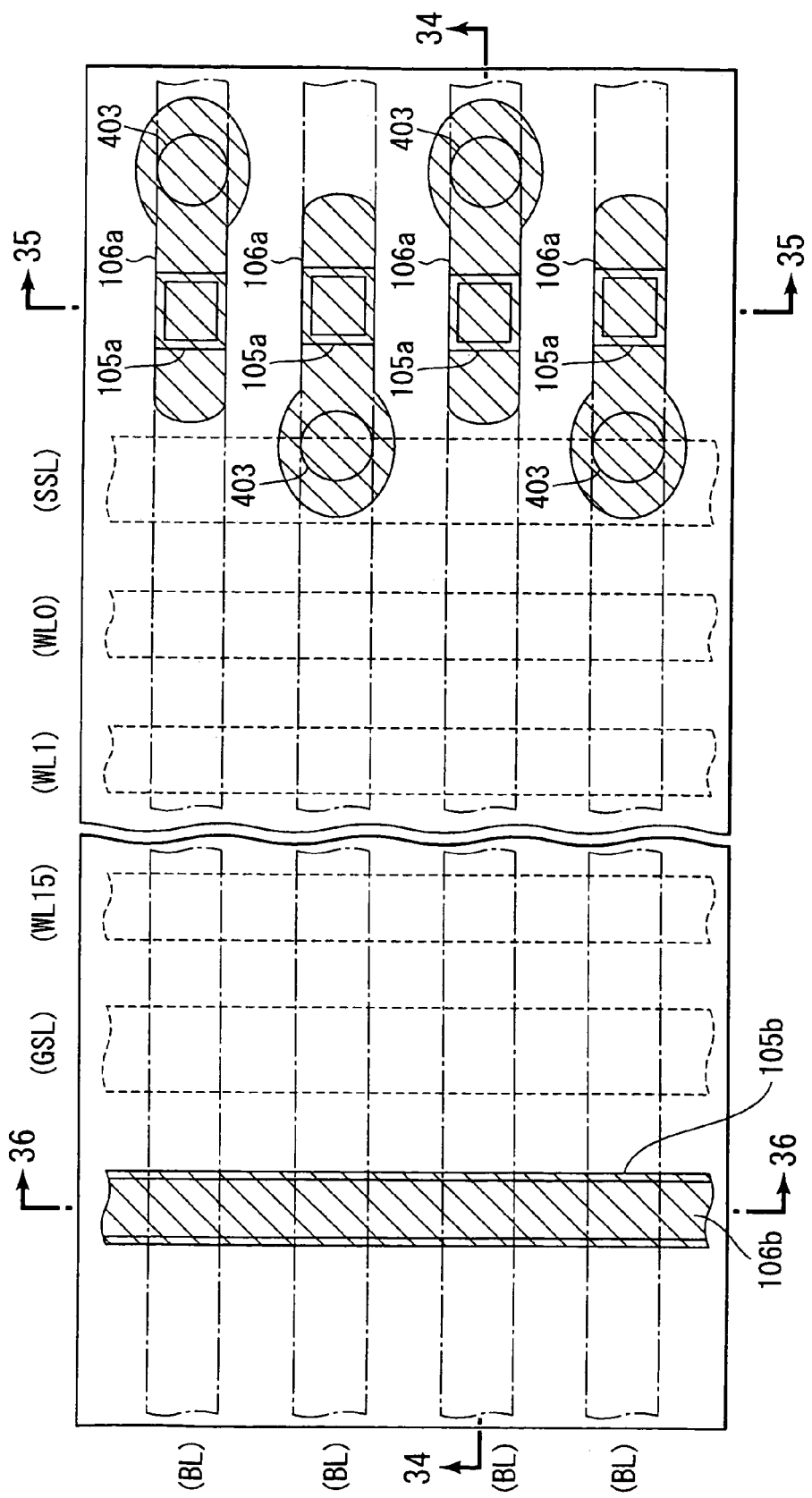
FIG. 33 is a plan view showing a cell array according to another embodiment of the present invention.
Figure 34A:
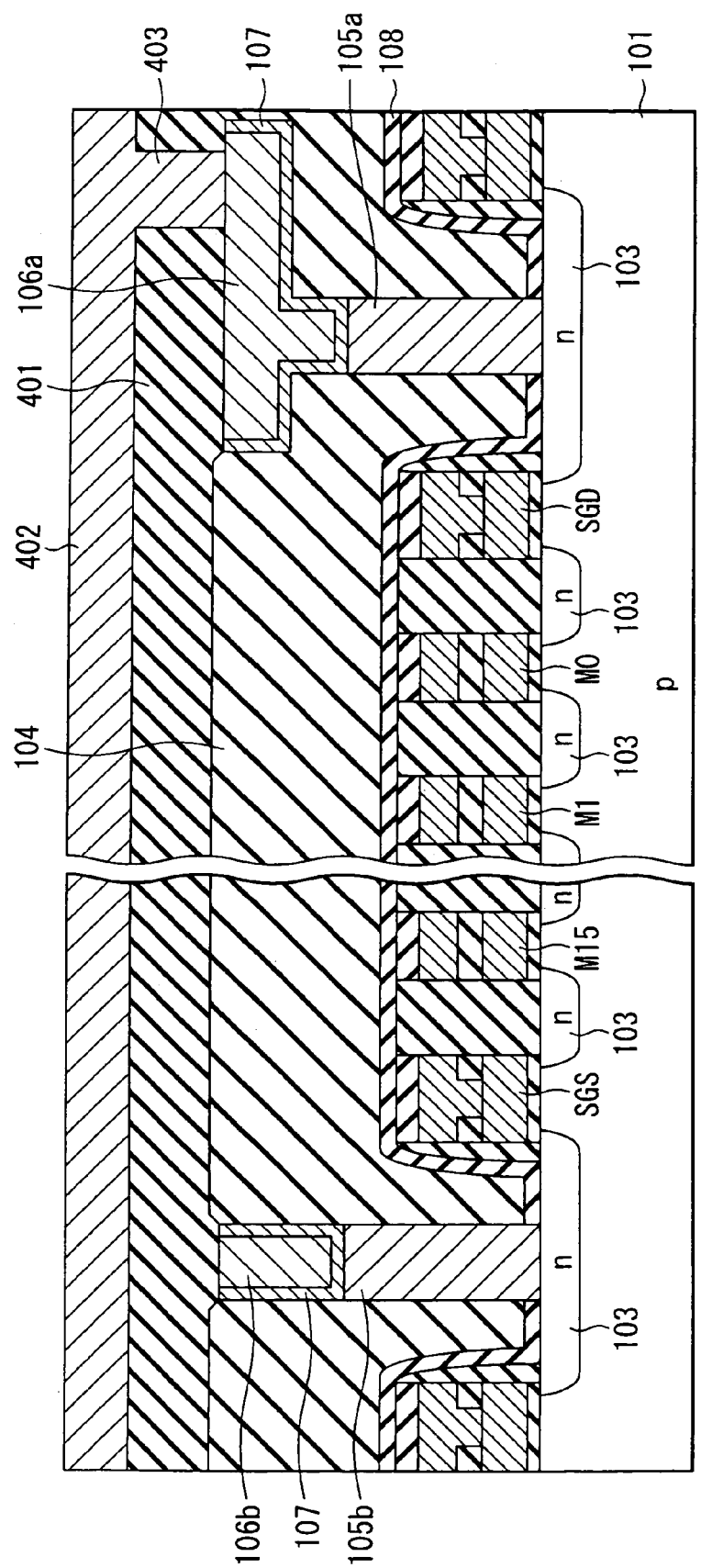
FIG. 34A is a cross sectional view of the cell array shown in FIG. 33, which is taken along the line 34—34 of FIG. 33.
Figure 35A:
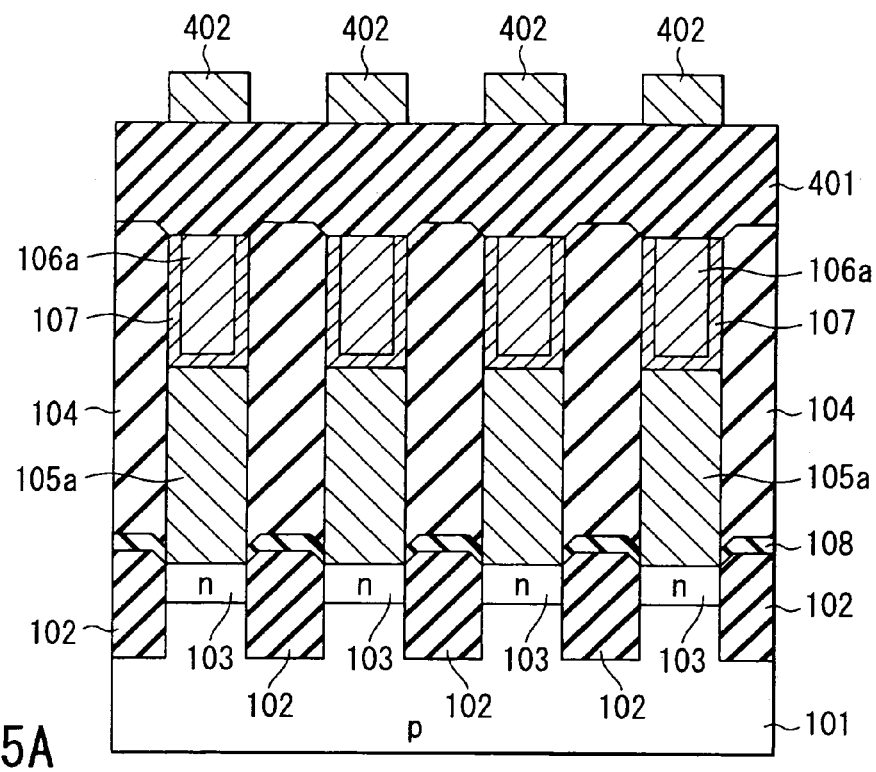
FIG. 35A is a cross sectional view of the cell array shown in FIG. 33, which is taken along the line 35—35 of FIG. 33.
Figure 35B:
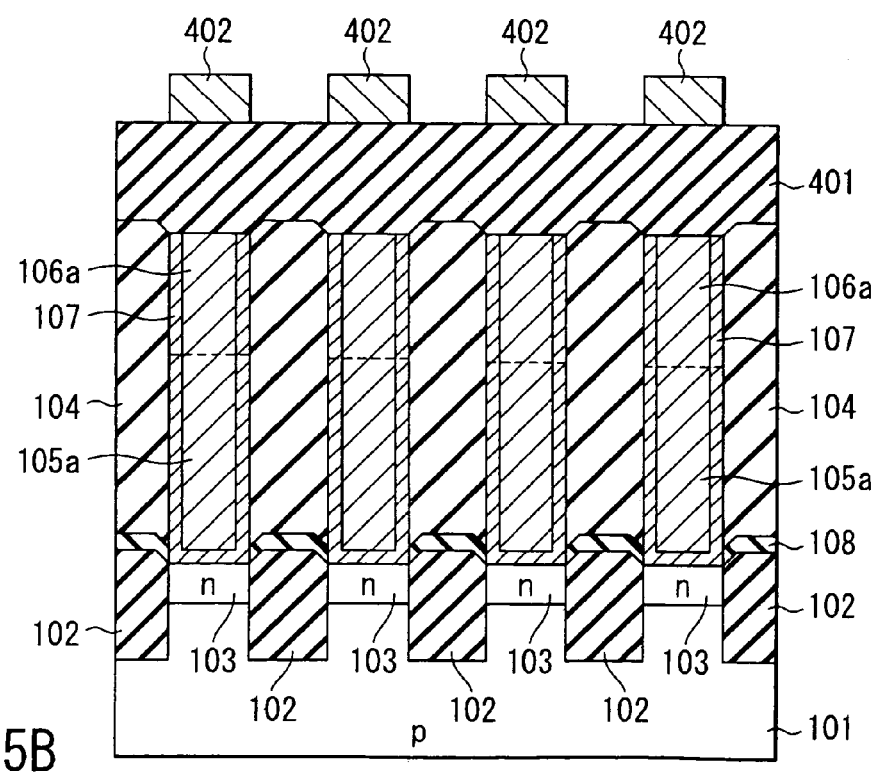
FIG. 35B is a cross sectional view of a modification of the cell array shown in FIG. 33 and corresponds to the cross sectional view of FIG. 35A.
Figure 36A:
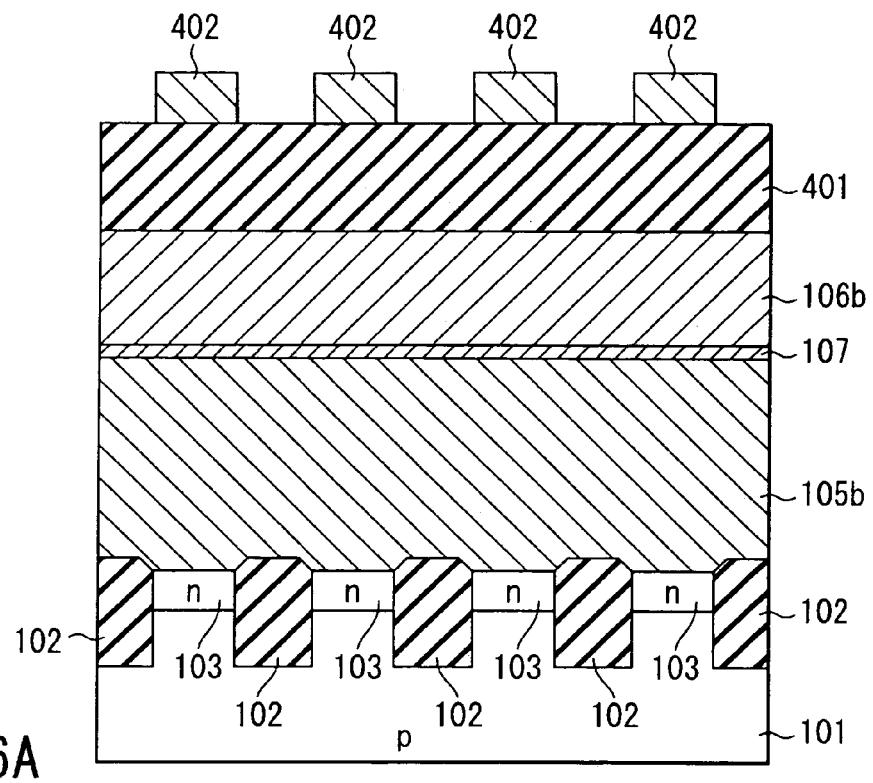
FIG. 36A is a cross sectional view of the cell array shown in FIG. 33, which is taken along the line 36—36 of FIG. 33.
Figure 36B:
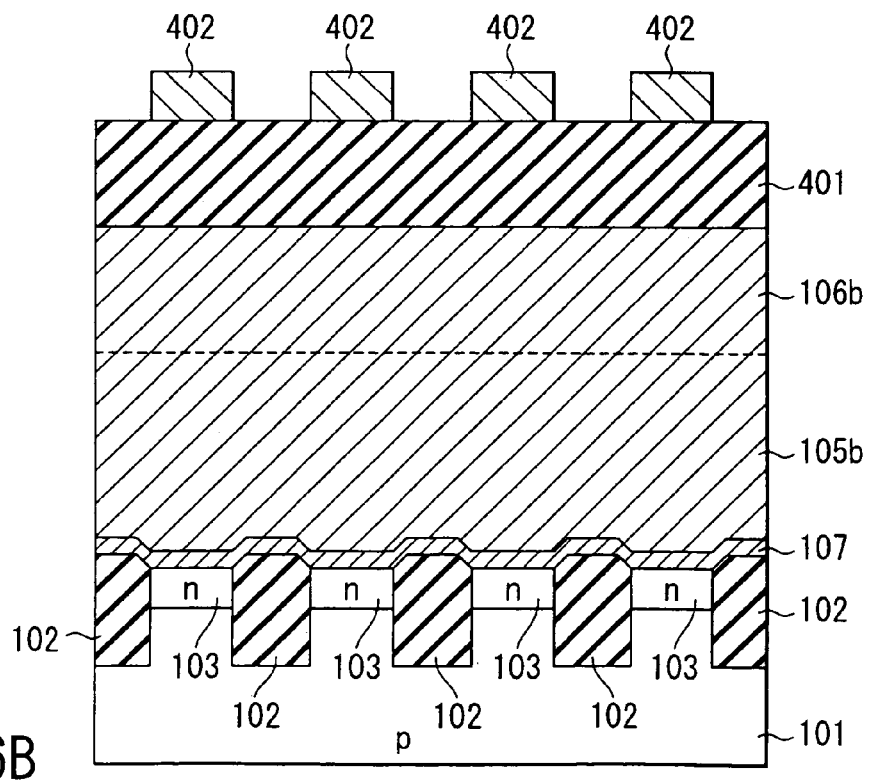
FIG. 36B is a cross sectional view of a modification of the cell array shown in FIG. 33 and corresponds to the cross sectional view of FIG. 36A.

FIGS. 33 and 34A–34B to 36A–386 show a seventh embodiment which modifies the sixth embodiment. The present embodiment is different from the sixth embodiment in common source lines and a structure of a contact thereof. FIG. 33 is a layout of a memory cell block, and FIGS. 34A, 35A, and 36A are cross sectional views taken along the lines 34—34, 35—35, and 36—36, respectively. In the present embodiment, the source line contact 105b is not separated for each element region, and is formed in a continuous layer used as a local interconnection. In other words, the wiring groove of the common source line 106b is formed so as to be a contact hole of the contact plug 105a as is.

The contact 105b caused by poly-crystalline silicon in which phosphor is doped at a high concentration is embedded at the lower part of the common source line 106b. The upper part is embedded by a barrier metal and a metal material such as tungsten, aluminum, or copper. That is, the lower embedding region is in the same layer as the contact plug 105a of the bit line lead-out wiring 106a, and the upper part is in the same layer as the bit line lead-out wiring 106a. In the present embodiment, in the case where the resistance of the wiring layer is not large, the common source line wiring and contact can be formed with a resolution which is as high as lithography used to process the wiring layer. In addition, the widths of the common source line contact and wiring can be formed in a self-align manner, and thus, misalignment of these widths does not occur.

Figure 34B:
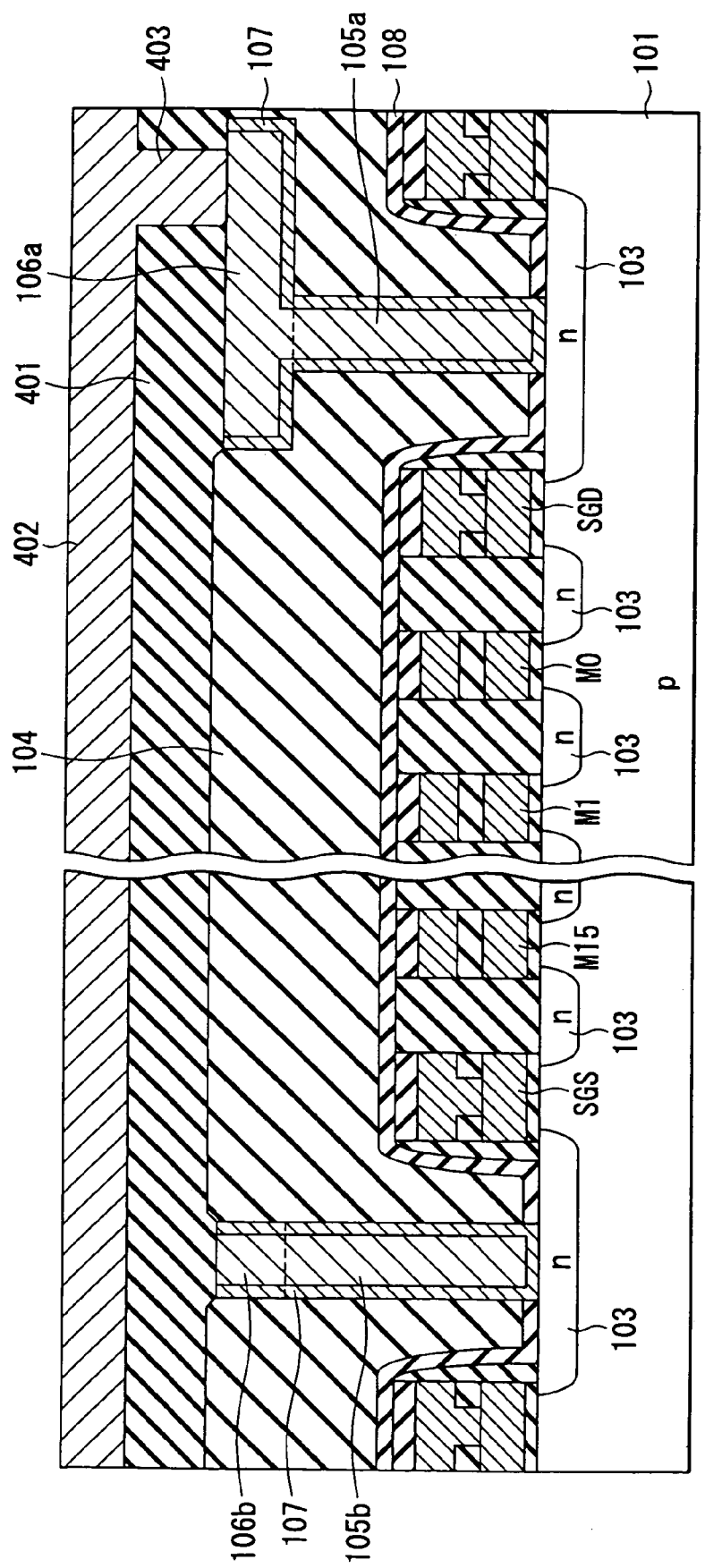
FIG. 34B is a cross sectional view of a modification of the cell array shown in FIG. 33 and corresponds to the cross sectional view of FIG. 34A.

Alternatively, as shown in FIGS. 34B to 36B, similarly to the first embodiment, the contact plugs 105a and 105b and wiring layers 106a and 106b both may be formed by embedding a metal material such as tungsten, aluminum, or copper via a barrier metal 107 such as Ti, Ta, TaN, or TiN. FIGS. 34B to 34B correspond to FIGS. 34A to 34A, respectively.

Figure 37A:
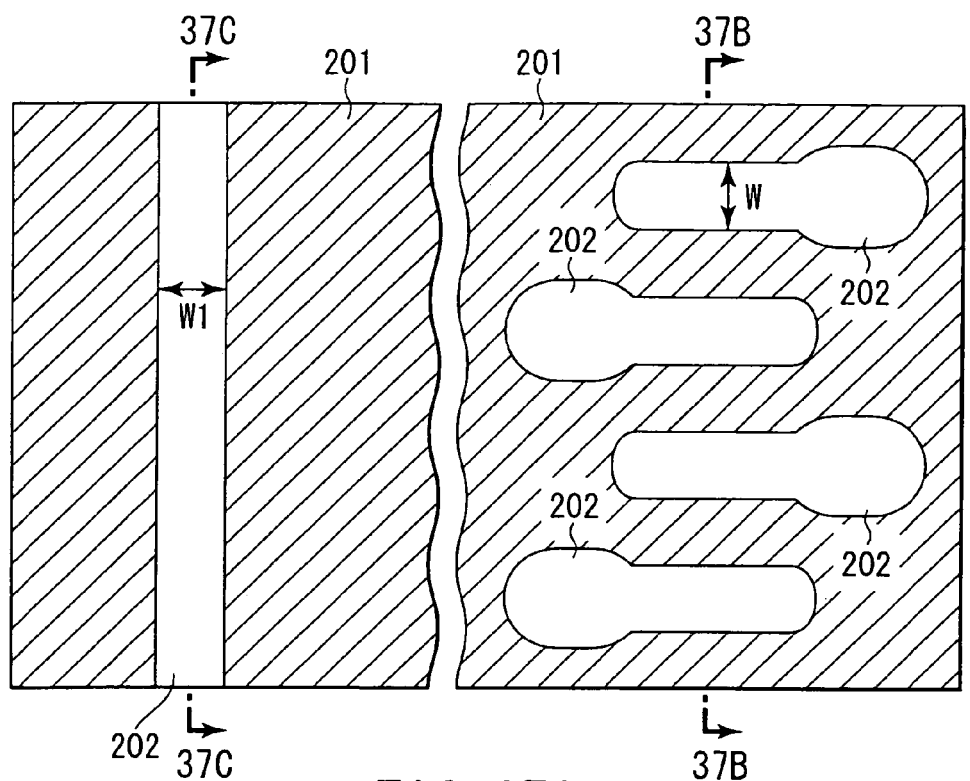
FIG. 37A is a plan view of the semiconductor device array in a step of the manufacturing method, of forming a wiring groove for a bit line lead-out wiring and a common source line according to the embodiment of the present invention.
Figure 37B:
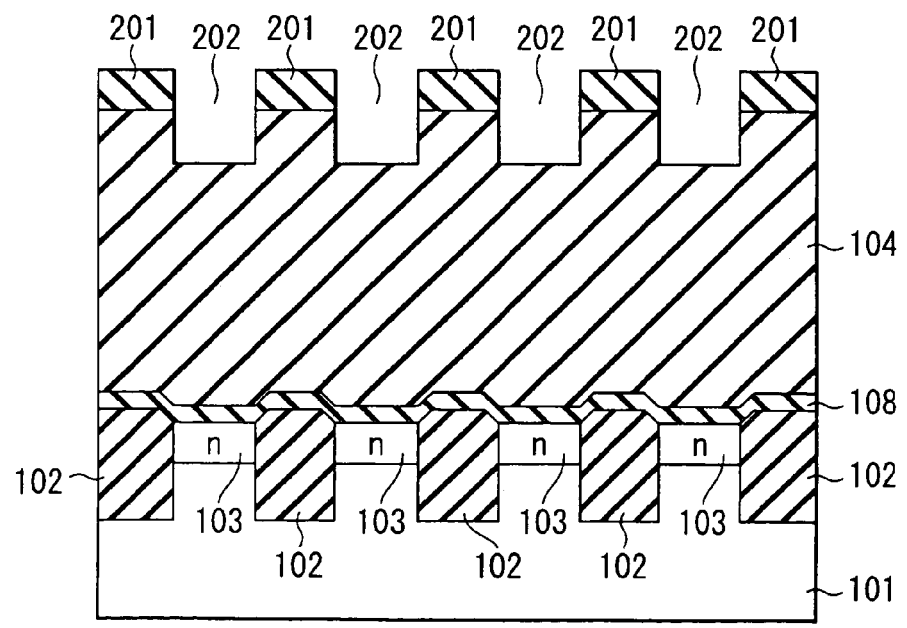
FIG. 37B is a cross sectional view of the semiconductor device shown in FIG. 37A, which is taken along the line 37B—37B of FIG. 37A.
Figure 37C:
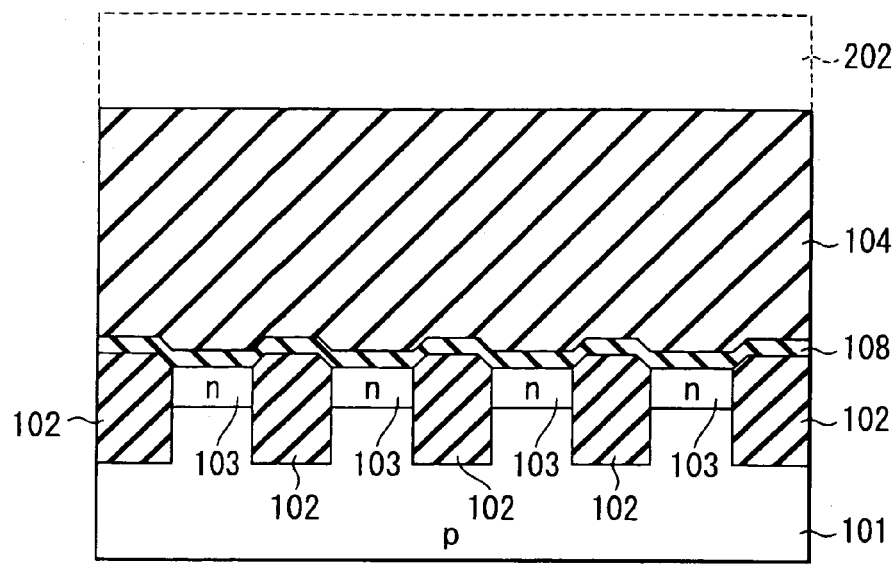
FIG. 37C is a cross sectional view of the semiconductor device shown in FIG. 37A, which is taken along the line 37C—37C of FIG. 37A.

FIGS. 37A to 37C through FIGS. 40A to 40C show a manufacturing process according to the present embodiment when attention is paid to the bit line lead-out wiring portion and common source line portion. FIG. 37A is a layout corresponding to FIG. 29A according to the foregoing embodiment. FIG. 37B is a cross sectional view taken along the line 37B—37B of FIG. 37A (a cross sectional view in the bit line contact arrangement direction) and FIG. 37C is a cross sectional view taken along the line 37C—37C of FIG. 37A (a cross sectional view in the common source line direction). As in the foregoing sixth embodiment, as shown in FIGS. 37A to 37C, after forming an element, the barrier insulation film 108, interlayer insulation film 104, and barrier insulation film 201 are deposited, the barrier insulation film 201 is selectively etched, and the wiring groove 202 for bit line lead-out wiring and common source wiring is patterned. The wiring groove 202 at the common source line side (at a position taken along the line 37C—37C) is defined as a width W1 of the common source line. This width is equal to the wiring groove width W at the bit line lead-out wiring side (a position taken along the line 37B—37B).

Figure 38A:
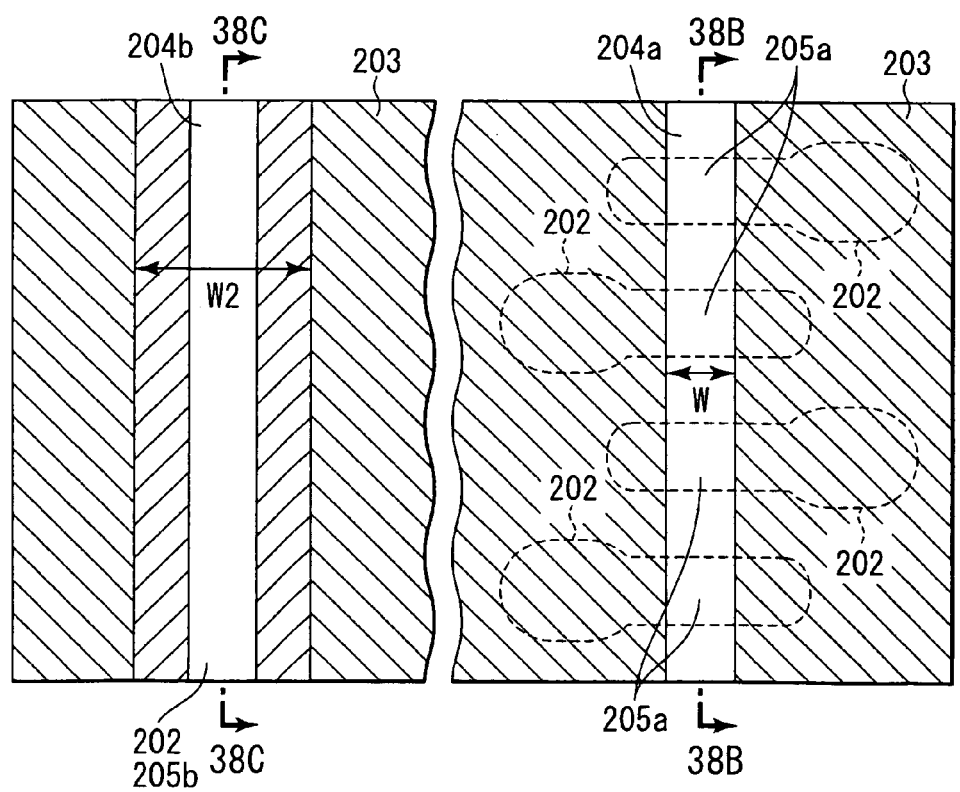
FIG. 38A is a plan view of the semiconductor device array in a step of the manufacturing method, of forming a contact hole for a bit line lead-out wiring and a common source line according to the embodiment of the present invention.
Figure 38B:
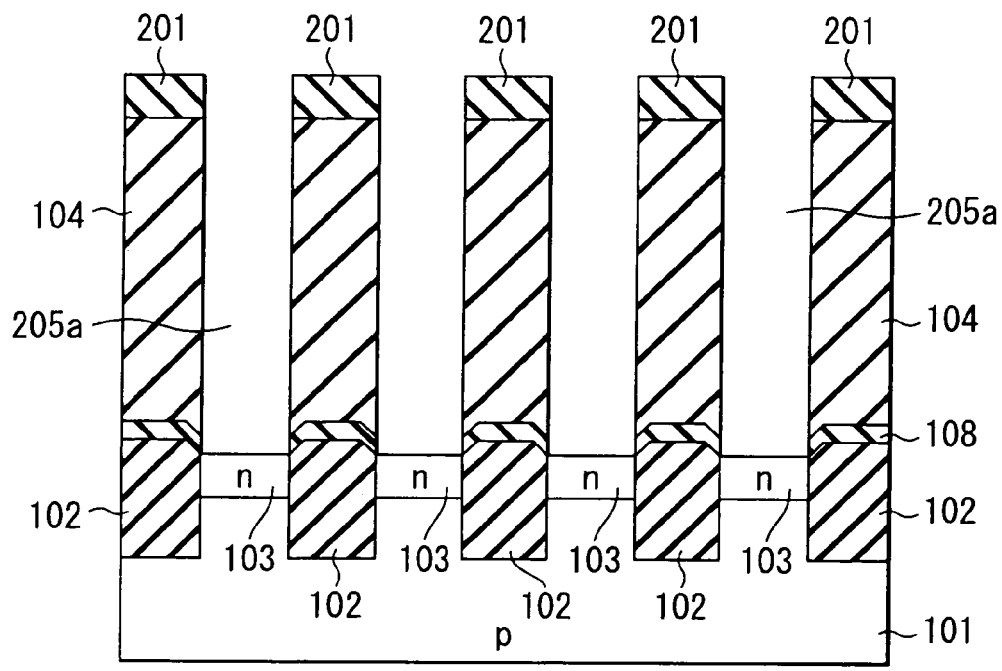
FIG. 38B is a cross sectional view of the semiconductor device shown in FIG. 38A, which is taken along the line 38B—38B of FIG. 38A.
Figure 38C:
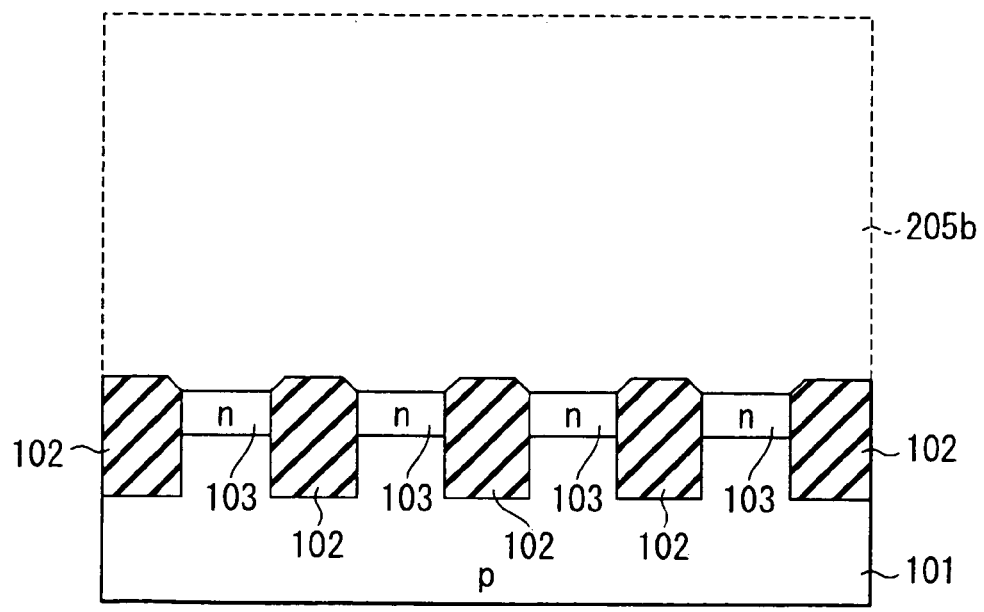
FIG. 38C is a cross sectional view of the semiconductor device shown in FIG. 38A, which is taken along the line 38C—38C of FIG. 38A.

Next, in accordance with lithography, as shown in FIGS. 38A to 38C, there is formed a resist pattern 203 having long linear openings 204a and 204b in the arrangement direction of bit line contacts arranged in line and in a direction of the common source-line contact. The width of the opening 204b at the common source line side is defined as a width W2 that is greater than W1. A portion, at which the contact of the bit line lead-out line is formed, is formed with an opening width W.

Next, with the resist 203 being a mask, the interlayer insulation film 104 is etched in an anisotropic manner under a condition having a selection ratio relevant to the barrier insulation films 108 and 201. As shown in FIGS. 38A to 38C, contact holes 205a and 205b are formed. At this time, at the bit line lead-out wiring portion, the contact hole 205a is formed to be separated for each element region. Two sides in the bit line direction is defined by the barrier insulation film 201 while the other two sides in the word line direction is defined by the resist 203. At the common source line side, as shown in FIG. 38C, the contact hole 205b is defined by the barrier insulation film 201, and is formed as a continuous pattern that is the same as the wiring groove 202 formed in advance. When this contact hole is formed, since the barrier insulation film 108 works as an etching stopper, the element separation groove is never etched.

The wiring groove width W1 at the common source side is reduced to be equal to the width W of the bit line lead-out portion, whereby a chip area can be reduced. The wiring groove 202 of the common source line formed in accordance with anisotropic etching is formed in width in a local interconnection shape determined depending on the width of the barrier insulation film 201.

Figure 39A:
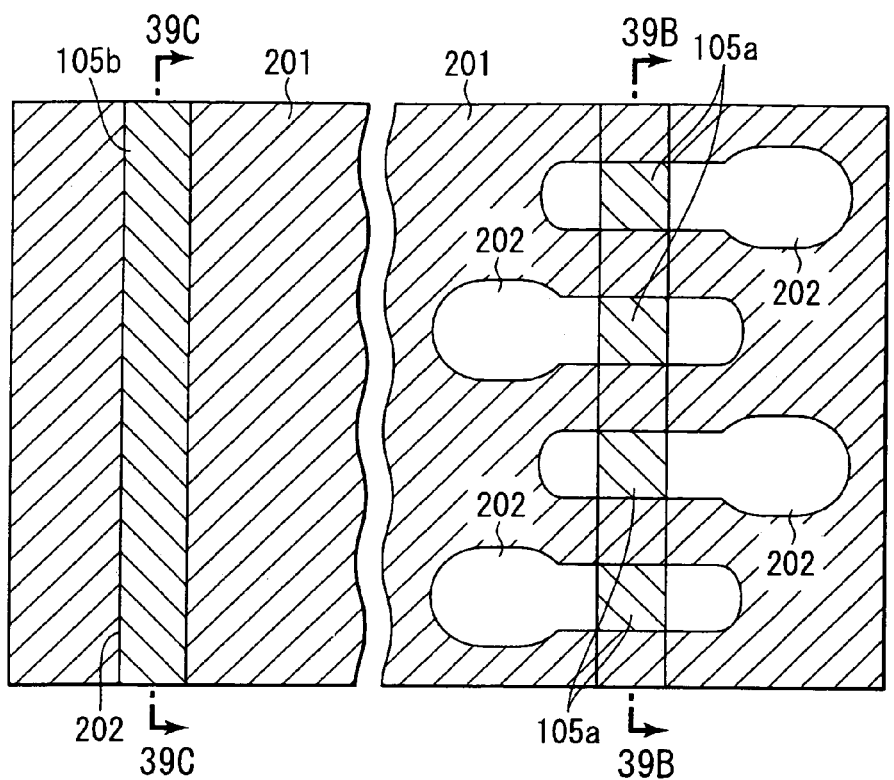
FIG. 39A is a plan view of the semiconductor device array in a contact plug embedding step of the manufacturing method according to the embodiment of the present invention.
Figure 39B:
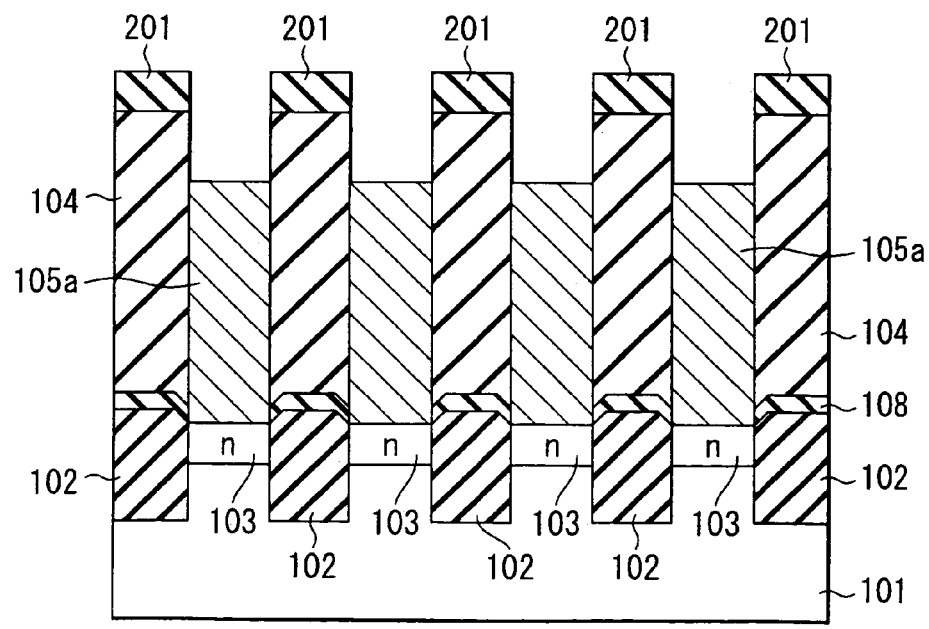
FIG. 39B is a cross sectional view of the semiconductor device shown in FIG. 39A, which is taken along the line 39B—39B of FIG. 39A.
Figure 39C:
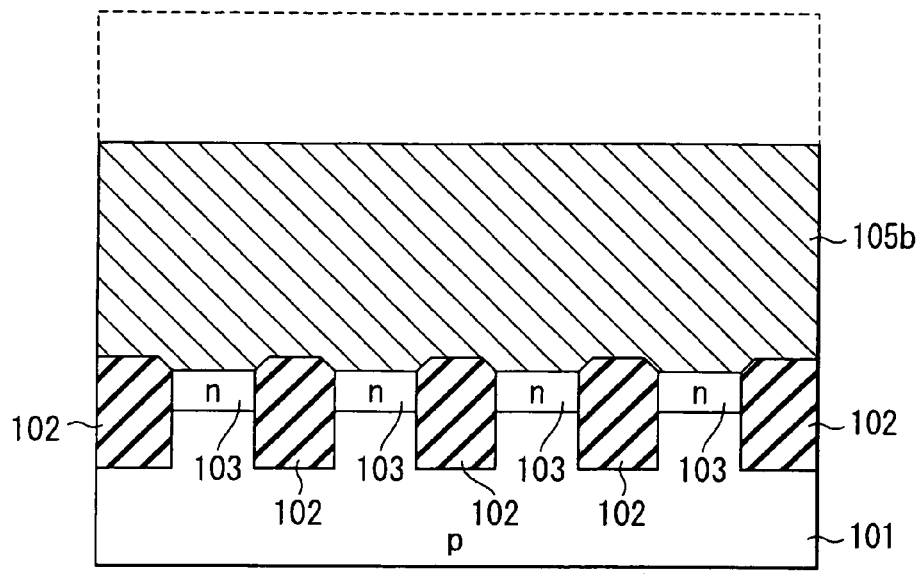
FIG. 39C is a cross sectional view of the semiconductor device shown in FIG. 39A, which is taken along the line 39C—39C of FIG. 39A.
Figure 40A:
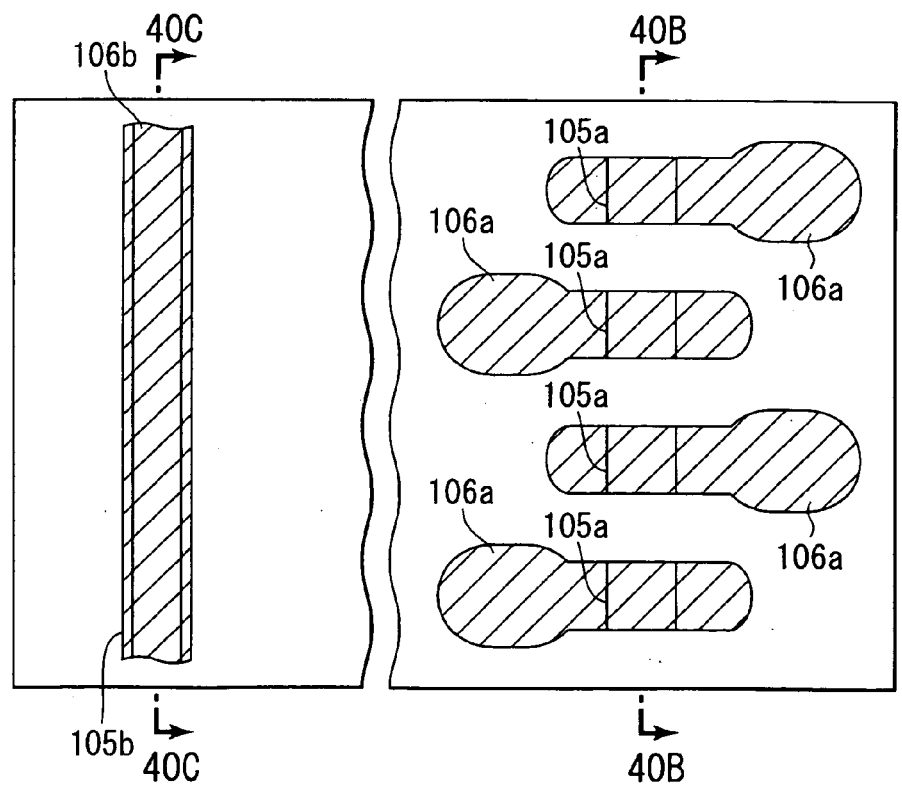
FIG. 40A is a plan view of the semiconductor device array in a step of the manufacturing method, of embedding a bit line lead-out wiring and a common source line according to the embodiment of the present invention.
Figure 40B:
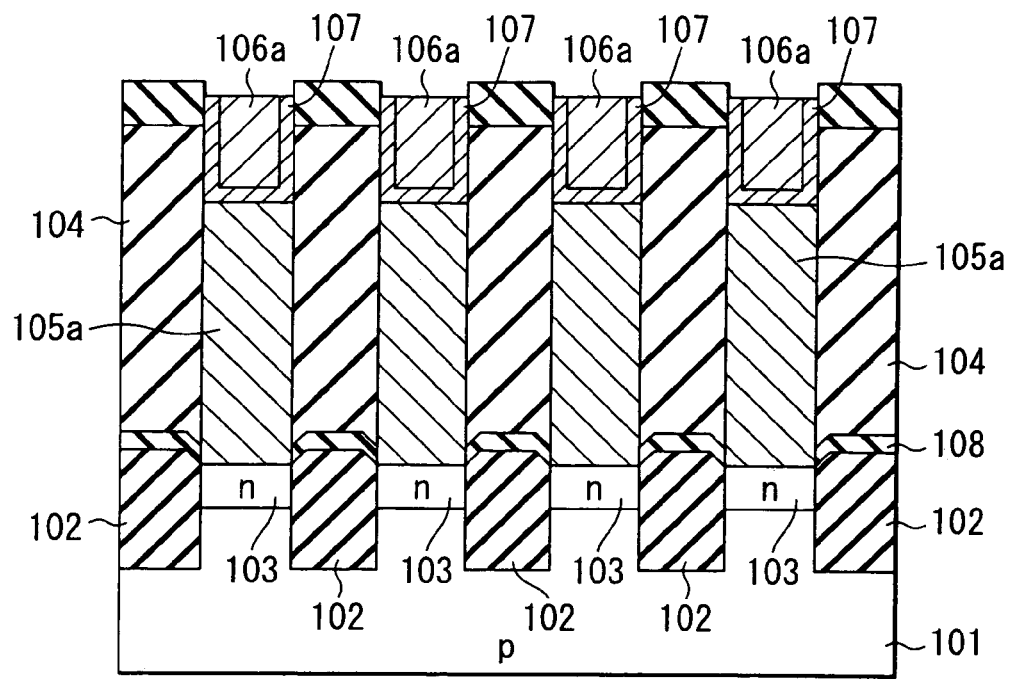
FIG. 40B is a cross sectional view of the semiconductor device shown in FIG. 40A, which is taken along the line 40B—40B of FIG. 40A.
Figure 40C:
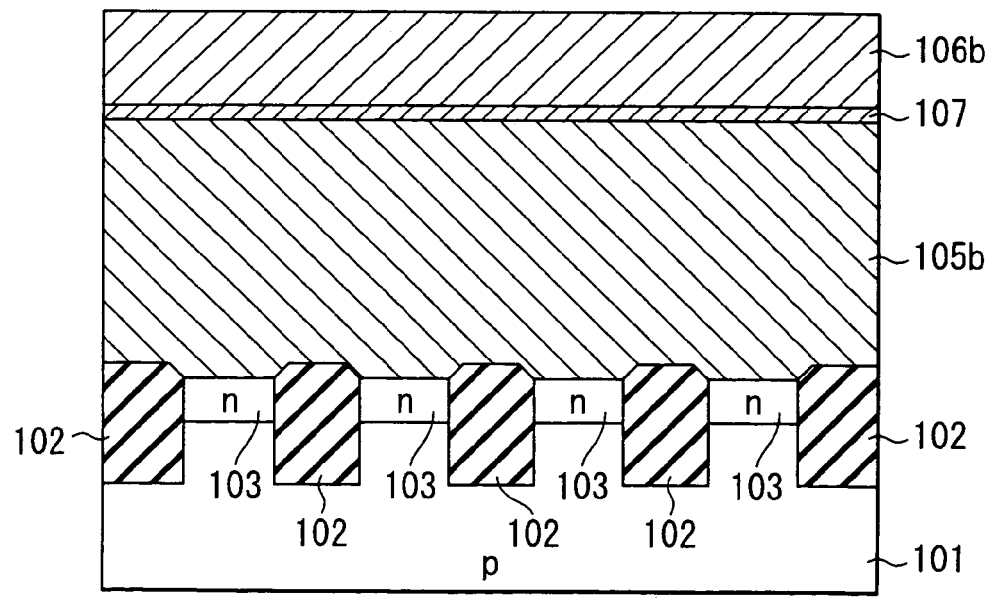
FIG. 40C is a cross sectional view of the semiconductor device shown in FIG. 40A, which is taken along the line 40C—40C of FIG. 40A.

Next, as in the sixth embodiment, poly-crystalline silicon in which phosphor or arsenic is doped at a high concentration is deposited, and etching back is carried out in accordance with anisotropic etching or isotropic etching such as CDE (Chemical Dry Etching). As shown in FIGS. 39A to 39C, the contact plugs 105a and 105b are embedded in the middle of the contact holes 205a and 205b. After embedding the contact plugs 105a and 105b, the barrier insulation film 201 is removed. Then, after depositing the barrier metal 107 such as TiN, a metal material such as tungsten, aluminum, or copper is deposited, and CMP processing is carried out. As shown in FIGS. 40A to 40C, the contact hole 205 and wiring groove 202 are embedded with the wiring layers 106a and 106b.

According to the present embodiment, the common source line contact is not separated for each element region, and is formed into a form of a continuous pattern. Thus, the present embodiment is featured in that the lithography margin is increased, and the wiring resistance of the common source line is reduced.

[Eighth Embodiment]

Figure 41:
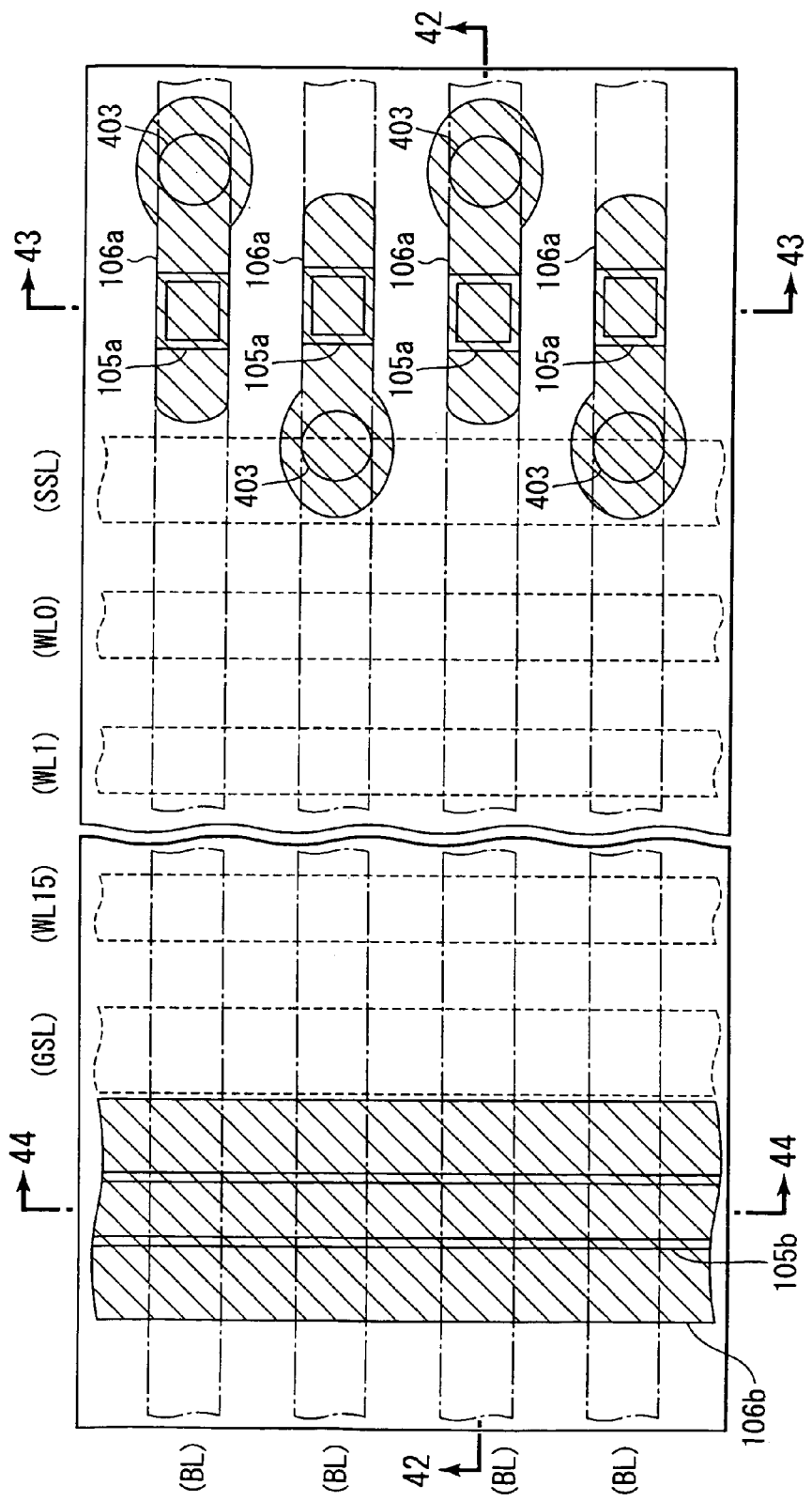
FIG. 41 is a plan view showing a cell array according to a further embodiment of the present invention.
Figure 42A:
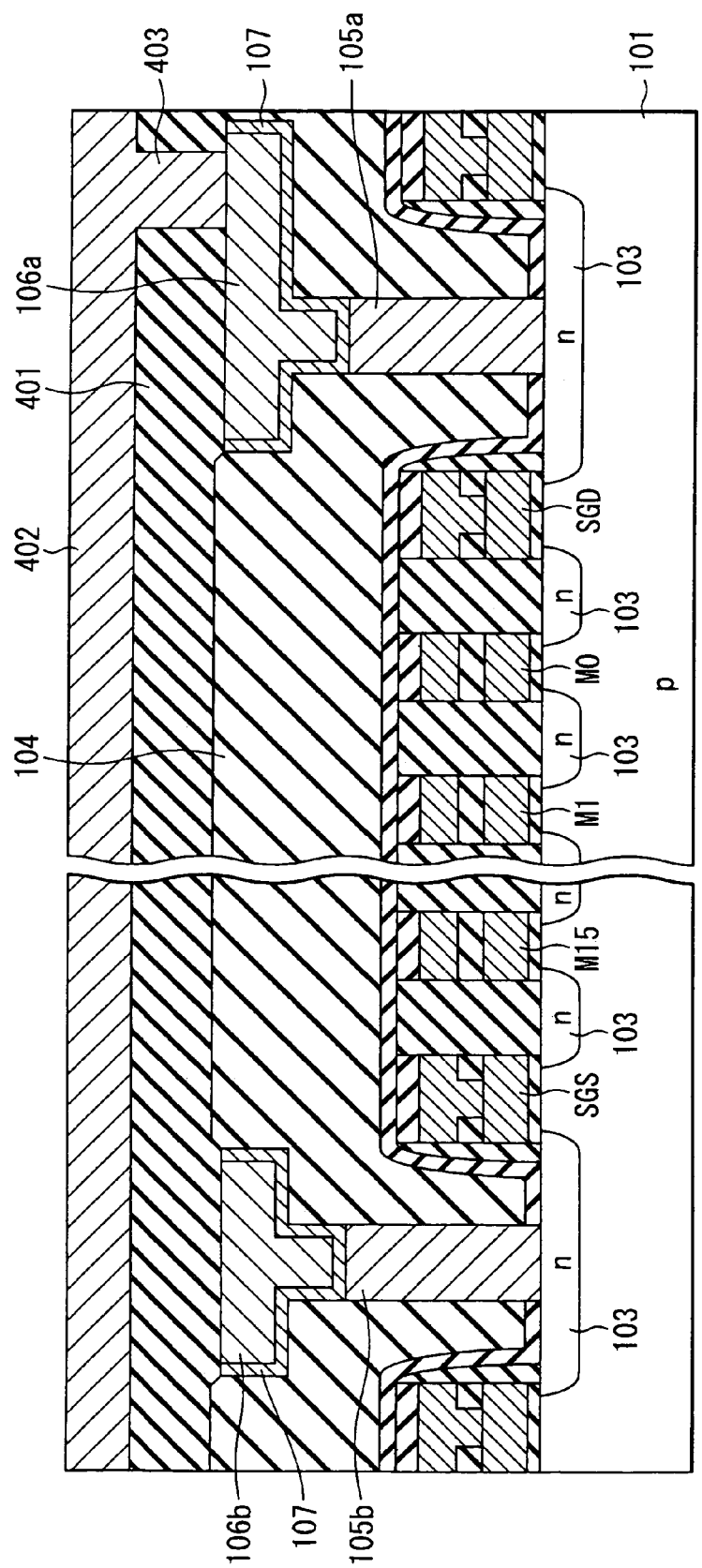
FIG. 42A is a cross sectional view of the cell array shown in FIG. 41, which is taken along the line 42—42 of FIG. 41.
Figure 42B:
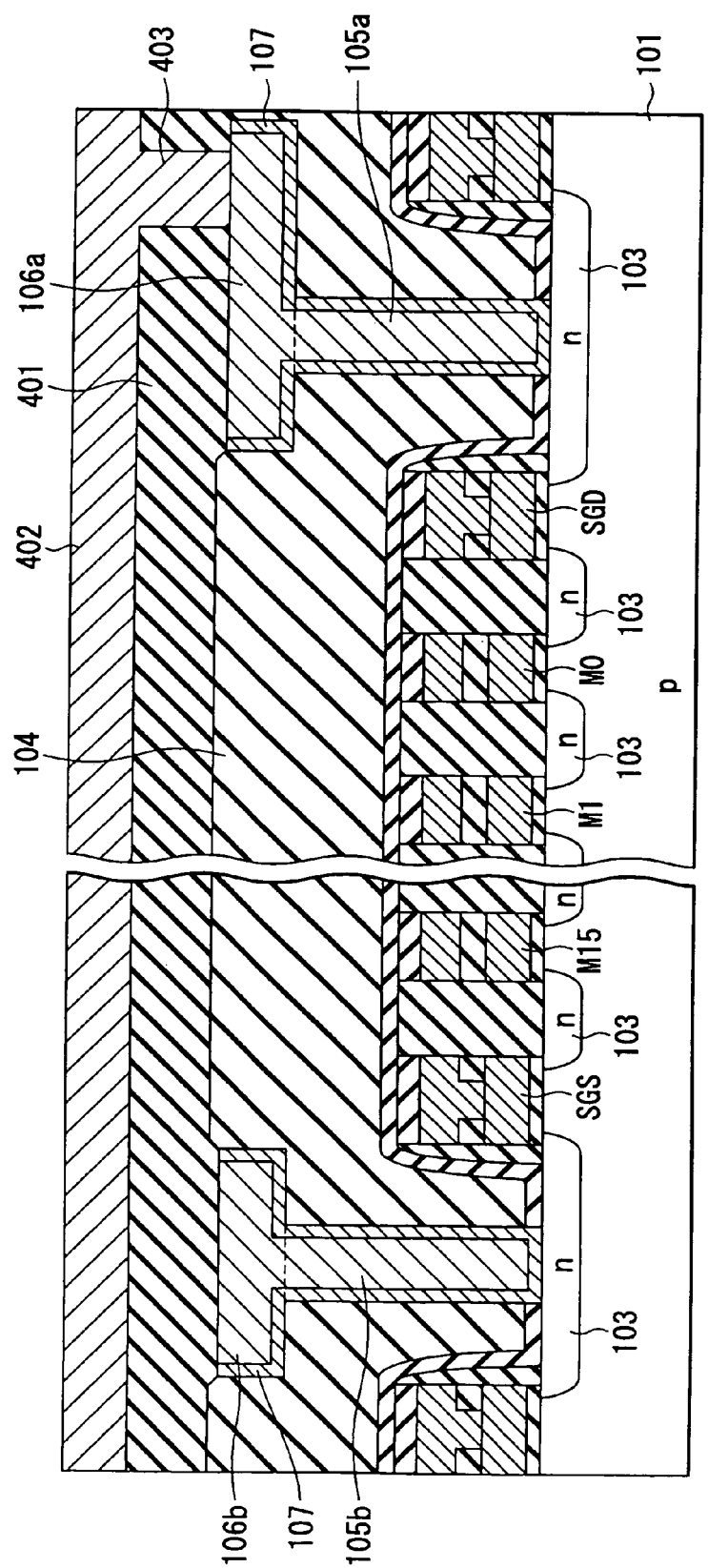
FIG. 42B is a cross sectional view of a modification of the cell array shown.
Figure 43A:
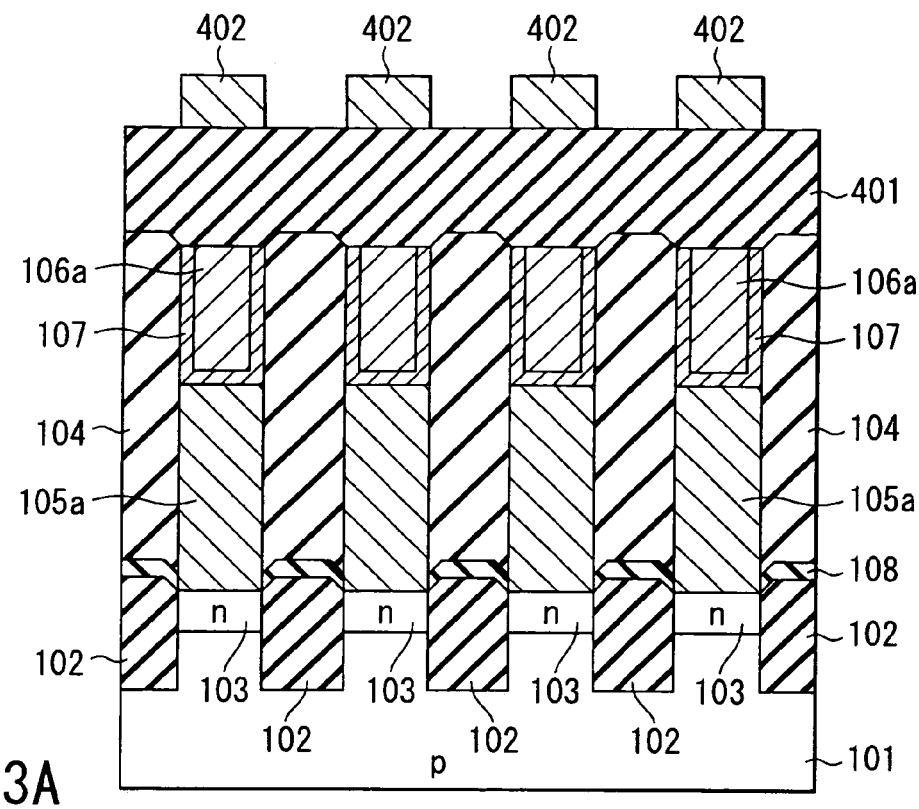
FIG. 43A is a cross sectional view of the cell array shown in FIG. 41, which is taken along the line 43—43 of FIG. 41.
Figure 43B:
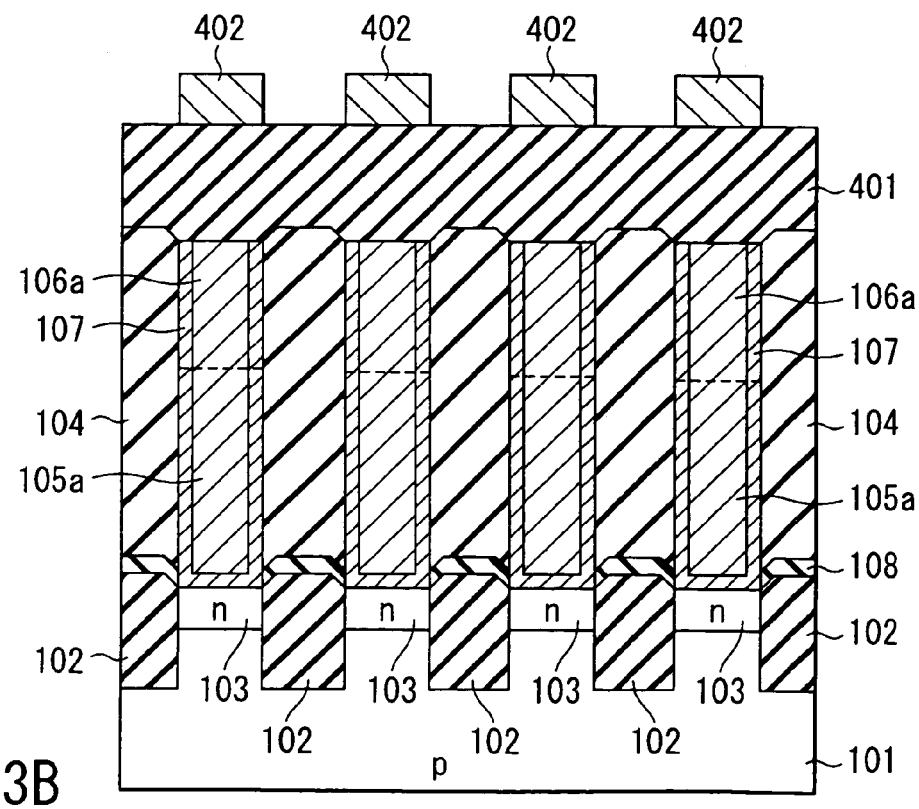
FIG. 43B is a cross sectional view of a modification of the cell array shown in FIG. 41 and corresponds to the cross sectional view of FIG. 43A.
Figure 44A:
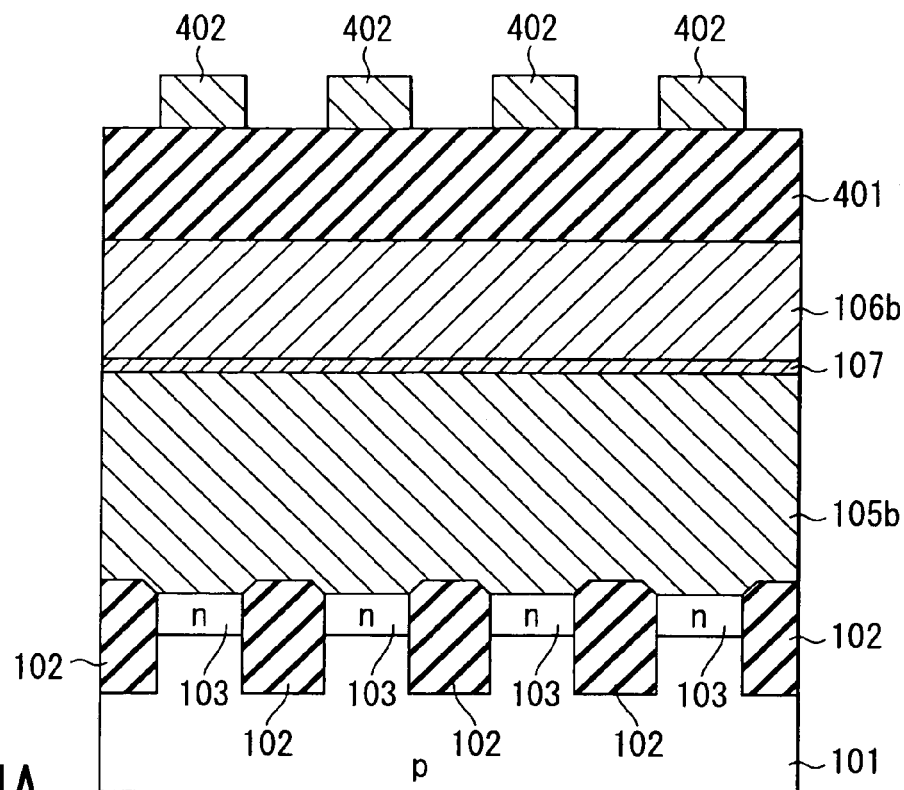
FIG. 44A is a cross sectional view of the cell array shown in FIG. 41, which is taken along the line 44—44 of FIG. 41.
Figure 44B:
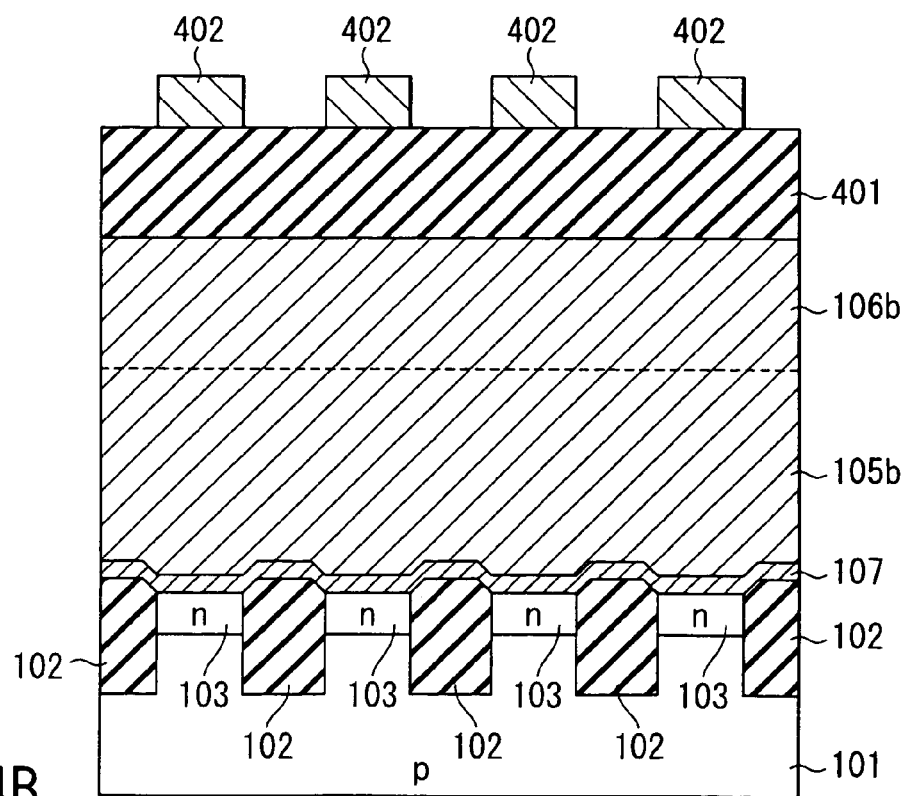
FIG. 44B is a cross sectional view of a modification of the cell array shown in FIG. 41 and corresponds to the cross sectional view of FIG. 44A.

FIG. 41 and FIG. 42A to 44A show an eight embodiment which modifies the seventh embodiment. The present embodiment is slightly different from the seventh embodiment in a common source line and a structure of a contact thereof. FIG. 41 is a layout of a memory cell block. FIGS. 42A, 43A, and 44A are cross sectional views taken along the lines 42—42, 43—43, and 44—44 of FIG. 41, respectively. In the present embodiment, the source line contact 105b is not separated for each element region as in the seventh embodiment, and is formed into a form of a continuous pattern. Unlike the seventh embodiment, the common source line 106b is embedded with a wiring width that is larger than the width of the contact plug 105b.

The contact plug 105b caused by poly-crystalline silicon in which phosphor is doped at a high concentration is embedded at the lower part of the common source line 106b. The upper part is embedded with a barrier metal and a metal material such as tungsten, aluminum, or copper. That is, the lower embedding region is in the same layer as the contact plug 105a of the bit line lead-out wiring 106a, and the upper part is in the same layer as the bit line lead-out wiring 106a.

Alternatively, as shown in FIGS. 42B to 44B, similarly to the first embodiment, the contact plugs 105a and 105b and wiring layers 106a and 106b both may be formed by embedding a metal material such as tungsten, aluminum, or copper via a barrier metal 107 such as Ti, Ta, TaN, or TiN. FIGS. 42B to 44B correspond to FIGS. 42A to 44A, respectively.

Figure 45A:
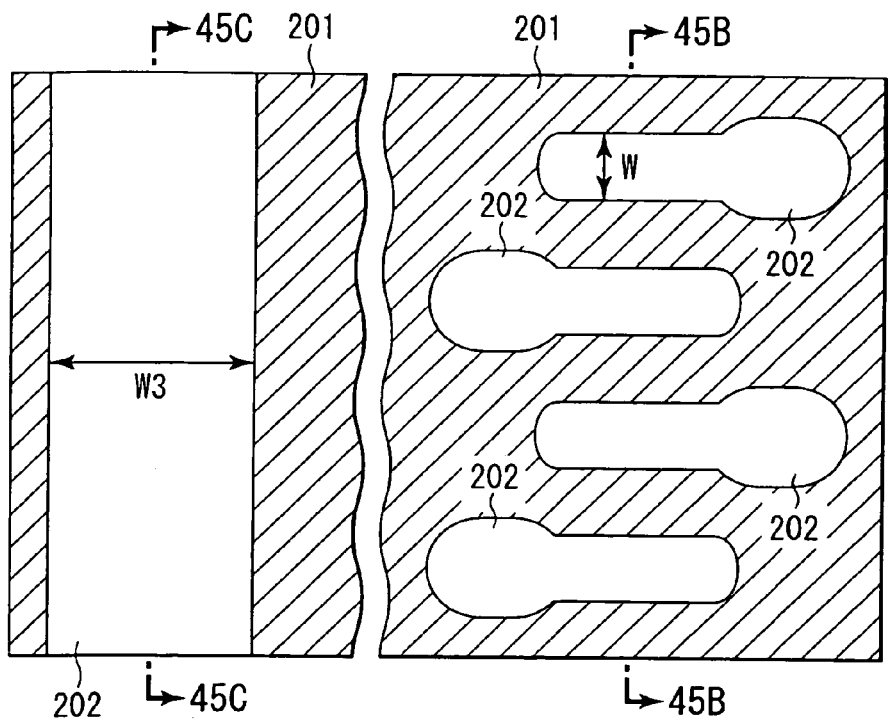
FIG. 45A is a plan view of the semiconductor device array in a step of the manufacturing method, of forming a wiring groove for a bit line lead-out wiring and a common source line according to the embodiment of the present invention.
Figure 45B:
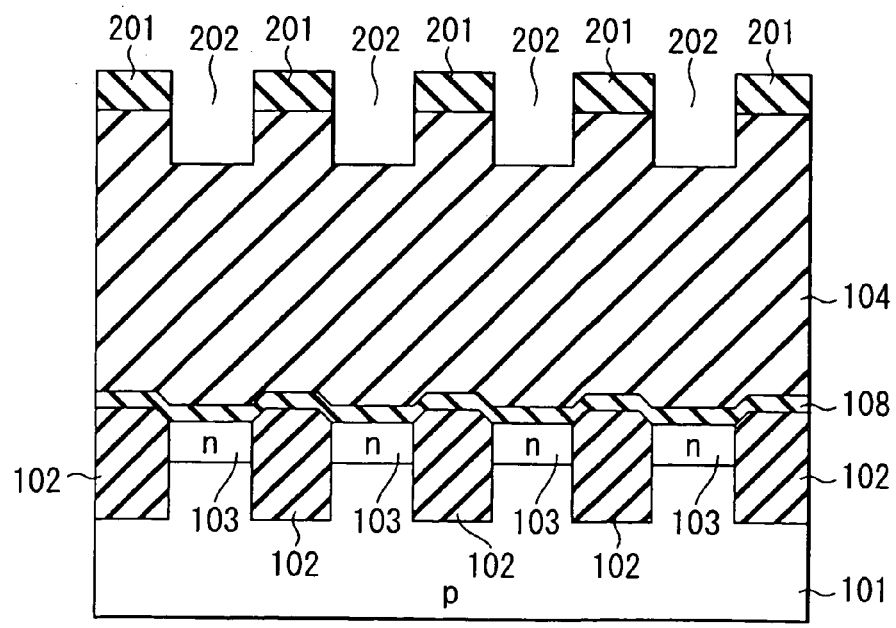
FIG. 45B is a cross sectional view of the semiconductor device shown in FIG. 45A, which is taken along the line 45B—45B of FIG. 45A.
Figure 45C:
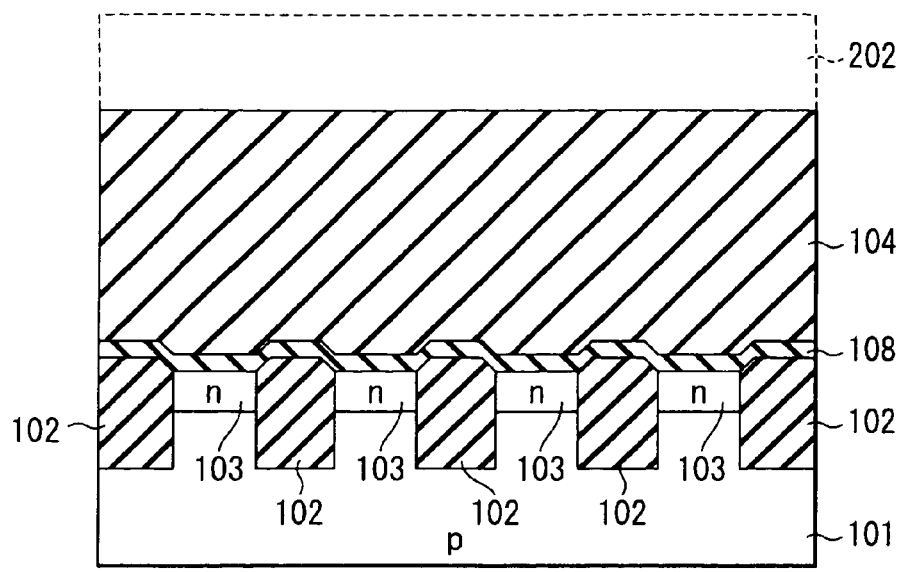
FIG. 45C is a cross sectional view of the semiconductor device shown in FIG. 45A, which is taken along the line 45C—45C of FIG. 45A.

FIGS. 45A to 45C through FIGS. 48A to 48C show a manufacturing process according to the present embodiment when attention is paid to the bit line lead-out wiring portion and common source line portion. FIG. 45A is a layout corresponding to FIG. 37A according to the foregoing seventh embodiment. FIG. 45B is a cross sectional view taken along the line 45B—45B (a cross sectional view in the bit line contact arrangement direction) and FIG. 45C is a cross sectional view taken along the line 45C—45C (a cross sectional view in the common source line direction). As in the foregoing seventh embodiment, as shown in FIGS. 45A to 45C, after forming an element, the barrier insulation film 108, interlayer insulation film 104, and barrier insulation film 201 are deposited. Then, the barrier insulation film 201 is selectively etched, and the wiring groove 202 for the bit line lead-out wiring and common source wiring is patterned. The width W3 of the wiring groove 202 at the common source line side (a position taken along the line 45C—45C) is about three times as wide as the wiring groove width W at the bit line lead-out wiring side (a position taken along the line 45B—45B).

Figure 46A:
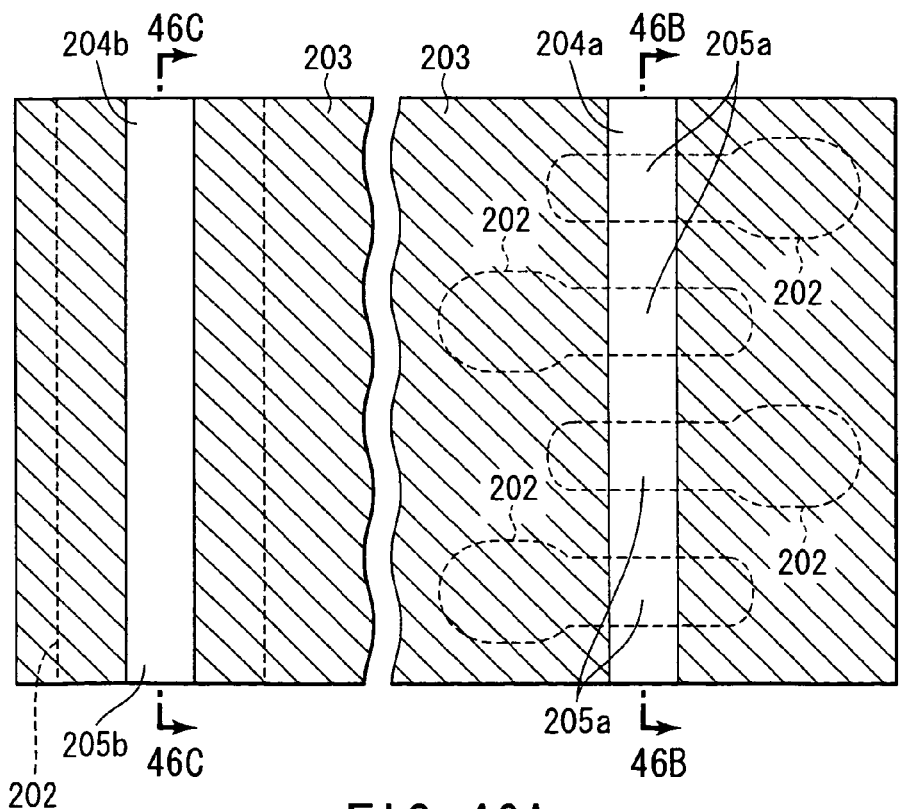
FIG. 46A is a plan view of the semiconductor device array in a step of the manufacturing method, of forming a contact hole for a bit line lead-out wiring and a common source line according to the embodiment of the present invention.
Figure 46B:
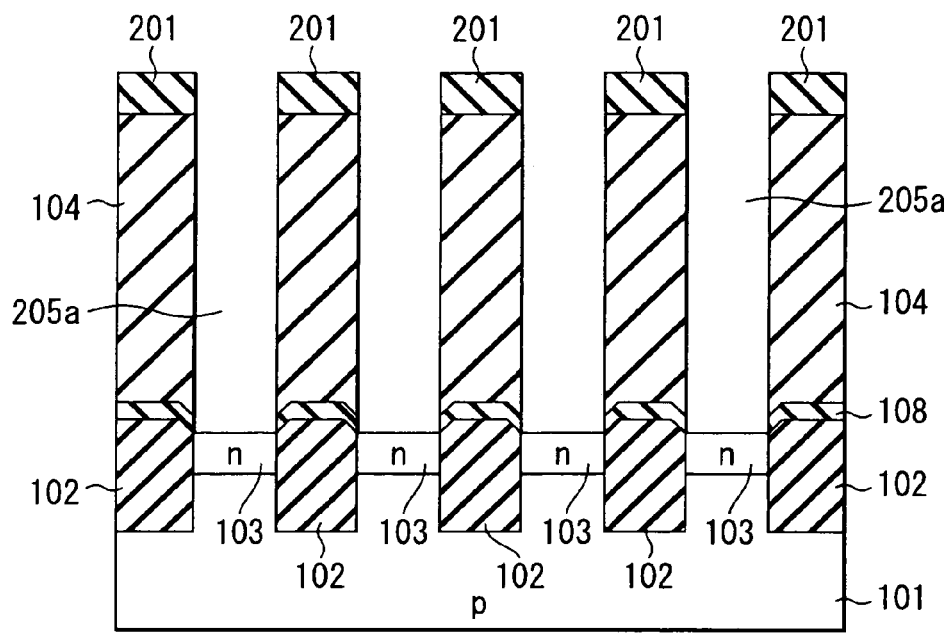
FIG. 46B is a cross sectional view of the semiconductor device shown in FIG. 46A, which is taken along the line 46B—46B of FIG. 46A.
Figure 46C:
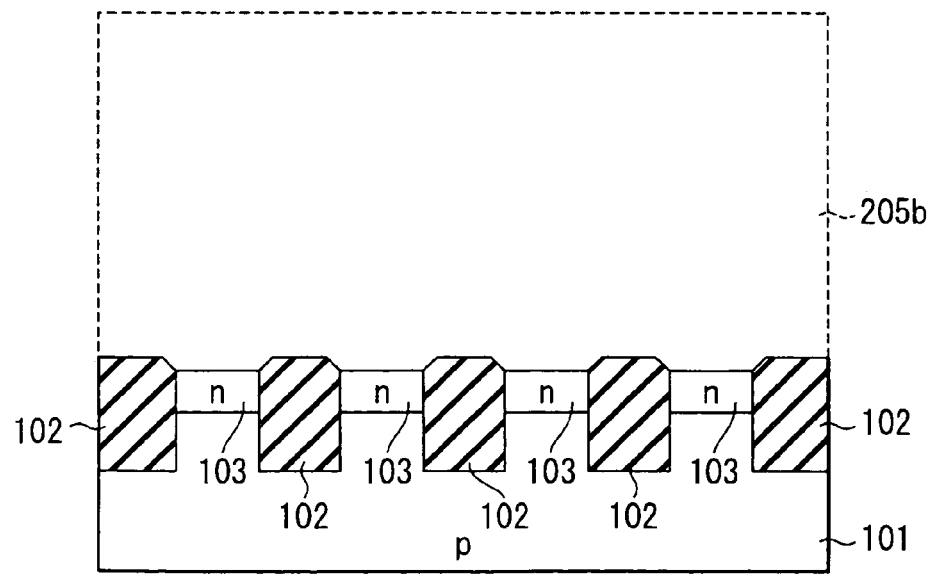
FIG. 46C is a cross sectional view of the semiconductor device shown in FIG. 46A, which is taken along the line 46C—46C of FIG. 46A.

Next, in accordance with lithography, as shown in FIGS. 46A to 46C, there is formed a resist pattern 203 having long linear openings 204a and 204b arranged in line in the arrangement direction of bit line contacts and in the common source line contact direction. The width of the opening 204b at the common source line side is smaller than the wiring groove width W3. For example, this width is defined to be equal to the opening width W of a portion at which a contact of the bit line lead-out wiring is formed.

With the resist 203 being a mask, the interlayer insulation film 104 is etched in an anisotropic manner under a condition having a selection ratio to the barrier insulation films 108 and 201. As shown in FIGS. 46A to 46C, the contact holes 205a and 205b are formed. At this time, at the bit line lead-out wiring portion, the contact hole 205a is formed to be separated for each element region. Two sides in the bit line direction are defined by the barrier insulation film 201 while the other two sides in the word line direction are defined by the resist 203. At the common source line side, as shown in FIG. 46C, the contact hole 205b is defined by the resist pattern 203. This hole is smaller than the wiring groove 202 formed in advance, but is formed into a form of a continuous pattern. When this contact hole is formed, since the barrier insulation film 108 works as an etching stopper, the element separation groove is never etched.

Figure 47A:
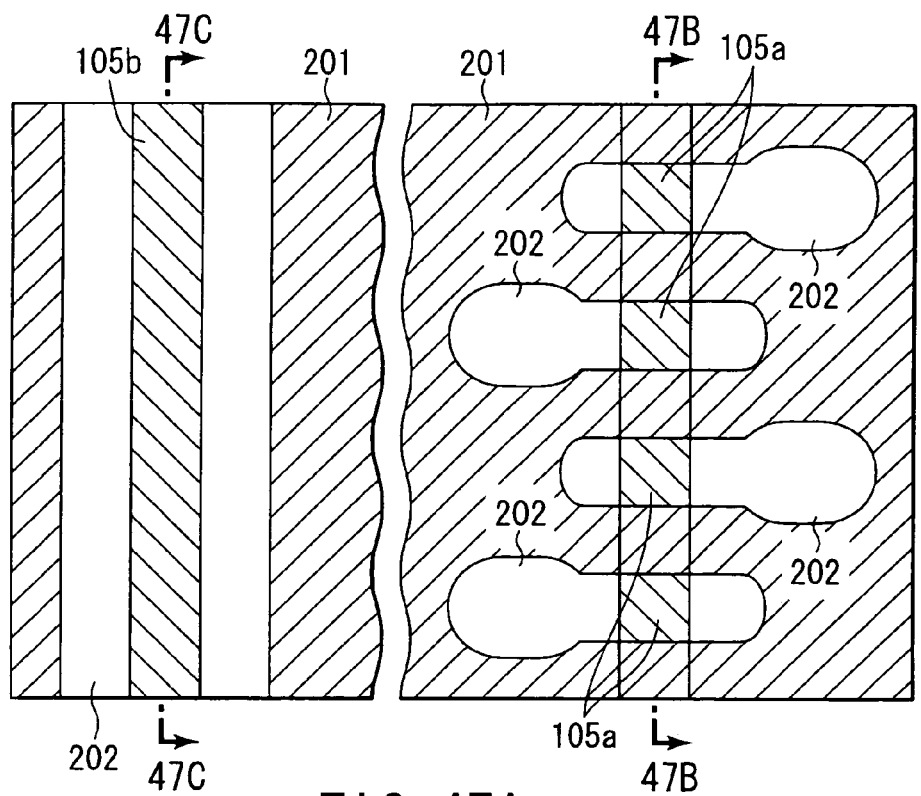
FIG. 47A is a plan view of the semiconductor device array in a contact plug embedding step of the manufacturing method according to the embodiment of the present invention.
Figure 47B:
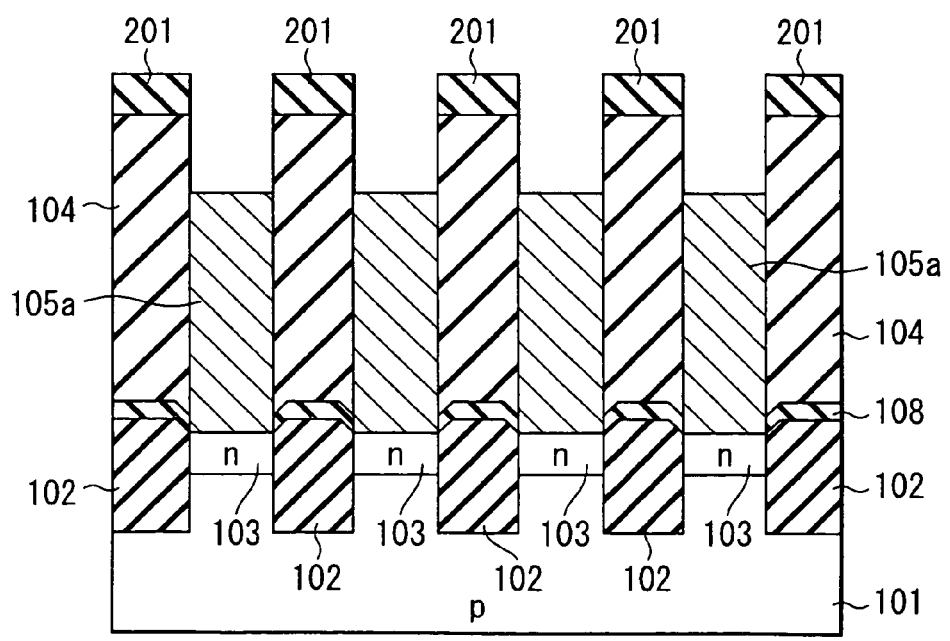
FIG. 47B is a cross sectional view of the semiconductor device shown in FIG. 47A, which is taken along the line 47B—47B of FIG. 47A.
Figure 47C:
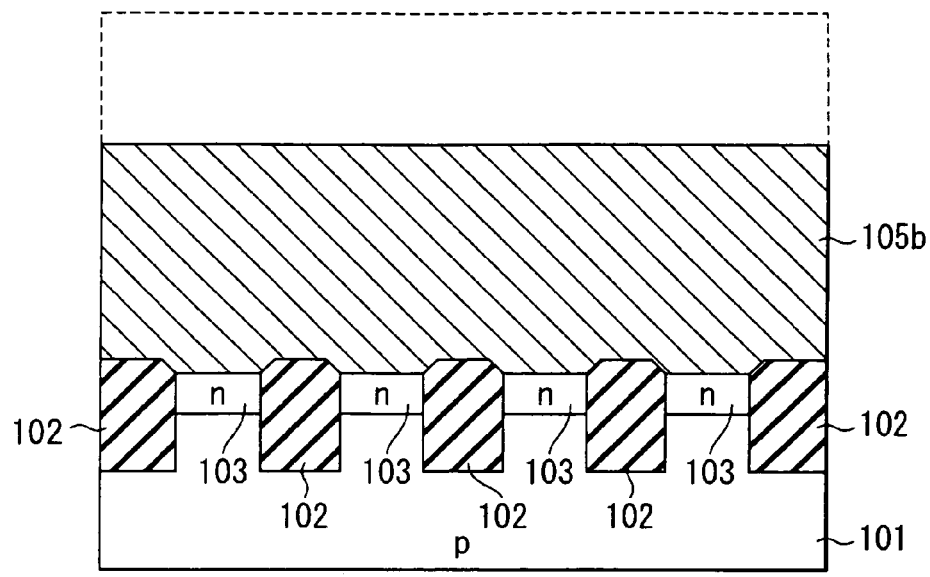
FIG. 47C is a cross sectional view of the semiconductor device shown in FIG. 47A, which is taken along the line 47C—47C of FIG. 47A.
Figure 48A:
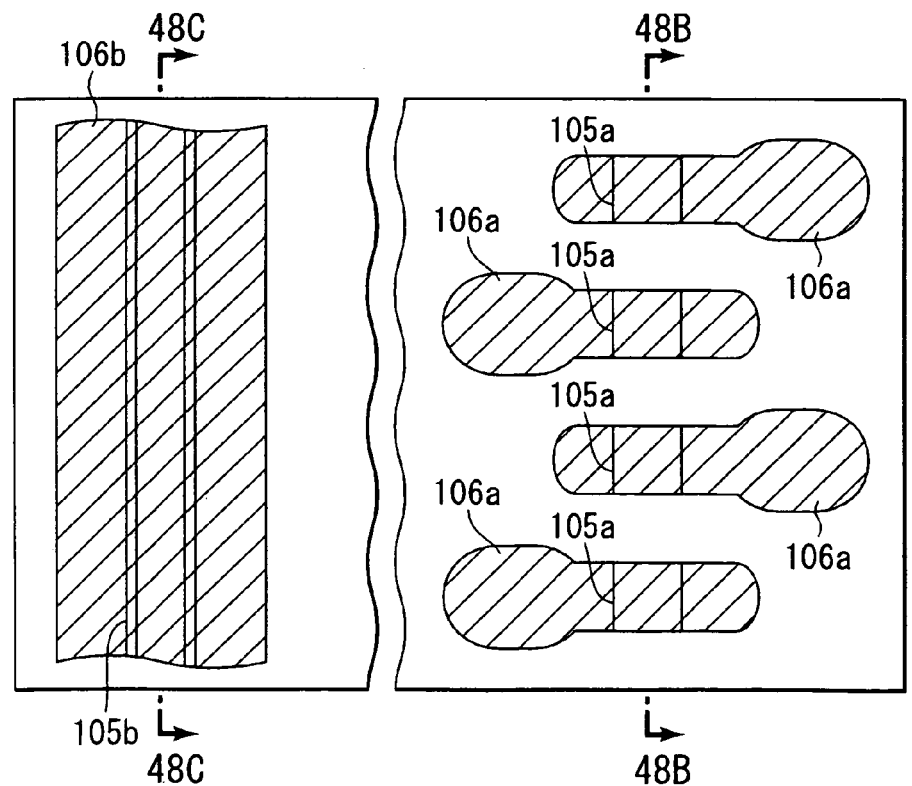
FIG. 48A is a plan view of the semiconductor device array in a step of the manufacturing method, of embedding a bit line lead-out wiring and a common source line according to the embodiment of the present invention.
Figure 48B:
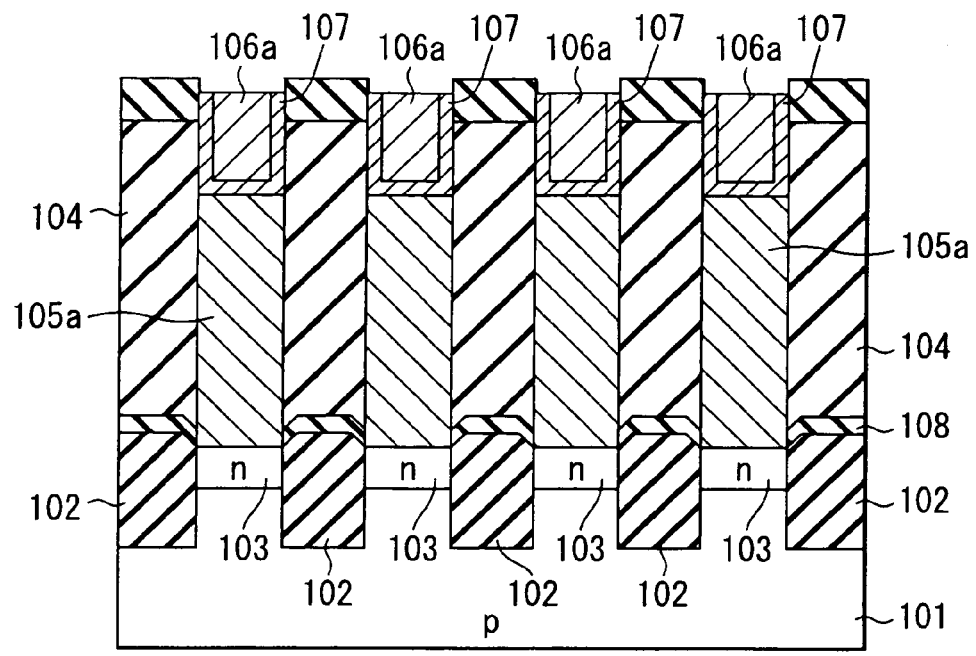
Figure 48C:
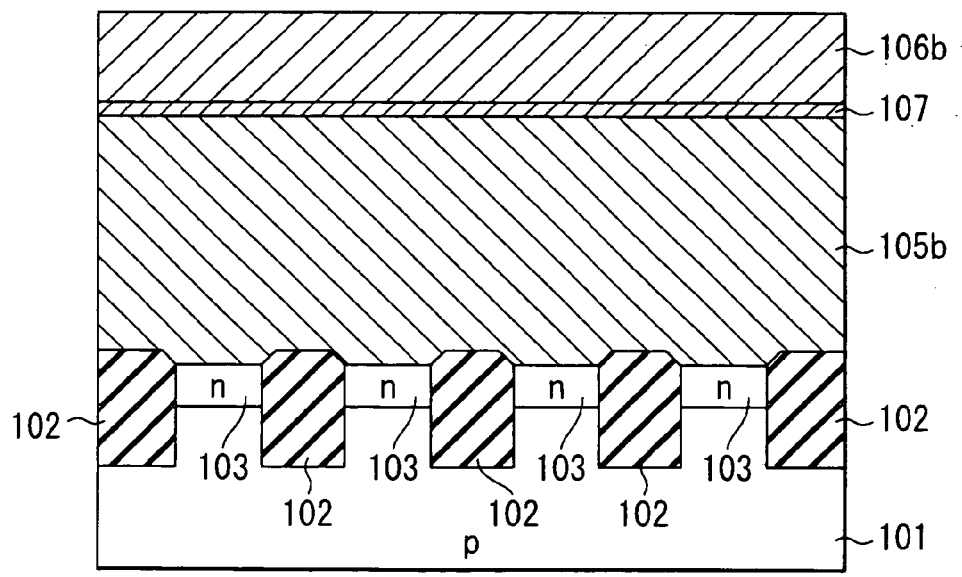

Next, as in the seventh embodiment, poly-crystalline silicon in which phosphor or arsenic is doped at a high concentration is deposited, and etching back is carried out in accordance with anisotropic etching or isotropic etching such as CDE (Chemical Dry Etching). As shown in FIGS. 47A to 47C, the contact plugs 105a and 105b are embedded in the middle of the contact holes 205a and 205b. After embedding the contact plugs 105a and 105b, the barrier insulation film 201 is removed. Then, after depositing the barrier metal 107 such as TiN, a metal material such as tungsten, aluminum, or copper is deposited, and CMP processing is carried out. As shown in FIGS. 48A to 48C, the contact hole 205 and wiring groove 202 are embedded with the wiring layers 106a and 106b.

In the present embodiment, unlike the seventh embodiment, the local interconnection wiring width of the common source line is changed in the midway thereof, the width of the lower part of the wiring is small, and the width of the upper part of the wiring is large. The width of the lower part of the common source line can be reduced, thus making it possible to reduce a space between selection gates, and then, achieving miniaturization of an element.

In addition, a pattern is formed so as to widely ensure the source line width of the same wiring layer as the bit line lead-out portion, so that the source line resistance can be lowered as well, and more stable threshold settings can be provided.

In addition, in the present embodiment, the contact diameter can be determined independent of the control gate intervals of the selection transistors SGD and SGS. A film with a lower dielectric and a higher breakdown voltage than a silicon oxide film or a silicon nitride film such as silicade glass can be used for a side wall material for the control gates. A need for forming a side wall of a silicon nitride film or the like in order to obtain the resistance of etching for forming a contact does not occur. Therefore, the intervals of the selection transistors SGD and SGS can be reduced between the adjacent memory cell blocks, and a small chip area can be achieved.

[Ninth Embodiment]

Figure 49:
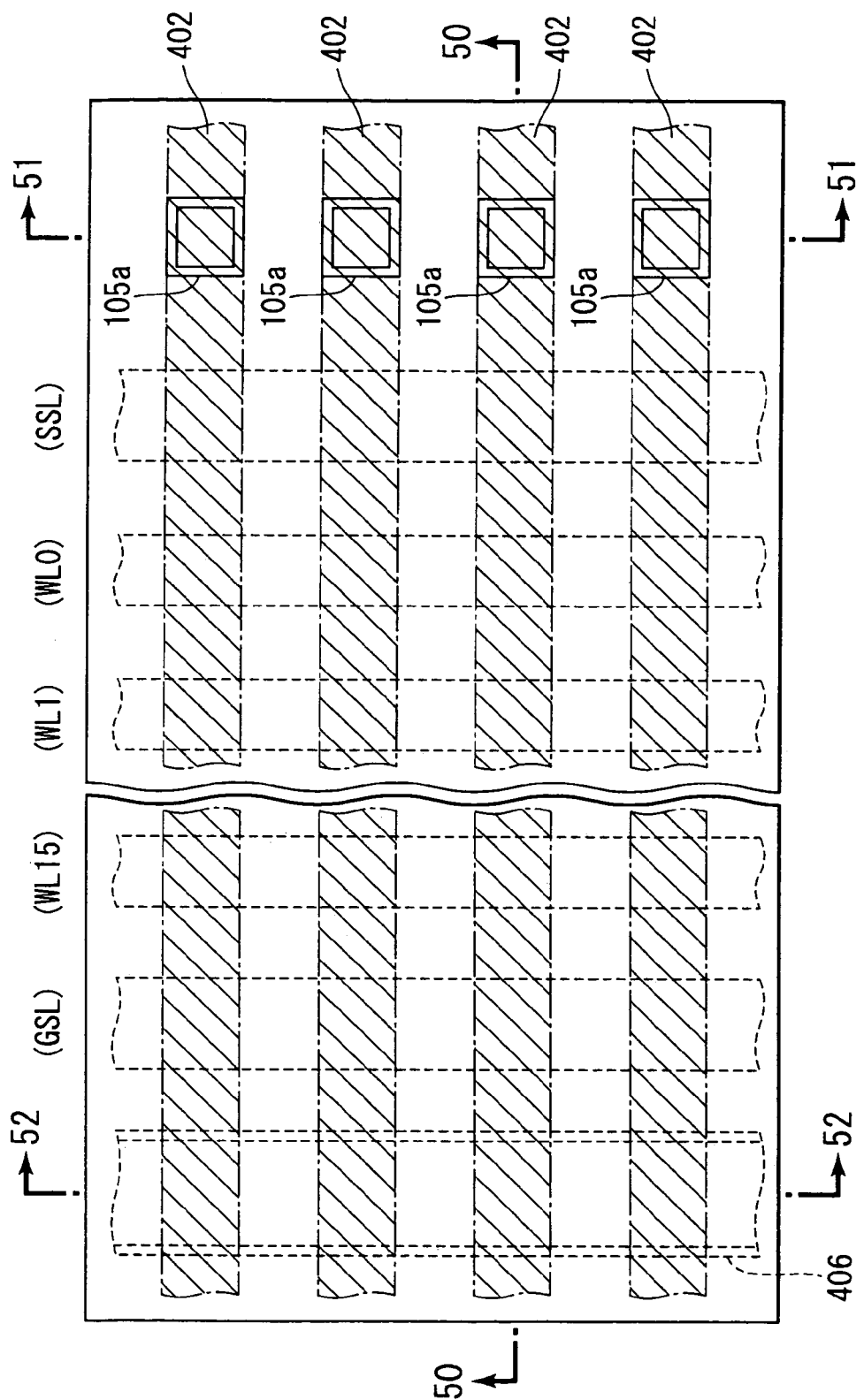
Figure 50A:
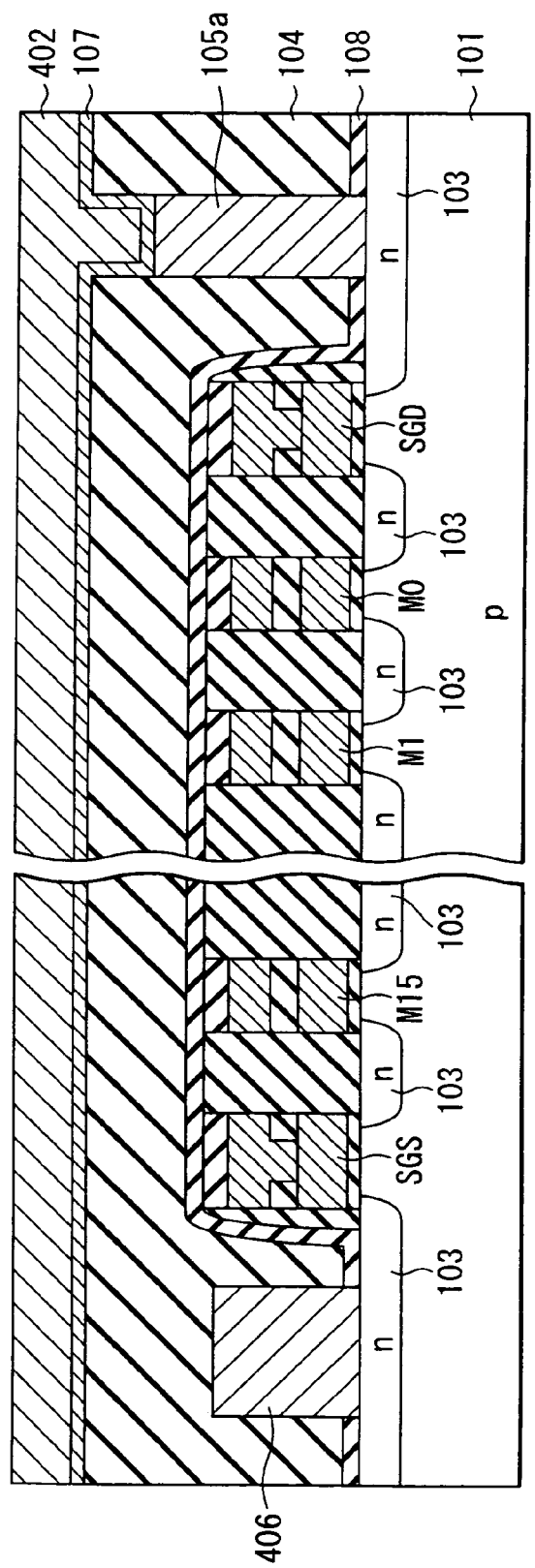
Figure 51A:
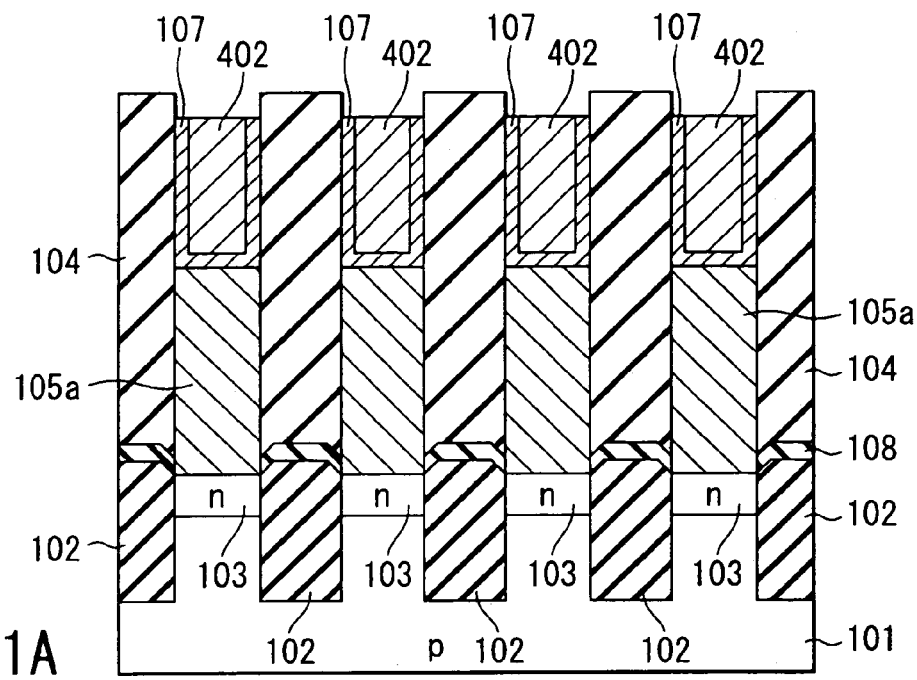
Figure 52A:
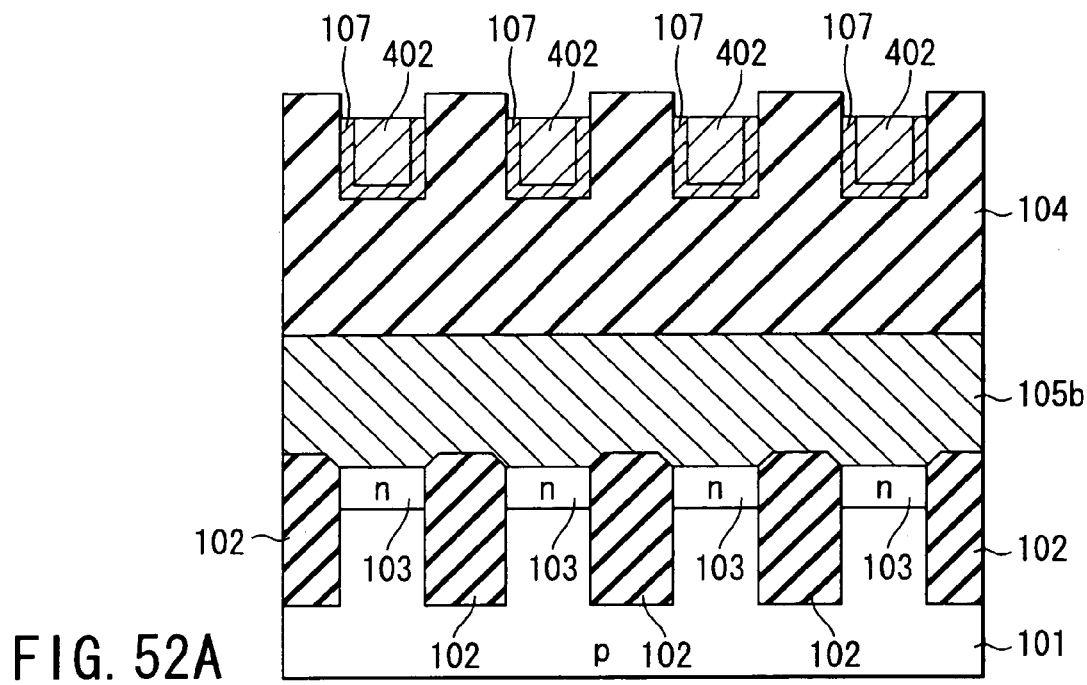

FIG. 49 shows a layout of a memory cell block according to another embodiment. FIGS. 50A, 51A, and 52A are cross sectional views taken along the lines 50—50, 51—51, and 52—52 of FIG. 49, respectively. The present embodiment is different from the foregoing sixth to eighth embodiments in that the bit line contact plug 105a is directly connected to the bit line 402 without intervening the lead-out wiring. The common source line is formed of a local interconnection 406 of only one layer. Since the NAND cell structure is the same as that according to the foregoing embodiments each, a duplicate description is omitted here.

Figure 53:
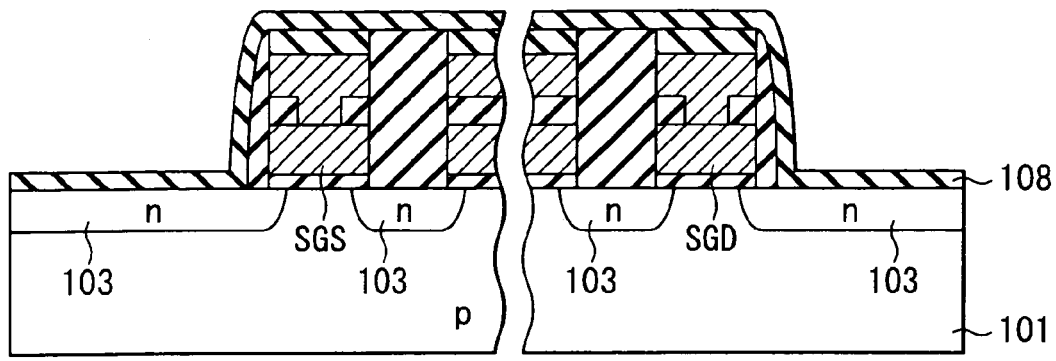
Figure 54:
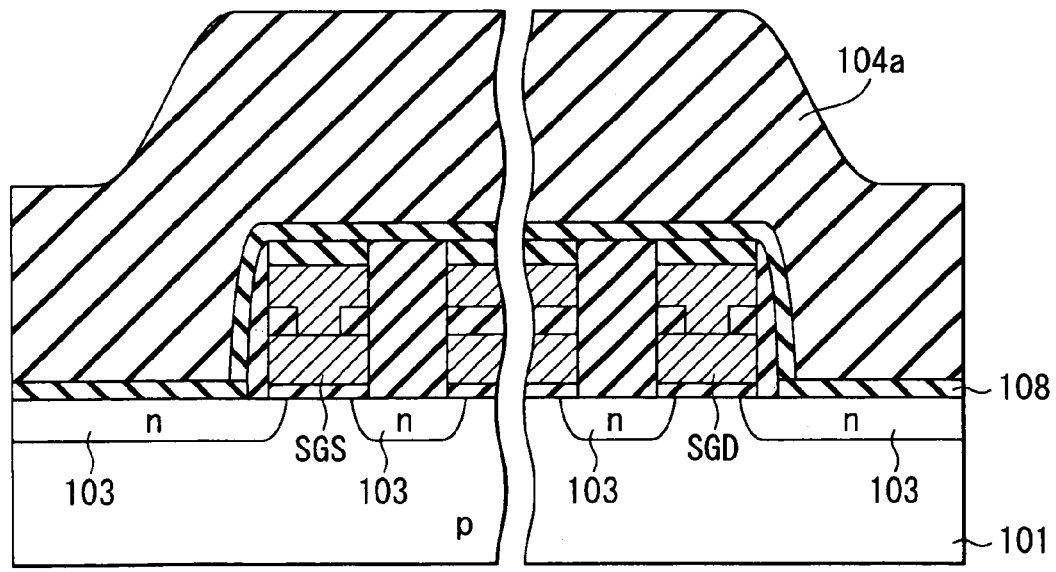
Figure 55:
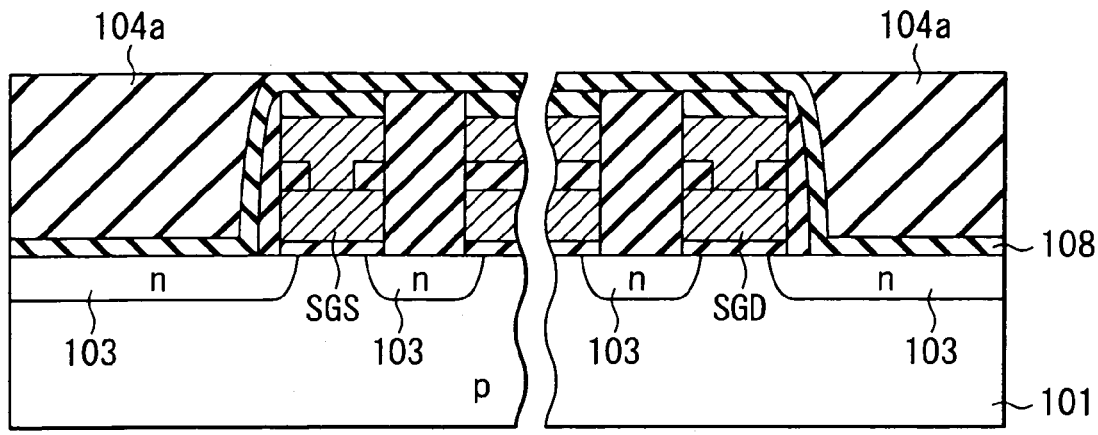

FIGS. 53 to 59 are cross sectional views each corresponding to the cross sectional view taken along the line 50—50 of FIG. 49, and show a process for forming the local interconnection 406 in an embedded manner. As in the foregoing embodiments, after gate processing of a memory cell and a selection transistor, the barrier insulation film 108 is deposited (FIG. 53). Prior to depositing the barrier insulation film 108, the interlayer insulation film is embedded between the memory cells. Next, the interlayer insulation film 104a is deposited (FIG. 54). The interlayer insulation film 104a is etched back and flattened to the height of the gate electrode of the cell by means of CMP (FIG. 55).

Next, when a resist (not shown) patterned by lithography is defined as a mask, the interlayer insulation film 104a in the common source line region is etched in an anisotropic manner to expose the n-type diffusion layer 104. A stripe shaped groove 405 in the word line direction is formed (FIG. 56). Then, there is deposited a wiring material layer 406 such as poly-crystalline silicon in which impurities such as phosphor or arsenic are doped in $1\times10^{19}$ cm$^{-3}$ or more and $1\times10^{21}$ cm$^{-3}$ or less, amorphous silicon, or SiGe mixture crystal (FIG. 57). Etching back is carried out by CDE or CMP, and a local interconnection 406 serving as a common source line is embedded in the groove 405 (FIG. 58).

Subsequently, after depositing the interlayer insulation film 104a again, the barrier insulation film 201 is deposited, and a ground configuration for forming a bit line contact is completed (FIG. 59). In the following description, a process of forming a bit line contact and a bit wiring will be described with reference to FIGS. 60A to 60C including a plan view and two cross sectional views thereof; FIGS. 61A to 61C, and FIGS. 62A and 62B including cross sectional views.

The barrier insulation film 201 is etched in an anisotropic manner by using a resist (not shown) formed to be patterned in accordance with lithography. Then, the inter-layered film 104 is further etched in an anisotropic manner in predetermined depth, and as shown in FIGS. 60A to 60C, a wiring groove 407 for embedding a bit line is formed. Next, as shown in FIG. 61A to FIG. 61C, there is formed a resist pattern 203 having a linear opening 204 along the arrangement direction of bit line contacts (i.e., in a direction orthogonal to the bit line). Then, the interlayer insulation film 104 is etched in an anisotropic manner, and a contact hole 205 for a bit line contact is formed. At this time, as in the foregoing embodiments each, in the contact hole 205, two sides in the bit line direction are defined by the barrier insulation film 201 while the other two sides in the word line direction are defined by the resist 203. Then, the contact hole is formed to be separated for each element region.

Then, FIGS. 62A and 62B are cross sectional views taken along the lines 62A—62A and 62B—62B in FIG. 61A, respectively. The contact plug 105a caused by poly-crystalline silicon and the like is embedded in the bit line contact hole 205. After embedding the contact plug 105a, the barrier insulation film 108 is removed. Then, the barrier metal 107 is formed, and the metal wiring layer is deposited and etched back. In this manner, as shown in FIGS. 50 to 52, the bit line 402 is embedded in the wiring groove 407.

According to the present embodiment, a process for forming a bit line lead-out wiring and a via contact is eliminated, and the number of processes is reduced, so that the manufacturing cost can be reduced. In addition, according to the present embodiment, a bit line contact with a less misalignment can be achieved for both of the control electrode of the selection transistor SGD and the element region. Therefore, a memory cell array can be formed with a small alignment margin, and a memory cell area can be reduced.

In NAND type EEPROM, the bit line contact pitch is arranged to be equal to the pitch of the memory cell array element region and element separation region. In the NAND type EEPROM according to the present embodiment, even if the bit line contact pitch is reduced together with miniaturization of an element, it is possible to ensure a margin for short-circuit between the contacts and a misalignment between the adjacent bit line contacts. In addition, in the present embodiment, although the contact is embedded with poly-crystalline silicon, and the contact upper part and wiring layer are embedded with a barrier metal and a metal in accordance with the second embodiment, the bit line contact may be formed by using another method shown in the first to fifth embodiments or the like.

Figure 50B:
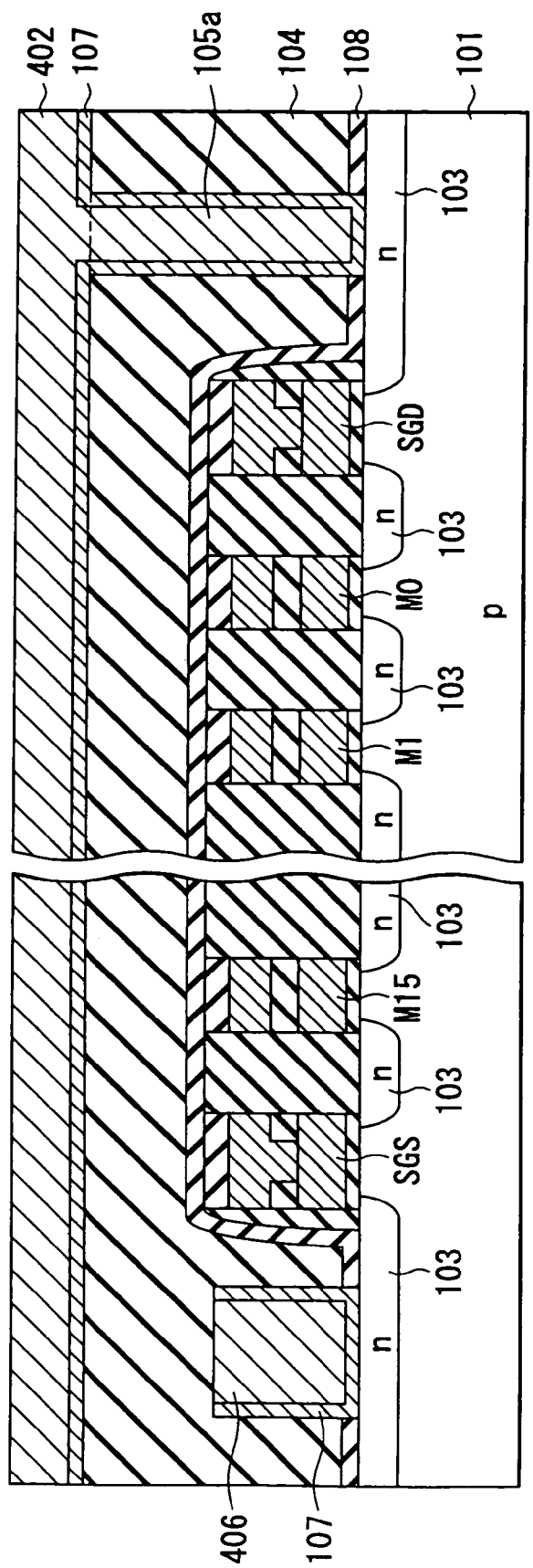
Figure 51B:
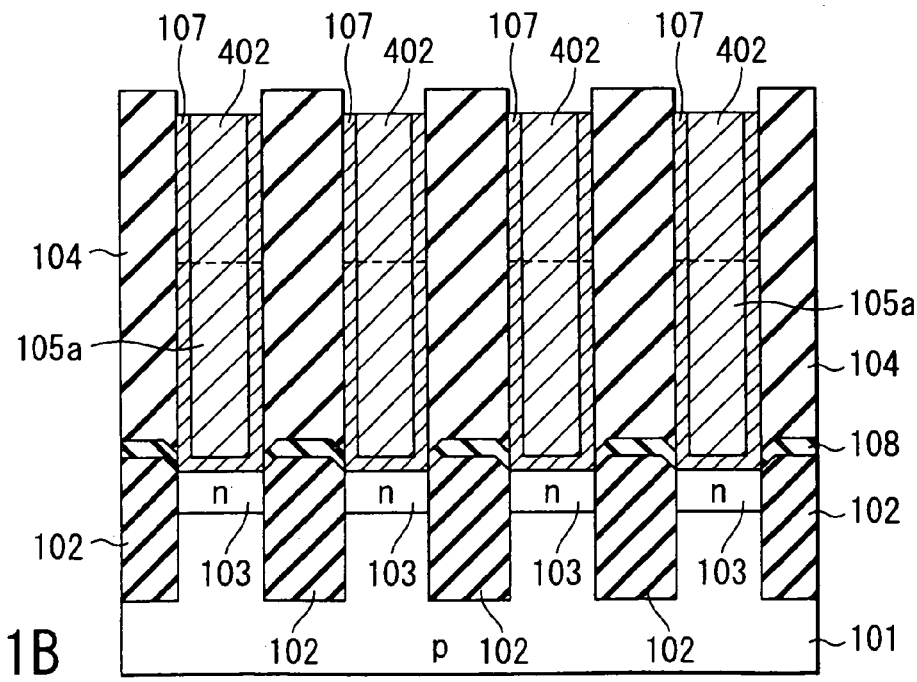
Figure 52B:
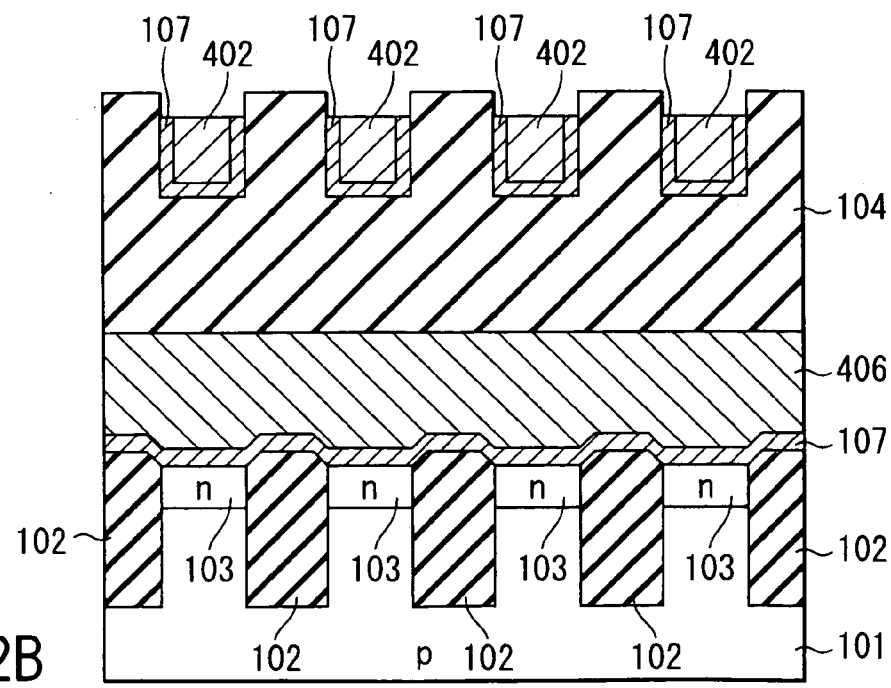

As shown in FIGS. 50B to 52B, similarly to the first embodiment, the contact plugs 105a and 105b and wiring layers 106a and 106b both may be formed by embedding a metal material such as tungsten, aluminum, or copper via a barrier metal 107 such as Ti, Ta, TaN, or TiN. FIGS. 50B to 50B correspond to FIGS. 50A to 50A, respectively.

[Tenth Embodiment]

Now, a tenth embodiment in which the present invention is applied to NOR type EEPROM will be described here.

FIG. 63 is a circuit diagram showing a cell array equivalent circuit of the NOR type EEPROM. As is the case of a NAND type, a memory cell MC has a stacked gate structure having a floating gate or a MONOS structure (FIG. 25). One end of the memory cell MC is connected to a common source line SL, and the other end is connected to a bit line BL. This memory cell is disposed at each of the crossing portions of the bit line BL and the word line WL.

FIG. 64 is a plan view showing a cell array. FIGS. 65A, 66A, and 67A are cross sectional views taken along the lines 65—65, 66—66, and 67—67 of FIG. 64, respectively. The memory cell MC is covered with the barrier insulation film 108. This barrier insulation film 108 works as en etching stopper film for preventing the bit line contact 105a and source line from being formed to extend into the element separation region.

A manufacturing process is the same as that according to the ninth embodiment. A common source line SL is embedded as a local interconnection 406 as in the ninth embodiment. Specifically, the local interconnection 406 is formed by a plug formed by poly-crystalline silicon in which impurities such as phosphor or arsenic are doped in $1 \times 10^{19}$ $cm^{-3}$ or more and $1 \times 10^{21}$ $cm^{-3}$ or less, for example, amorphous silicon, or a SiGe mixture crystal. The bit line contact plug 105a is formed to be embedded with poly-crystalline silicon doped at a high concentration as in the ninth embodiment. In addition, as in the ninth embodiment, the bit line 402 connected to the contact plug 105a is embedded with a metal material such as tungsten, aluminum, or copper via the barrier metal 107 such as Ti, Ta, TaN, or TiN without interposing the bit line lead-out wiring.

The bit line contact plugs 105a are formed in a rectangular shape in which two sides are defined, and are arranged in line as in the ninth embodiment. In the NOR type EEPROM, it is important to reduce the contact and wiring resistance in order to increase a write operation speed. Therefore, as described in the first embodiment, the bit line contact and the local interconnection in a common source line may be embedded with a metal.

In the NOR type EEPROM, the bit line contact pitch is equal to the pitch of the memory cell element region and element separation region. In the NOR type EEPROM according to the present embodiment, even if the bit line contact pitch is reduced together with miniaturization of an element, it is possible to ensure a margin for short-circuit between the contacts and a misalignment margin between the adjacent bit line contacts. In addition, in the present embodiment, although the contact and wiring layers are embedded with a barrier metal or a metal in accordance with the first embodiment, a bit line contact may be formed by using another method described in the first embodiment or the like.

As shown in FIGS. 65B to 67B, similarly to the first embodiment, the contact plugs 105a and 105b and wiring layers 106a and 106b both may be formed by embedding a metal material such as tungsten, aluminum, or copper via a barrier metal 107 such as Ti, Ta, TaN, or TiN. FIGS. 65B to 67B correspond to FIGS. 65A to 67A, respectively.

In all of the foregoing embodiments, although there has been described a case in which contact plugs are disposed in line in a direction orthogonal to a wiring layer, the present invention is effective to a case in which the contact plugs are arranged in a staggered manner without being limited to a case in which the contact plugs are arranged on line as well. Such an example is shown in FIGS. 74A and 74B in correspondence with FIG. 1A. The contact plugs 105 may be disposed in a staggered manner as far as a condition is met in which the plugs are arranged in the same pitch as that of the wiring layers 106 and openings (upper surface) of the contact plugs 105 overlap with a straight line of the arrangement direction of the contact plugs 105.

In this case, of the contact holes for embedding rectangular contact plugs 105, a resist pattern 203 for defining two sides in a direction crossing the wiring layer 106 is produced as a waveform, as shown in FIGS. 75A and 75B when the pattern is shown in correspondence with FIG. 4A.

FIGS. 74B and 75B each shows a case in which a resist corner is rounded during exposure. At this time, the upper surface shape of the contact plug 105 is formed in a shape different from a conventional circular shape (or elliptical shape) or from a rectangular shape according to the first embodiment. The features of the contact shape in this case will be described with reference to FIG. 76 in correspondence with FIGS. 73A and 73B. When a split line passing through the center of gravity is rotated from 0 degree to 360 degrees, there are produced four maximum points P11, P12, P13, and P14 corresponding to the diagonal line direction and four minimum points P21, P22, P23, and P24 in the wiring width direction and in a direction orthogonal thereto (solid line in FIG. 76).

However, when the contact shape is larger and is rounded, a portion at the minimum point P22 is produced as an maximum point. In this state, three maximum points and three minimum points are produced, respectively (broken line in FIG. 76). The two sides in the wiring direction, of the sides defining the contact cut-face, is determined in a wiring width in a self-align manner is the same as a case of a rectangular contact.

FIG. 77 is a plan view and shows a circular contact according to a further embodiment of the present invention and corresponds to FIG. 74.

In the foregoing description, even when contacts are disposed alternately, two sides in the wiring direction, of the sides defining a contact, are defined in a wiring width, and the other two sides in a direction orthogonal to the wiring are defined in a resist pattern having a linear opening. In this manner, in comparison with a conventional circular (or elliptical) contact, the similar advantageous effect to that described in the first embodiment or the like can be achieved.

In addition, in the sixth to tenth embodiments, although there has been described a method of forming a bit line contact and a source line contact in a memory cell region, it is possible to form a contact of a peripheral circuit portion and a contact in a memory cell region at the same time in a semiconductor memory device having the memory cell region and the peripheral circuit portion. Peripheral circuit transistors are shown in FIGS. 78A–78D through FIGS. 81A–81D.

FIGS. 78A–78D show an example where the contact 105c of the peripheral circuit transistor is a circular contact and the contact 105c is not formed in a self-align manner with the wiring layer 106c, but formed in a pattern having an alignment margin.

FIG. 78A is a plan view of a peripheral circuit transistor, and FIG. 78B is a cross sectional view of the peripheral circuit transistor shown in FIG. 78A. FIG. 78C shows a pattern of a wiring layer of the peripheral circuit transistor shown in FIG. 78A, and FIG. 78D shows a pattern of a contact of the peripheral circuit transistor shown in FIG. 78A. In FIG. 78A, the contact 105c of the peripheral circuit transistor is a circular contact. The contact 105c of the peripheral circuit transistor may be an elliptical contact. The contact 105c of the peripheral circuit transistor is not formed in a self-align manner with the wiring layer 106c, but formed in a pattern having an alignment margin.

For example, in the semiconductor device according to the sixth embodiment, in the case of forming the contact 105c and the wiring 106c of the peripheral circuit portion shown in FIG. 78A, the wiring layer patterning of the peripheral circuit portion as shown in FIG. 78C is carried out at the same time as patterning of the wiring layer of the memory cell region as shown in FIG. 29A.

Further, patterning of the contact of the peripheral circuit shown in FIG. 78D is carried out at the same time as patterning of the contact of the memory cell region shown in FIG. 30A. In addition, it is possible to embed the contact and the wiring layer of the peripheral circuit with a poly-crystalline silicon doped at a high impurity concentration or a metal material such as tungsten, aluminum, or copper via a barrier metal such as Ti, Ta, TaN, or TiN, by carrying out the embedding of the contact and the wiring layer of the peripheral circuit at the same time as embedding the memory cell portion.

Namely, if the semiconductor memory device having the memory cell region according to the sixth to tenth embodiments further comprises the peripheral circuit portion shown in FIG. 78A, the contacts 105a and 105b of which two sides are formed in a self-align manner with the wiring layer and the contact 105c formed in an alignment margin for the wiring layer are formed at the same time. At this time, it is desirable to increase the diameter of the contact 105c more than one side of the contact 105a in order to ensure a lithography margin. In addition, the width of the wiring 106c is always formed to be larger than that of the wiring 106a. This is because an alignment margin for the contact 105c is required.

By forming the elements in the above shape, the contact resistance and wiring resistance of the peripheral circuit portion can be smaller than those of the bit line contact and wiring, and thus the peripheral circuit can be operated at a high speed.

FIGS. 79A–79D show an example where the contact 105c of the peripheral circuit portion is a rectangular contact of which two sides are formed in a self-align manner with the wiring 106c in the same manner as in the bit line contact 105a. FIG. 79A is a plan view of a peripheral circuit transistor, and FIG. 79B is a cross sectional view of the peripheral circuit transistor shown in FIG. 79A. FIG. 79C shows a pattern of a wiring layer of the peripheral circuit transistor shown in FIG. 79A, and FIG. 79D shows a pattern of a contact of the peripheral circuit transistor shown in FIG. 79A. As shown in FIG. 79A, the contact 105c of the peripheral circuit portion may be a rectangular contact of which two sides are formed in a self-align manner with the wiring 106c in the same manner as in the bit line contact 105a.

In this case as well, the contact 105c of the peripheral circuit portion is formed at the same time when the contacts (bit line contacts) 105a and 105b of the memory cell portion are formed, and the wiring 106c is formed at the same time when the wirings 106a and 106b of the memory cell portion are formed. At this time, pattern examples of the wiring 106c and contact 105c are shown in FIG. 79C and FIG. 79D. It is desirable that the width of the wiring 106c be formed to be wider than that of the wiring 106a of the memory cell portion in view of the lithography margin and wiring resistance.

Further, the contact 105c is formed in a rectangular shape in which two sides, which are not defined by the wiring, are defined as long sides, thereby making it possible to increase a sectional area for the contact and to reduce the contact resistance.

In addition, it is desirable in view of miniaturization that two sides defined by the wiring layer are formed in the minimum processing dimension F and are formed in the same pitch as the bit line contact 106a, as in the same manner as in the bit line contact 106a.

FIGS. 80A–80D show a case in which the contact 105c of the peripheral circuit portion is formed in an elliptical line pattern formed with an alignment margin for the wiring layer. FIG. 80A is a plan view of a peripheral circuit transistor, and FIG. 80B is a cross sectional view of the peripheral circuit transistor shown in FIG. 80A. FIG. 80C shows a pattern of a wiring layer of the peripheral circuit transistor shown in FIG. 80A, and FIG. 80D shows a pattern of a contact of the peripheral circuit transistor shown in FIG. 80A.

As shown in FIG. 80A, the contact 105c of the peripheral circuit portion is formed in an elliptical line pattern formed in an alignment margin for the wiring layer.

In this example, a contact is formed at a portion which is provided in the examples shown in FIGS. 78A–78D and FIGS. 79A–79D as a space between the contacts, thus making it possible to increase the sectional area and to further reduce the contact resistance. In addition, as shown in FIG. 80D, a contact opening of this example is larger than those in the examples shown in FIGS. 78A–78D and FIGS. 79A–79D, thus making it possible to extend a lithography margin.

Also, in this example, as in the cases of FIGS. 78A–78D and FIGS. 79A–79D, the contact 105c of the peripheral circuit portion is formed at the same time when the contacts (bit line contacts) 105a and 105b of the memory cell portion are formed, and the wiring 106c is formed at the same time when the wirings 106a and 106b of the memory cell portion are formed.

FIGS. 81A–81D show a case in which the contact 105c of the peripheral circuit portion is formed in an elliptical line pattern formed in an alignment margin for the wiring layer. FIG. 81A is a plan view of a peripheral circuit transistor, and FIG. 81B is a cross sectional view of the peripheral circuit transistor shown in FIG. 81A. FIG. 80C shows a pattern of a wiring layer of the peripheral circuit transistor shown in FIG. 81A, and FIG. 81D shows a pattern of a contact of the peripheral circuit transistor shown in FIG. 81A. As shown in FIG. 81A, the contact 105c of the peripheral circuit may be a rectangular contact of which two sides are formed in a self-align manner with the wiring 106c, as in the bit line contact 105a.

A difference from the case of FIG. 79A–79D is that two sides of the contact 105c, defined by the wiring, are defined as long sides. Since the contact 105c is made to have a line pattern as shown in FIG. 81A, a contact is formed at a portion which is provided in the examples shown in FIGS. 78A–78D and FIGS. 79A–79D as a space between the contacts, and thus, a sectional area can be increased, and the contact resistance can be further reduced.

In comparison with the elliptical contact of FIGS. 80A–80D, there is no need to provide an alignment margin for the wiring. Thus, the sectional area for the contact can be increased, and the wiring width can be formed to be small, so that miniaturization of the element is easily compatible with higher performance.

Also, in this example (FIGS. 81A–81D), as in the cases of FIGS. 78A–78D, FIGS. 79A–79D and FIGS. 80A–80D, the contact 105c of the peripheral circuit portion is formed at the same time when the contacts (bit line contacts) 105a and 105b of the memory cell portion are formed, and the wiring 106c is formed at the same time when the wirings 106a and 106b of the memory cell portion are formed.

As describe above, the contact and wiring of the peripheral circuit portion are formed at the same time when the bit line contact 105a and wiring 106a (or bit line 402) according to the sixth to tenth embodiments are formed. Thus, the miniaturization of the memory cell region and peripheral circuit portion can be compatible with low resistance of the contact and wiring without increasing the number of steps. The term "forming at the same time" used here denotes that the contacts of the peripheral circuit portion and bit line are processed at the same time. As a result, the contact plug of the peripheral circuit portion and the contact plug of the bit line are formed of the same conductive material, and the wiring layers 106a and 106a (or bit line 402) connected thereto, respectively, are formed of the same layer.

Namely, as in the examples shown in FIGS. 78A–78D and FIGS. 80A–80D, a circular or elliptical contact 105c having an alignment margin for the wiring layer and a rectangular contact 105 or 105a of which two sides are defined in a self-align manner with the wiring layer as in the first to tenth embodiments, are formed on the same semiconductor substrate, so that the higher performance of the peripheral circuit portion (i.e., lower resistance of the contact and wiring) can be compatible with the miniaturization of the memory cell region. In addition, as shown in FIGS. 79A–79D and FIGS. 80A–80D, at the peripheral circuit portion as well, as in the contact 105 or 105a according to the first to tenth embodiments, the rectangular contact 105a of which two sides are defined in a self-align manner with the wiring layer is formed, so that the peripheral circuit portion can be made fine.

As a method for forming the contact 105c and wiring 106c of the peripheral circuit portion, there may be used any method according to the first to tenth embodiments. In addition, a contact having the same structure as that of the bit line contact 105 according to the first to fifth embodiments or the bit line contact 105a or source line contact 105b according to the sixth to tenth embodiments may be used as a well contact connected to a well or a gate contact connected to a gate.

With such a structure, the effect of the lowered wiring resistance and contact resistance and miniaturization of the element, described in the first to tenth embodiments and in the examples shown in FIGS. 78A–78D through FIGS. 81A–81D, can be achieved in the well contact or gate contact.

The present invention is not limited to the above described embodiments. For example, as a method for forming an element separation film or an interlayer insulation film, in addition to a method for depositing a silicon oxide film or a silicon nitride film, there may be used a method for implanting an oxygen ion in the deposited silicon, thereby producing an oxide film, or a method for oxidizing the deposited silicon. In addition, in the element separation method, there may be used a LOCOS structure or a field shield structure using a gate electrode as well as STI. In a memory cell charge strage layer, there may be used $TiO_2$ or $Al_2O_3$, a tantalum oxide film, a titanic acid strontium or titanic acid barium, titanic acid zirconium, or a deposited film thereof.

In the present embodiment, although there has been described a case in which a p-type silicon substrate is used as a semiconductor substrate, an n-type silicon substrate or a SOI substrate may be used. In addition, there can be used a monocrystalline semiconductor substrate including silicon such as SiGe mixture crystal or SiGe mixture crystal. Although there has been described a case in which a memory cell array is formed on a p-type well with an NMOS transistor structure, a memory cell having a PMOS transistor structure may be formed on an n-type well. In this case, n-type of the source or drain region and each semiconductor region in the embodiments each is substituted as p-type, and p-type is substituted as n-type, respectively. Further, As, P, or Sb that is a kind of doped impurity may be substituted as any of In and B.

In addition to a poly-crystal Si, a SiGe mixture crystal or a SiGeC mixture crystal may be used for a control gate electrode, or may have a deposition structure. Further, amorphous Si, an amorphous SiGe mixture crystal, or an amorphous SiGeC mixture crystal can be used, and may have a deposition structure. However, it is desirable that the control gate electrode is a semiconductor, in particular, be a semiconductor including Si because a p-type gate electrode can be formed and electron implantation from the gate electrode can be prevented. In addition, the charge accumulation layer may be formed to be disposed in a dotted shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a plurality of element regions defined by an element separation region in a semiconductor substrate and forming an element in each of said element regions;
    forming sequentially a first barrier insulation film, an interlayer insulation film, and a second barrier insulation film on the semiconductor substrate having the element formed thereon;
    etching from the second barrier insulation film to a predetermined depth of the interlayer insulation film to form a plurality of wiring grooves aligned with said plurality of element regions;
    forming a resist pattern having a linear or wave shaped opening that crosses said plurality of wiring grooves;
    etching the interlayer insulation film and the first barrier insulation film while using the resist pattern and the second barrier insulation film as masks, to form a contact hole on each of said element regions;
    embedding a conductor plug in the contact hole;
    removing the second barrier insulation film; and
    embedding a wiring layer which is connected to the conductor plug in the wiring groove of the interlayer insulation film.

2. A method of semiconductor device according to claim 1, wherein embedding the conductor plug in the contact hole is embedding in the contact hole a material which is the same as that of the wiring layer at the same time when the wiring layer is embedded.

3. A method of manufacturing a semiconductor device according to claim 1, wherein the conductor plug is embedded in the contact hole up to a predetermined depth and the wiring layer is embedded in an upper-portion of the contact hole which is upper than the predetermined depth.

4. A method of manufacturing a semiconductor device according to claim 1, wherein the first barrier insulation film is formed to be thicker than the second barrier insulation film.

5. A method of manufacturing a semiconductor device according to claim 1, wherein the second barrier insulation film is formed to be thicker than the first barrier insulation film.

6. A method of manufacturing a semiconductor device, comprising:
    forming a plurality of element regions defined by an element separation region in a semiconductor substrate and forming an element in each of said element regions;
    forming sequentially a first barrier insulation film, a first interlayer insulation film, and a second barrier insulation film on the semiconductor substrate having the element formed thereon;
    etching the second barrier insulation film to form a stripe groove which is formed over the element regions and extends to the first interlayer insulation film;
    forming a second interlayer insulation film which is embedded in the stripe groove to flatly cover the second barrier insulation film;
    forming a resist pattern having a linear or wave shaped opening orthogonal to the stripe groove on the second interlayer insulation film;
    etching the second interlayer insulation film and the first interlayer insulation film while using the resist pattern and the second barrier insulation film as masks to form a contact hole leading to each of said element regions and at the same time a wiring groove which ends at the first barrier insulation film;
    embedding a conductor plug in the contact hole; and
    embedding a wiring layer which is connected to the conductor plug in the wiring groove of the second interlayer insulation film.

* * * * *